US009082986B2

(12) United States Patent
Kato et al.

(10) Patent No.: US 9,082,986 B2
(45) Date of Patent: Jul. 14, 2015

(54) ORGANIC ELECTROLUMINESCENT ELEMENT

(75) Inventors: Tomoki Kato, Chiba (JP); Nobuhiro Yabunouchi, Chiba (JP); Takayasu Sado, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/122,131

(22) PCT Filed: May 23, 2012

(86) PCT No.: PCT/JP2012/063163

§ 371 (c)(1), (2), (4) Date: Nov. 25, 2013

(87) PCT Pub. No.: WO2012/165256

PCT Pub. Date: Dec. 6, 2012

(65) Prior Publication Data

US 2014/0110692 A1 Apr. 24, 2014

(30) Foreign Application Priority Data

May 27, 2011 (JP) ................................ 2011-119664

(51) Int. Cl.
*H01L 29/08* (2006.01)
*H01L 35/24* (2006.01)
(Continued)

(52) U.S. Cl.
CPC ........ *H01L 51/0056* (2013.01); *H01L 51/0072* (2013.01); *H01L 51/5012* (2013.01); *H01L 51/5016* (2013.01); *H01L 51/5056* (2013.01)

(58) Field of Classification Search
CPC ........ H01L 51/00; H01L 27/00; C09K 11/00; C07D 403/00; C07D 519/00; C07D 478/00
USPC ............................................ 257/40; 548/305
See application file for complete search history.

(56) References Cited

U.S. PATENT DOCUMENTS

| | | | | |
|---|---|---|---|---|
| 8,227,801 | B2 * | 7/2012 | Xia et al. | 257/40 |
| 8,598,610 | B2 * | 12/2013 | Oda | 257/98 |
| 8,816,380 | B2 * | 8/2014 | Oda | 257/98 |

(Continued)

FOREIGN PATENT DOCUMENTS

| | | |
|---|---|---|
| JP | 2000 38064 | 2/2000 |
| JP | 2004 319441 | 11/2004 |

(Continued)

OTHER PUBLICATIONS

International Search Report Issued Aug. 7, 2012 in PCT/JP12/063163 Filed May 23, 2012.

*Primary Examiner* — Telly Green
(74) *Attorney, Agent, or Firm* — Oblon, McClelland, Maier & Neustadt, L.L.P.

(57) ABSTRACT

An organic electroluminescence device includes a first organic thin-film layer and a second organic thin-film layer between an anode and a cathode opposing the anode in this order from the anode side. The first organic thin-film layer includes a specific aromatic heterocyclic derivative A, and the second organic thin-film layer includes a specific aromatic heterocyclic derivative B. The aromatic heterocyclic derivative A and the aromatic heterocyclic derivative B are different from each other. The organic electroluminescence device is capable of driving at a low voltage and has a long lifetime.

15 Claims, 1 Drawing Sheet

(51) Int. Cl.
*H01L 51/00* (2006.01)
*H01L 51/50* (2006.01)

(56) References Cited

U.S. PATENT DOCUMENTS

2005/0147842 A1 7/2005 Hirayama et al.
2009/0284139 A1 11/2009 Ushikubo et al.
2011/0260138 A1 10/2011 Xia et al.
2012/0126222 A1* 5/2012 Ogiwara et al. ................ 257/40
2013/0105787 A1* 5/2013 Tanaka et al. .................. 257/40

FOREIGN PATENT DOCUMENTS

| | | |
|---|---|---|
| JP | 3695714 | 7/2005 |
| JP | 2009 302041 | 12/2009 |
| JP | 2010 241801 | 10/2010 |
| WO | 2004 066685 | 8/2004 |
| WO | 2010 150593 | 12/2010 |
| WO | 2012 008281 | 1/2012 |

* cited by examiner

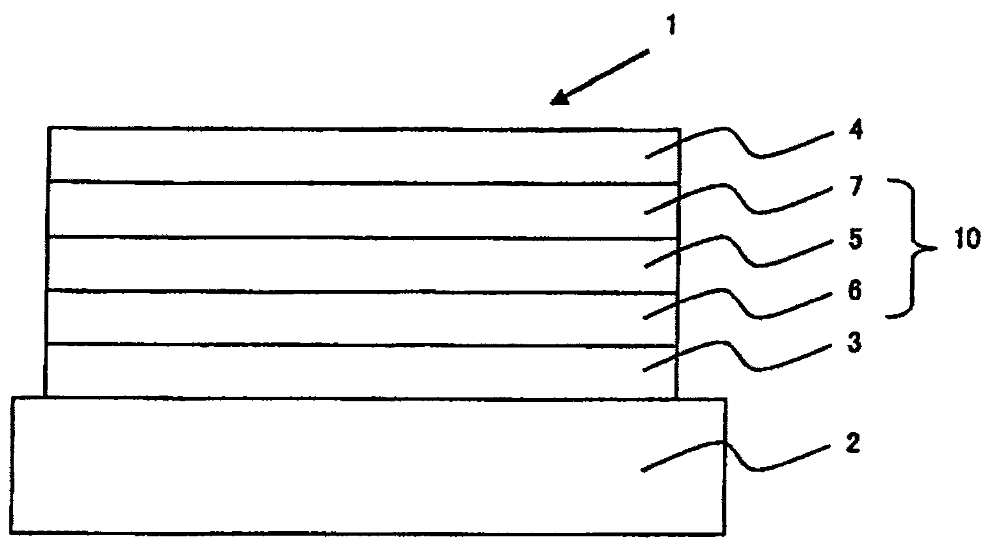
1
4
7
5
6
3
2
10

ORGANIC ELECTROLUMINESCENT ELEMENT

TECHNICAL FIELD

The present invention relates to organic electroluminescence devices, particularly organic electroluminescence devices employing similar compounds each having a specific connected structure of nitrogen-containing aromatic heterorings.

BACKGROUND ART

By applying voltage to an organic electroluminescence device (also referred to as "organic EL device"), holes from an anode and electrons from a cathode are injected into a light emitting layer. The holes and electrons injected into the light emitting layer recombine to form excitons. Singlet excitons and triplet excitons are formed in a ratio of 25%:75% according to spin-statistics theorem. Since the fluorescence utilizes the emission from singlet excitons, it has been known that the internal quantum efficiency of a fluorescent organic EL device is limited to 25% at most. In contrast, since the phosphorescence utilizes the emission from triplet excitons, it has been known that the internal quantum efficiency of a phosphorescent organic EL device can be increased to 100% if the intersystem crossing occurs efficiently.

In the development of known organic EL devices, an optimum device design has been made depending upon the emission mechanism such as fluorescence and phosphorescence. It has been known in the art that a high-performance phosphorescent organic EL device cannot be obtained by a mere application of the fluorescent technique to the phosphorescent device, because the emission mechanisms are different from each other. This may be generally because the following reasons.

Since the phosphorescence utilizes the emission from triplet excitons, a compound with larger energy gap is required to be used in the light emitting layer. This is because that the singlet energy (energy difference between the lowest excited singlet state and the ground state) of a compound is generally larger than its triplet energy (energy difference between the lowest excited triplet state and the ground state).

Therefore, to effectively confine the triplet energy of a phosphorescent dopant material within a device, a host material having triplet energy larger than that of the phosphorescent dopant material should be used in the light emitting layer. In addition, if an electron transporting layer and a hole transporting layer are formed adjacent to the light emitting layer, a compound having triplet energy larger than that of the phosphorescent dopant material should be used also in the electron transporting layer and the hole transporting layer. Thus, the device design conventionally employed for developing a phosphorescent organic EL device has been directed to the use of a compound having an energy gap larger than that of a compound for use in a fluorescent organic EL device, thereby increasing the voltage for driving an organic EL device.

A hydrocarbon compound highly resistant to oxidation and reduction, which has been known as a useful compound for a fluorescent device, has a small energy gap because of a broad distribution of π-electron cloud. Therefore, such a hydrocarbon compound is not suitable for use in a phosphorescent organic EL device and, instead, an organic compound having a heteroatom, such as oxygen and nitrogen, has been selected. However, a phosphorescent organic EL device employing such an organic compound having a heteroatom has a shorter lifetime as compared with a fluorescent organic EL device.

In addition, the relaxation time of triplet excitons of a phosphorescent dopant material is extremely longer than that of singlet excitons, this largely affecting the device performance. Namely, in the emission from singlet excitons, since the relaxation speed which leads to emission is high, the diffusion of excitons into a layer adjacent to the light emitting layer (for example, a hole transporting layer and an electron transporting layer) is difficult to occur and efficient emission is expected. In contrast, the emission from triplet excitons is a spin-forbidden transition and the relaxation speed is low. Therefore, the diffusion of excitons into adjacent layers occurs easily and the thermal energy deactivation occurs in most compounds other than the specific phosphorescent compound. Thus, as compared with a fluorescent organic EL device, it is more important for a phosphorescent organic EL device to control the region where electrons and holes are recombined.

For the above reasons, the development of a high performance phosphorescent organic EL device requires the selection of materials and the consideration of device design which are different from those for a fluorescent organic EL device.

Patent Document 1 discloses the combined use of a phosphorescent host material wherein a carbazole and an azine are connected to each other and a hole transporting material having a carbazole-containing amine structure with a large triplet energy. Although the monoamine material which has been used successfully as the hole transporting material is used, the durability against charges is poor because of its structure. In addition, the proposed host material has a large ionization potential because carbazoles are not directly bonded to each other. Therefore, holes are accumulated in the interface between the transporting material and the host material to adversely affect the performance of device.

Patent Document 2 discloses the combined use of a phosphorescent host material having a biscarbazole structure wherein carbazoles are boned to each other and a hole transporting material having a carbazole-containing amine structure with a large triplet energy. Since the material having a small ionization potential is used as the host material, the hole injecting ability from the hole transporting material is improved. However, since the conventional monoamine material is used as the hole transporting material, the triplet energy is likely to easily diffuse.

PRIOR ART

Patent Documents

Patent Document 1: WO2004/066685
Patent Document 2: JP 2010-241801A

SUMMARY OF THE INVENTION

Problem to be Solved by the Invention

The present invention has been made to solve the above problems, and the object of the invention is to realize an organic EL device capable of driving at low voltage and having a long lifetime.

Means for Solving Problem

As a result of extensive research in view of achieving the above object, the inventors have found that the energy barrier of ionization potential in the first organic thin-film layer/second organic thin-film layer interface is eliminated by using similar compounds in the first organic thin-film layer and the second organic thin-film layer. Each compound has a specific connected structure of nitrogen-containing aromatic heterorings. By the use of such similar compounds, the accumulation of holes in the interface is prevented to increase the amount of holes injected into the second organic thin-film layer and simultaneously reduce the load on the electron injection into the first organic thin-film layer, thereby prolong the lifetime of organic EL device. It has been further found that the triplet excitons can be confined effectively in the second organic thin-film layer because of a large triplet energy of the compounds having a specific connected structure of nitrogen-containing aromatic heterorings.

The present invention provides:

1. An organic electroluminescence device comprising a first organic thin-film layer and a second organic thin-film layer between an anode and a cathode opposing the anode in this order from the anode side, wherein the first organic thin-film layer comprises an aromatic heterocyclic derivative A represented by formula (1-1), the second organic thin-film layer comprises an aromatic heterocyclic derivative B represented by formula (2-1), and the aromatic heterocyclic derivative A and the aromatic heterocyclic derivative B are different from each other:

(1-1)

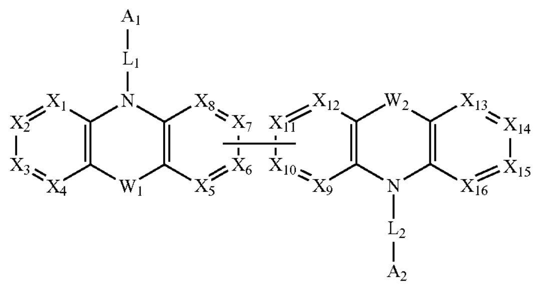

wherein:

each of $W_1$ and $W_2$ independently represents a single bond, $CR_1R_2$ or $SiR_1R_2$;

each of $R_1$ and $R_2$ independently represents a hydrogen atom, a substituted or unsubstituted alkyl group having 1 to 20 carbon atoms, a substituted or unsubstituted cycloalkyl group having 3 to 20 carbon atoms, a substituted or unsubstituted haloalkyl group having 1 to 20 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms;

each of $A_1$ and $A_2$ independently represents a substituted or unsubstituted aryl group having 6 to 30 ring carbon atoms or a substituted or unsubstituted heteroaryl group having 2 to 30 ring carbon atoms;

each of $L_1$ and $L_2$ independently represents a single bond, a substituted or unsubstituted arylene group having 6 to 30 ring carbon atoms, or a substituted or unsubstituted heteroarylene group having 2 to 30 ring carbon atoms;

one of $X_5$ to $X_8$ and one of $X_9$ to $X_{12}$ represent carbon atoms which are bonded to each other and the others of $X_1$ to $X_{16}$ independently represent $CR_3$ or a nitrogen atom; and $R_3$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms or adjacent $R_3$ groups are bonded to each other to form a ring structure;

(2-1)

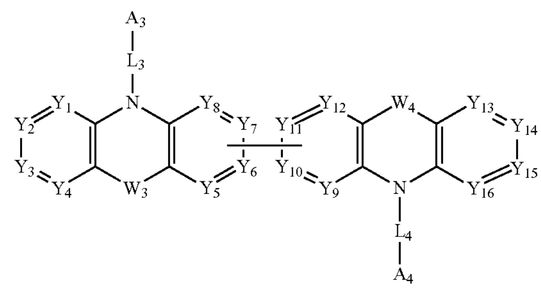

wherein:

each of $W_3$ and $W_4$ independently represents a single bond, $CR_4R_5$ or $SiR_4R_5$;

each of $R_4$ and $R_5$ independently represents a hydrogen atom, a substituted or unsubstituted alkyl group having 1 to 20 carbon atoms, a substituted or unsubstituted cycloalkyl group having 3 to 20 carbon atoms, a substituted or unsubstituted haloalkyl group having 1 to 20 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms;

each of $L_3$ and $L_4$ independently represents a single bond, a substituted or unsubstituted arylene group having 6 to 30 ring carbon atoms, or a substituted or unsubstituted heteroarylene group having 2 to 30 ring carbon atoms;

one of $Y_5$ to $Y_8$ and one of $Y_9$ to $Y_{12}$ represent carbon atoms which are bonded to each other and the others of $Y_1$ to $Y_{16}$ independently represent $CR_6$ or a nitrogen atom;

$R_6$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, or adjacent $R_6$ groups are bonded to each other to form a ring structure; and each of $A_3$ and $A_4$ independently represents a substituted or unsubstituted aryl group having 6 to 30 ring carbon atoms or a substituted or unsubstituted heteroaryl group having 2 to 30 ring carbon atoms;

2. The organic electroluminescence device according to item 1, wherein at least one of $A_3$ and $A_4$ is represented by formula (2-a):

(2-a)

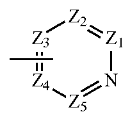

wherein:

each of $Z_1$ to $Z_5$ independently represents $CR_7$ or a nitrogen atom; and $R_7$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, or adjacent $R_7$ groups are bonded to each other to form a ring structure;

3. The organic electroluminescence device according to item 1 or 2, wherein the aromatic heterocyclic derivative A is represented by formula (1-2) and the aromatic heterocyclic derivative B is represented by formula (2-2):

(1-2)

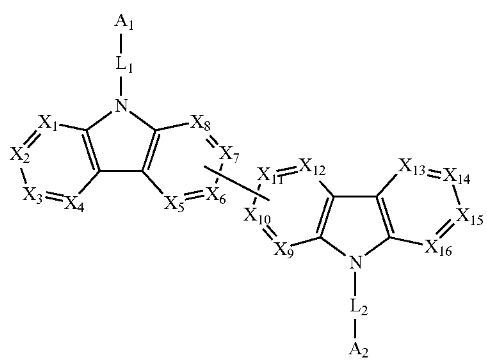

wherein $A_1$, $A_2$, $L_1$, $L_2$, and $X_1$ to $X_{16}$ are as defined in formula (1-1); and (2-2)

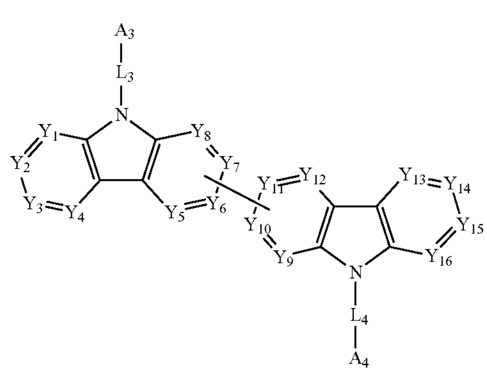

wherein $A_3$, $A_4$, $L_3$, $L_4$, and $Y_1$ to $Y_{16}$ are as defined in formula (2-1);

4. The organic electroluminescence device according to any one of items 1 to 3, wherein the aromatic heterocyclic derivative A is represented by formula (1-3):

(1-3)

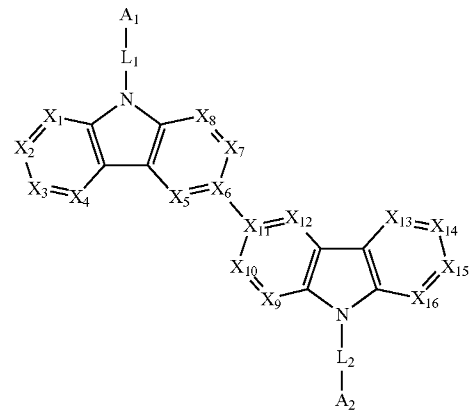

wherein $A_1$, $A_2$, $L_1$, $L_2$, and $X_1$ to $X_{16}$ are as defined in formula (1-1);

5. The organic electroluminescence device according to any one of items 1 to 3, wherein the aromatic heterocyclic derivative A is represented by formula (1-4) or (1-5):

(1-4)

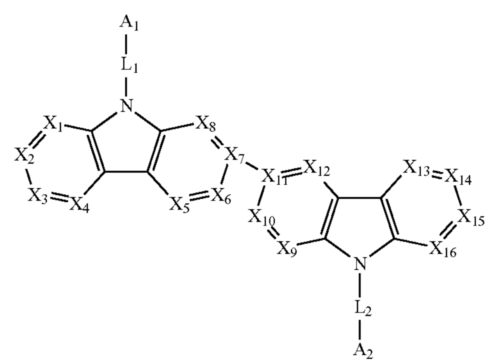

(1-5)

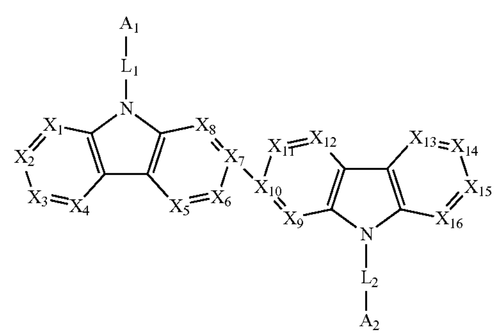

wherein $A_1$, $A_2$, $L_1$, $L_2$, and $X_1$ to $X_{16}$ are as defined in formula (1-1);

6. The organic electroluminescence device according to any one of items 1 to 5, wherein the aromatic heterocyclic derivative B is represented by formula (2-3):

(2-3)

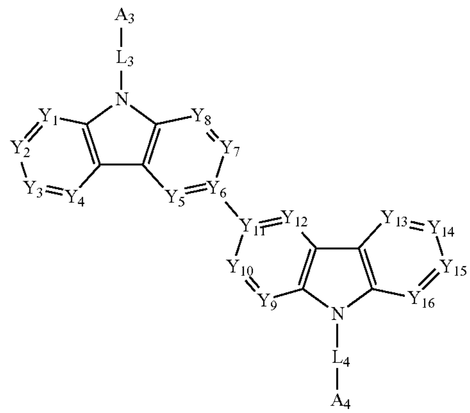

wherein $A_3$, $A_4$, $L_3$, $L_4$, and $Y_1$ to $Y_{16}$ are as defined in formula (2-1);

7. The organic electroluminescence device according to any one of items 1 to 5, wherein the aromatic heterocyclic derivative B is represented by formula (2-4) or (2-5):

(2-4)

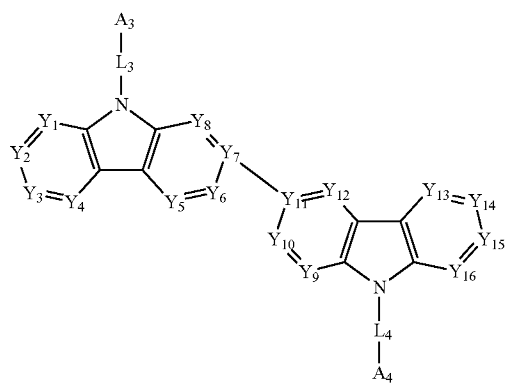

(2-5)

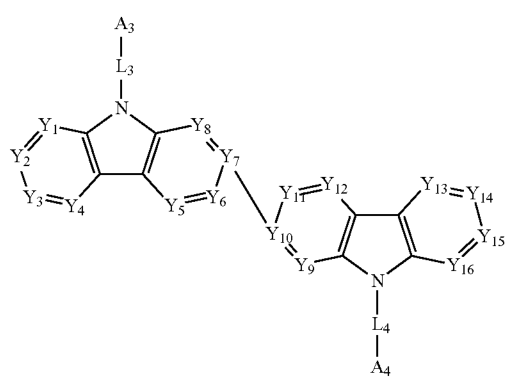

wherein $A_3$, $A_4$, $L_3$, $L_4$, and $Y_1$ to $Y_{16}$ are as defined in formula (2-1);

8. The organic electroluminescence device according to item 6, wherein the aromatic heterocyclic derivative A is represented by formula (1-3) and the aromatic heterocyclic derivative B is represented by formula (2-3);

9. The organic electroluminescence device according to item 7, wherein the aromatic heterocyclic derivative A is represented by formula (1-3) and the aromatic heterocyclic derivative B is represented by formula (2-4) or (2-5);

10. The organic electroluminescence device according to any one of items 1 to 9, wherein at least one of $A_1$ and $A_2$ represents a substituted or unsubstituted dibenzofuranyl group, a substituted or unsubstituted carbazolyl group, or a substituted or unsubstituted dibenzothiophenyl group;

11. The organic electroluminescence device according to any one of items 1 to 10, wherein a layer comprising a compound represented by formula (10) is bonded to the first organic thin-film layer:

(10)

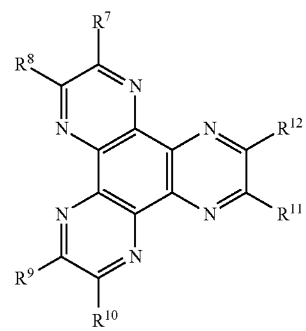

wherein each of $R^7$ to $R^{12}$ independently represents a cyano group, —$CONH_2$, a carboxyl group, or —$COOR^{13}$, wherein $R^{13}$ represents an alkyl group having 1 to 20 carbon atoms, or $R^7$ and $R^8$, $R^9$ and $R^{10}$, or $R^{11}$ and $R^{12}$ are bonded to each other to form —CO—O—CO—;

12. The organic electroluminescence device according to any one of items 1 to 11, wherein the second organic thin-film layer comprises a phosphorescent emitting material; and 13. The organic electroluminescence device according to item 12, wherein the phosphorescent emitting material is an ortho metallated complex comprising a metal selected from iridium (Ir), osmium (Os), and platinum (Pt).

Effect of the Invention

According to the present invention, an organic electroluminescence device capable of driving at low voltage and having a long lifetime is provided.

BRIEF DESCRIPTION OF DRAWINGS

FIG. 1 is a schematic cross-sectional view of an example of the organic EL device of the invention.

MODE FOR CARRYING OUT THE INVENTION

The present invention will be described below in more detail.

The organic electroluminescence device comprises a first organic thin-film layer and a second organic thin-film layer between an anode and a cathode opposing the anode in this order from the anode side. The first organic thin-film layer comprises an aromatic heterocyclic derivative A represented by formula (1-1), and the second organic thin-film layer comprises an aromatic heterocyclic derivative B represented by formula (2-1). The aromatic heterocyclic derivative A and the aromatic heterocyclic derivative B are different from each other.

Aromatic Heterocyclic Derivative A

The aromatic heterocyclic derivative A used in the invention is represented by formula (1-1):

(1-1)

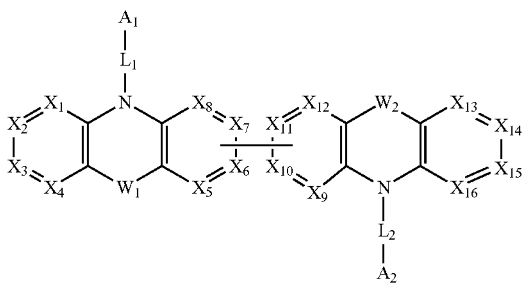

wherein:

each of $W_1$ and $W_2$ independently represents a single bond, $CR_1R_2$, or $SiR_1R_2$;

each of $R_1$ and $R_2$ independently represents a hydrogen atom, a substituted or unsubstituted alkyl group having 1 to 20 carbon atoms, a substituted or unsubstituted cycloalkyl group having 3 to 20 carbon atoms, a substituted or unsubstituted haloalkyl group having 1 to 20 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms;

each of $A_1$ and $A_2$ independently represents a substituted or unsubstituted aryl group having 6 to 30 ring carbon atoms, or a substituted or unsubstituted heteroaryl group having 2 to 30 ring carbon atoms;

each of $L_1$ and $L_2$ independently represents a single bond, a substituted or unsubstituted arylene group having 6 to 30 ring carbon atoms, or a substituted or unsubstituted heteroarylene group having 2 to 30 ring carbon atoms;

one of $X_5$ to $X_8$ and one of $X_9$ to $X_{12}$ represent carbon atoms which are bonded to each other and the others of $X_1$ to $X_{16}$ independently represent $CR_3$ or a nitrogen atom; and $R_3$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, or adjacent $R_3$ groups are bonded to each other to form a ring structure.

The aromatic heterocyclic derivative A is preferably represented by formula (1-2), (1-3), (1-4), or (1-5):

(1-2)

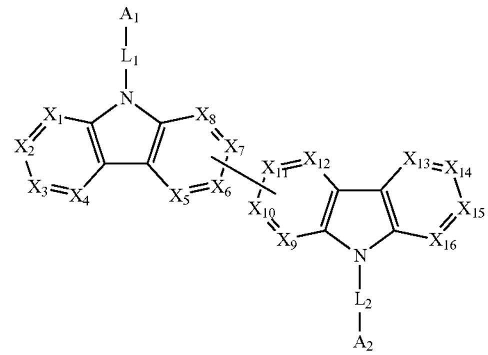

(1-3)

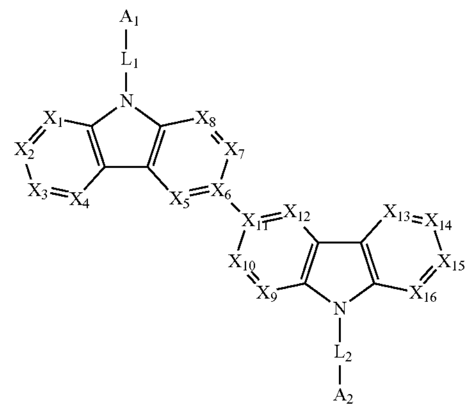

(1-4)

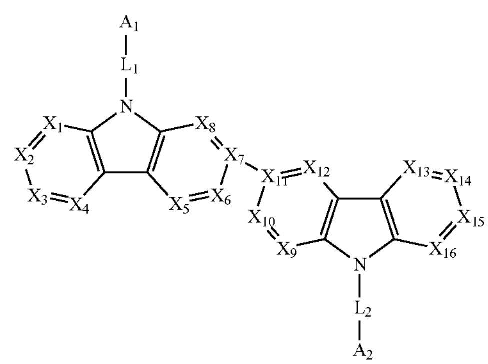

(1-5)

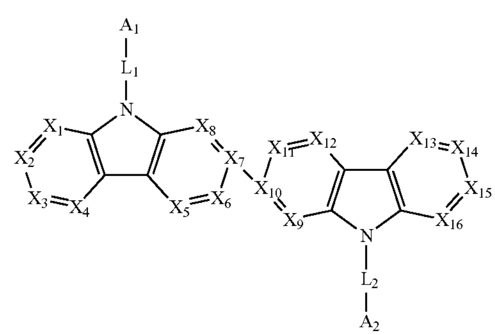

wherein $A_1$, $A_2$, $L_1$, $L_2$, and $X_1$ to $X_{16}$ are as defined in formula (1-1).

The aromatic heterocyclic derivative A is more preferably represented by formula (1-3), (1-4), or (1-5), and still more preferably represented by formula (1-3).

At least one of $A_1$ and $A_2$ preferably represents a substituted or unsubstituted dibenzofuranyl group, a substituted or unsubstituted carbazolyl group, or a substituted or unsubstituted dibenzothiophenyl group.

Aromatic Heterocyclic Derivative B

The aromatic heterocyclic derivative B used in the invention is represented by formula (2-1):

(2-1)

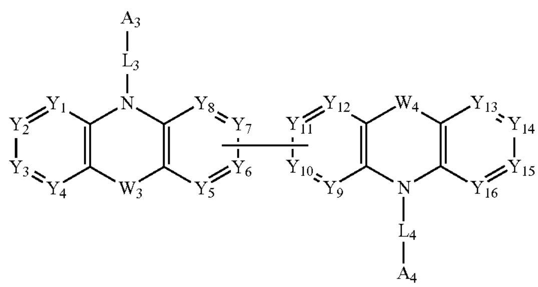

wherein:

each of $W_3$ and $W_4$ independently represents a single bond, $CR_4R_5$, or $SiR_4R_5$;

each of $R_4$ and $R_5$ independently represents a hydrogen atom, a substituted or unsubstituted alkyl group having 1 to 20 carbon atoms, a substituted or unsubstituted cycloalkyl group having 3 to 20 carbon atoms, a substituted or unsubstituted haloalkyl group having 1 to 20 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, provided that adjacent $R_4$ and $R_5$ may be bonded to each other to form a ring structure;

each of $L_3$ and $L_4$ independently represents a single bond, a substituted or unsubstituted arylene group having 6 to 30 ring carbon atoms, or a substituted or unsubstituted heteroarylene group having 2 to 30 ring carbon atoms;

one of $Y_5$ to $Y_8$ and one of $Y_9$ to $Y_{12}$ represent carbon atoms which are bonded to each other and the others of $Y_1$ to $Y_{16}$ independently represent $CR_6$ or a nitrogen atom;

$R_6$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, or adjacent $R_6$ groups are bonded to each other to form a ring structure; and each of $A_3$ and $A_4$ independently represents a substituted or unsubstituted aryl group having 6 to 30 ring carbon atoms or a substituted or unsubstituted heteroaryl group having 2 to 30 ring carbon atoms.

At least one of $A_3$ and $A_4$ is preferably represented by formula (2-a):

(2-a)

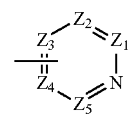

wherein:

each of $Z_1$ to $Z_5$ independently represents $CR_7$ or a nitrogen atom; and $R_7$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, or adjacent $R_7$ groups are bonded to each other to form a ring structure.

The aromatic heterocyclic derivative B is preferably represented by formula (2-2), (2-3), (2-4), or (2-5):

(2-2)

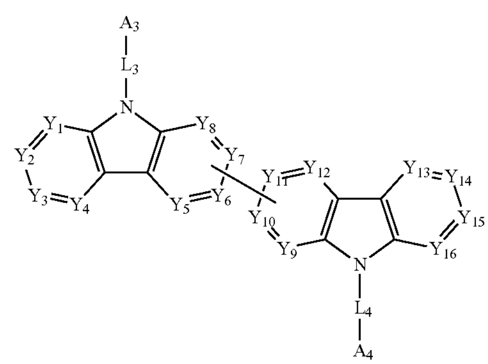

(2-3)

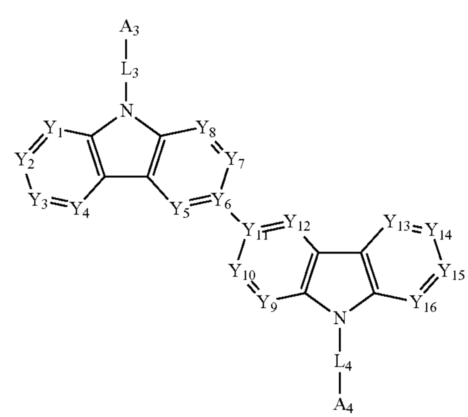

-continued

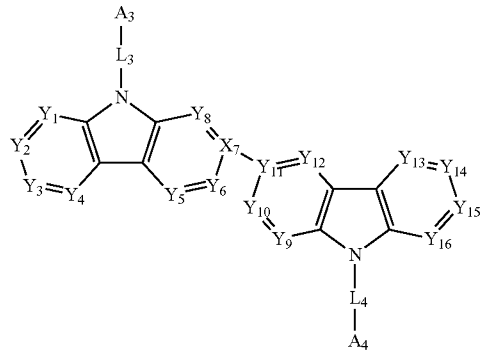

(2-4)

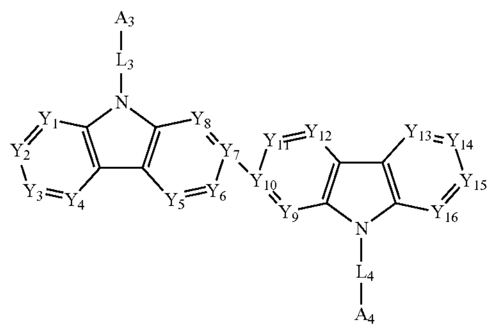

(2-5)

wherein $A_3$, $A_4$, $L_3$, $L_4$, and $Y_1$ to $Y_{16}$ are as defined in formula (2-1).

The aromatic heterocyclic derivative B is more preferably represented by formula (2-3), (2-4), or (2-5).

Examples of the alkyl group for $R_1$ to $R_7$ include a methyl group, an ethyl group, a n-propyl group, an isopropyl group, a n-butyl group, a s-butyl group, an isobutyl group, a t-butyl group, a n-pentyl group, a n-hexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a neopentyl group, a 1-methylpentyl group, 2-methylpentyl group, 1-pentylhexyl group, 1-butylpentyl group, 1-heptyloctyl group, and 3-methylpentyl group, with a methyl group, a t-butyl group, an ethyl group, a n-propyl group, and isopropyl group being preferred.

Examples of the cycloalkyl group for $R_1$ to $R_7$ include a cyclopropyl group, a cyclobutyl group, a cyclopentyl group, a cyclohexyl group, and a cyclooctyl group, with a cyclopentyl group and a cyclohexyl group being preferred.

Examples of the alkoxy group for $R_1$ to $R_7$ include groups represented by —OY, wherein Y is selected from the alkyl group mentioned above, with a methoxy group, an ethoxy group, and a propoxy group being preferred.

Examples of the haloalkyl group for $R_1$ to $R_7$ include groups obtained by replacing at least one hydrogen atom of the alkyl group mentioned above with a halogen atom selected from a fluorine atom, a chlorine atom, an iodine atom, and a bromine atom, with a trifluoromethyl group, a 2,2,2-trifluoroethyl group, a 1,1,2,2,2-pentafluoroethyl group, and a 1,1,1,3,3,3-hexafluoro-2-propyl group being preferred.

Examples of the haloalkoxy group for $R_1$ to $R_7$ include groups represented by —OY', wherein Y' is selected from the haloalkyl group mentioned above, with a trifluoromethoxy group, a 2,2,2-trifluoroethoxy group, a 1,1,2,2,2-pentafluoroethoxy group, and a 1,1,1,3,3,3-hexafluoro-2-propoxy group being preferred.

Examples of the alkylsilyl group for $R_1$ to $R_7$ include groups represented by $—SiH_2R$, $—SiHR_2$, or $—SiR_3$, wherein R is selected from the alkyl group mentioned above and two or three R groups may be the same or different, with a trimethylsilyl group, a triethylsilyl group, and a t-butyldimethylsilyl group being preferred.

Examples of the aryl group for $R_1$ to $R_7$ and $A_1$ to $A_4$ include a phenyl group, a naphthyl group, a biphenyl group, a terphenyl group, a quaterphenyl group, a fluorenyl group, a fluoranthenyl group, a benzofluoranthenyl group, a dibenzofluoranthenyl group, a phenanthrenyl group, a benzophenanthrenyl group, a triphenylenyl group, a benzotriphenylenyl group, a dibenzotriphenylenyl group, a naphthotriphenylenyl group, a chrysenyl group, a benzochrysenyl group, a picenyl group, and a binaphthyl group.

Examples of the arylsilyl group for $R_1$ to $R_7$ include groups represented by $—SiH_2R'$, $—SiHR'_2$, or $—SiR'_3$, wherein R' is selected from the aryl group mentioned above and two or three R' groups may be the same or different, with a triphenylsilyl group being preferred.

Examples of the aralkyl group for $R_1$ to $R_7$ include groups having 7 to 30 carbon atoms which are obtained by replacing one hydrogen atom of the alkyl group mentioned above with the aryl group mentioned above, with a benzyl group and a naphthylmethyl group being preferred.

Examples of the heteroaryl group for $R_1$ to $R_7$ and $A_1$ to $A_4$ include a pyrrolyl group, a furyl group, a thienyl group, a pyridyl group, a pyridazinyl group, a pyrimidinyl group, a pyrazinyl group, a triazinyl group, an imidazolyl group, an oxazolyl group, a thiazolyl group, a pyrazolyl group, an isoxazolyl group, an isothiazolyl group, an oxadiazolyl group, a thiadiazolyl group, a triazolyl group, an indolyl group, an isoindolyl group, a benzofuranyl group, an isobenzofuranyl group, a benzothiophenyl group, an indolizinyl group, a quinolizinyl group, a quinolyl group, an isoquinolyl group, a cinnolyl group, a phthalazinyl group, a quinazolinyl group, a quinoxalinyl group, a benzimidazolyl group, a benzoxazolyl group, a benzothiazolyl group, an indazolyl group, a benzisoxazolyl group, a benzisothiazolyl group, a carbazolyl group, a dibenzofuranyl group, a dibenzothiophenyl group, a phenanthridinyl group, an acridinyl group, a phenanthrolinyl group, a phenazinyl group, a phenothiazinyl group, a phenoxazinyl group, and a xanthenyl group.

The heteroaryl group for $A_1$ and $A_2$ is preferably a pyrrolyl group, a furyl group, a thienyl group, an indolyl group, an isoindolyl group, a benzofuranyl group, an isobenzofuranyl group, a benzothiophenyl group, an indolizinyl group, a carbazolyl group, a dibenzofuranyl group, a dibenzothiophenyl group, a dihydroacridinyl group, a phenothiazinyl group, a phenoxazinyl group, or a xanthenyl group.

Examples of the arylene group for $L_1$ to $L_4$ include a phenylene group, a naphthylene group, a biphenylylene group, a terphenylylene group, a quaterphenylylene group, a fluorenediyl group, a fluoranthenediyl group, a benzofluoranthenediyl group, dibenzofluoranthenediyl group, a phenanthrenediyl group, a benzophenanthrenediyl group, a triphenylenediyl group, a benzotriphenylenediyl group, a dibenzotriphenylenediyl group, a naphthotriphenylenediyl group, a chrysenylene group, a benzochrysenylene group, a picenylene group, and a binaphthylylene group.

Examples of the heteroarylene group for $L_1$ to $L_4$ include a pyrrolediyl group, a furylene group, a thienylene group, a pyridinylene group, a pyridazinylene group, a pyrimidinylene group, a pyrazinylene group, a triazinylene group, an imidazolylene group, an oxazolylene group, a thiazolylene group, a pyrazolylene group, an isoxazolylene group, an isothiazolylene group, an oxadiazolylene group, a thiadiazolylene group, a triazolylene group, an indolylene group, an isoindolylene group, a benzofuranylene group, an isobenzofuranylene group, a benzothiophenylene group, an indolizinylene group, a quinolizinylene group, a quinolylene group, an isoquinolylene group, a cinnolylene group, a phthalazinylene group, a quinazolinylene group, a quinoxalinylene group, a benzimidazolylene group, a benzoxazolylene group, a benzothiazolylene group, an indazolylene group, a benzisoxazolylene group, a benzisothiazolylene group, a carbazolylene group, a dibenzofuranylene group, a dibenzothiophenylene group, a phenanthridinylene group, an acridinylene group, a phenanthrolinylene group, a phenazinylene group, a phenothiazinylene group, a phenoxazinylene group, and a xanthenylene group.

The heteroarylene group for $L_1$ and $L_2$ is preferably a pyrrolediyl group, a furylene group, a thienylene group, an indolylene group, an isoindolylene group, a benzofuranylene group, an isobenzofuranylene group, a benzothiophenylene group, an indolizinylene group, a carbazolylene group, a dibenzofuranylene group, a dibenzothiophenylene group, a dihydroacridinylene group, a phenothiazinylene group, a phenoxazinylene group, or a xanthenylene group.

The adjacent groups of $R_1$ to $R_7$ may be bonded to each other to form a divalent group, such as a butane-1,4-diyl group and a 1,3-butadiene-1,4-diyl group, thereby forming a ring together with the ring atoms.

Examples of the optional substituent when saying "substituted or unsubstituted" hereinbefore and hereinafter include a fluorine atom, a cyano group, an alkyl group having 1 to 20 carbon atoms, a cycloalkyl group having 3 to 20 carbon atoms, an alkoxy group having 1 to 20 carbon atoms, a haloalkyl group having 1 to 20 carbon atoms, a haloalkoxy group having 1 to 20 carbon atoms, an alkylsilyl group having 1 to 10 carbon atoms, an aryl group having 6 to 30 ring carbon atoms, an aryloxy group having 6 to 30 ring carbon atoms, an arylsilyl group having 6 to 30 carbon atoms, an aralkyl group having 7 to 30 carbon atoms, and a heteroaryl group having 5 to 30 ring atoms. Examples of these optional substituents are selected from corresponding groups mentioned above. The optional substituent may be two or more, and two or more optional substituents may be the same or different.

Particularly, the heteroaryl group as the optional substituent for $A_1$, $A_2$, $L_1$, and $L_2$ is preferably a pyrrolyl group, a furyl group, a thienyl group, an indolyl group, an isoindolyl group, a benzofuranyl group, an isobenzofuranyl group, a benzothiophenyl group, an indolizinyl group, a carbazolyl group, a dibenzofuranyl group, a dibenzothiophenyl group, a dihydroacridinyl group, a phenothiazinyl group, a phenoxazinyl group, or a xanthenyl group.

In a preferred embodiment, the aromatic heterocyclic derivative A is represented by formula (1-3) and the aromatic heterocyclic derivative B is represented by formula (2-3).

In another preferred embodiment, the aromatic heterocyclic derivative A is represented by formula (1-3) and the aromatic heterocyclic derivative B is represented by formula (2-4) or (2-5).

The aromatic heterocyclic derivative A represented by formula (1-1) and the aromatic heterocyclic derivative B represented by formula (2-1), for example, a 3,3'-biscarbazole derivative, can be produced according to the following synthesis route.

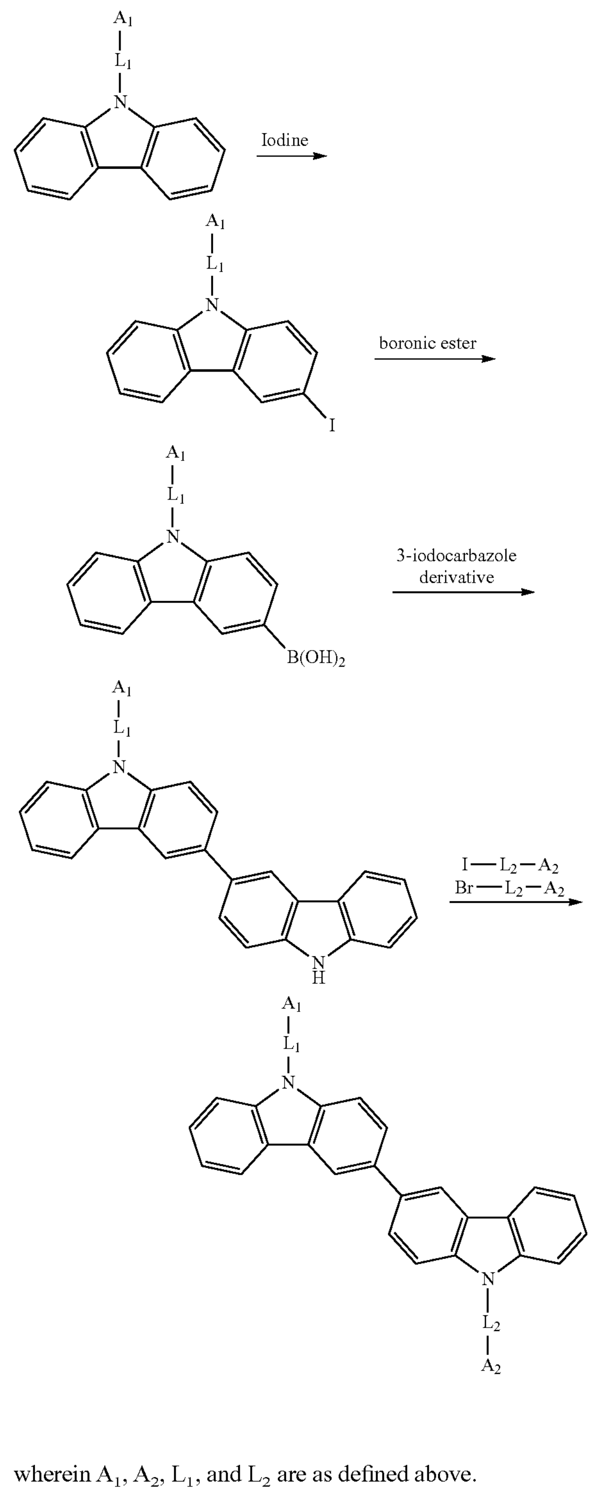

wherein $A_1$, $A_2$, $L_1$, and $L_2$ are as defined above.

Each elementary reaction is a known process. Therefore, one of ordinary skill in the art can easily select the conditions for each elementary reaction to easily synthesize other aromatic heterocyclic derivatives A and aromatic heterocyclic derivatives B.

Examples of the aromatic heterocyclic derivative A represented by formula (1-1) and the aromatic heterocyclic derivative B represented by formula (2-1) are shown below, although not limited to the following compounds.

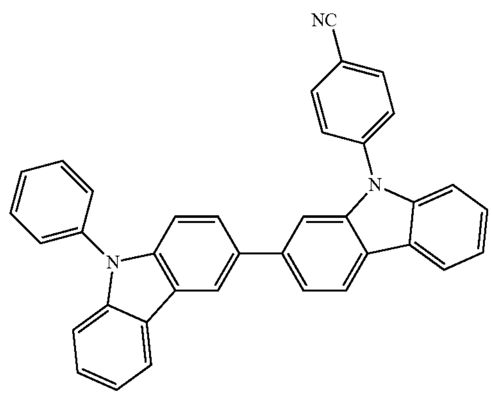
NC
N
N
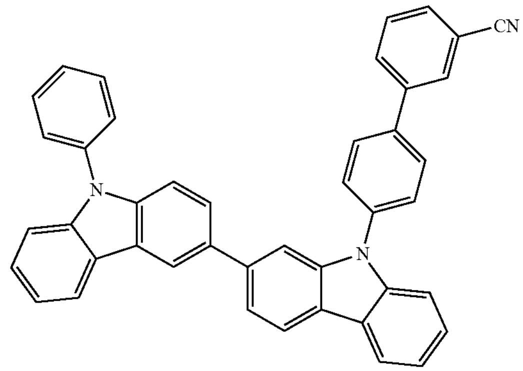
CN
N
N
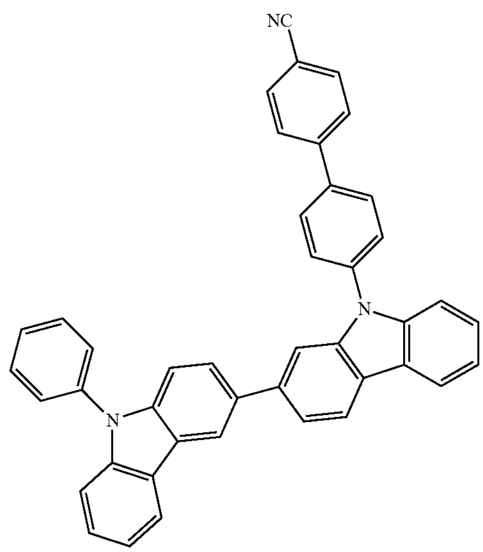
NC
N
N
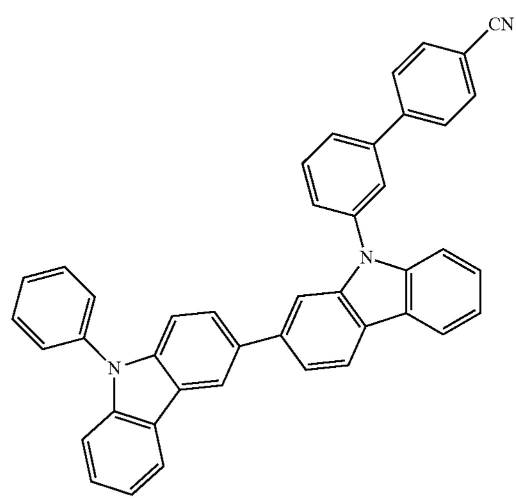
CN
N
N
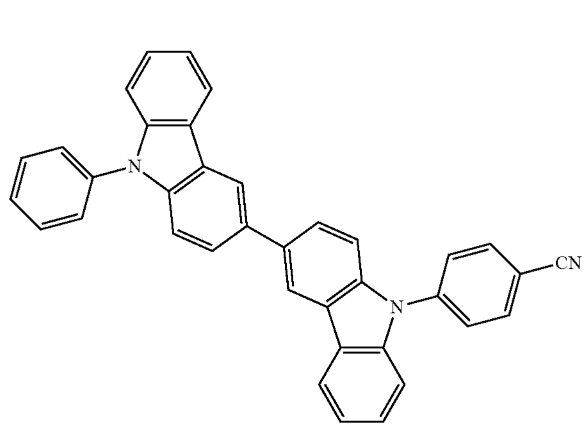
N
N
CN
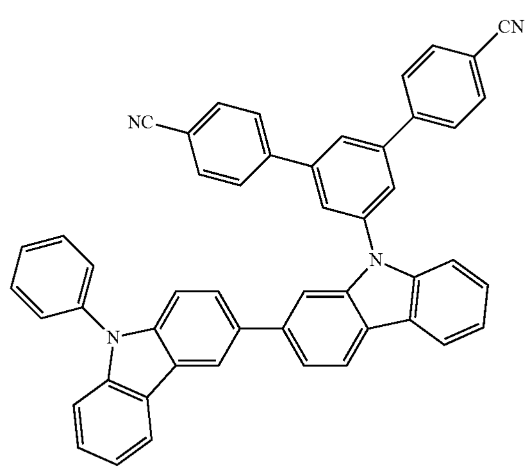
CN
NC
N
N -continued
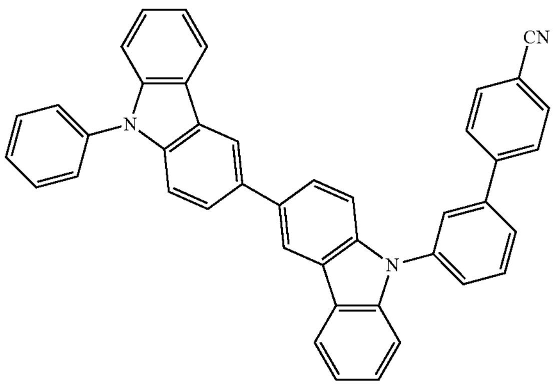
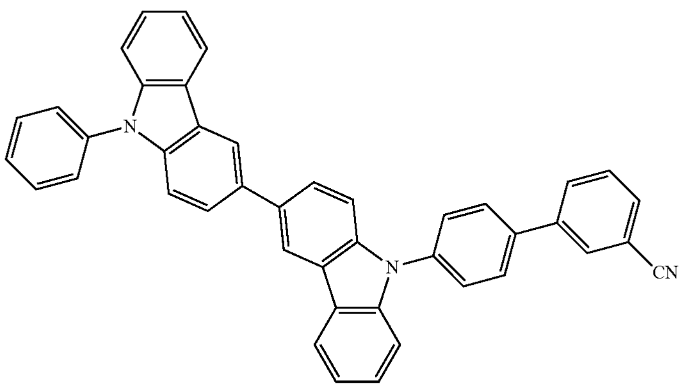
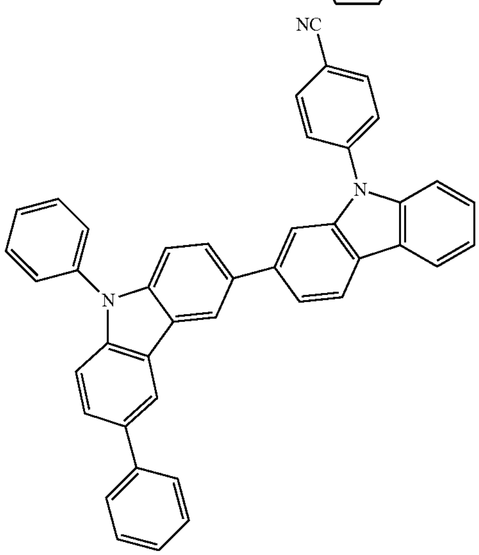
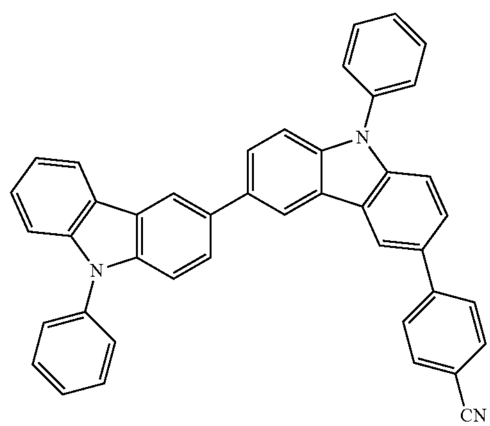
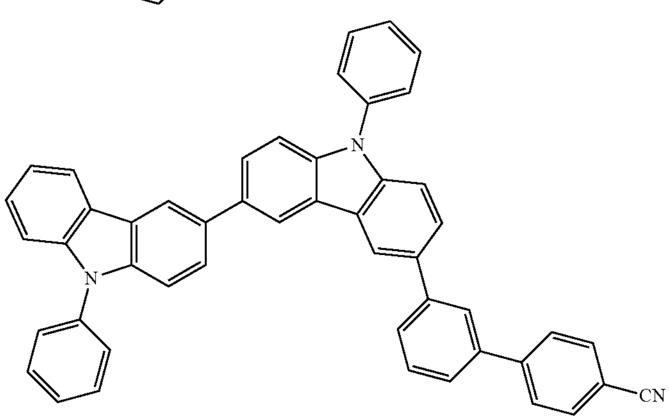

-continued
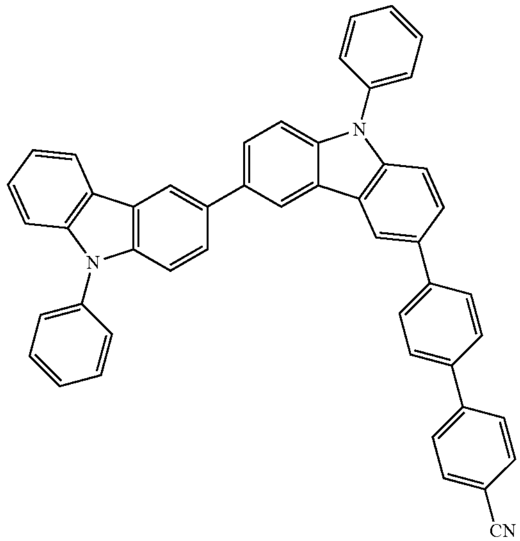
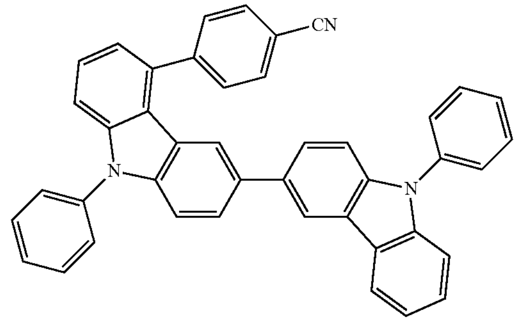
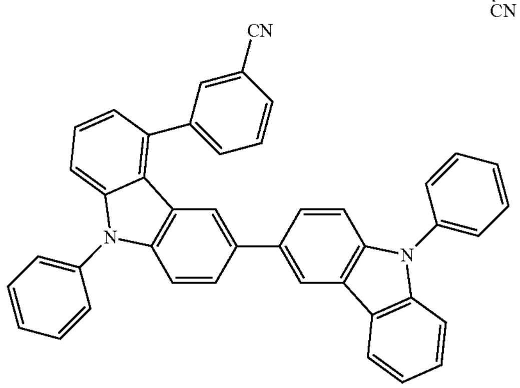
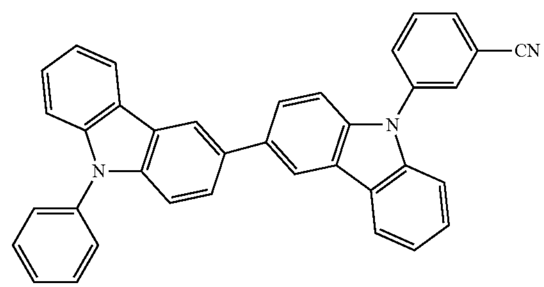
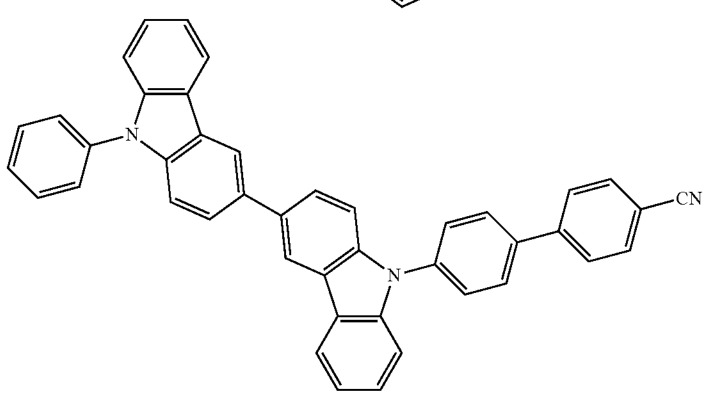
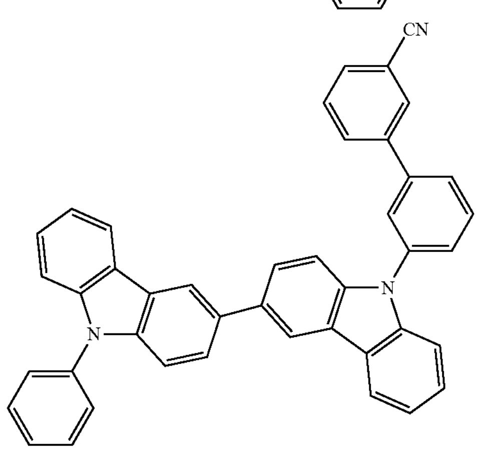
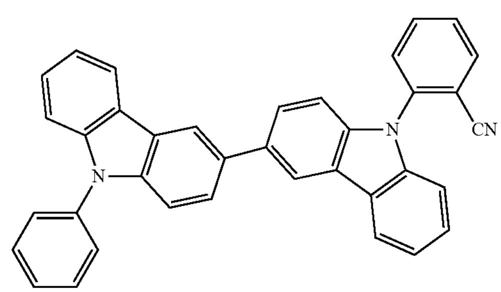

-continued
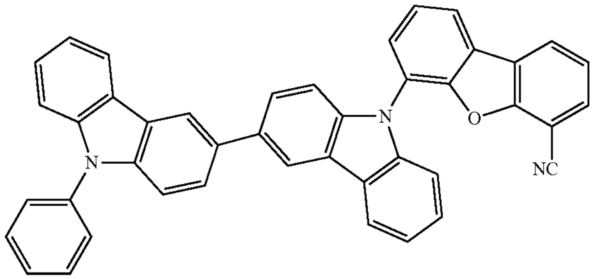
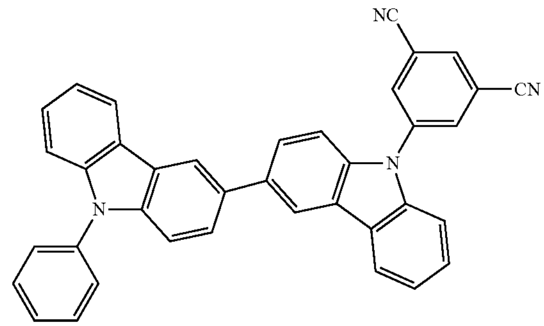
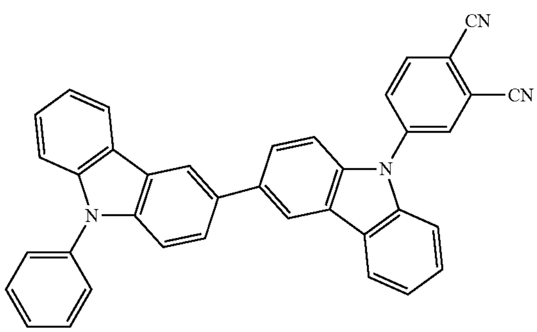
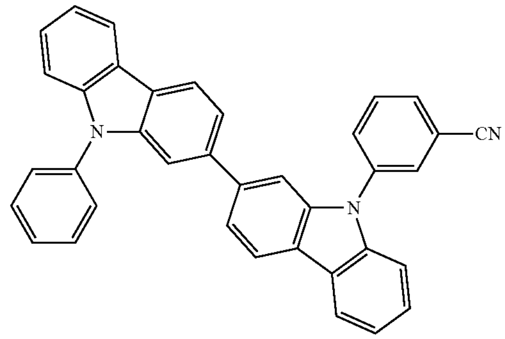
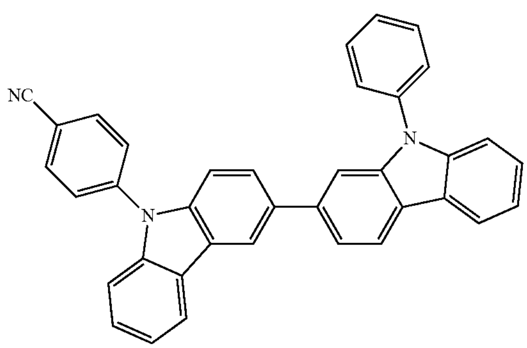
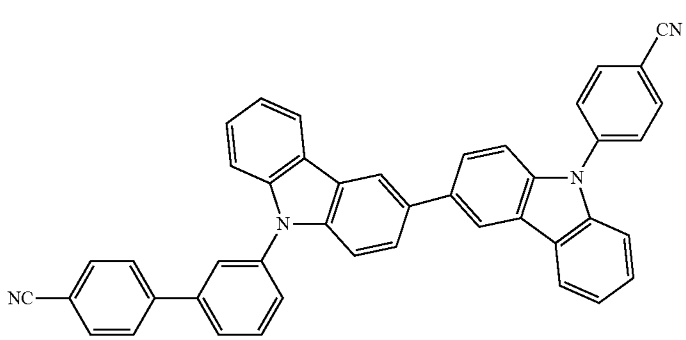

-continued
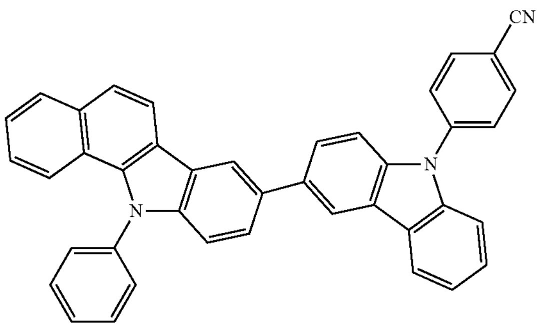
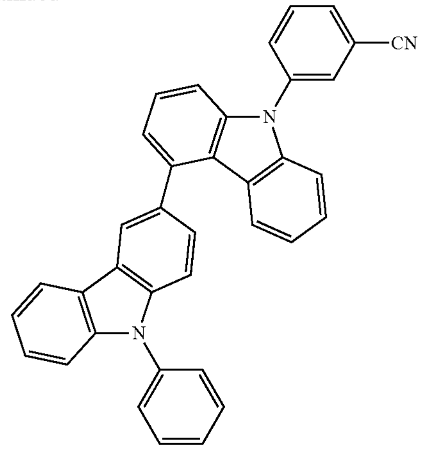
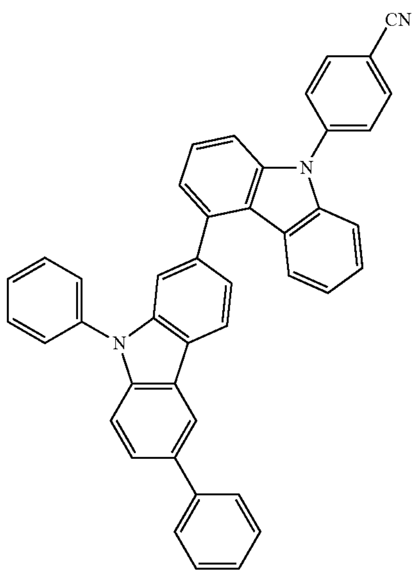
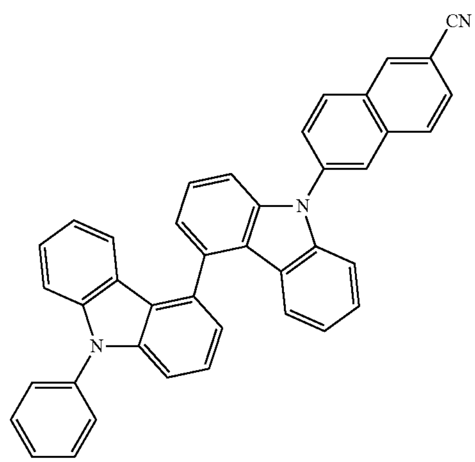
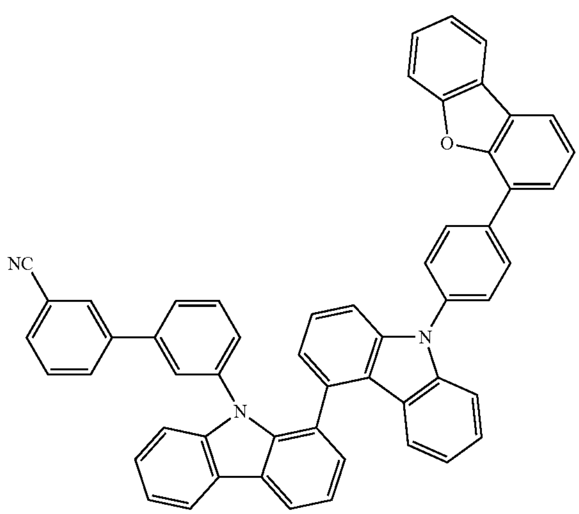

-continued
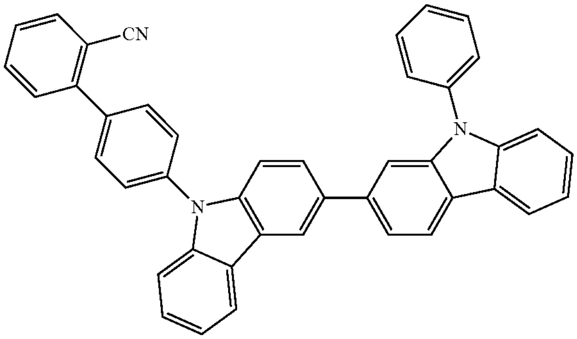
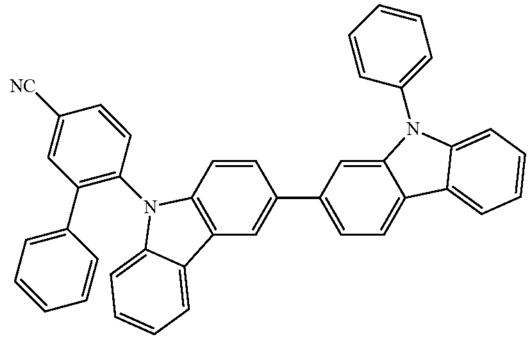
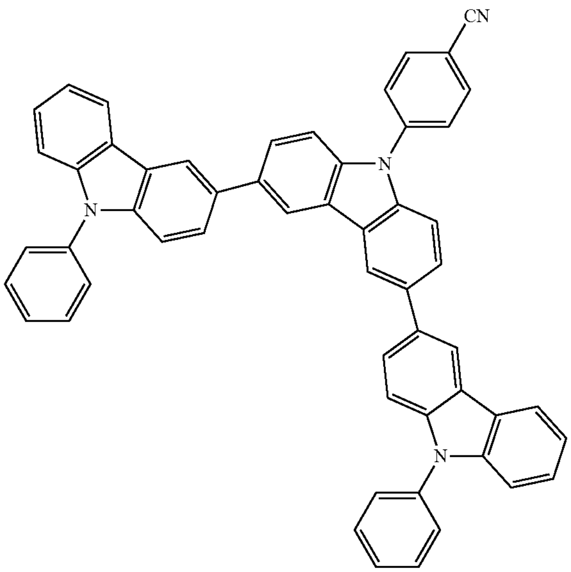
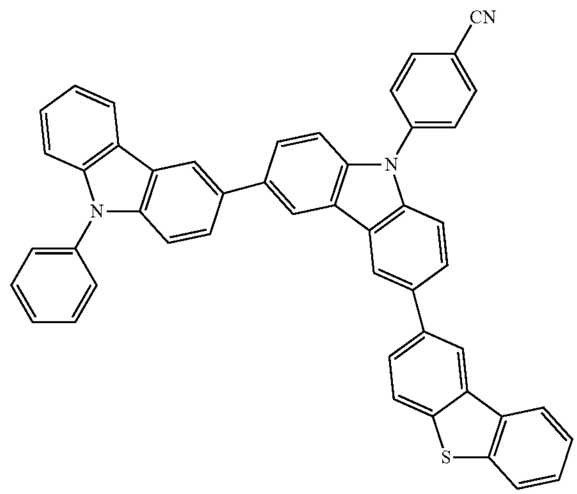
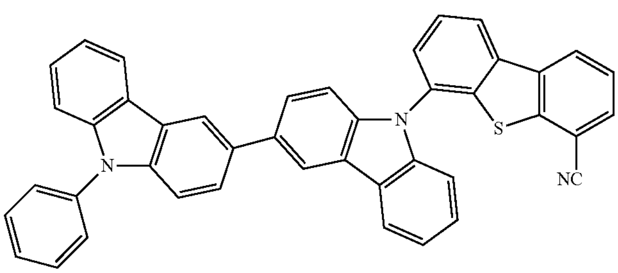
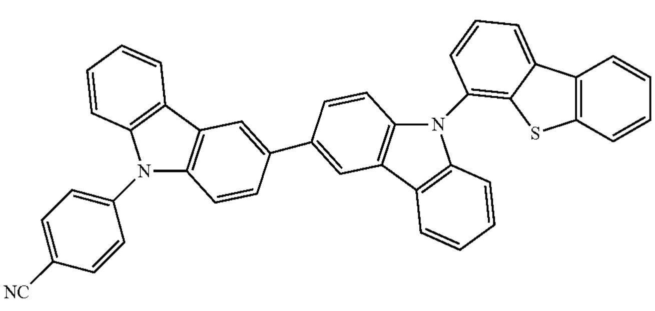

-continued
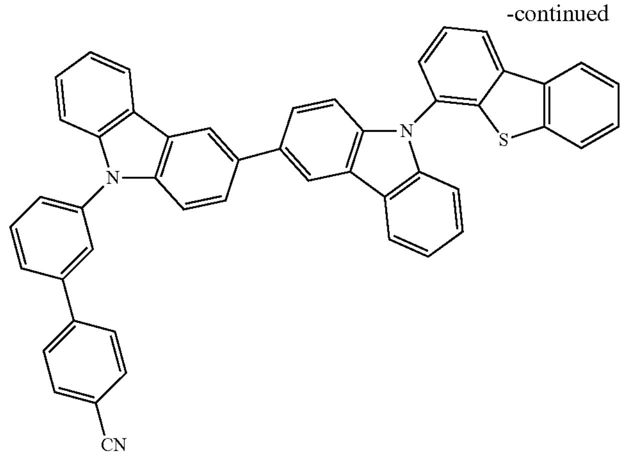
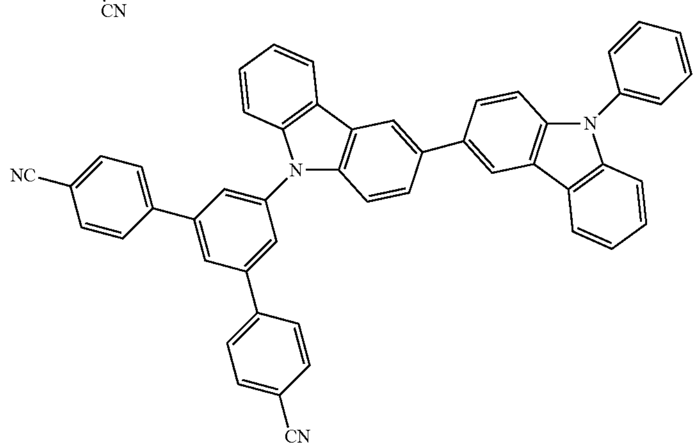
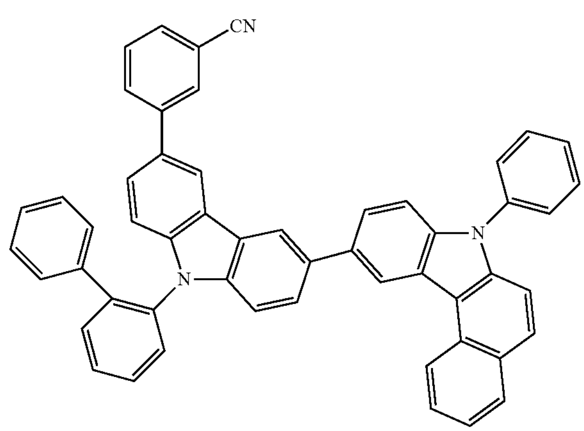
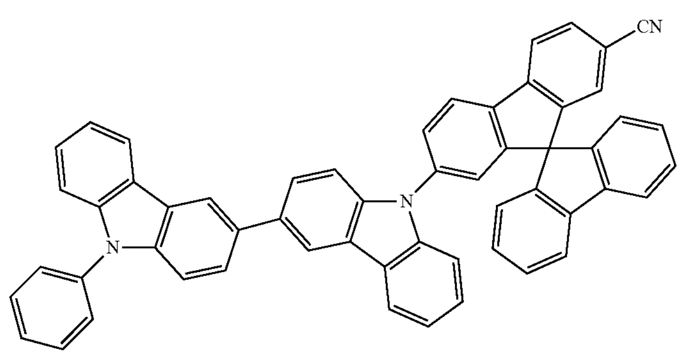

-continued
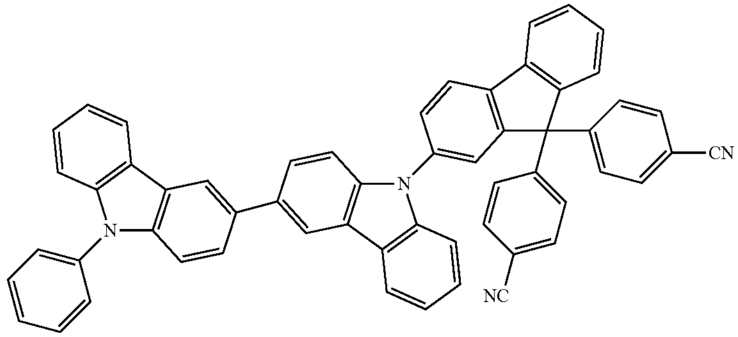
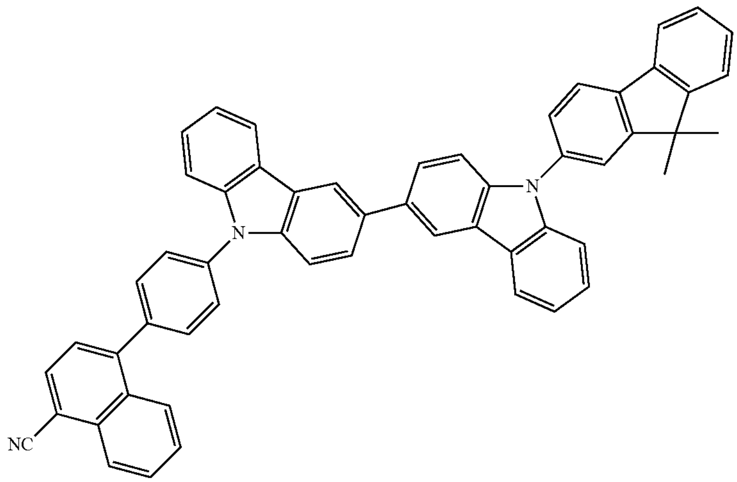
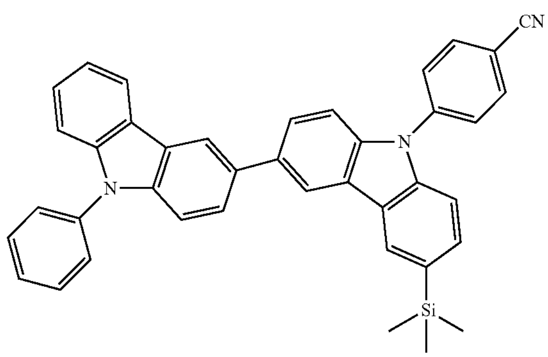
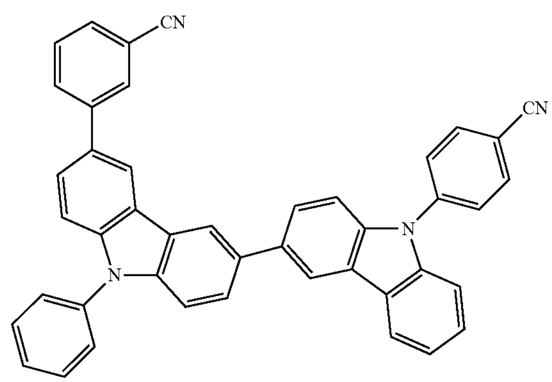
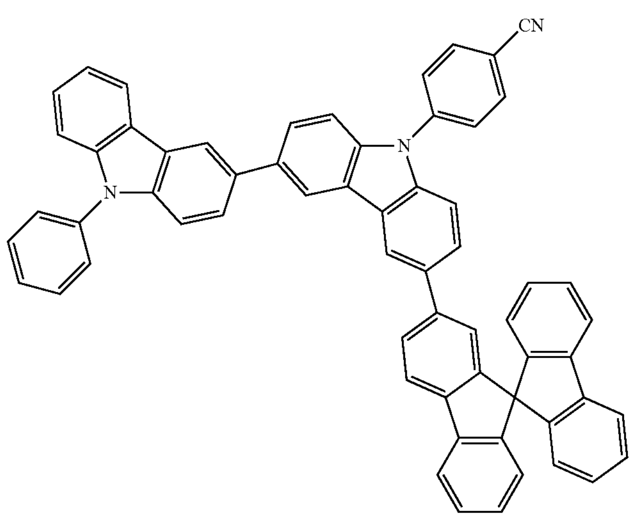

-continued
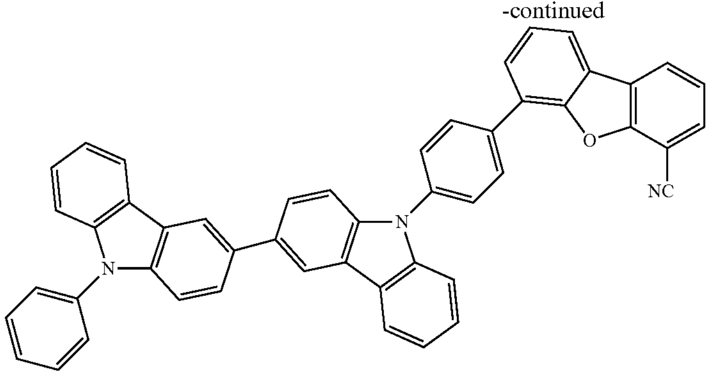
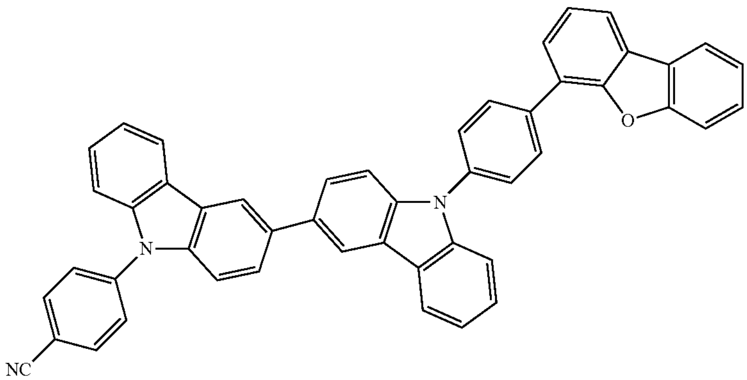
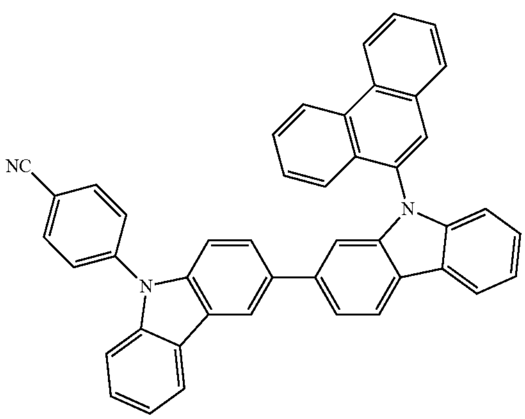
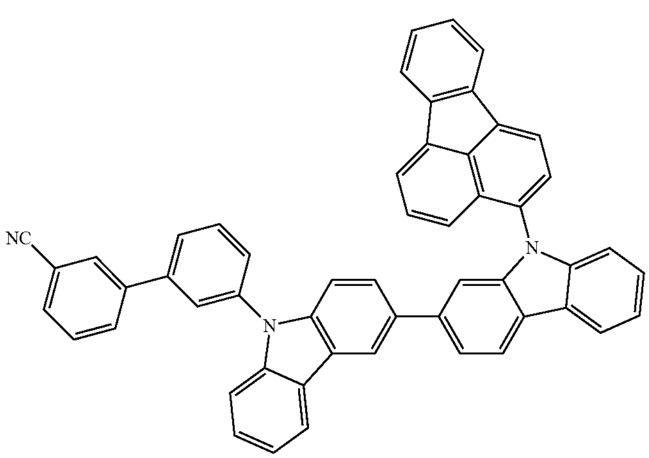

-continued
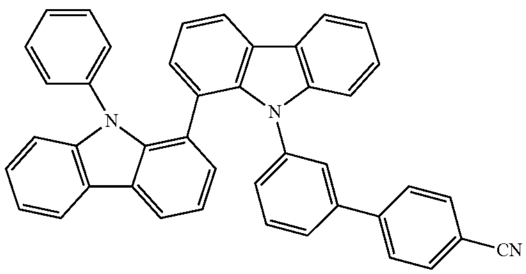
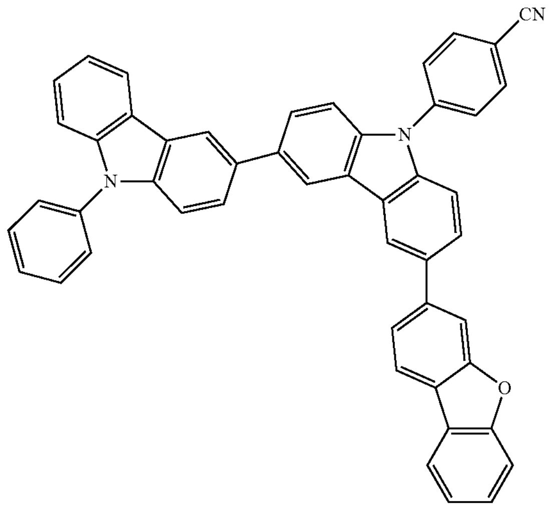
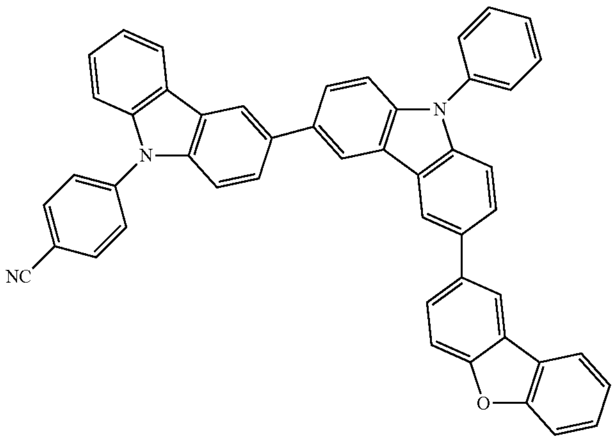
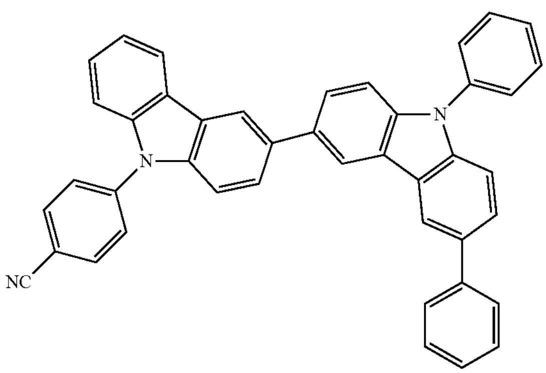
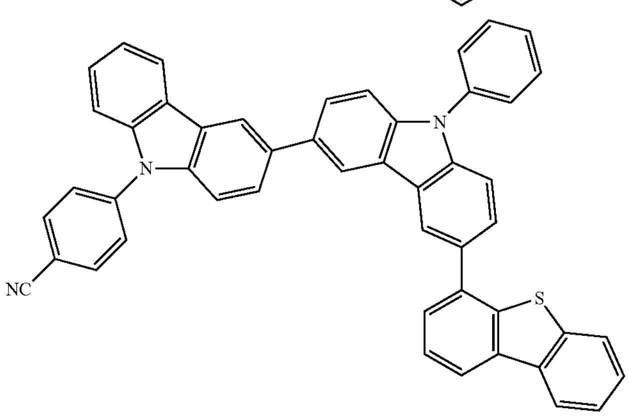

-continued
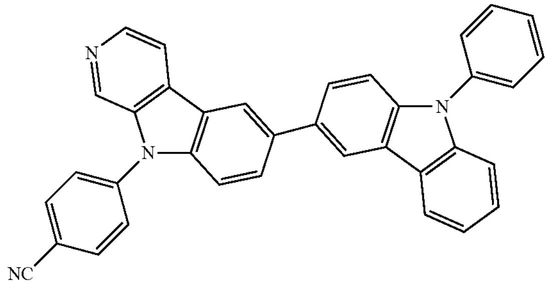
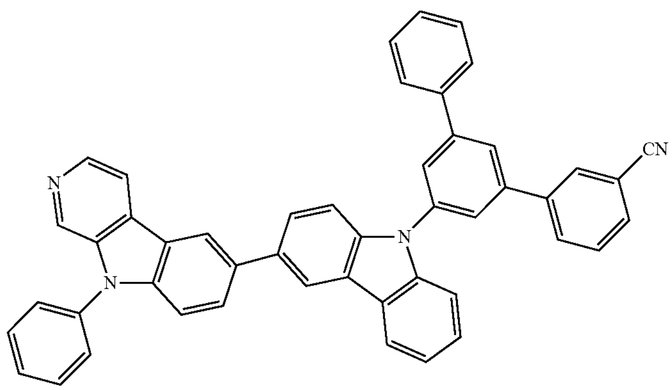
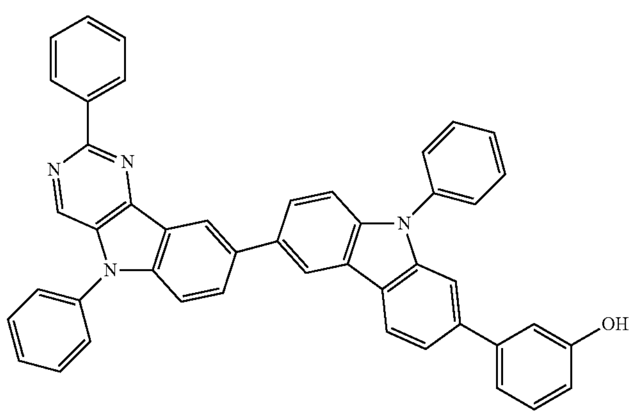
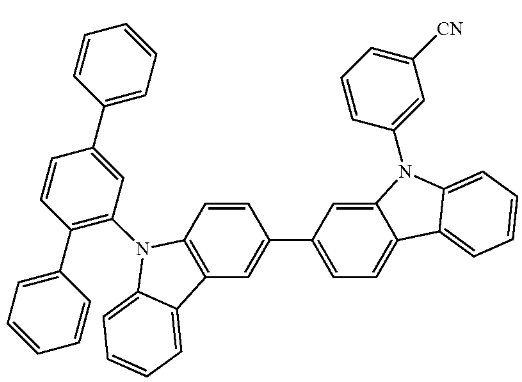
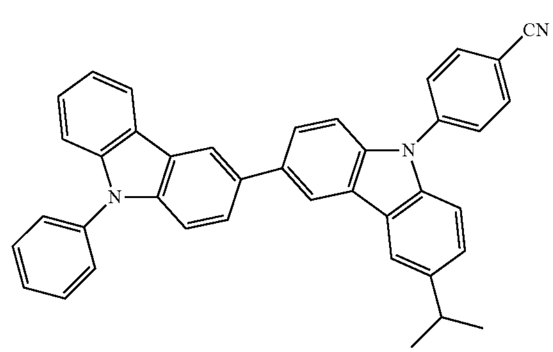

-continued
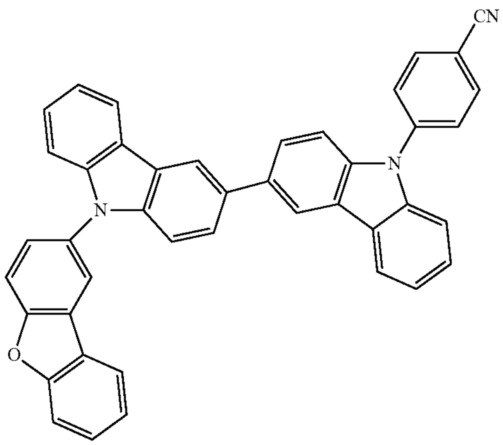
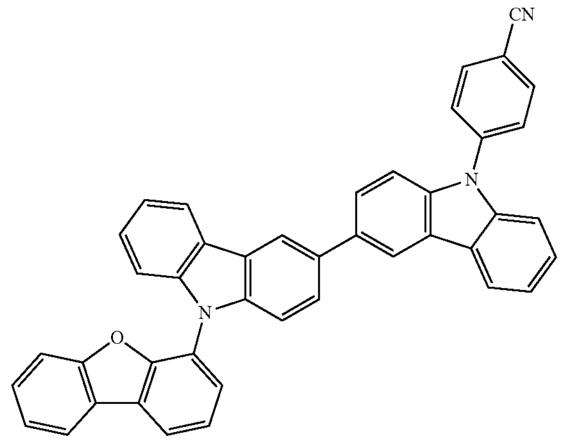
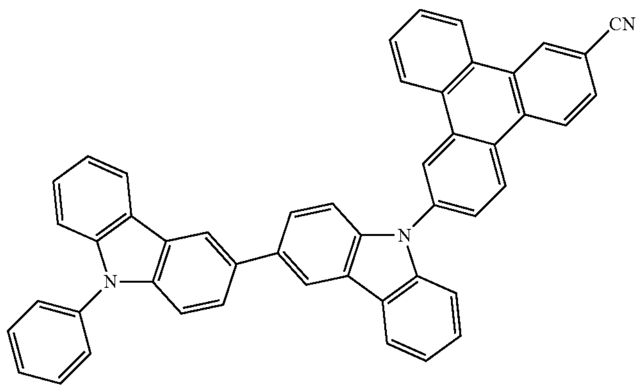
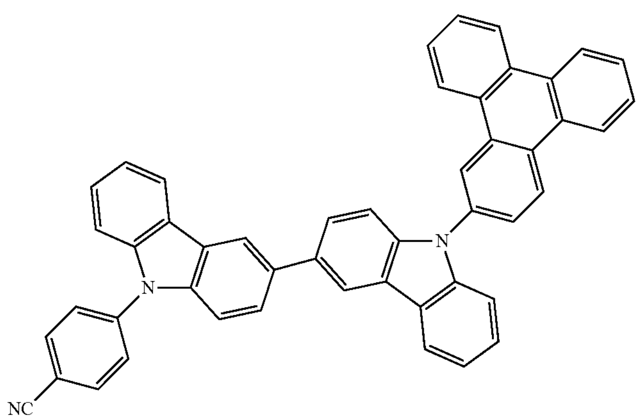
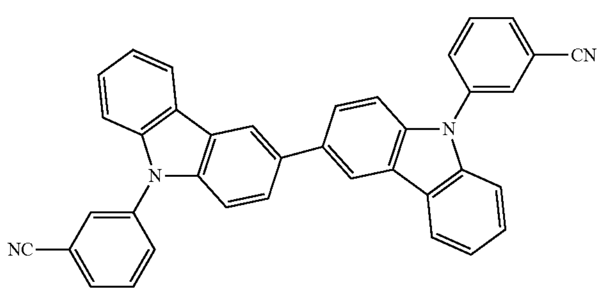

-continued
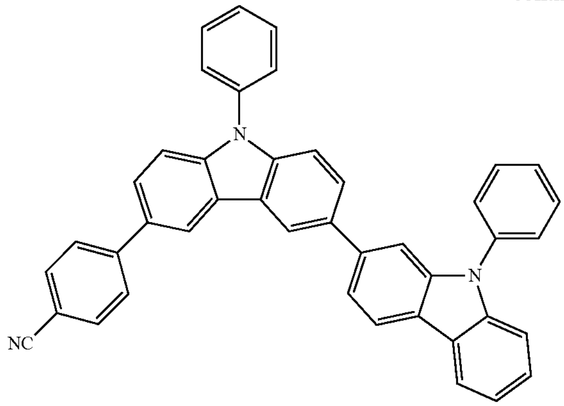
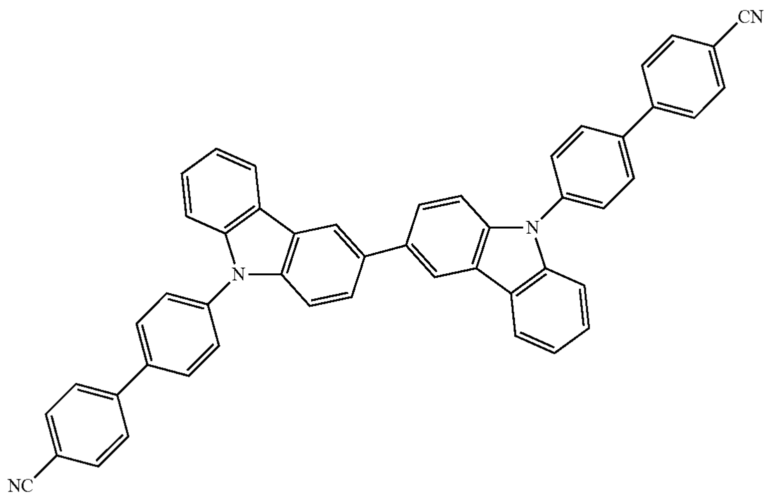
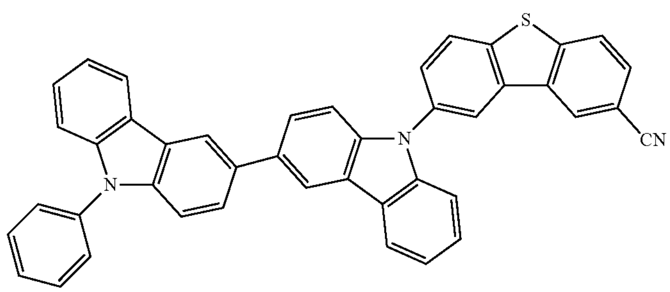
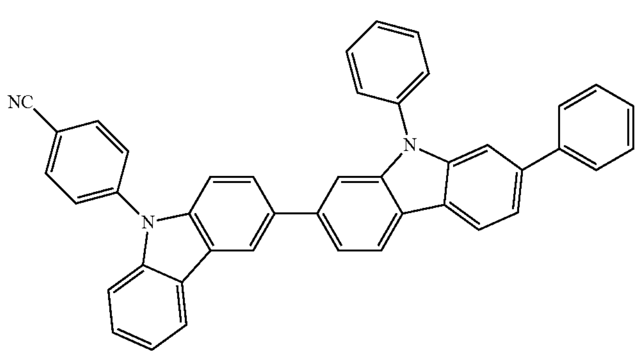

-continued
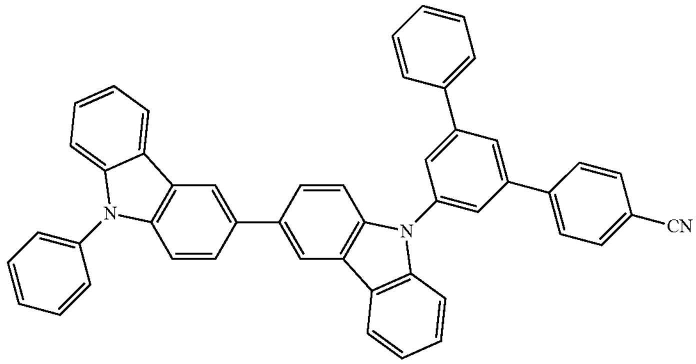
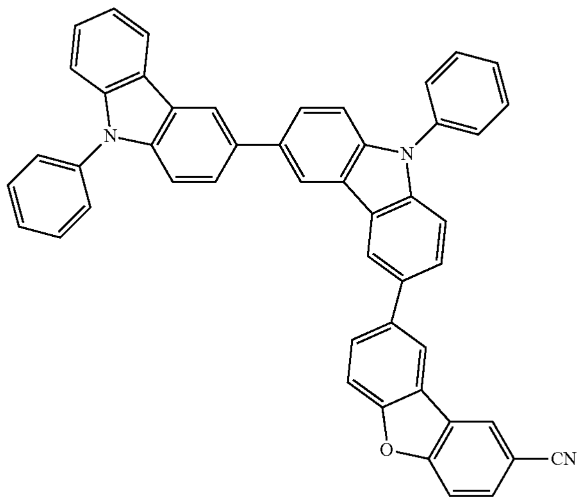
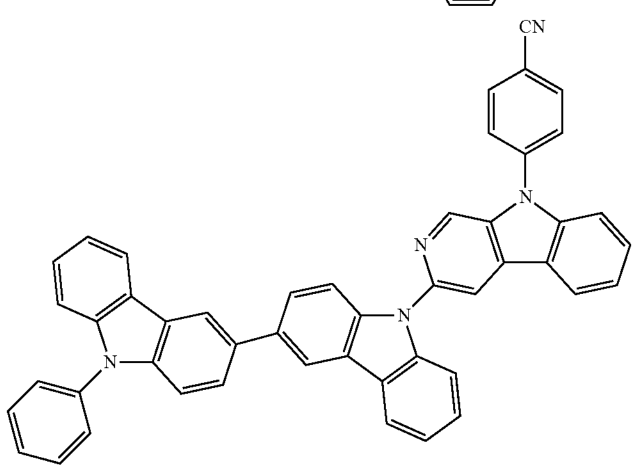
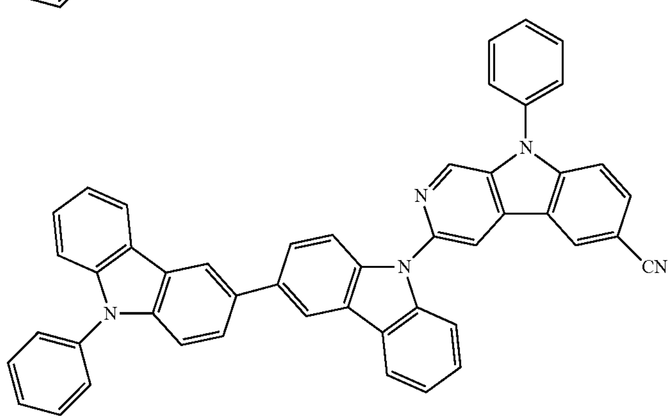

-continued
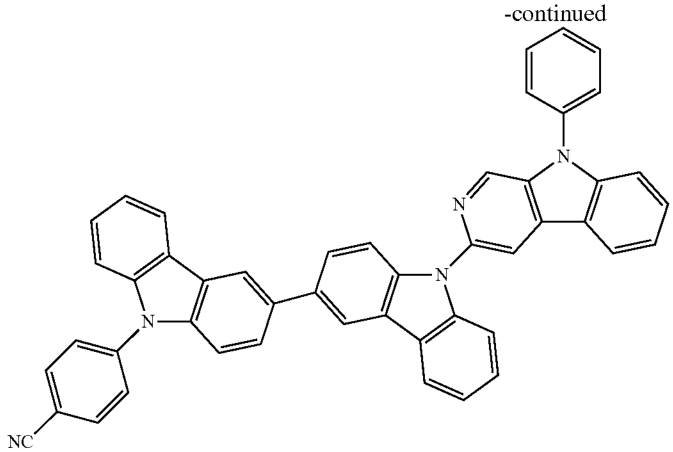
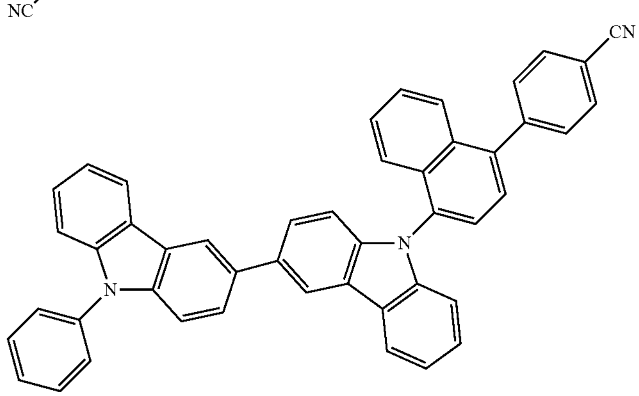
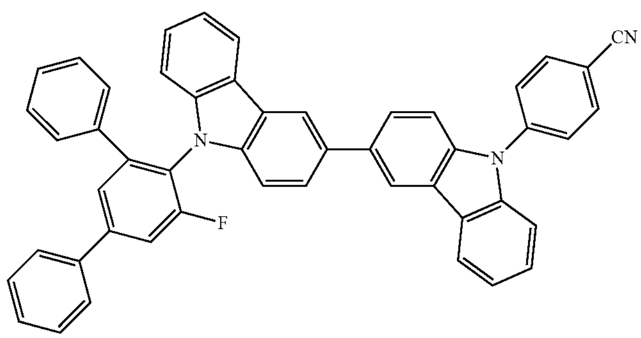
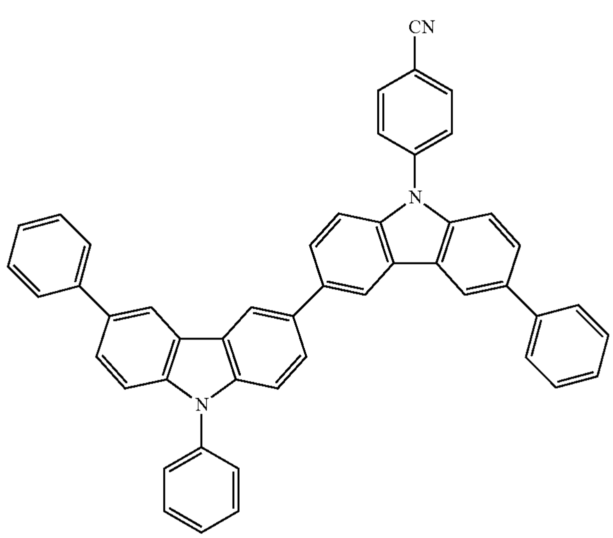

-continued
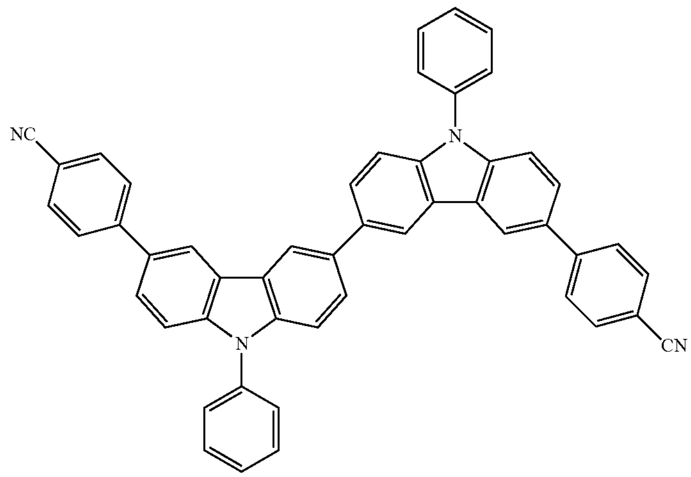
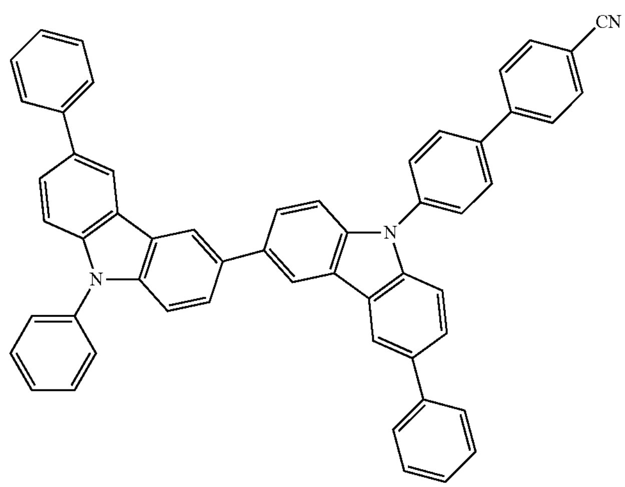
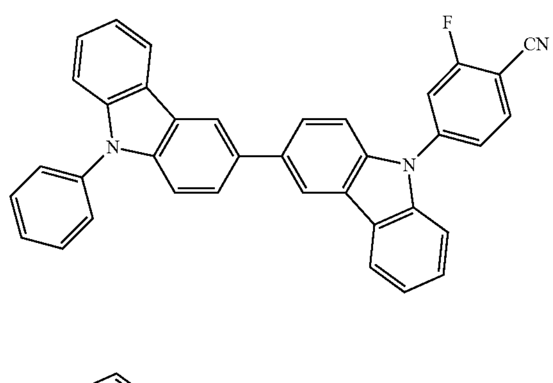
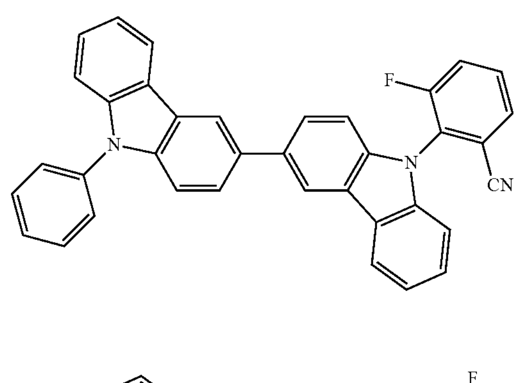
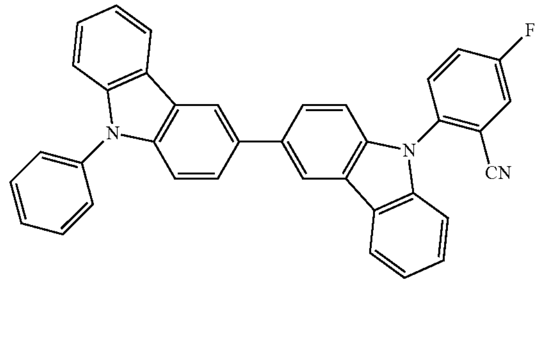
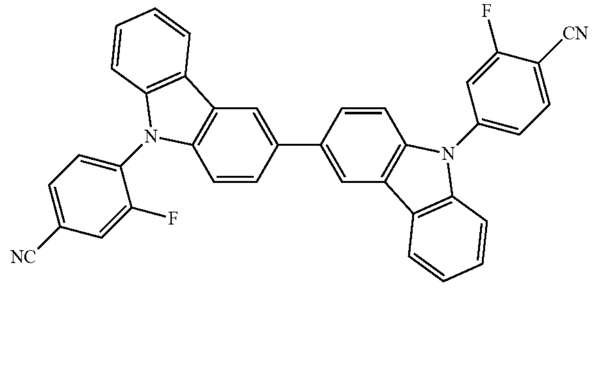

-continued
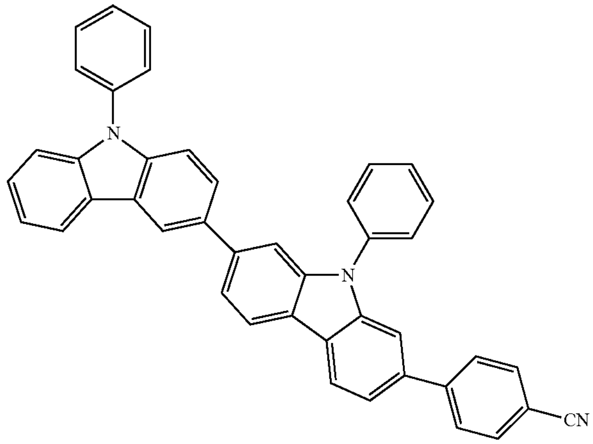
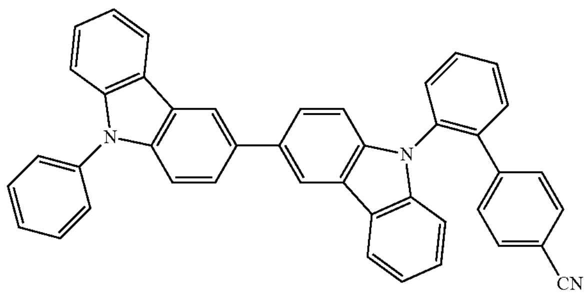
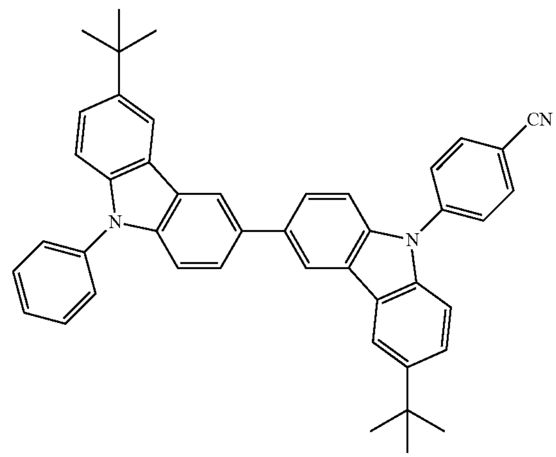
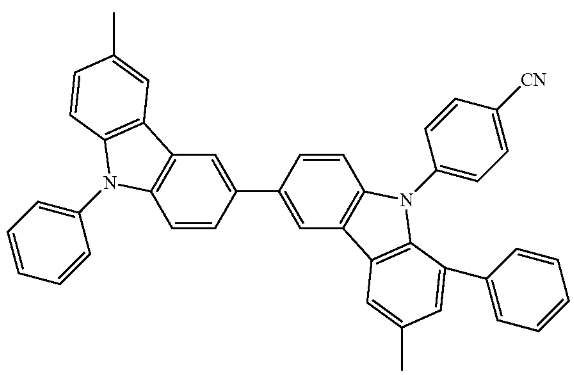
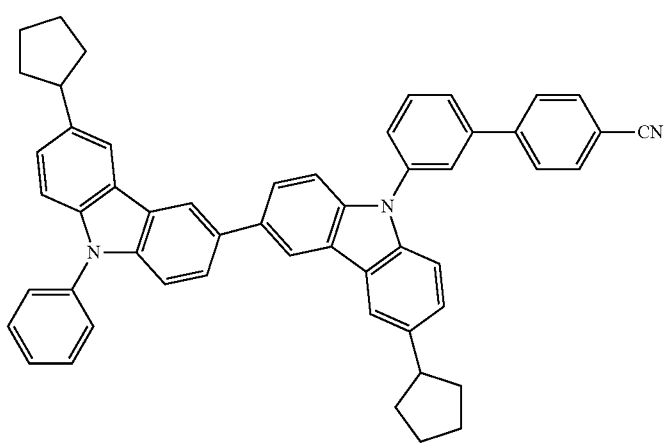

-continued
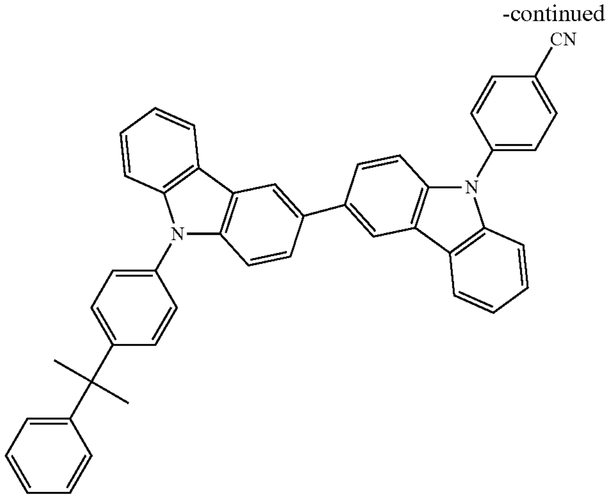
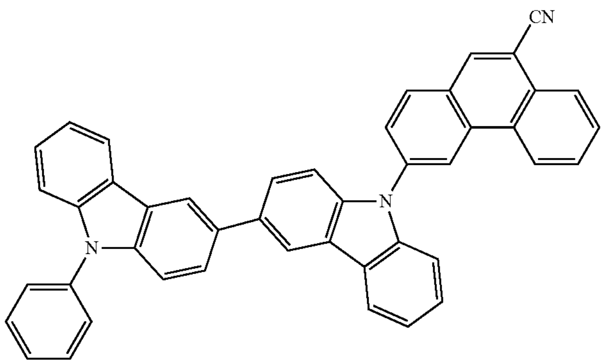
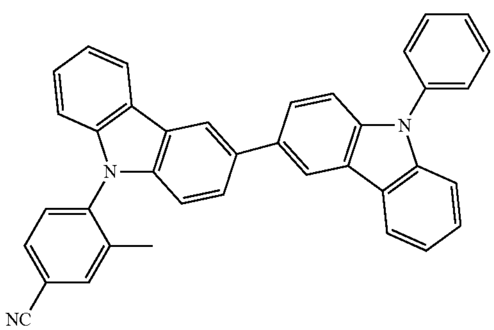
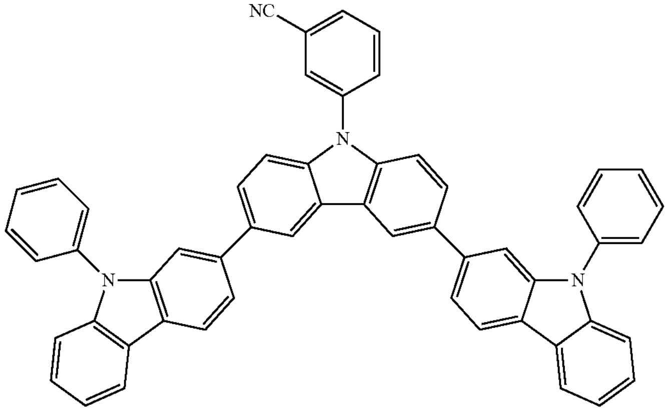

-continued
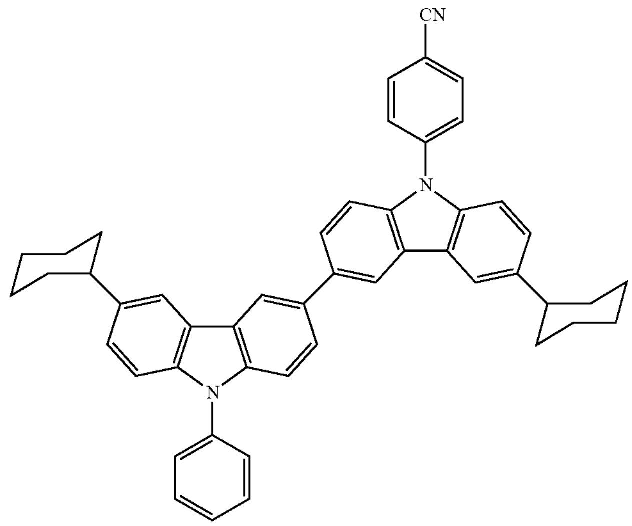
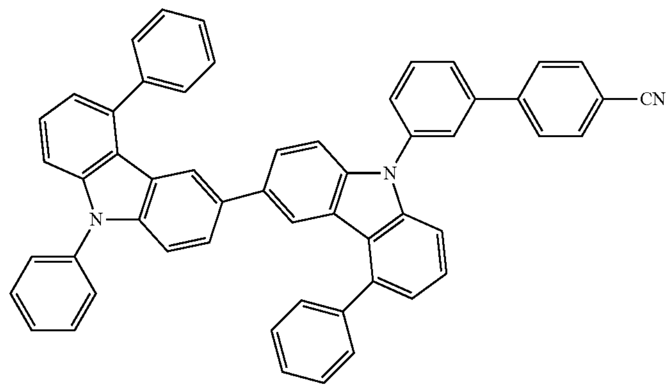
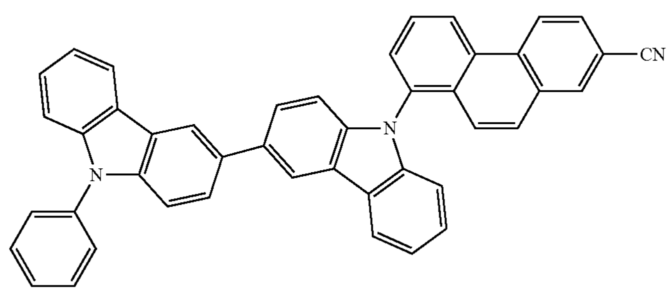
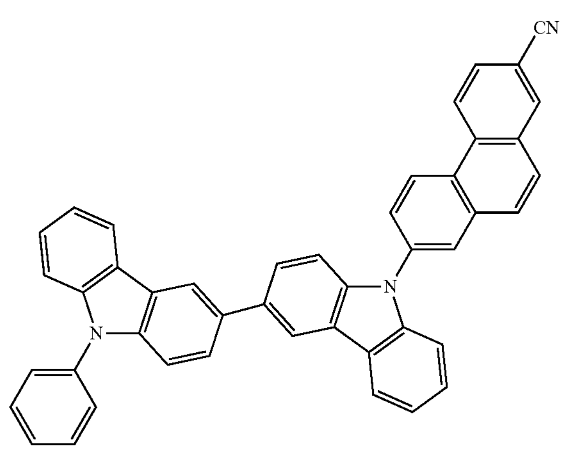
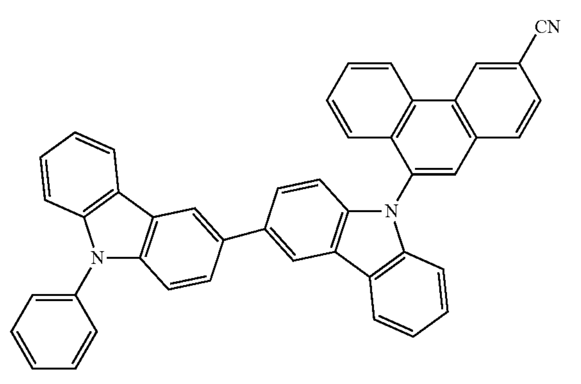

-continued
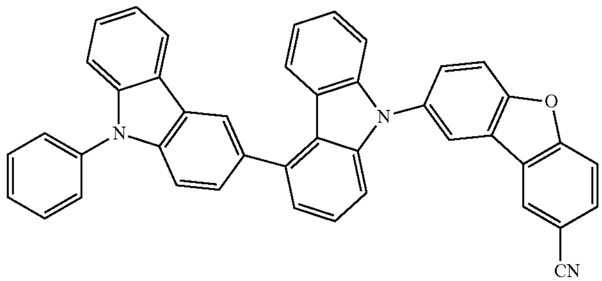
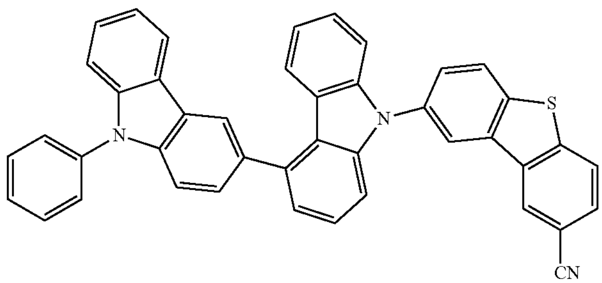
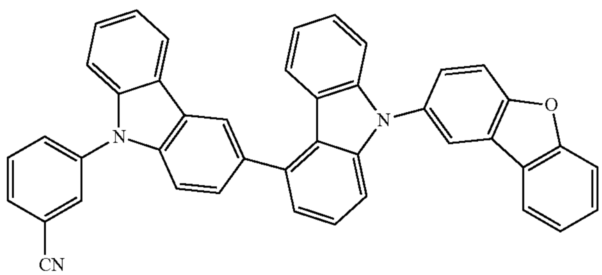
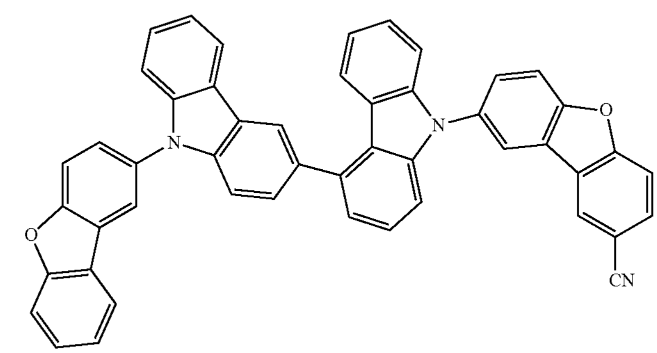
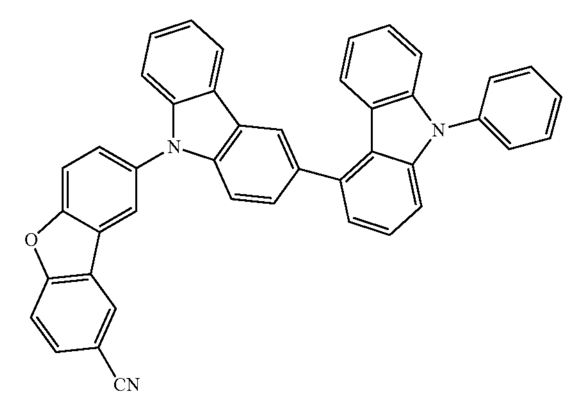

-continued
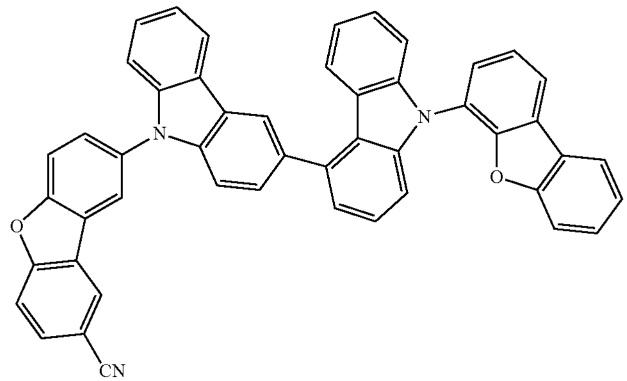
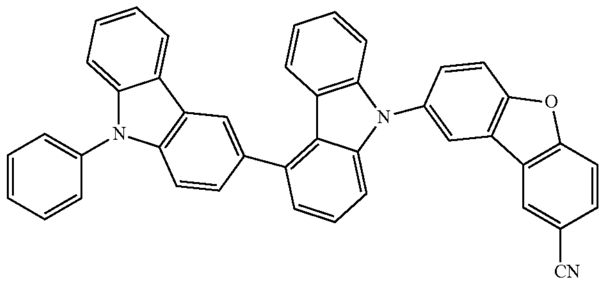
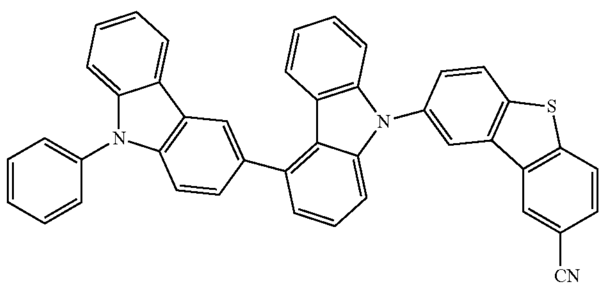
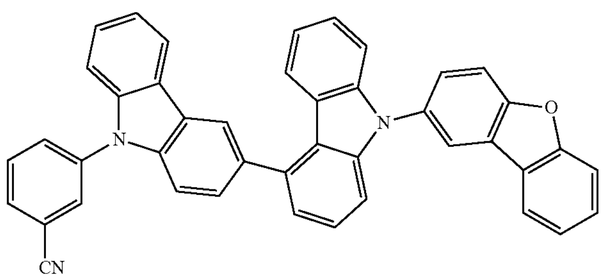
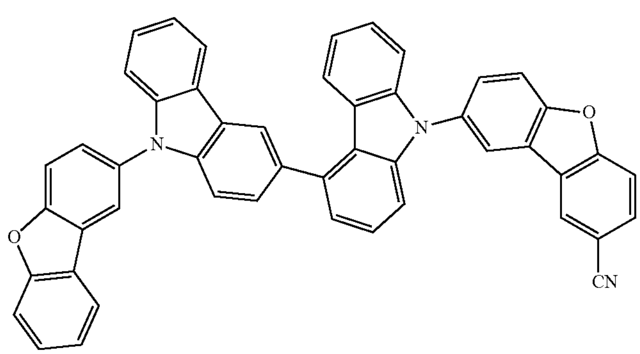

-continued
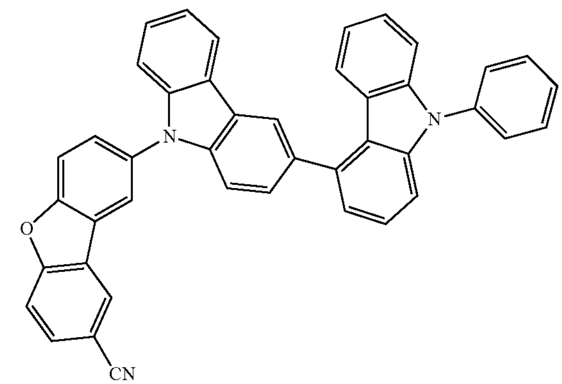
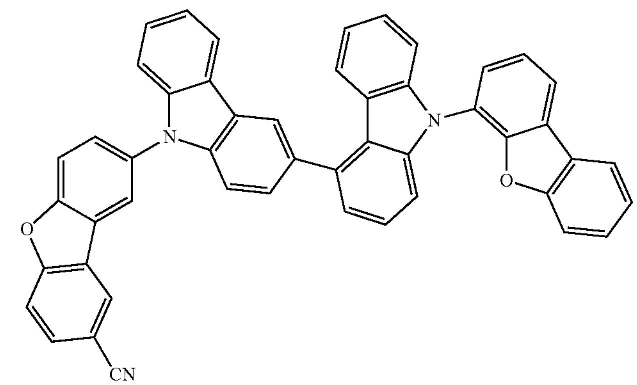
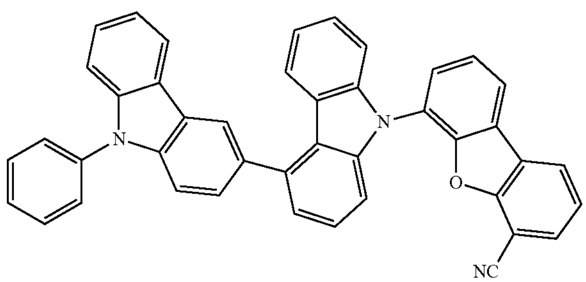
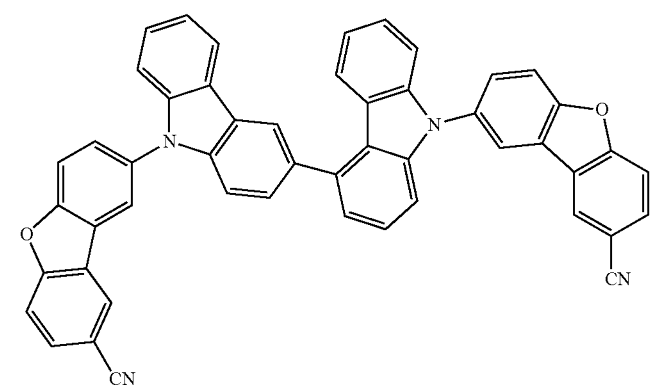
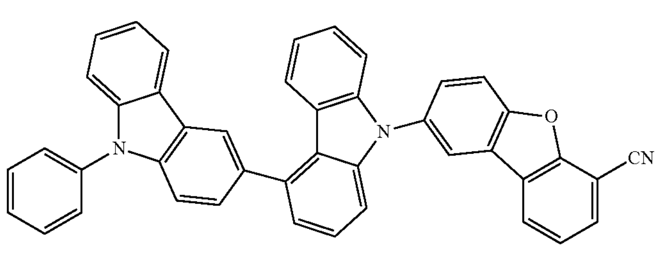

-continued
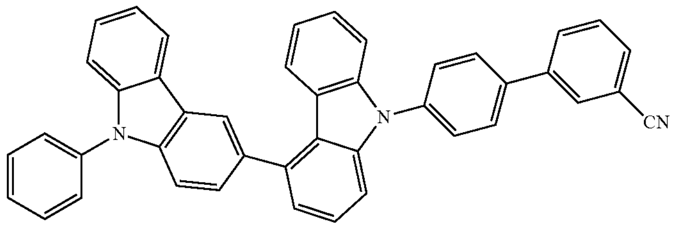
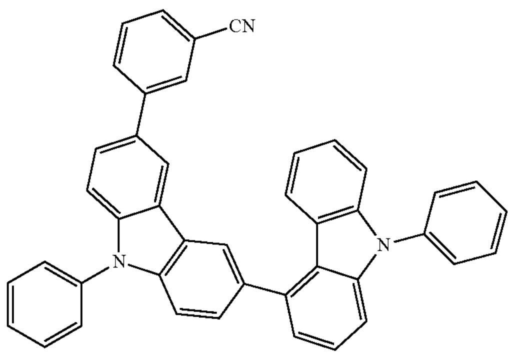
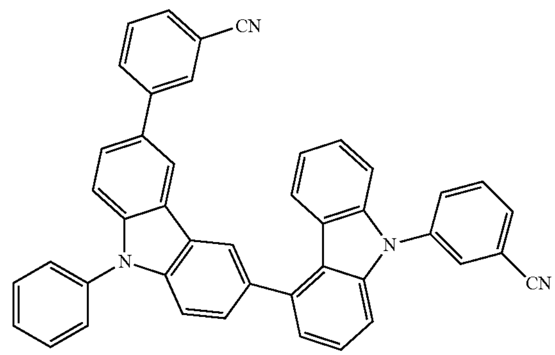
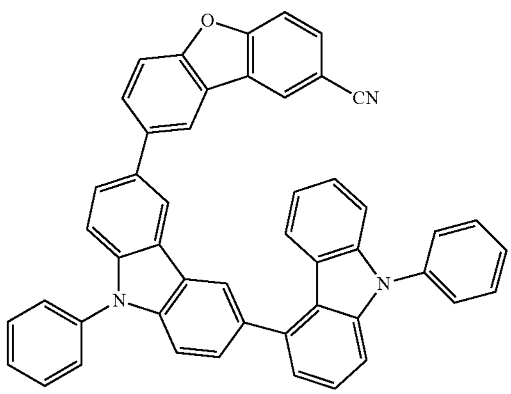
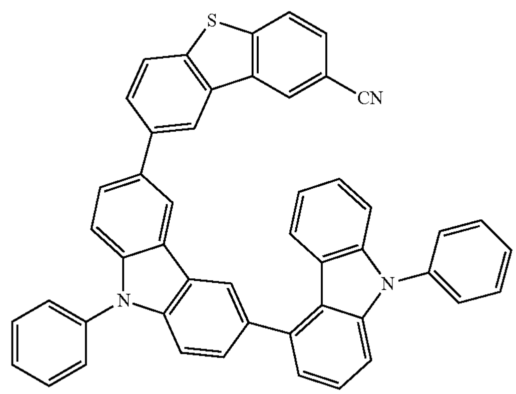
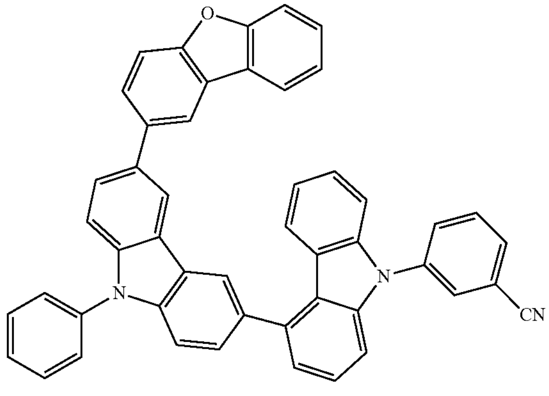

-continued
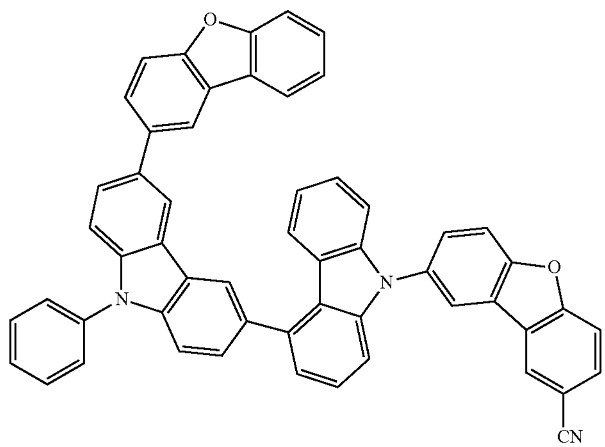
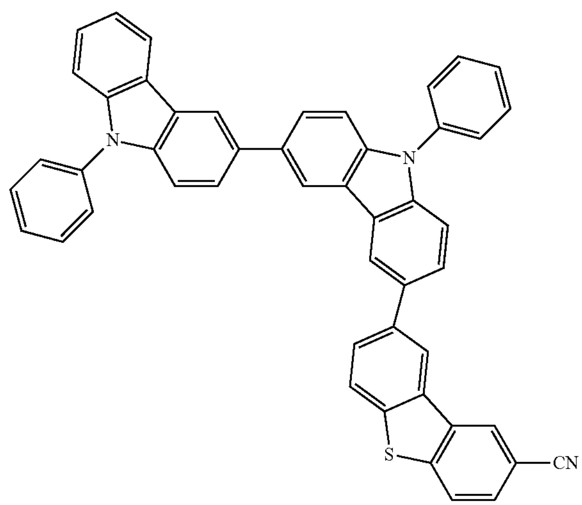
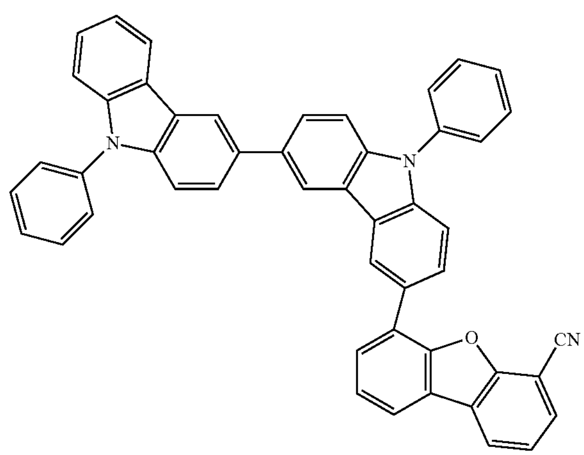 [SMILES: N#Cc1cccc2c1oc1c(-c3ccc4c(c3)c3cc(-c5ccc6c(c5)c5ccccc5n6-c5ccccc5)ccc3n4-c3ccccc3)cccc12]

Examples of the aromatic heterocyclic derivative A represented by formula (1-1) are shown below, although not limited to the following compounds.
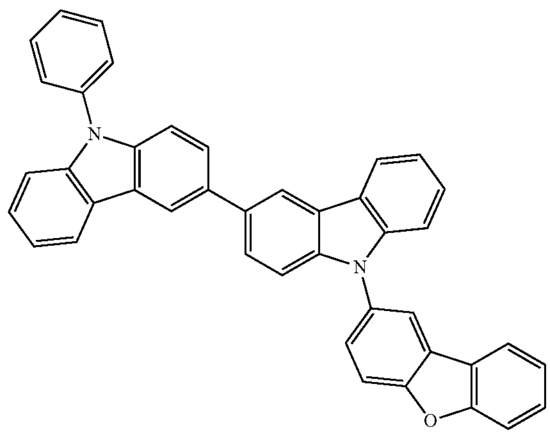
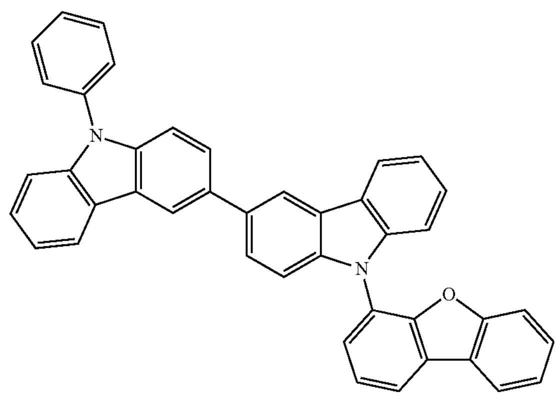
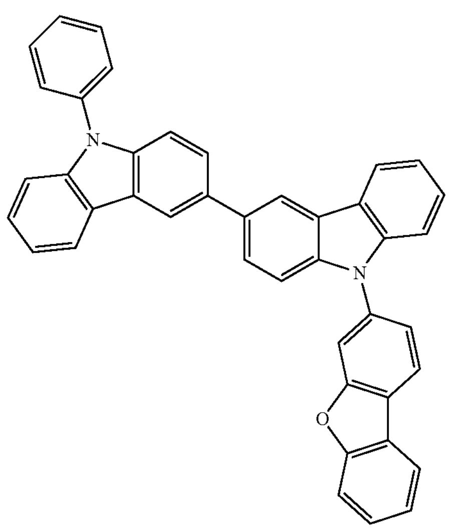
-continued
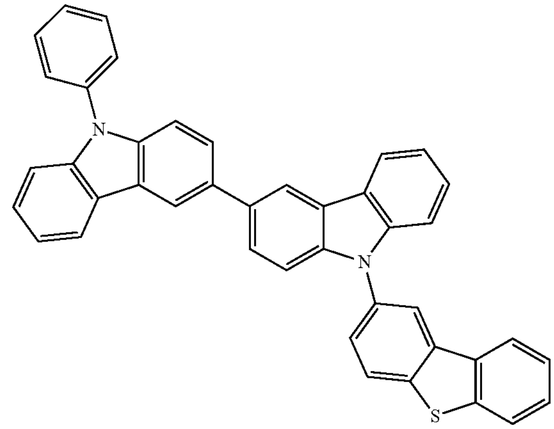
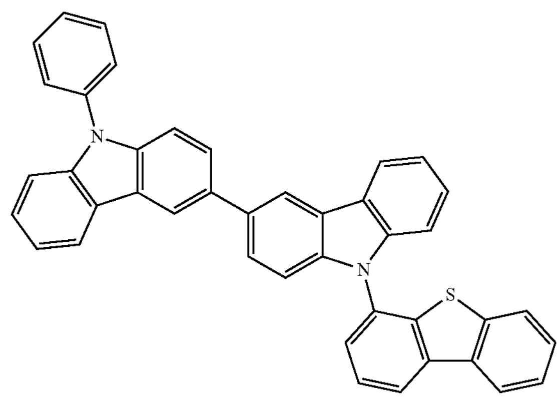
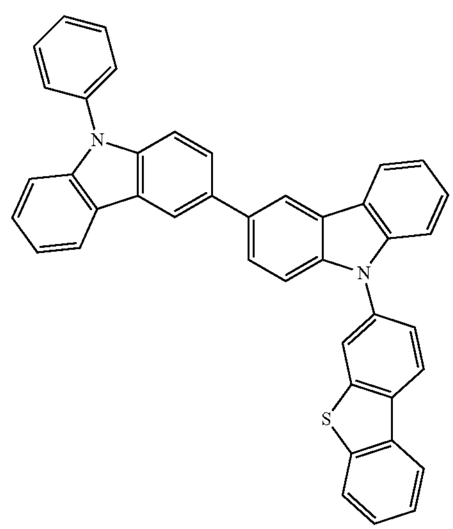

-continued
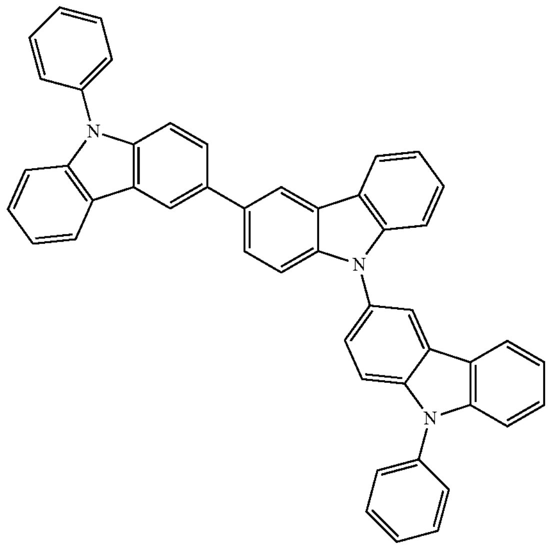
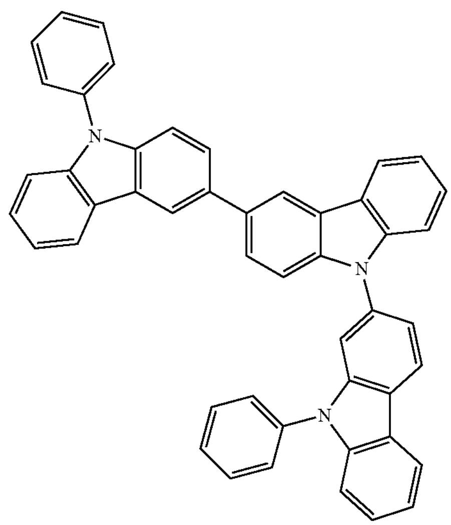
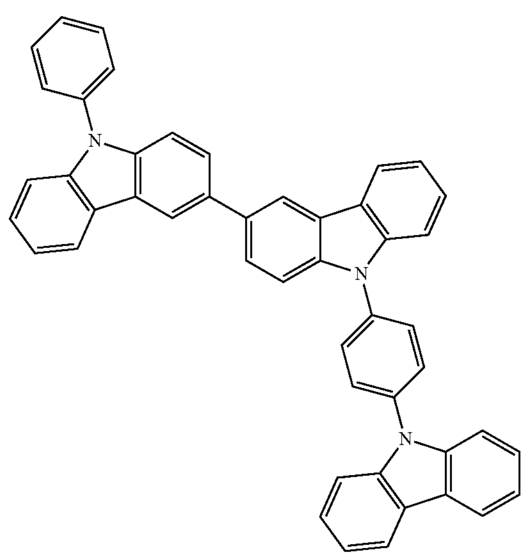
-continued
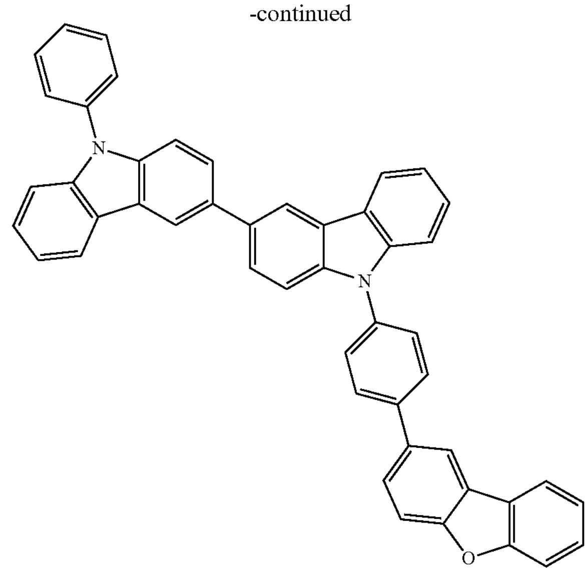
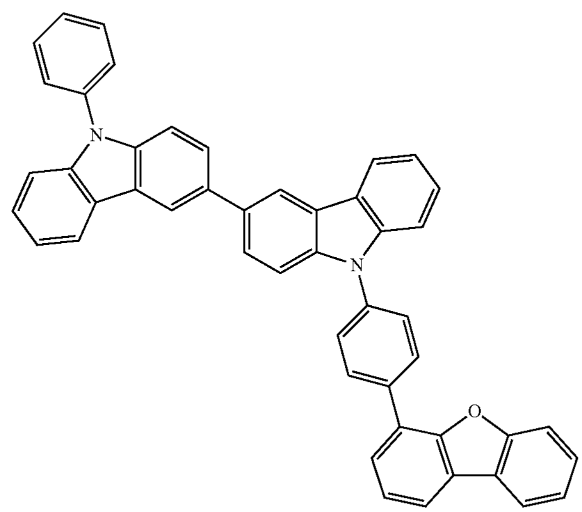
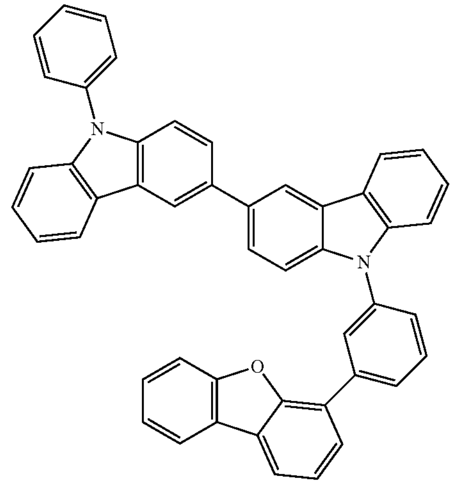

-continued
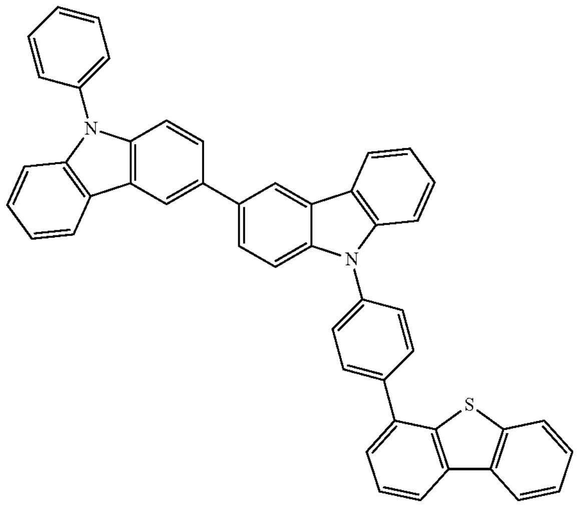
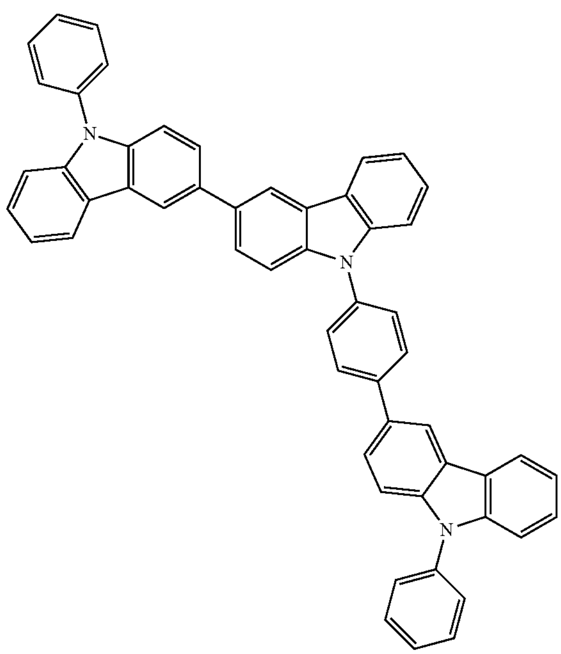
-continued
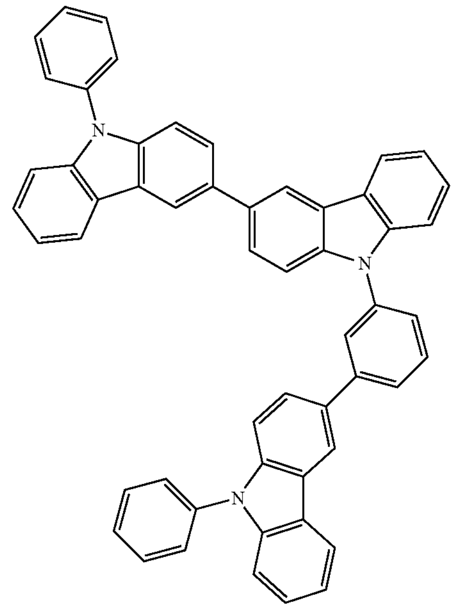
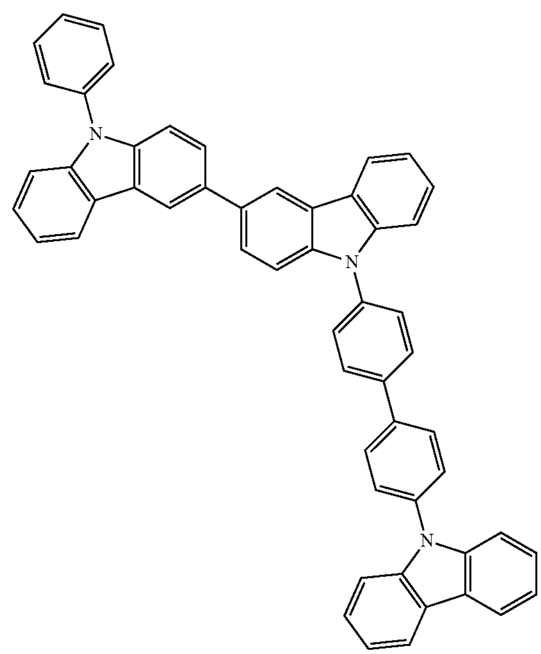

-continued
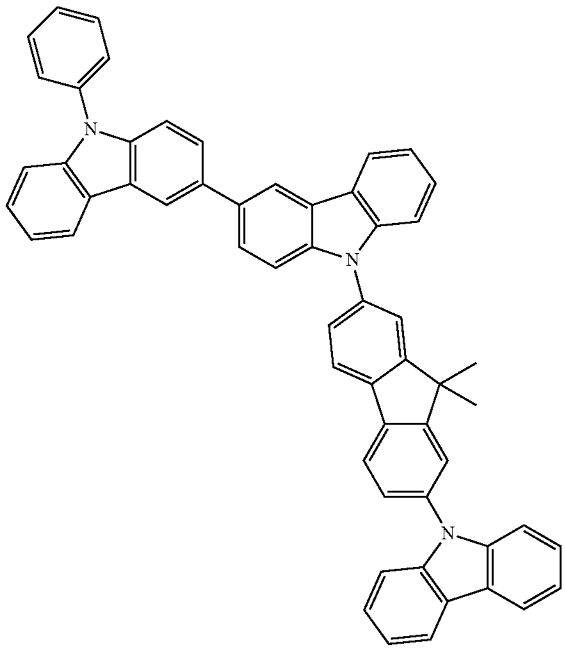
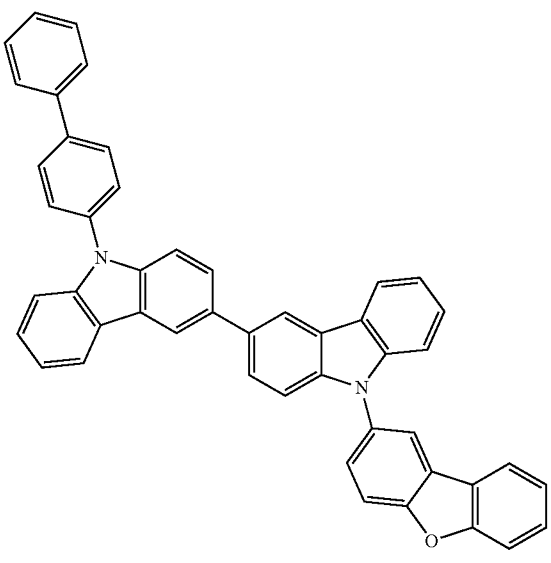
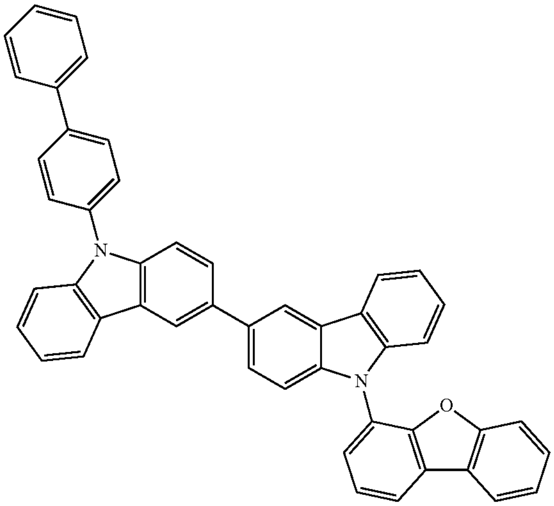
-continued
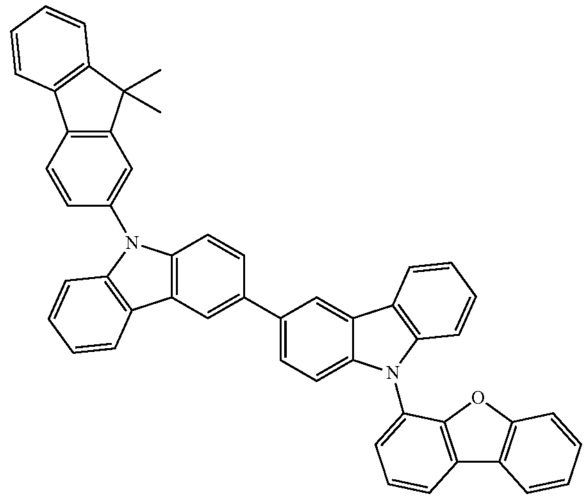
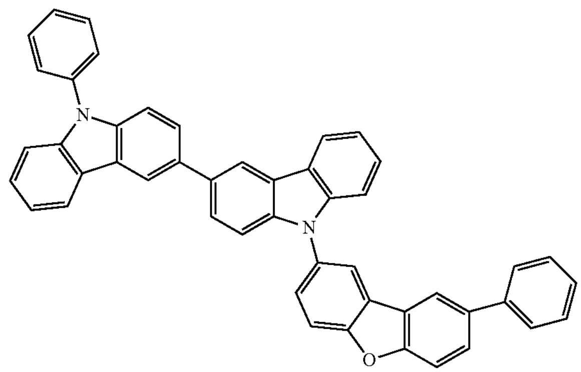
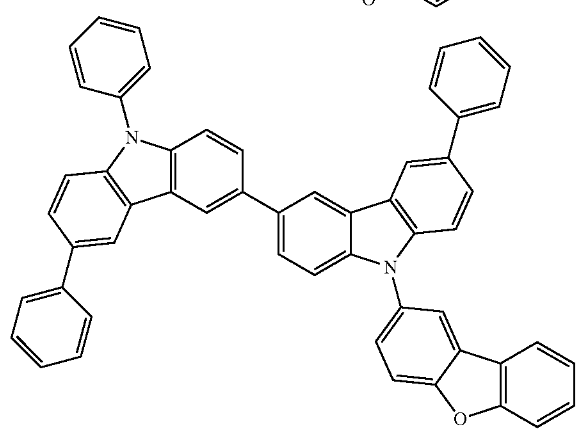
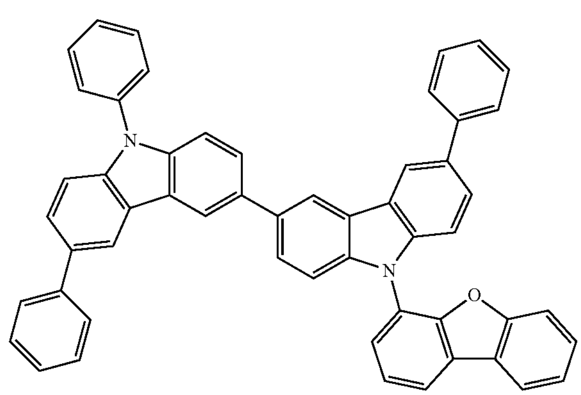

-continued
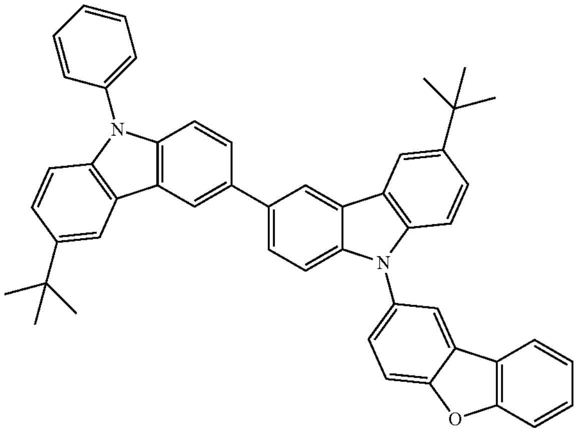
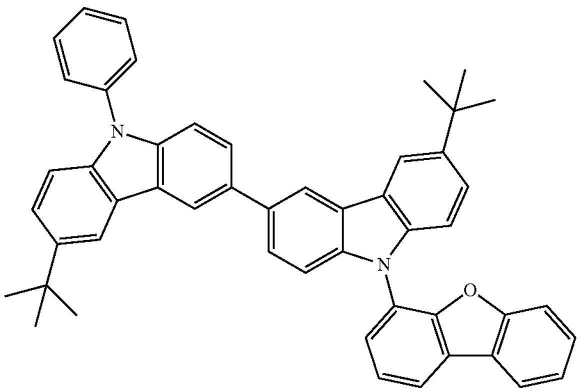
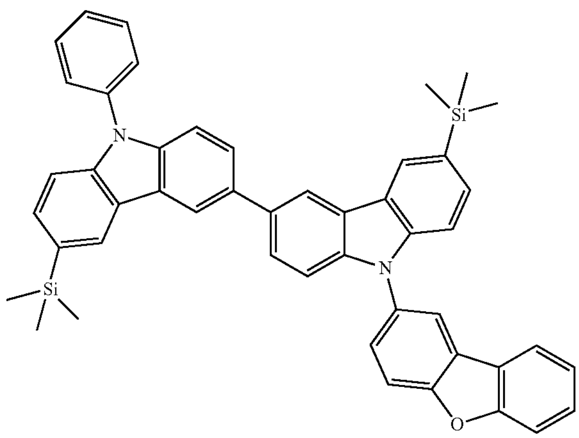
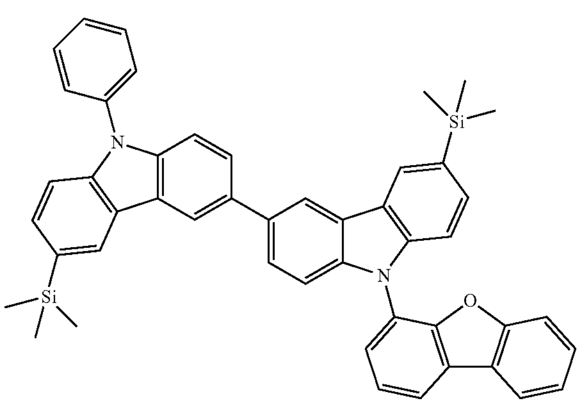
-continued
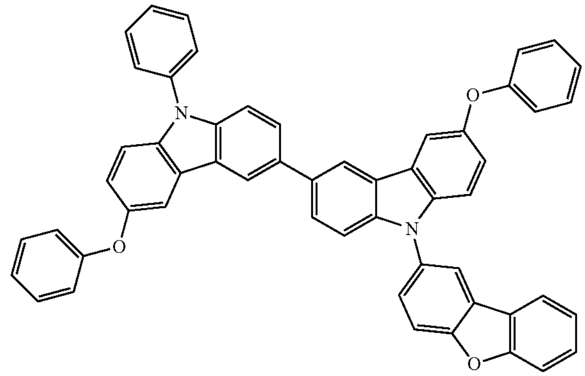
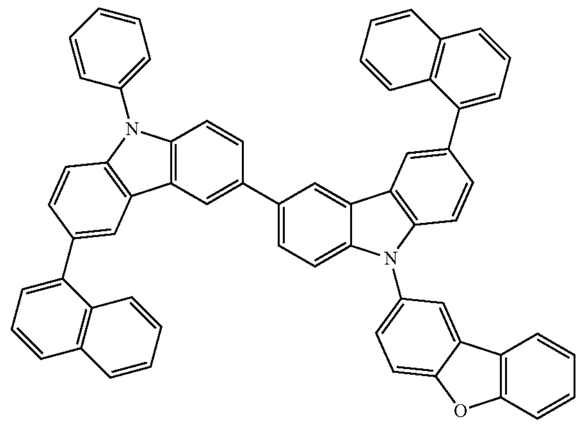
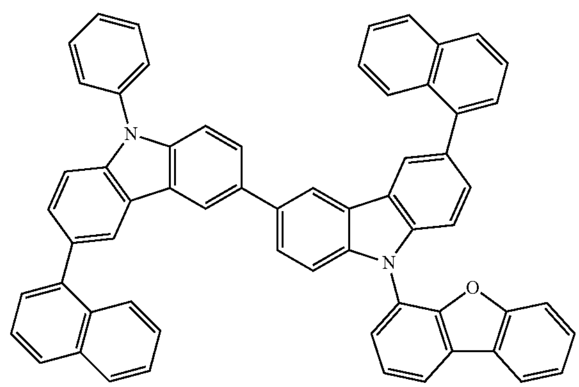
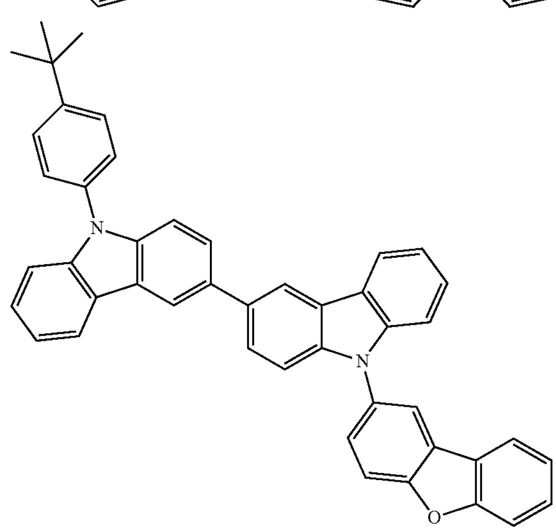

-continued
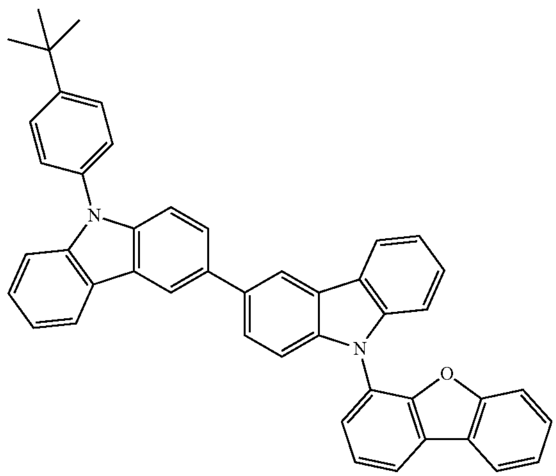
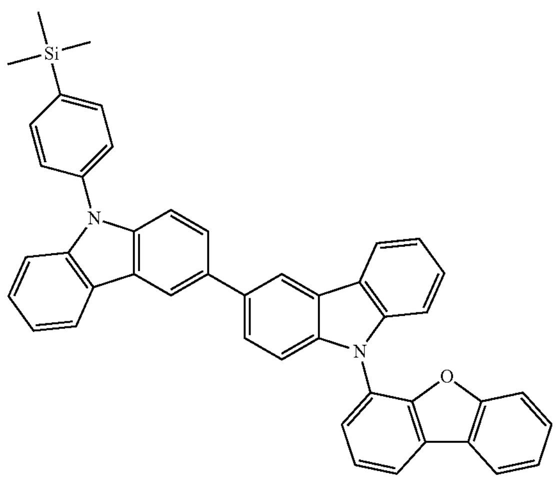
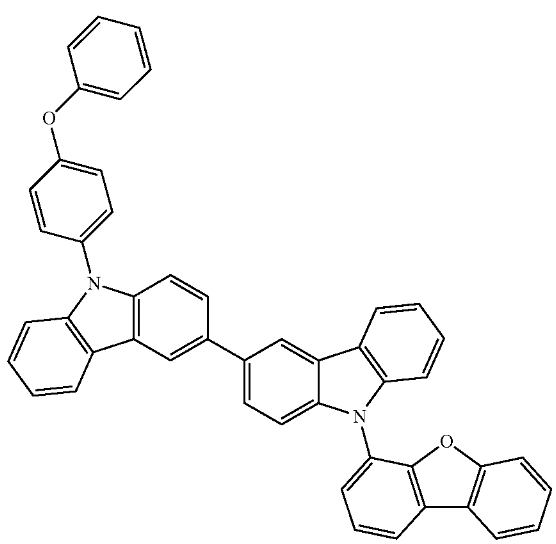
-continued
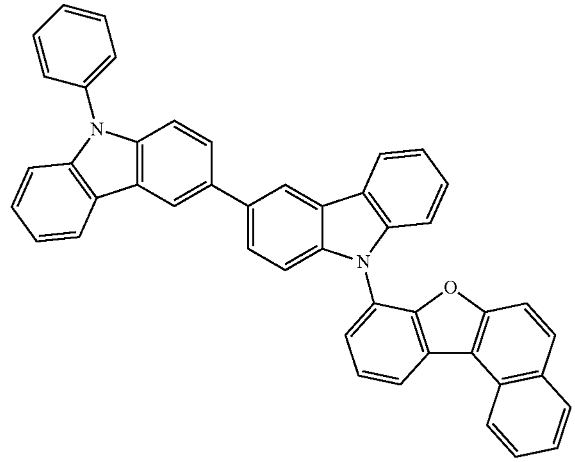
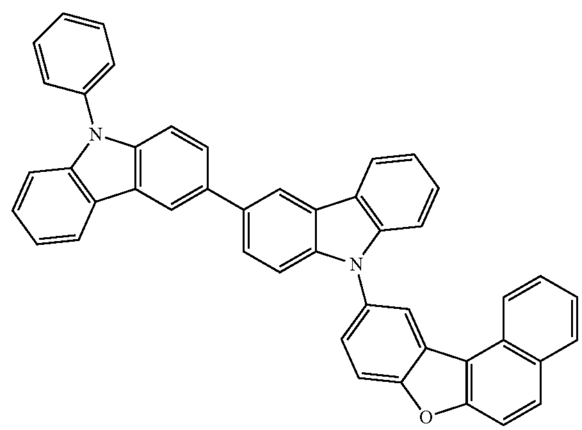
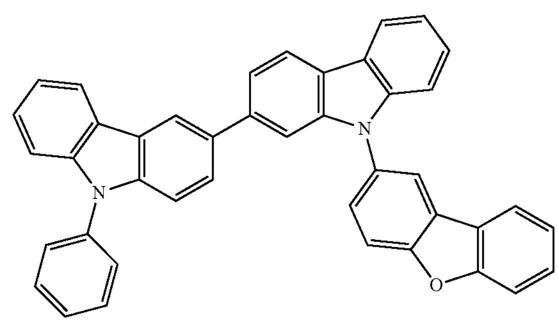
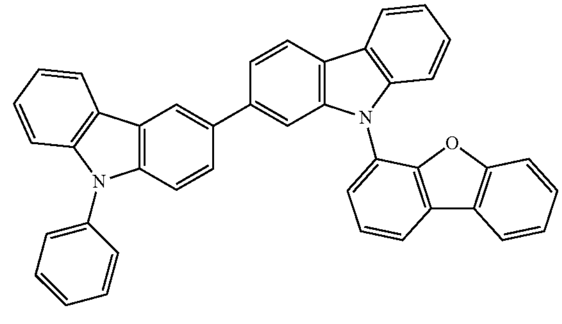

-continued
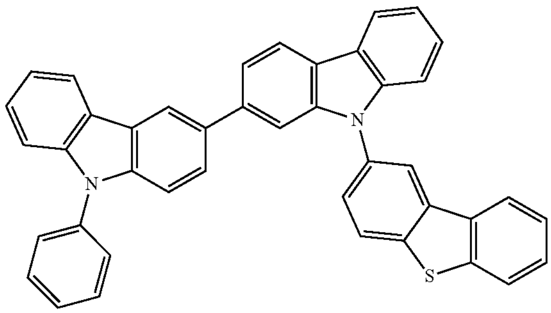
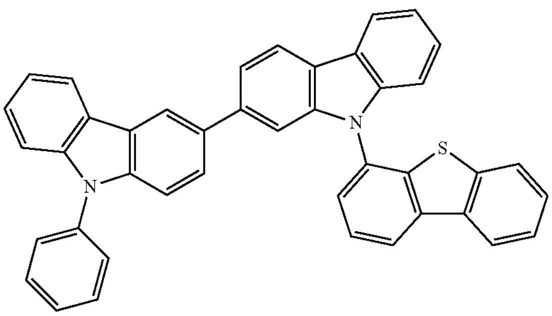
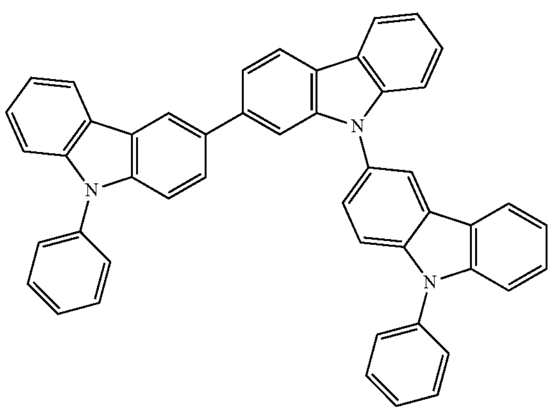
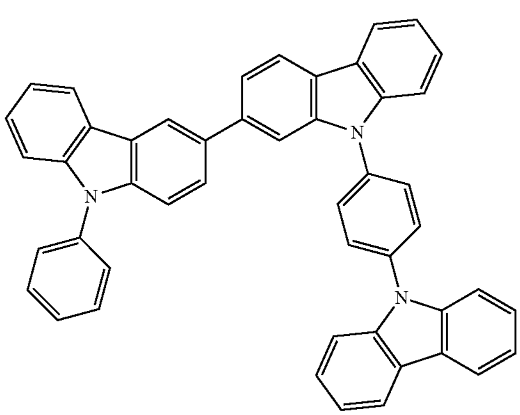
-continued
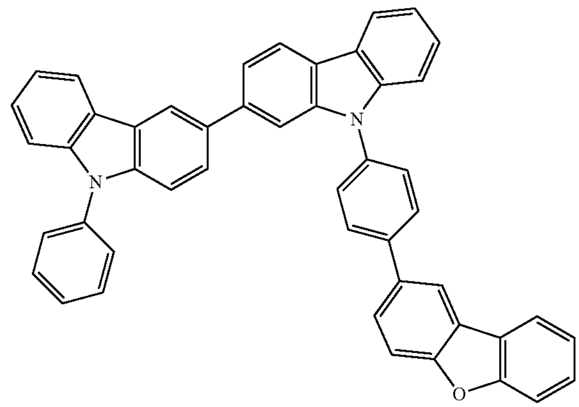
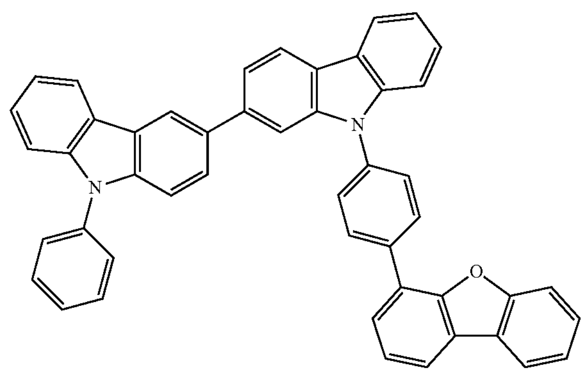
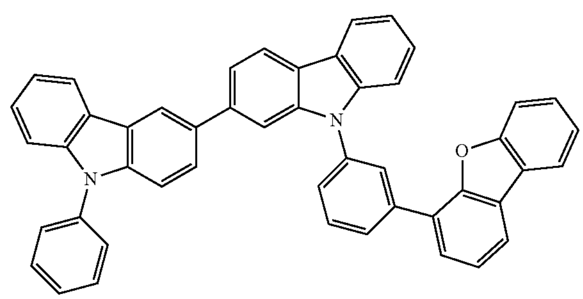
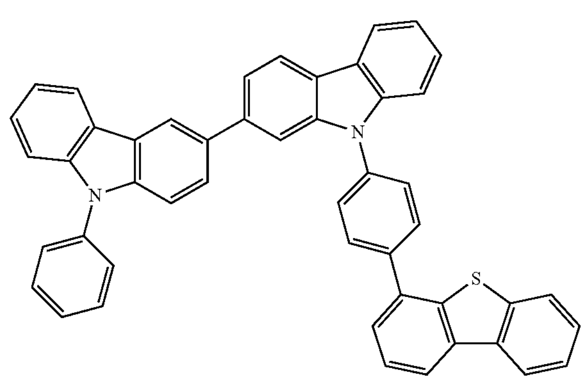

-continued
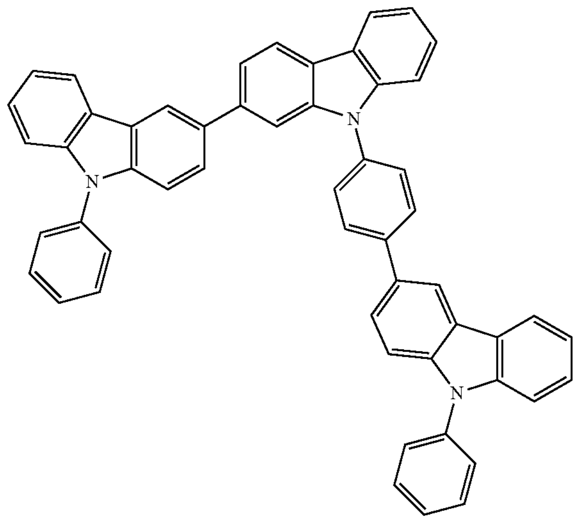
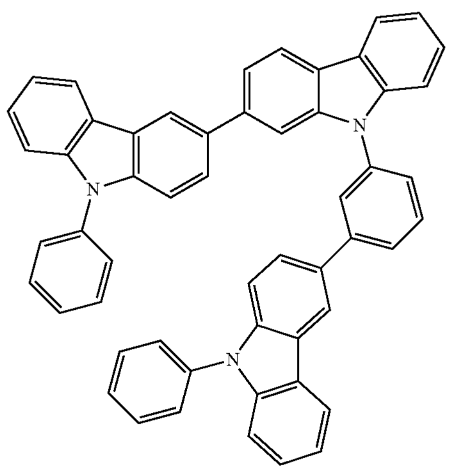
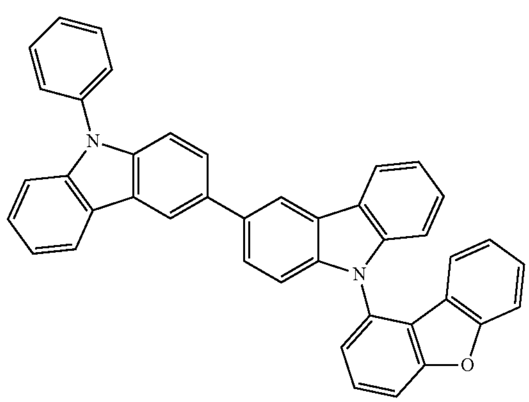
-continued
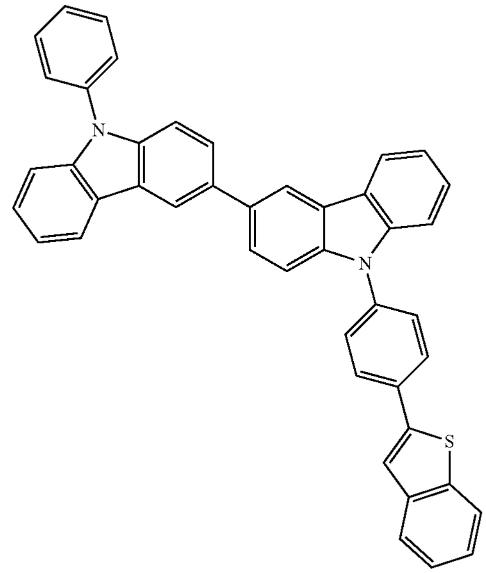
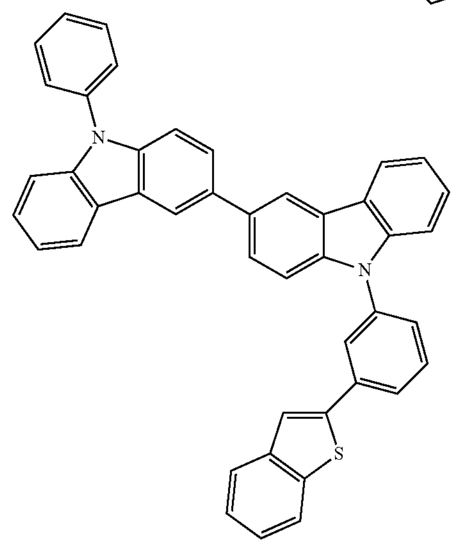
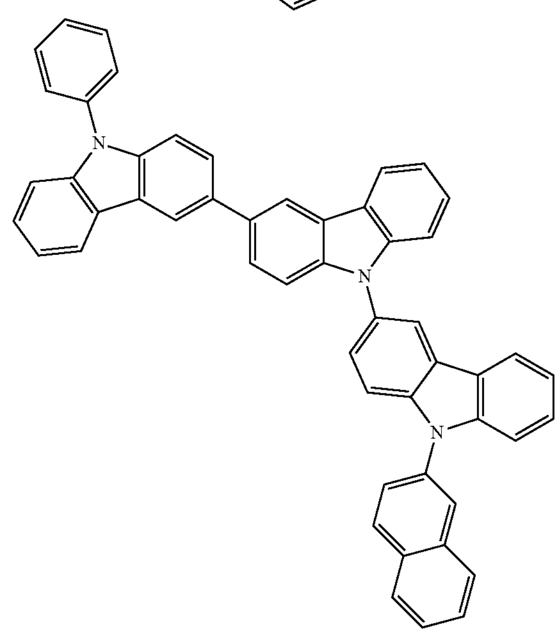

-continued
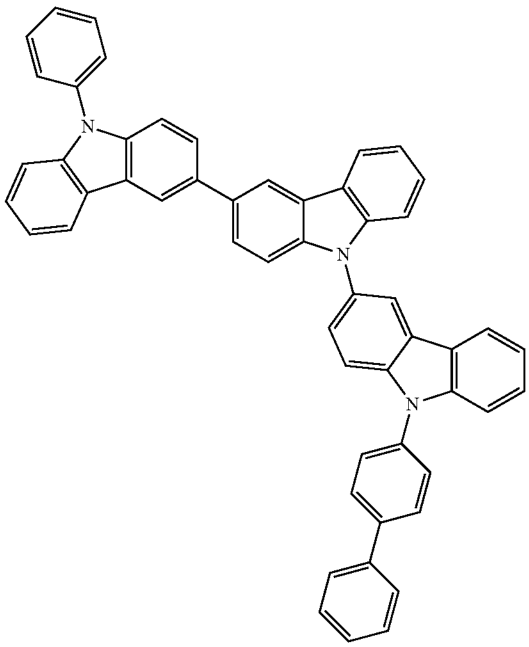
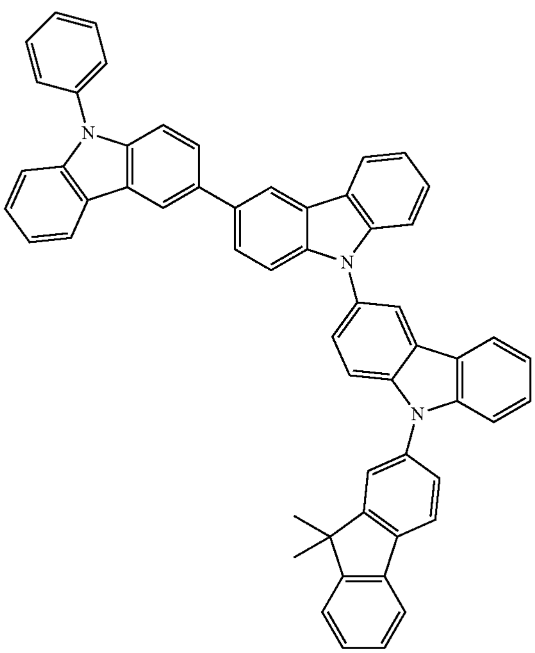
-continued
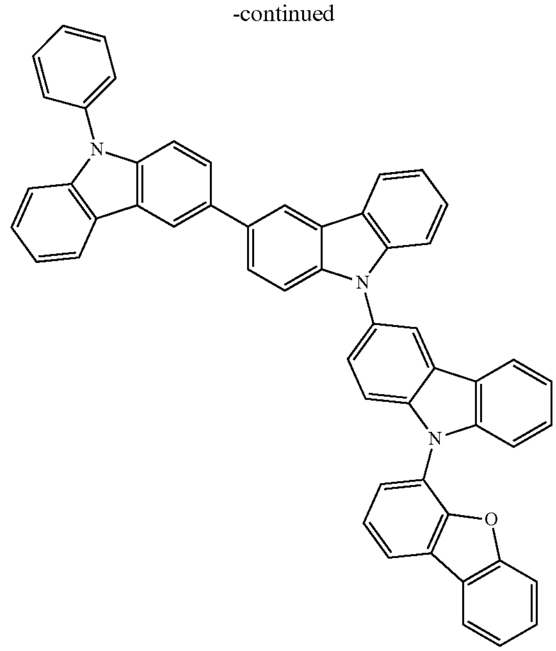
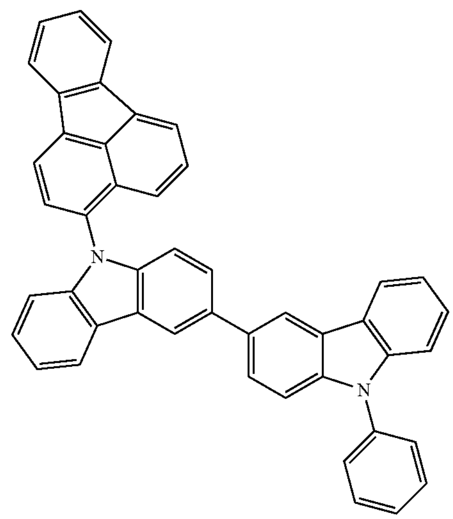
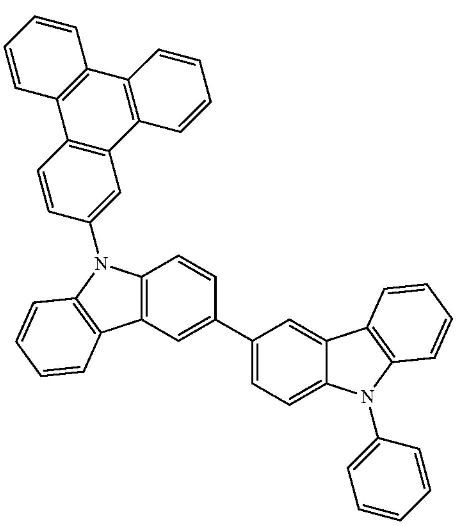

-continued
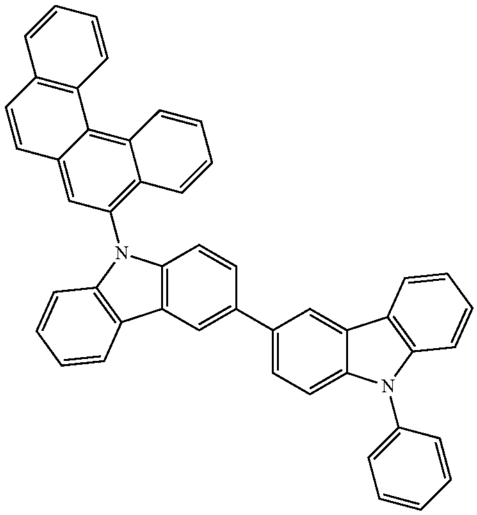
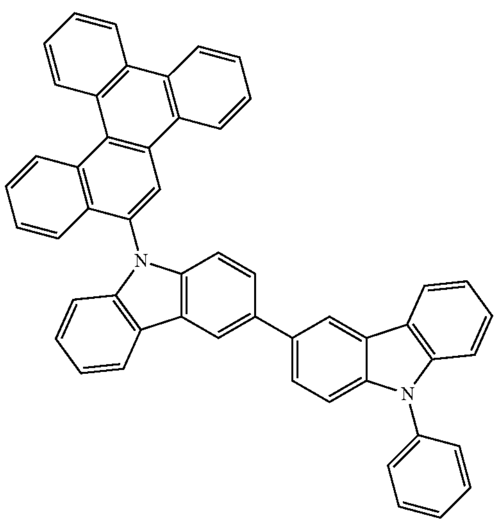
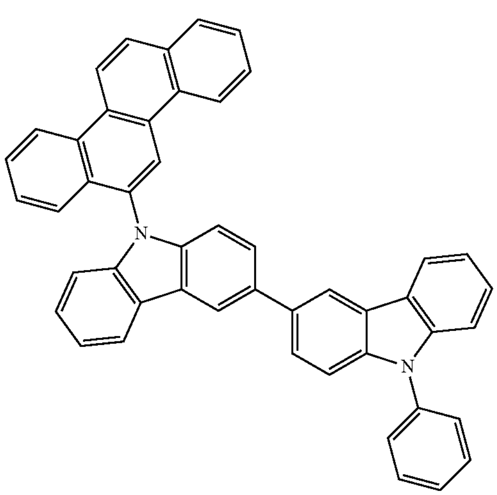
-continued
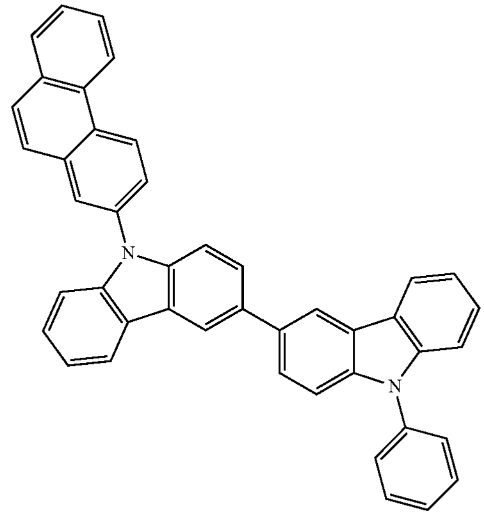
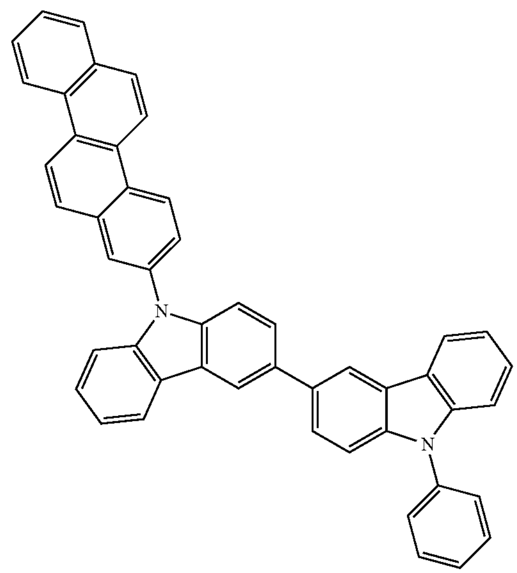
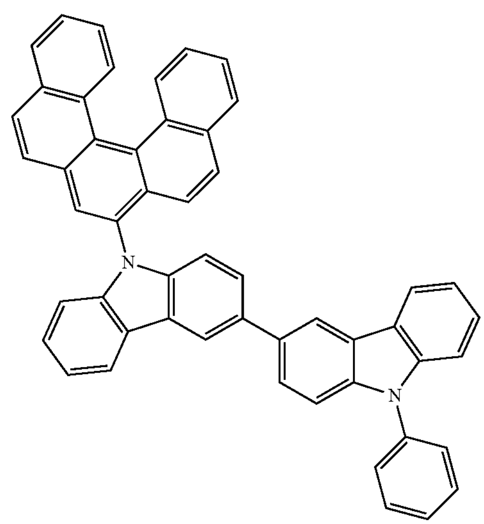

-continued
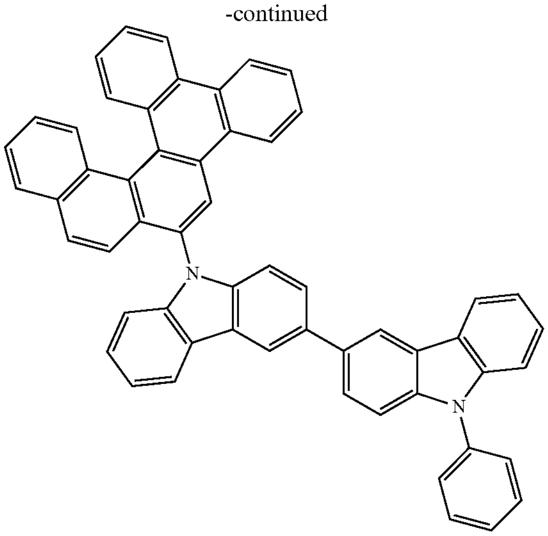
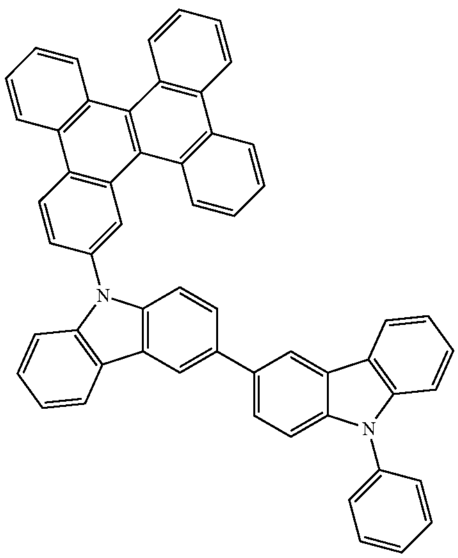
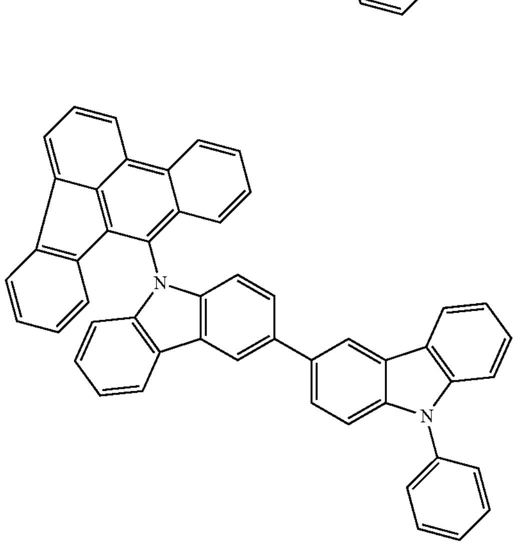
-continued
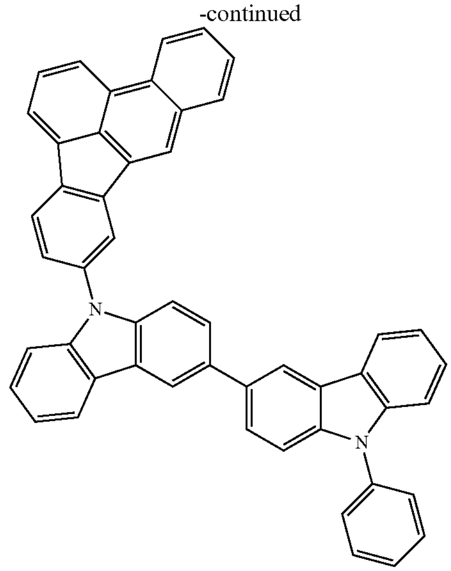
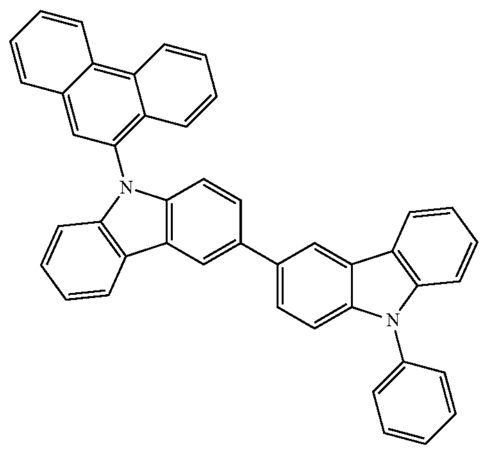
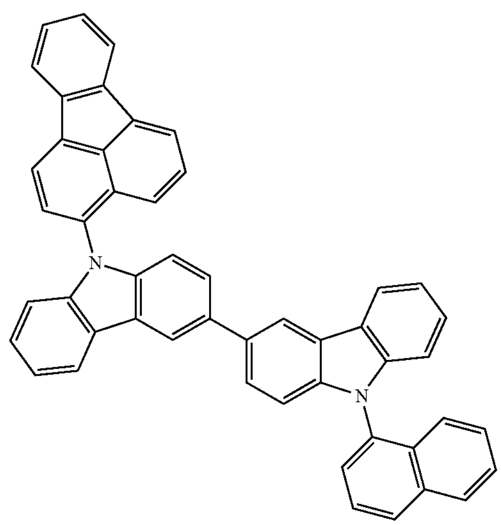

-continued
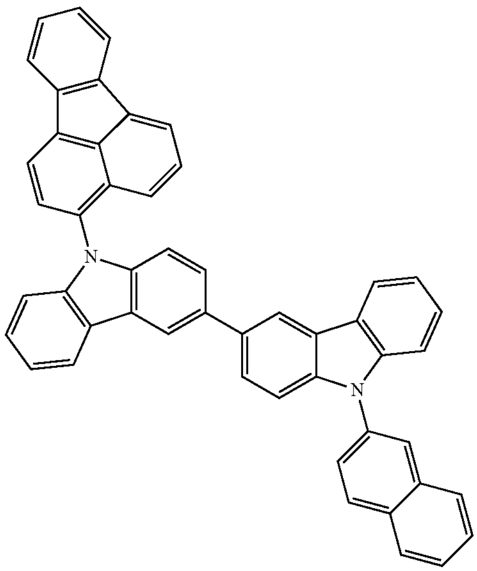
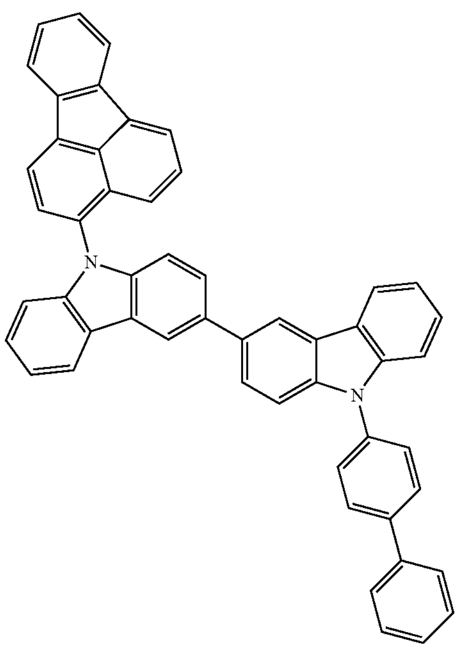
-continued
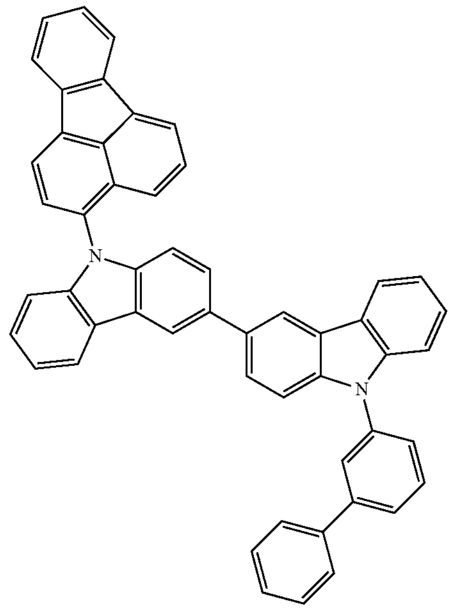
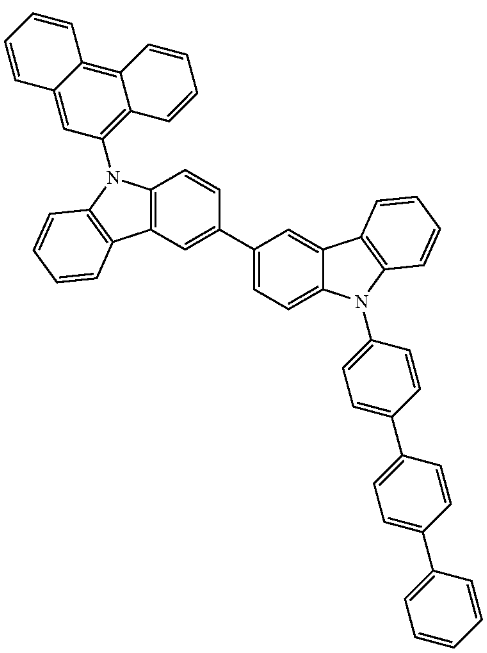

-continued
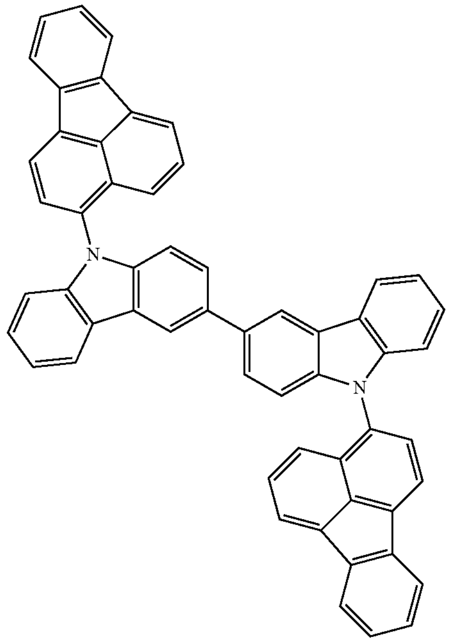
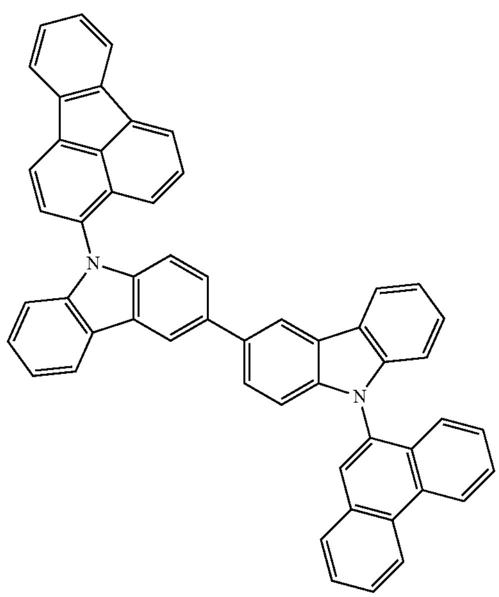
-continued
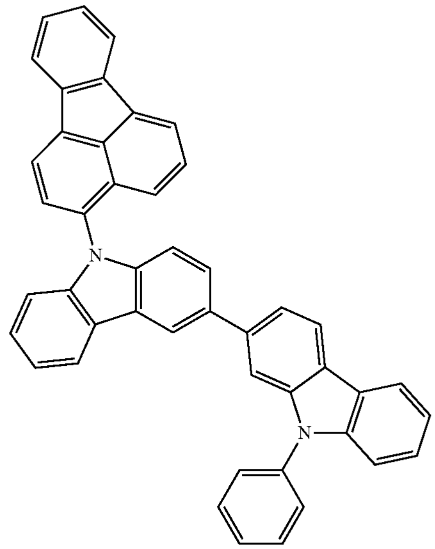
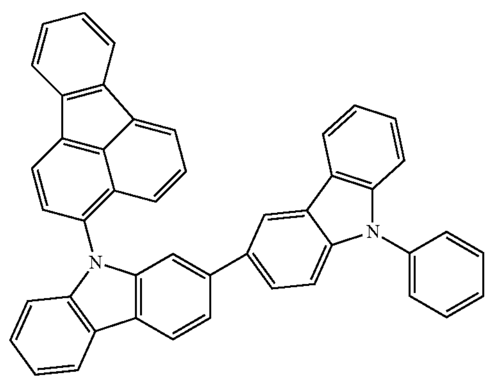
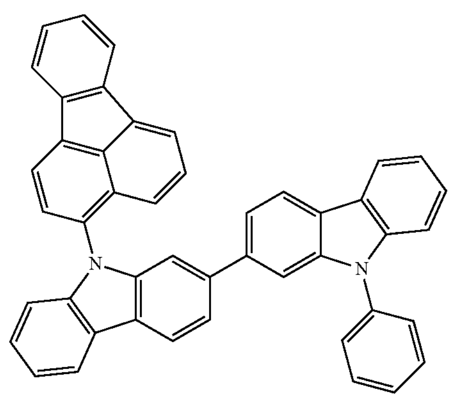

-continued
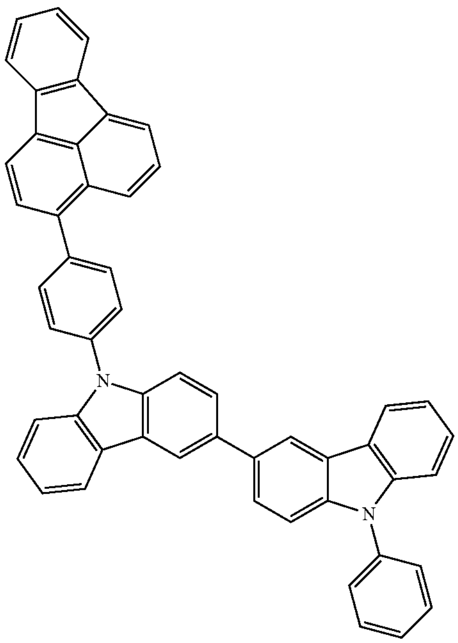
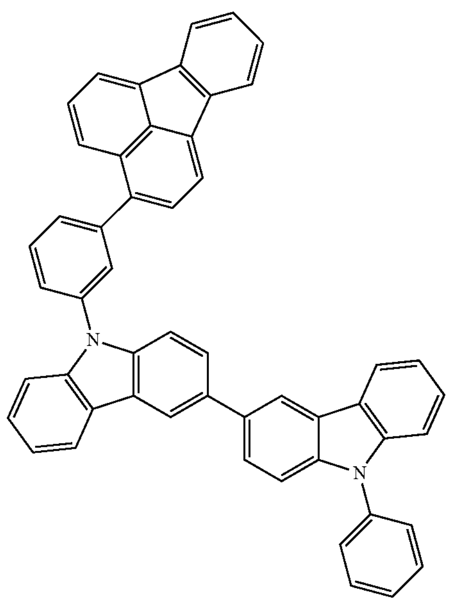
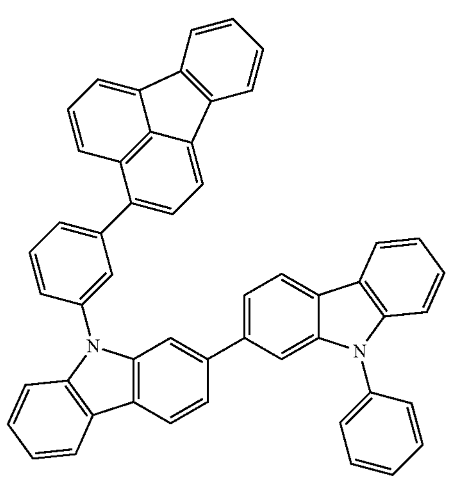
-continued
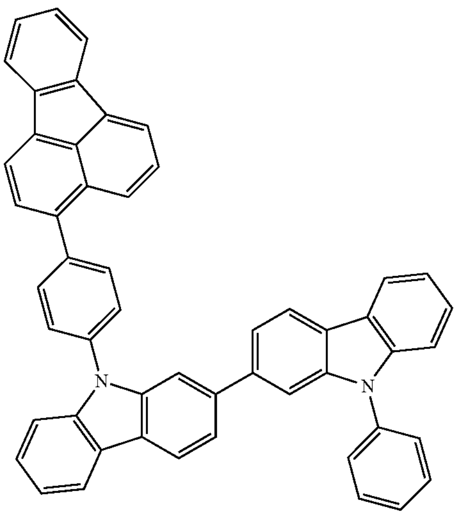
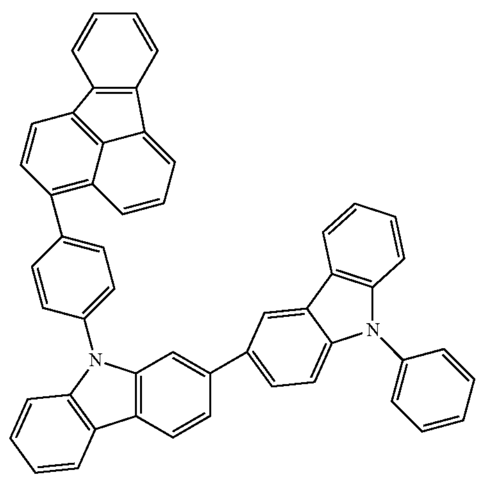
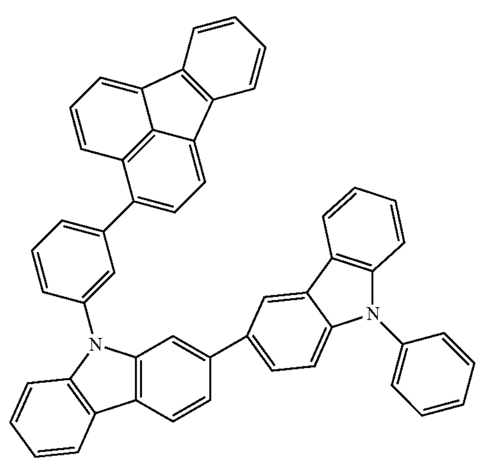

-continued
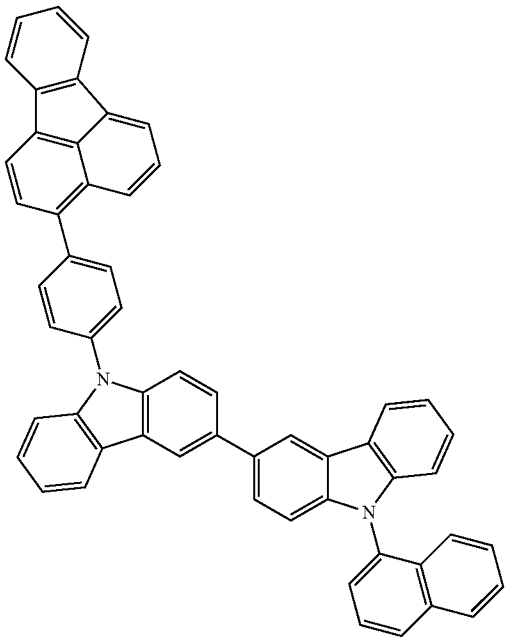
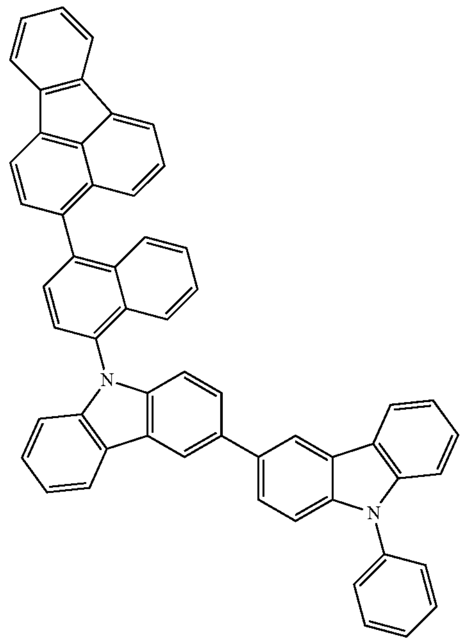
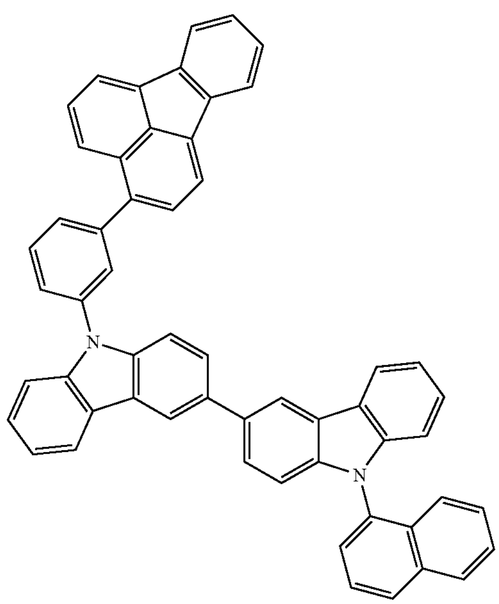
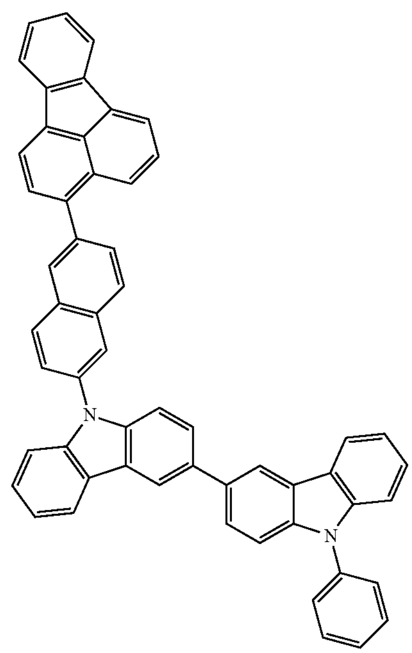

-continued
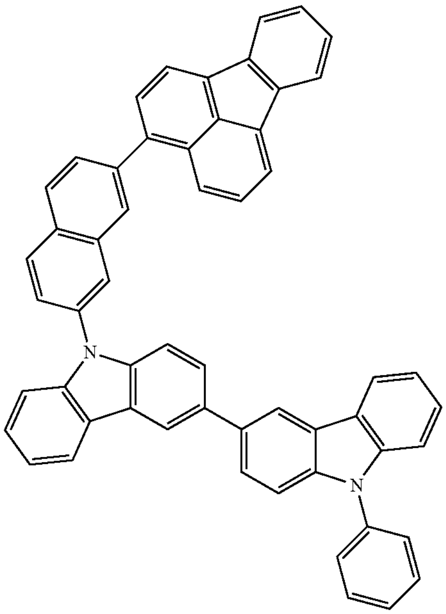
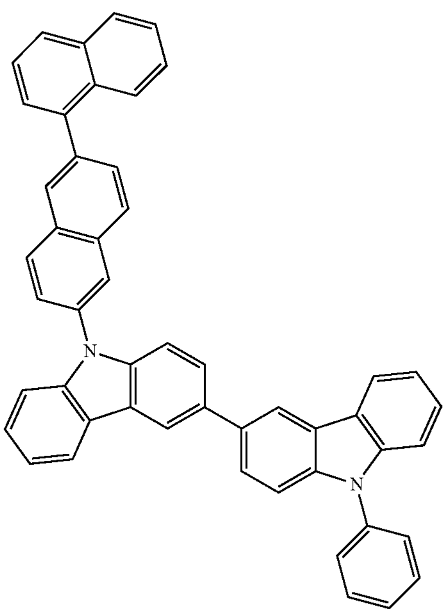
-continued
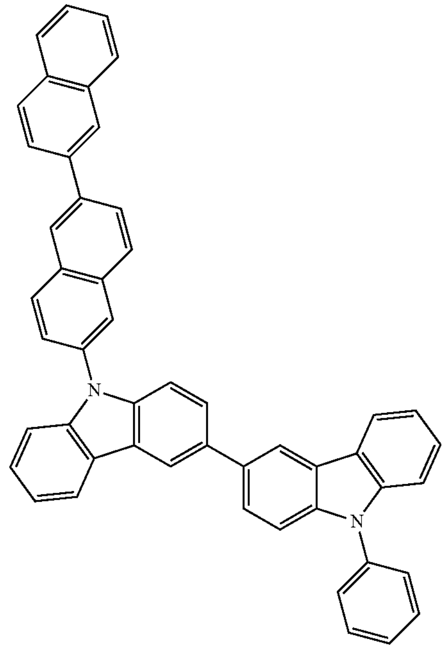
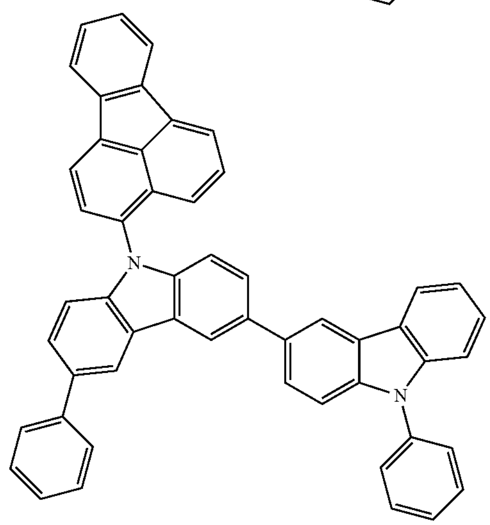
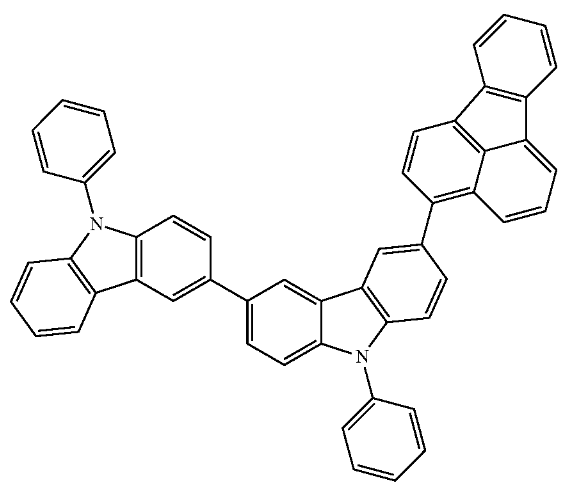

-continued
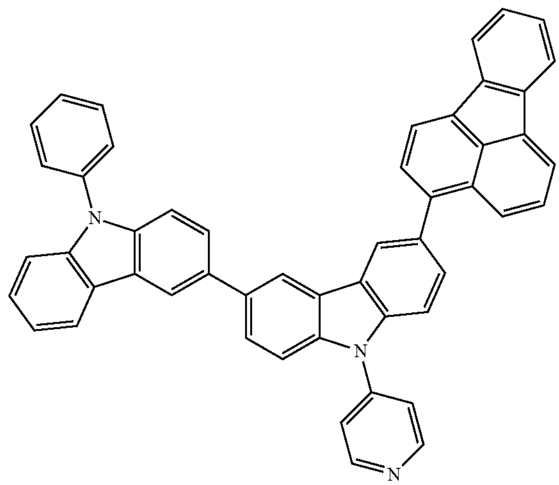
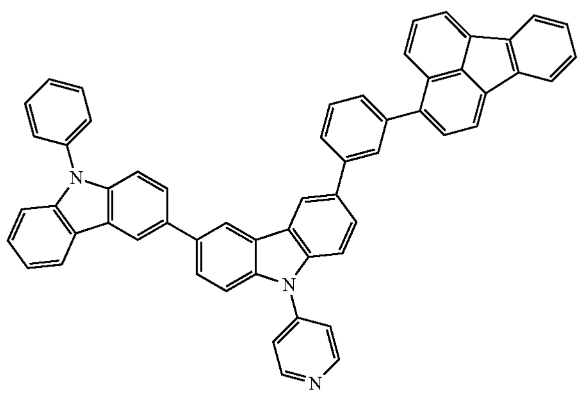
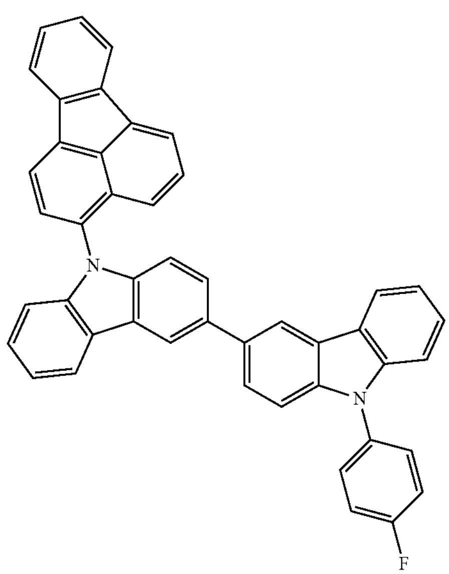
-continued
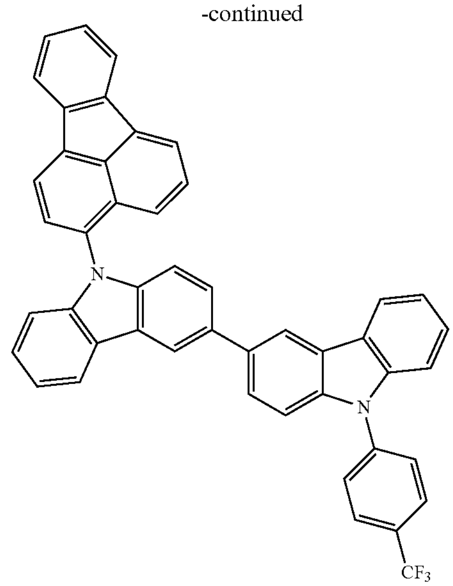
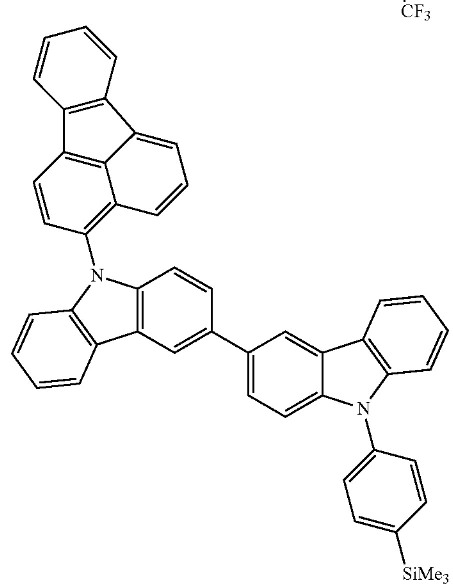
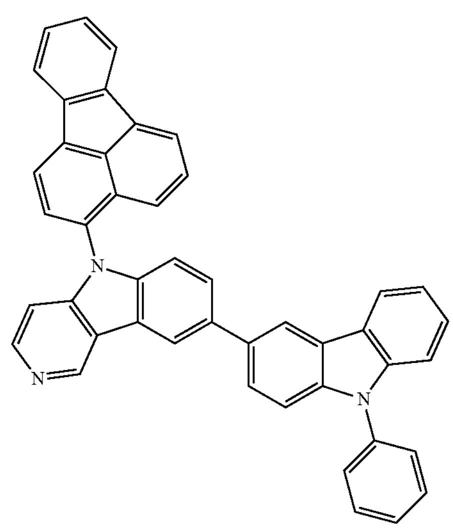

-continued
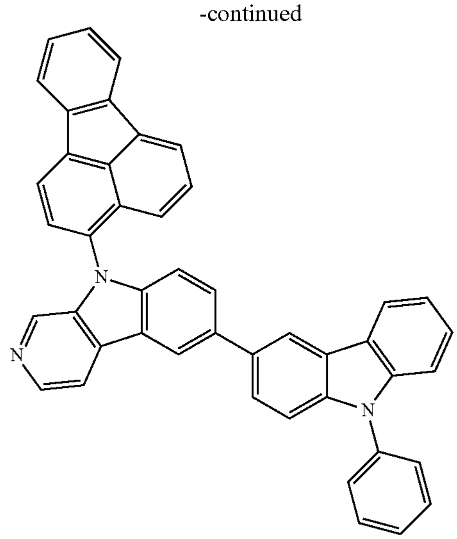
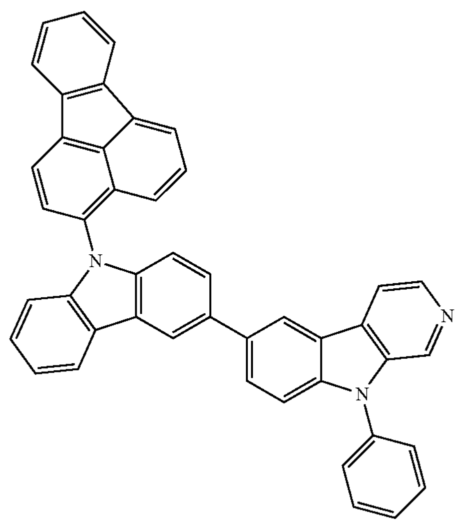
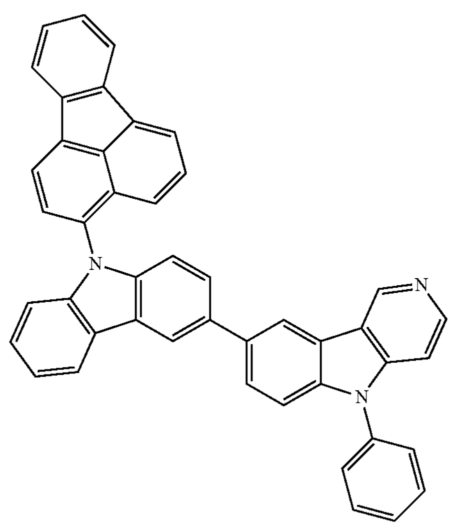
-continued
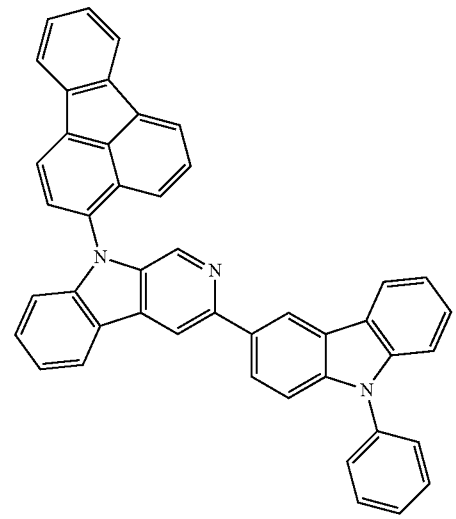
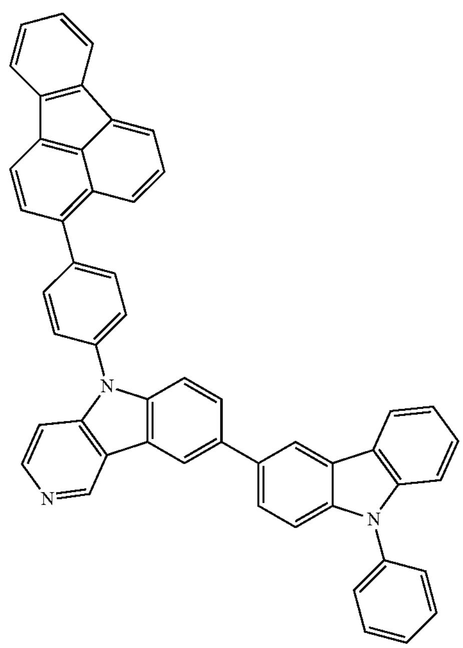

-continued
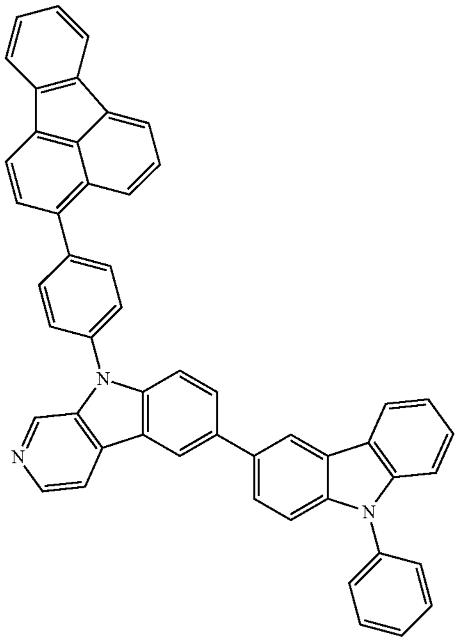
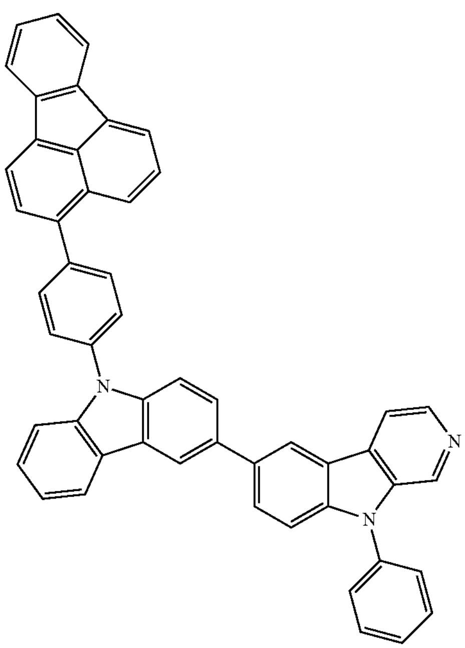
-continued
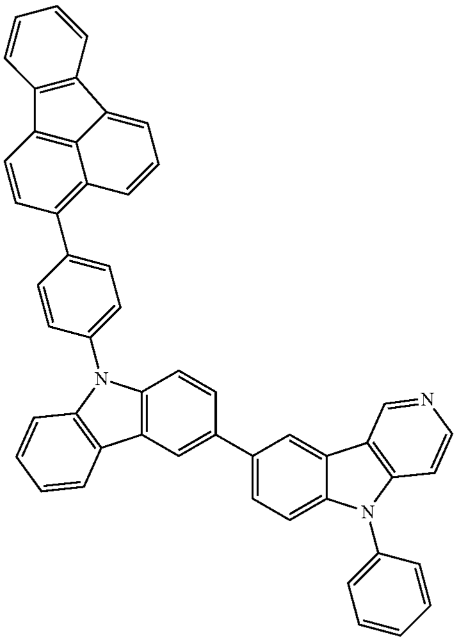
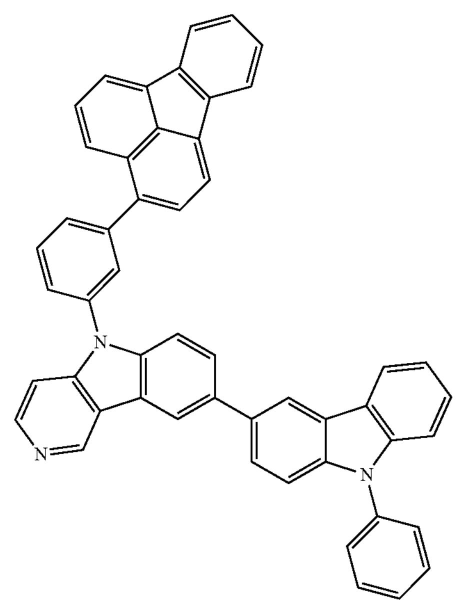

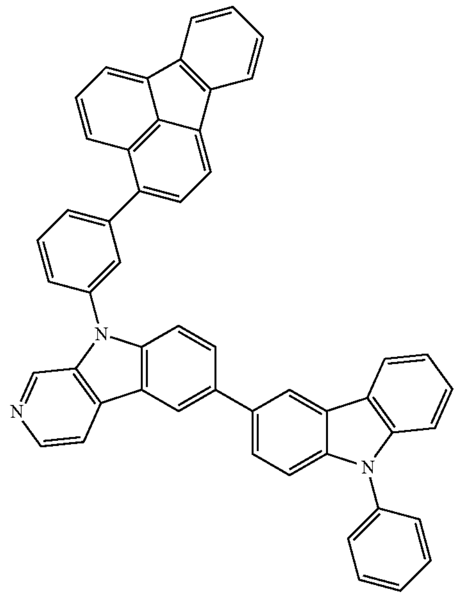
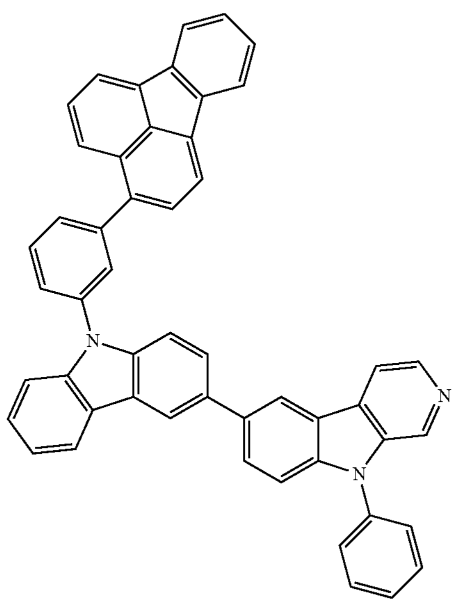
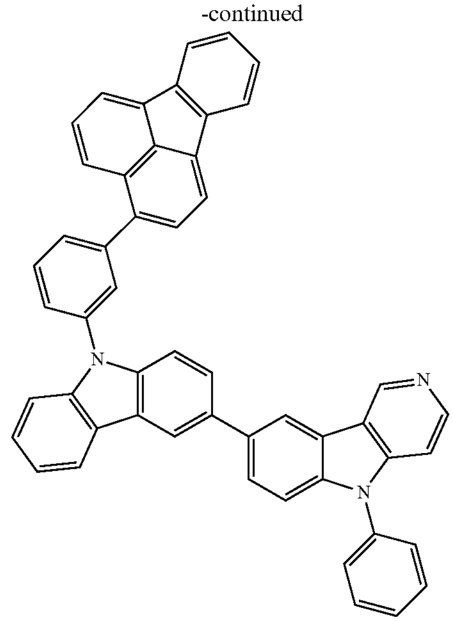
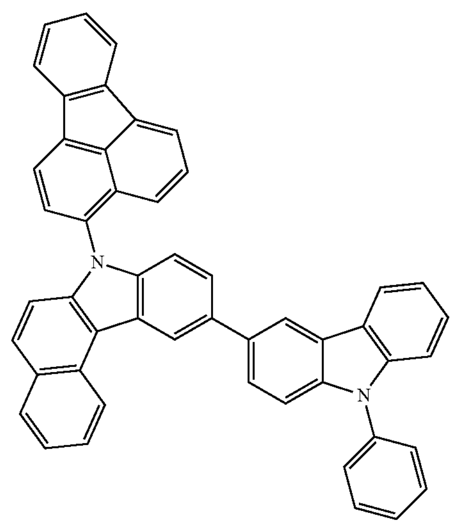
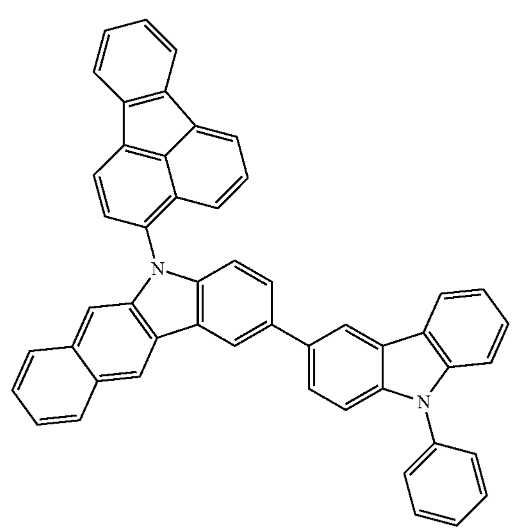

-continued
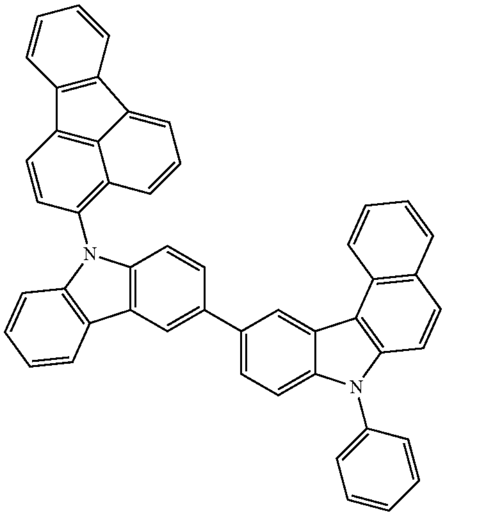
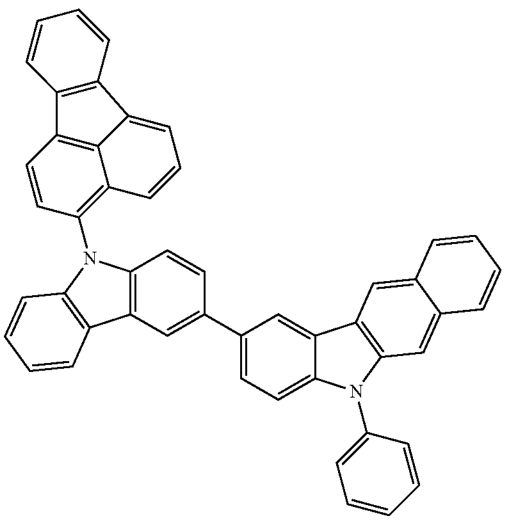
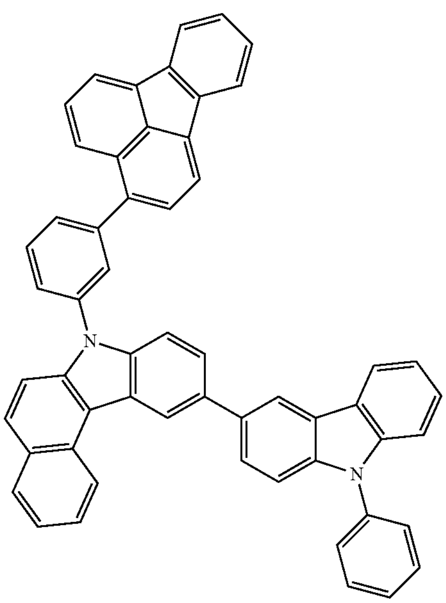
-continued
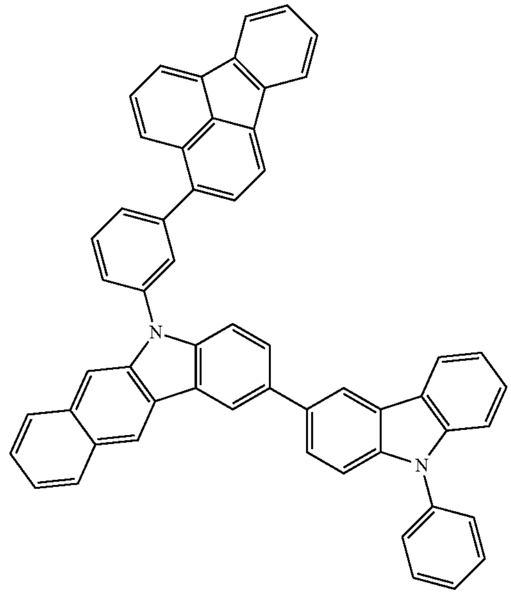
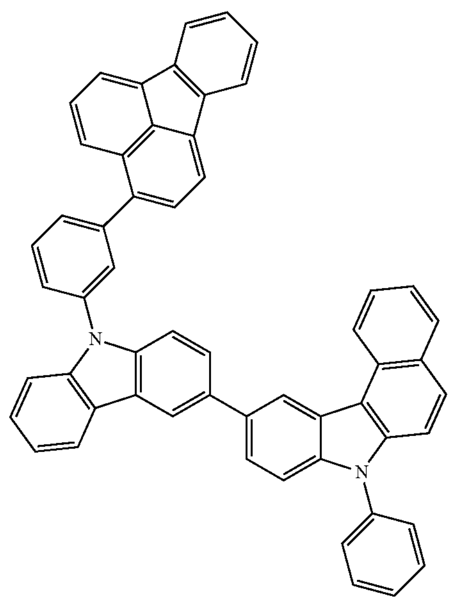

-continued
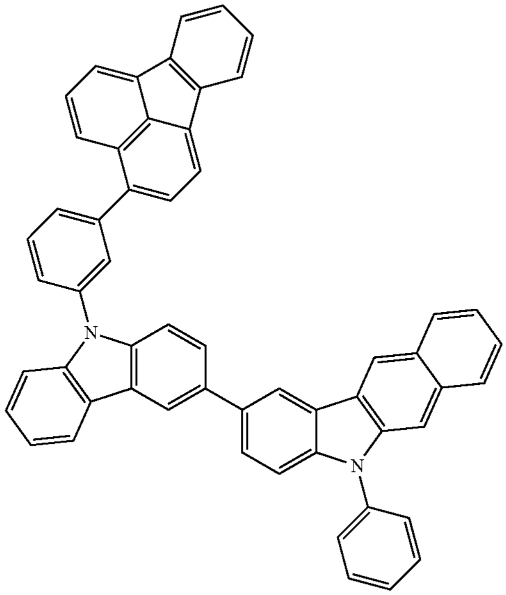
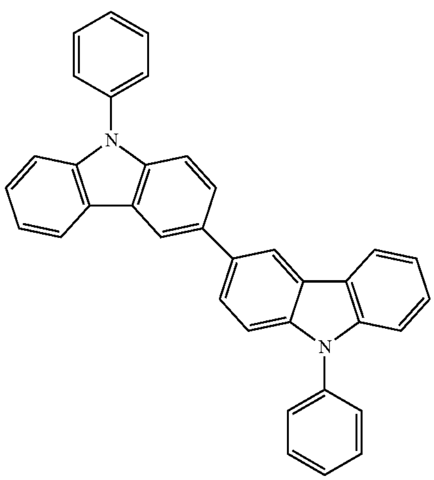
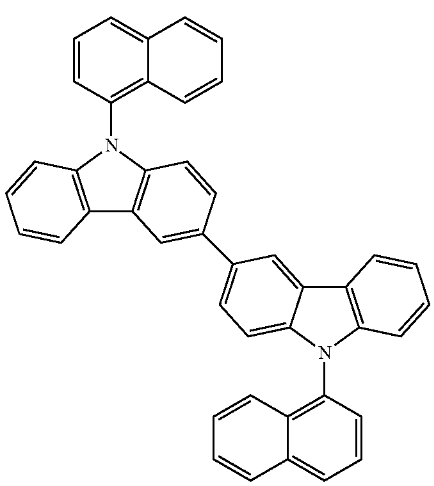
-continued
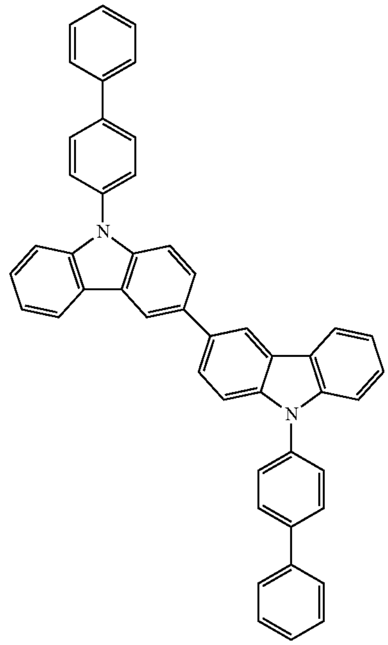
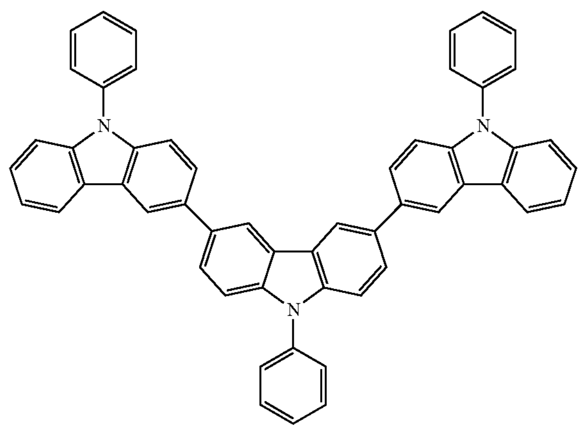
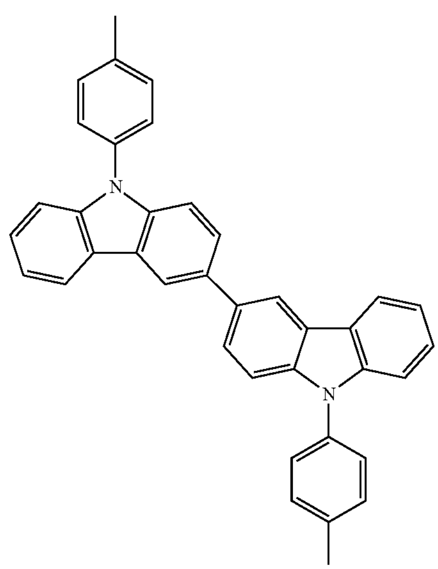

-continued
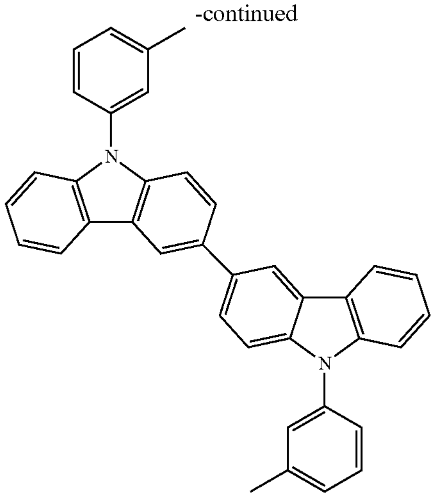
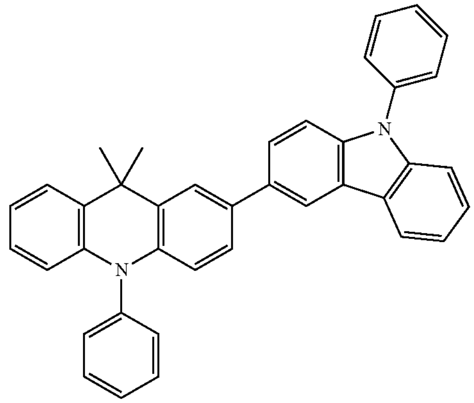
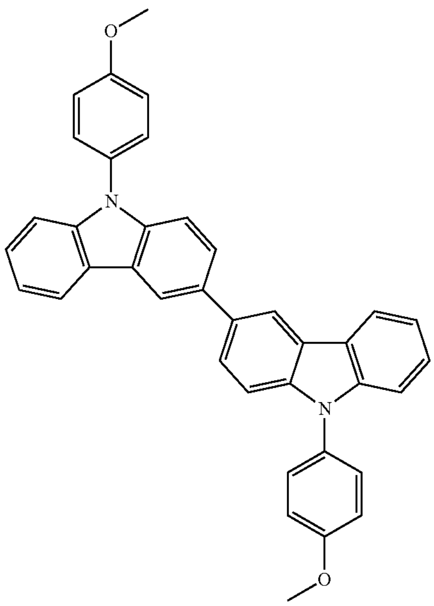
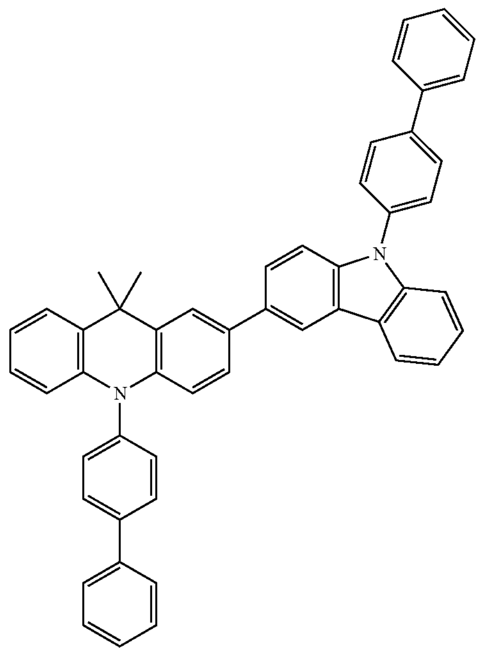
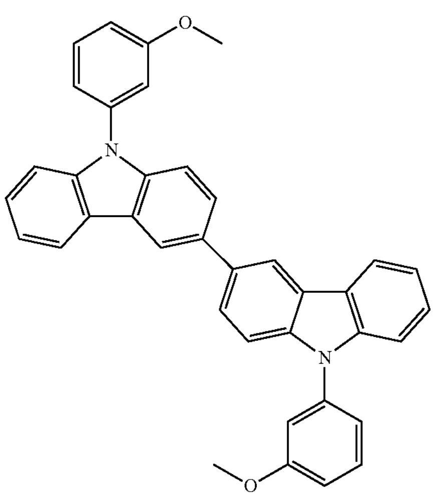
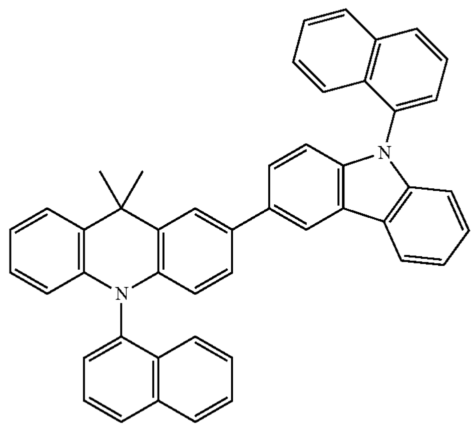
-continued -continued
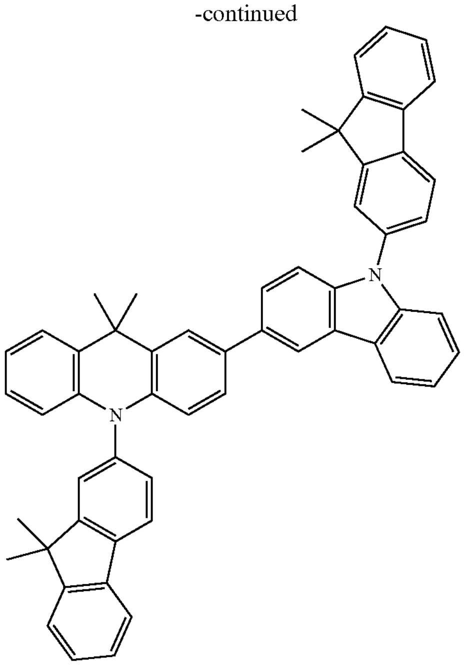
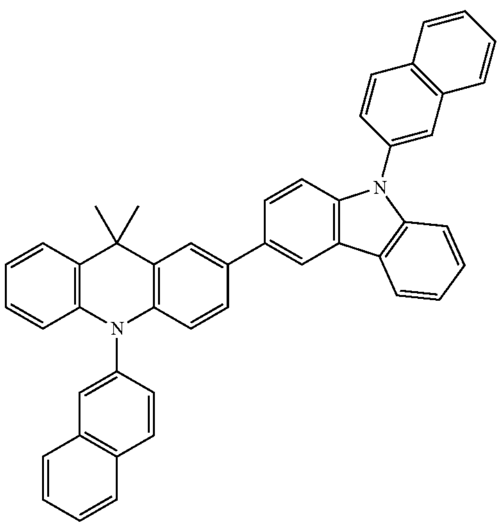
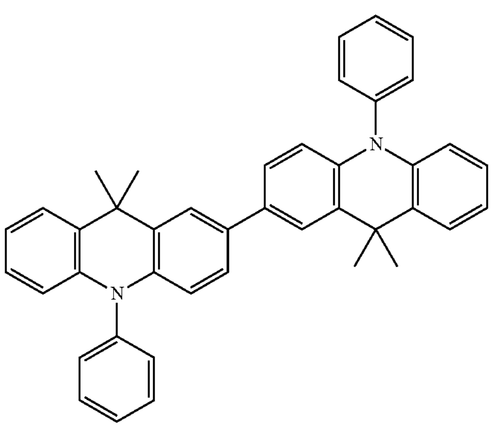
-continued
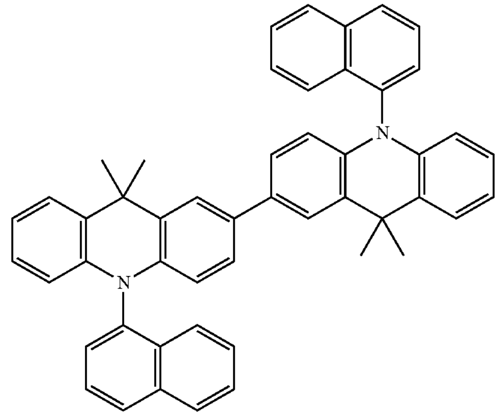
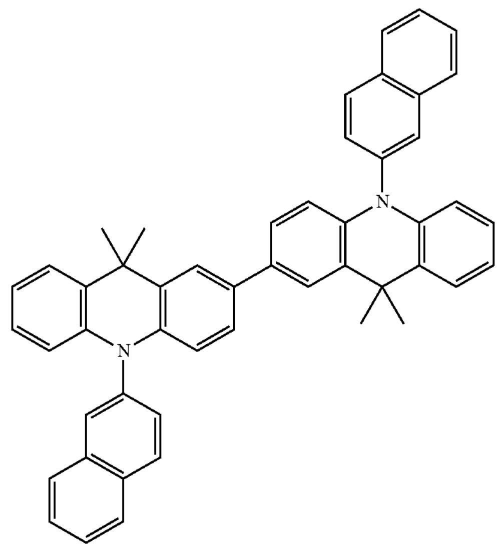
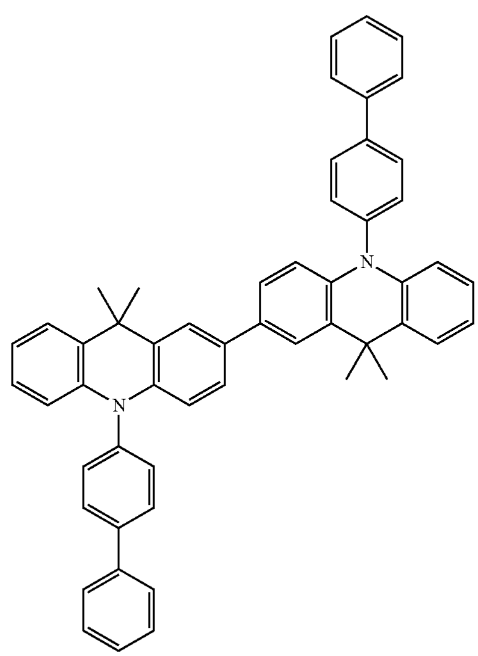

-continued
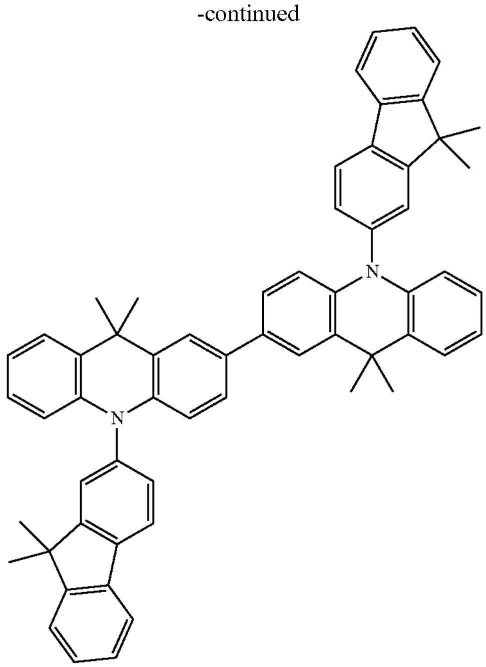
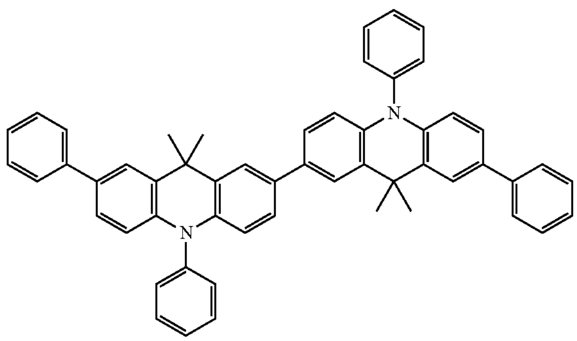
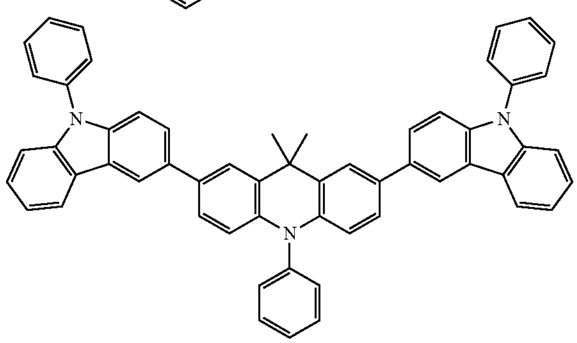
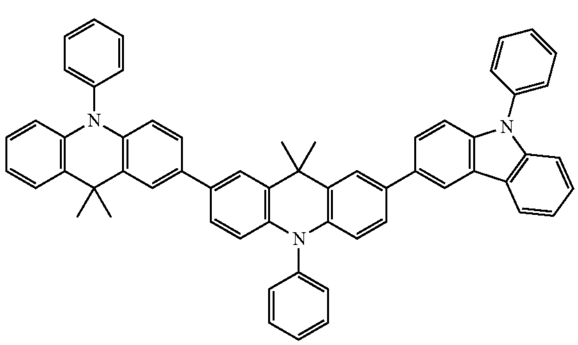
-continued
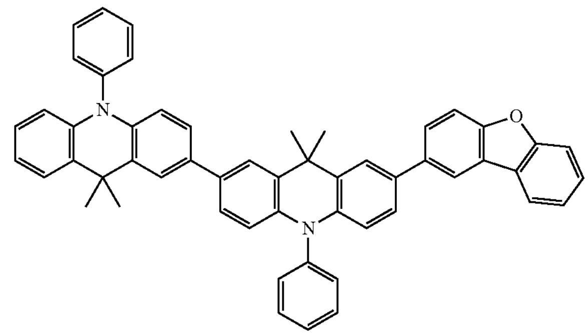
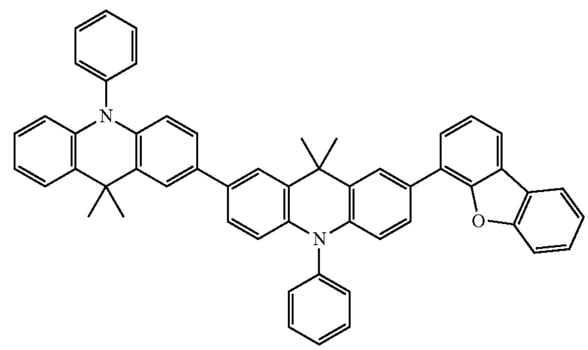
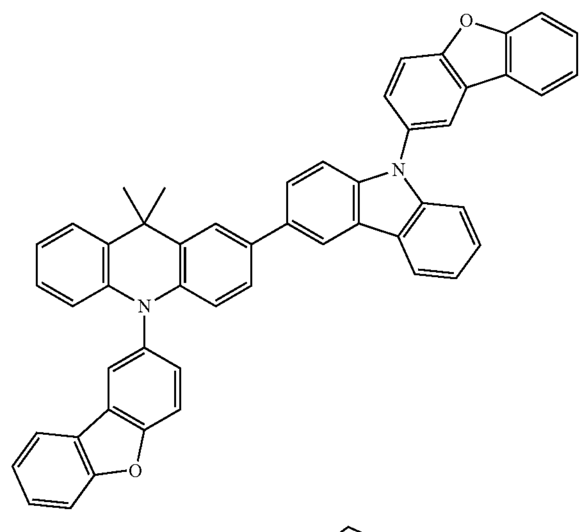
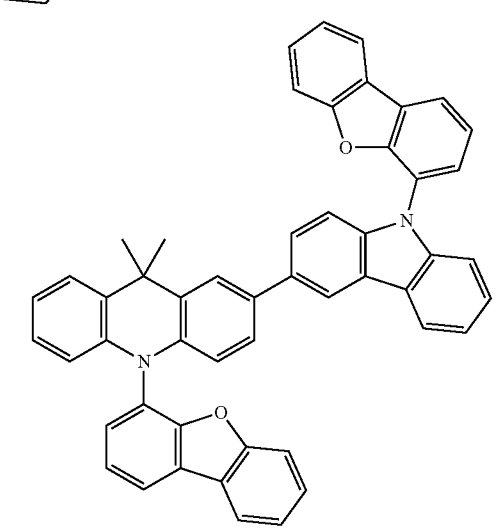

-continued
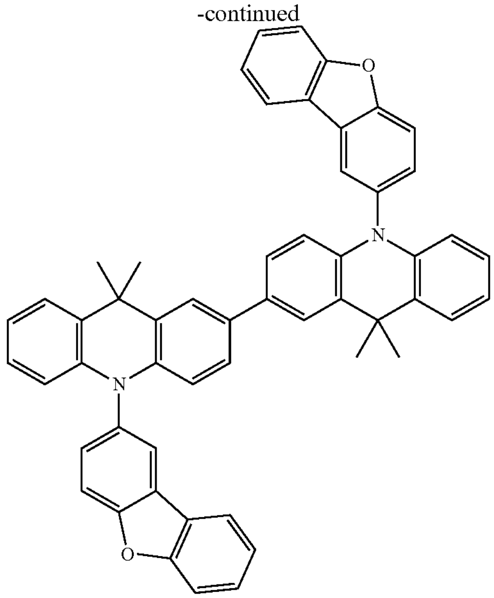
-continued
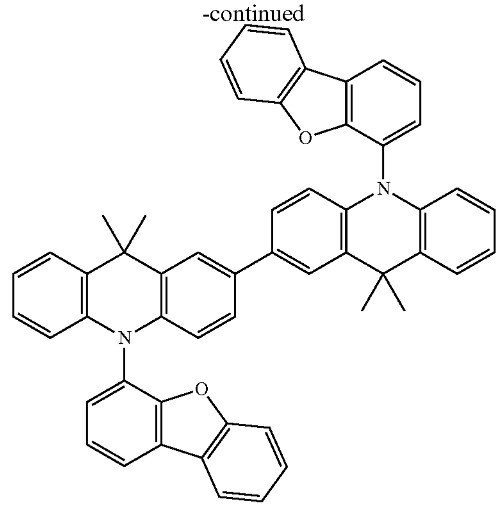
Examples of the aromatic heterocyclic derivative B represented by formula (2-1) are shown below, although not limited to the following compounds.
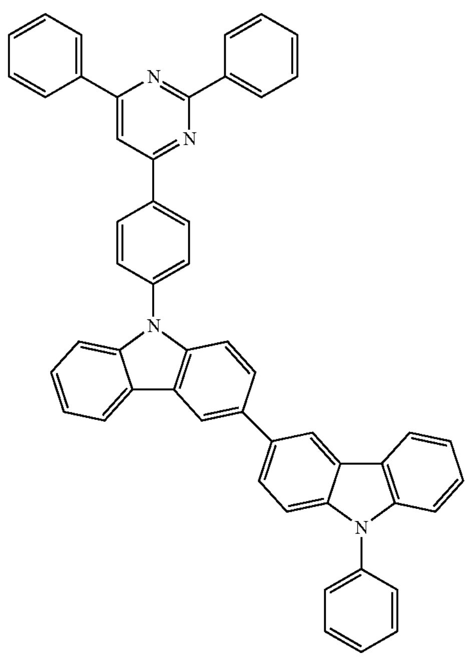
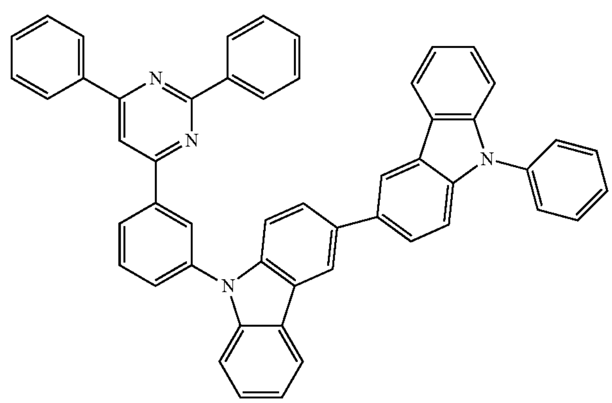

-continued
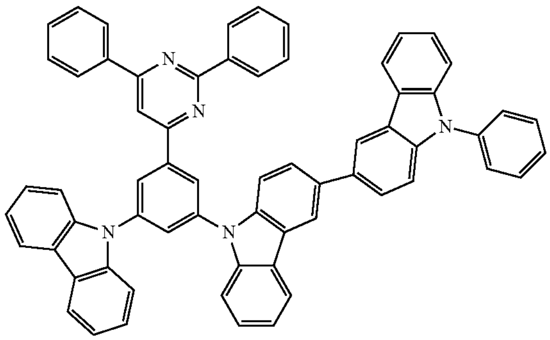
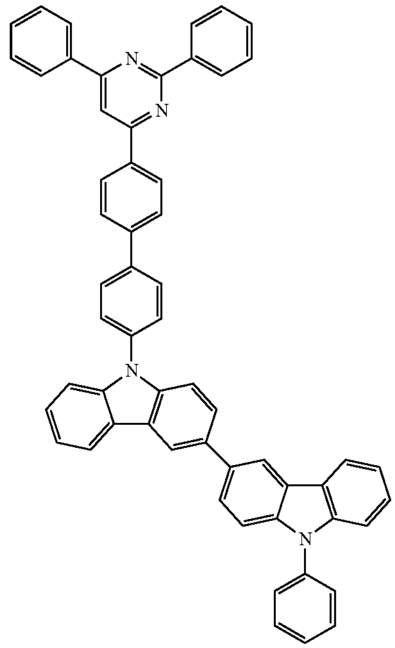
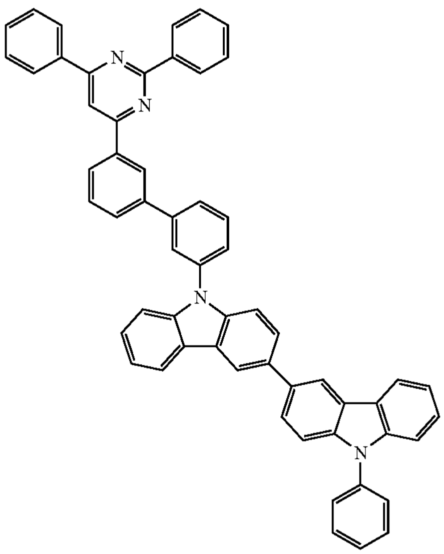
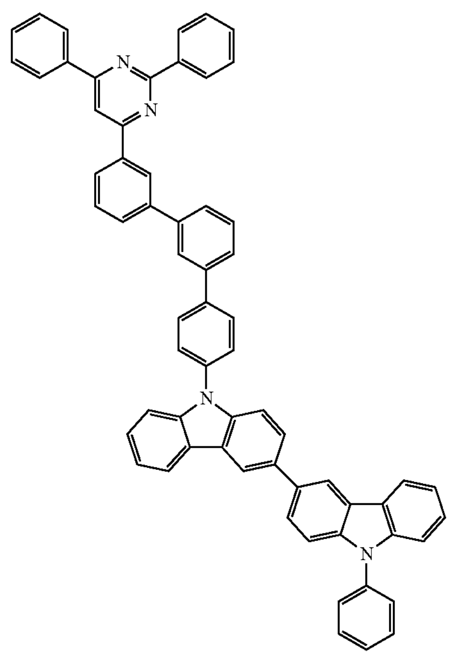

-continued
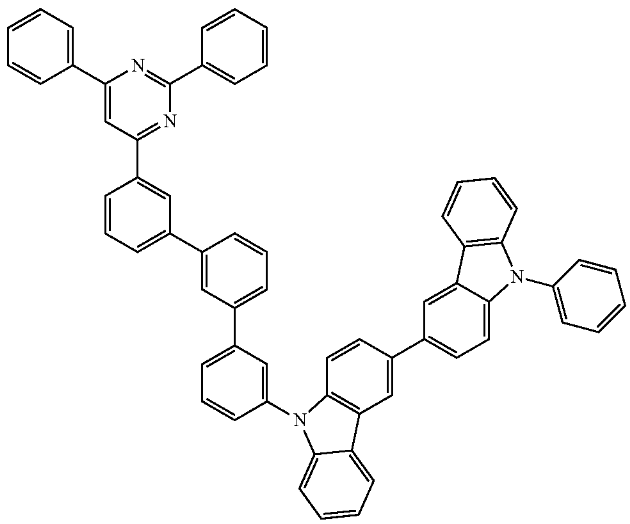
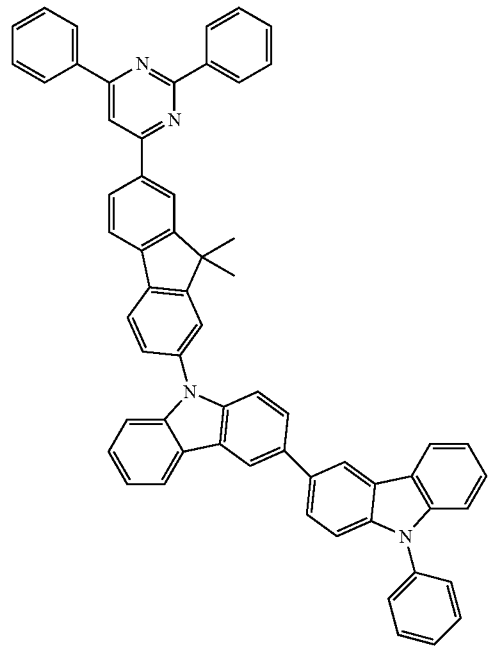
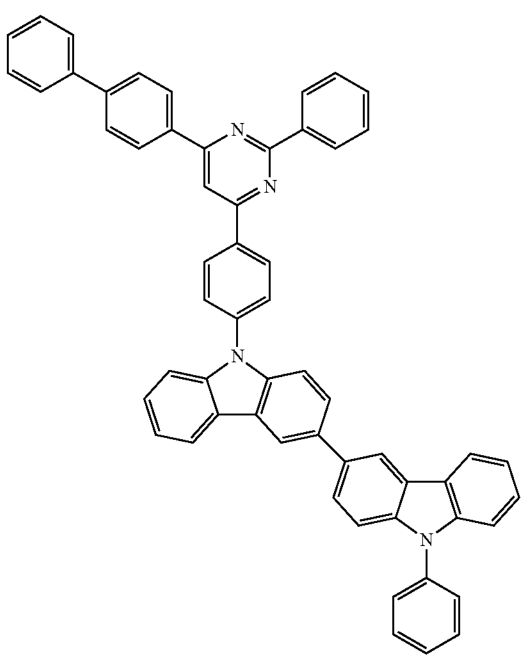
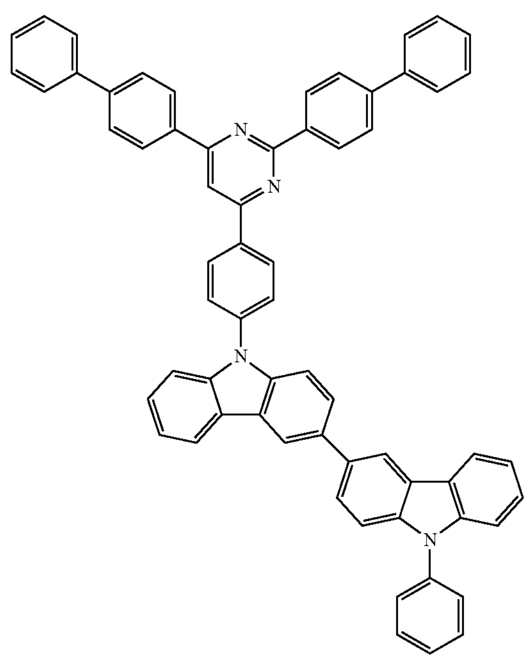

-continued
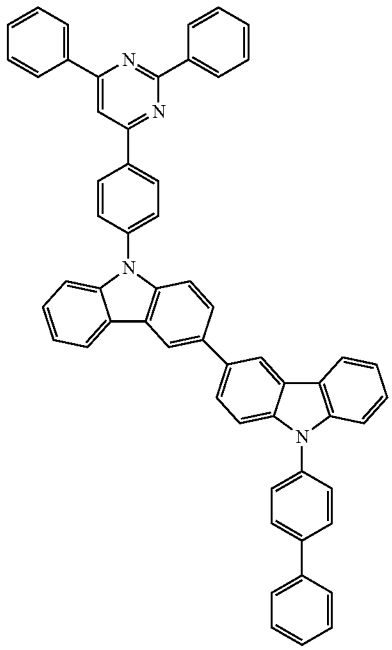
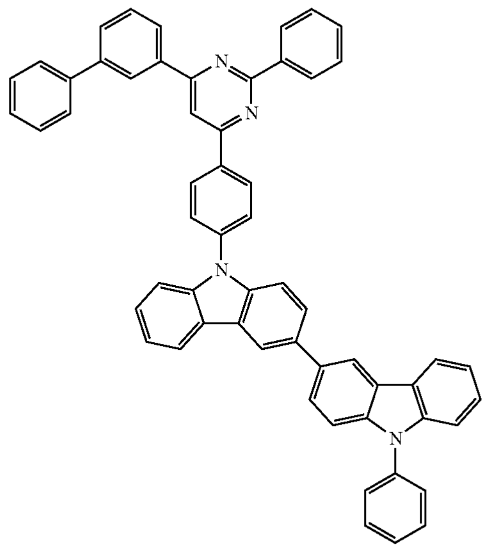
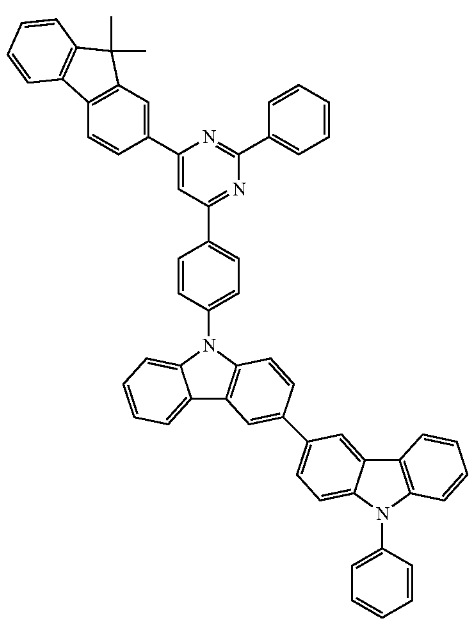
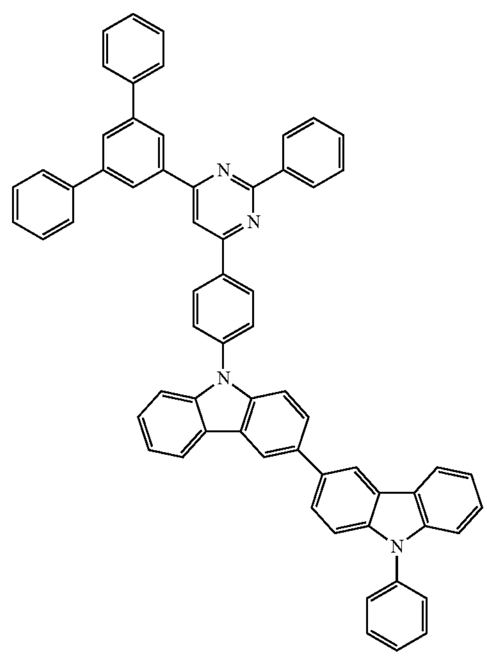

-continued
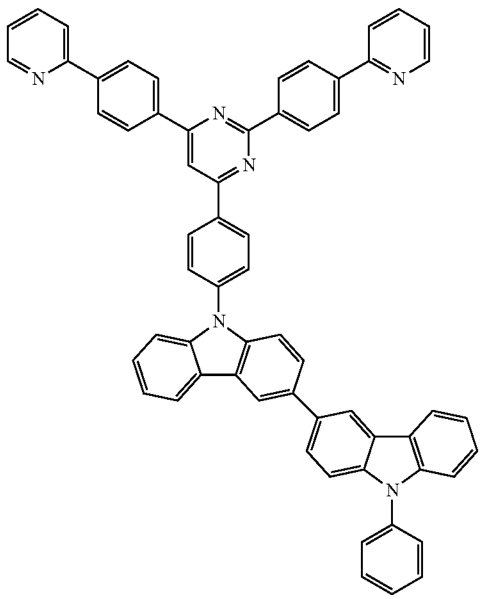
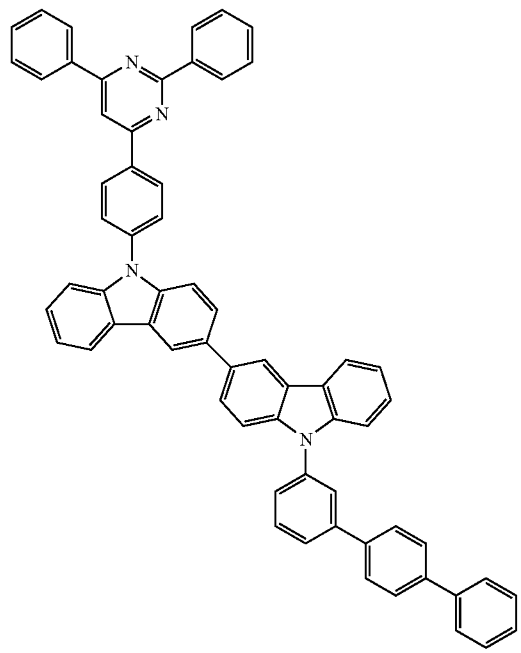
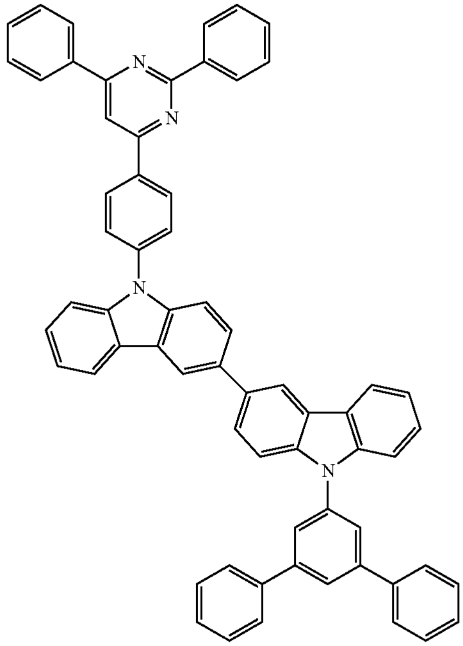
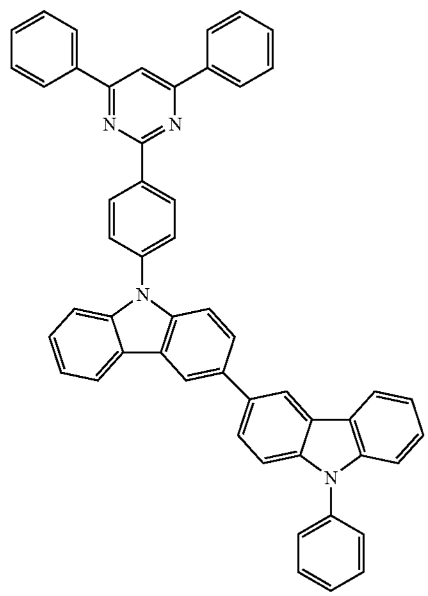
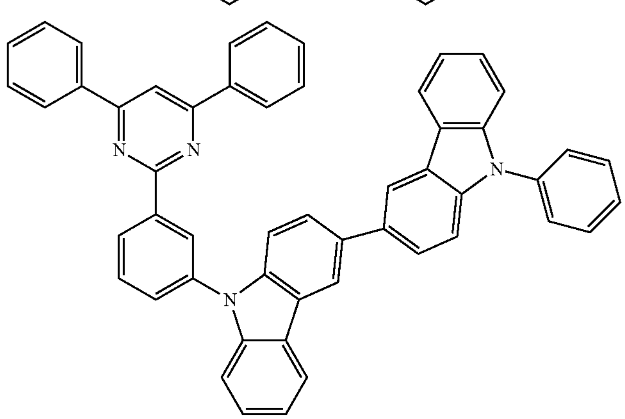

-continued
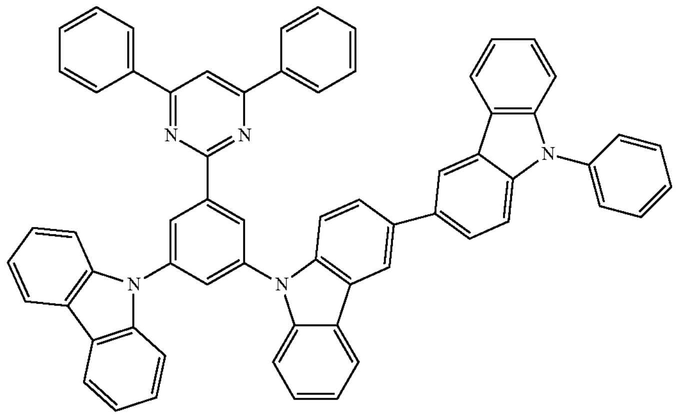
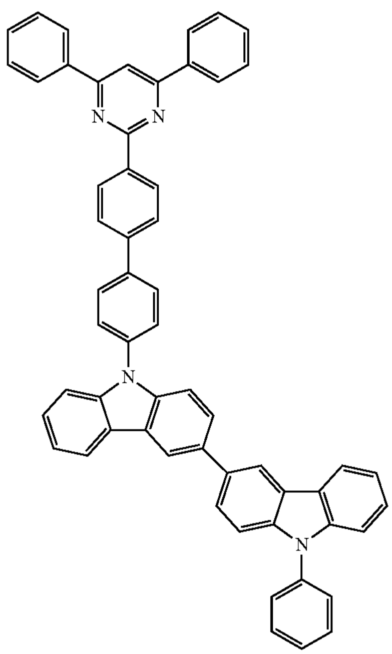
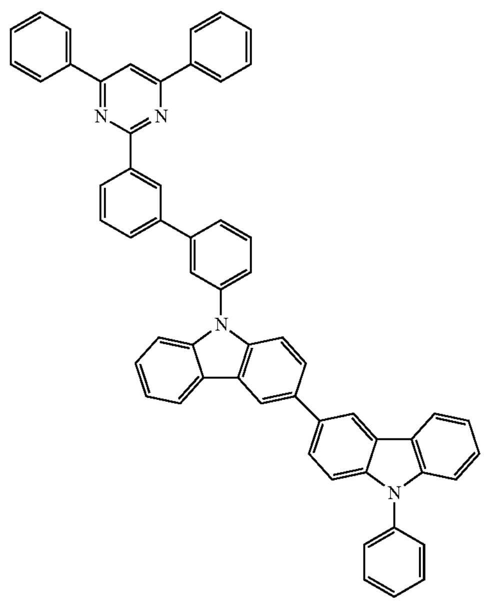
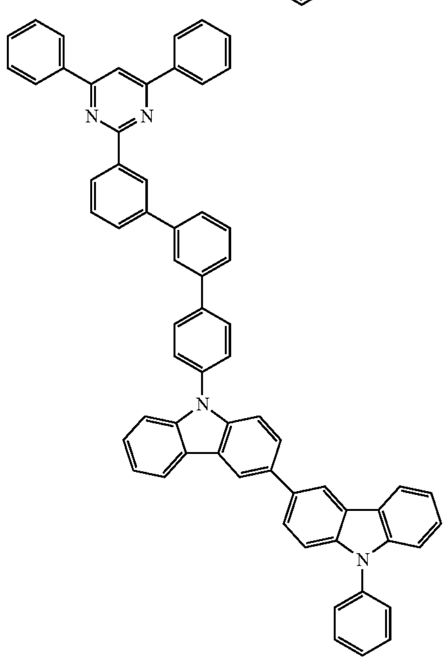
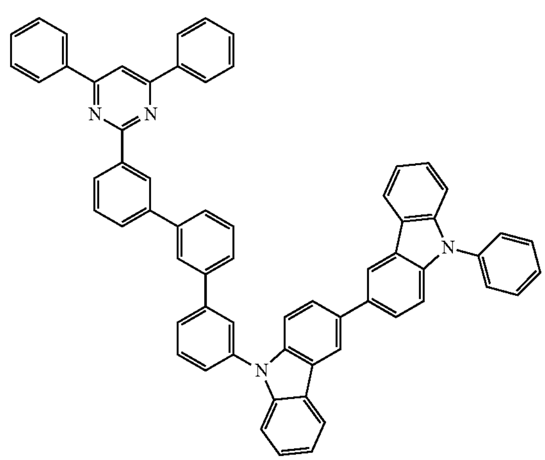

-continued
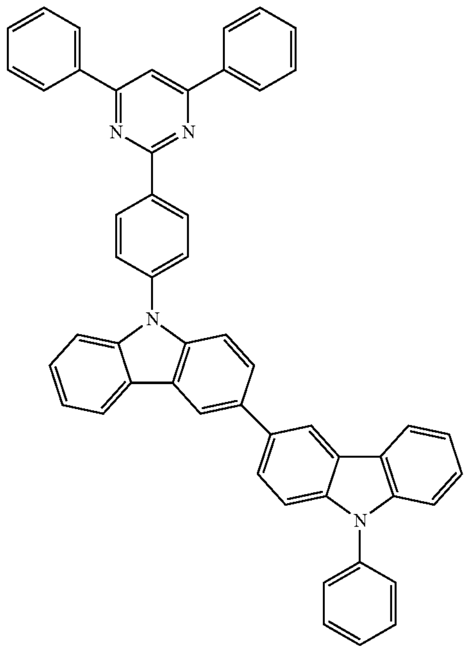
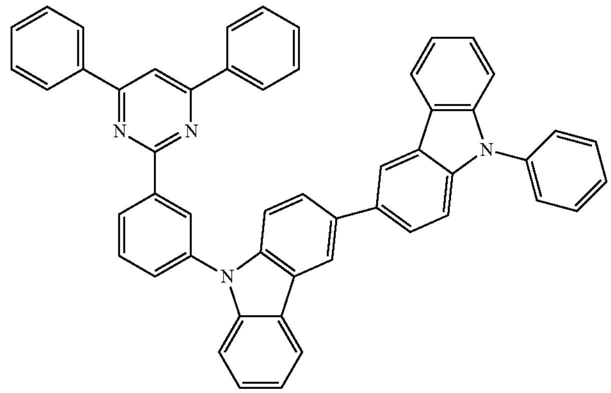
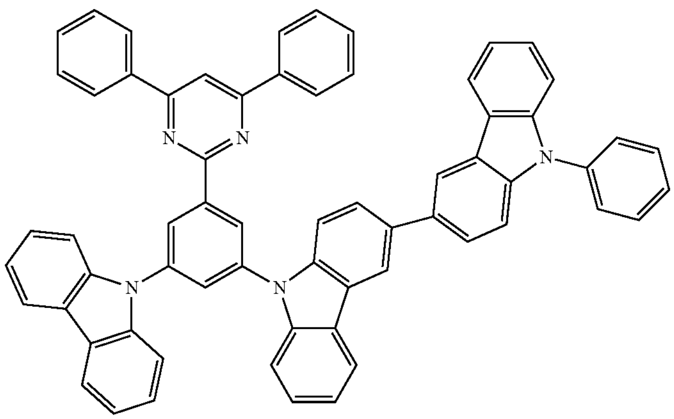
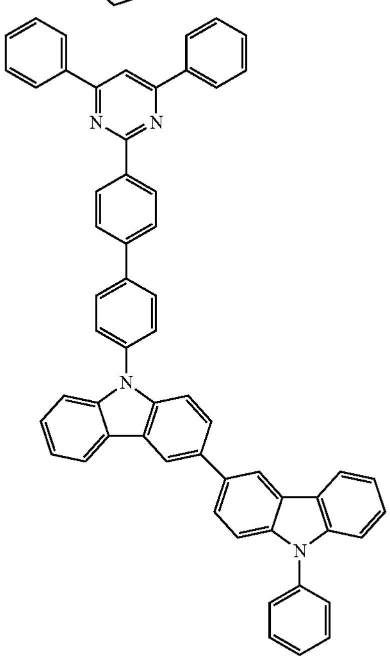
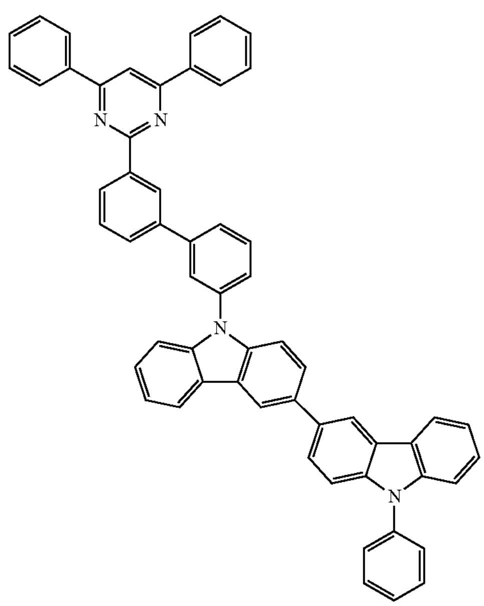

-continued
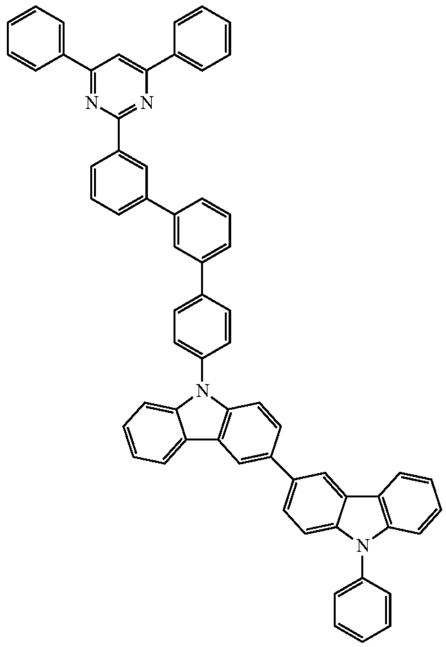
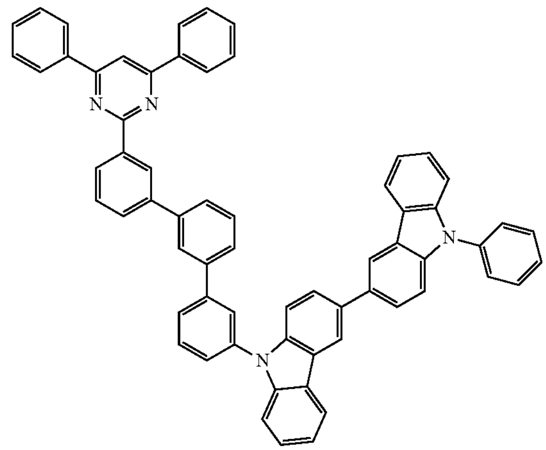
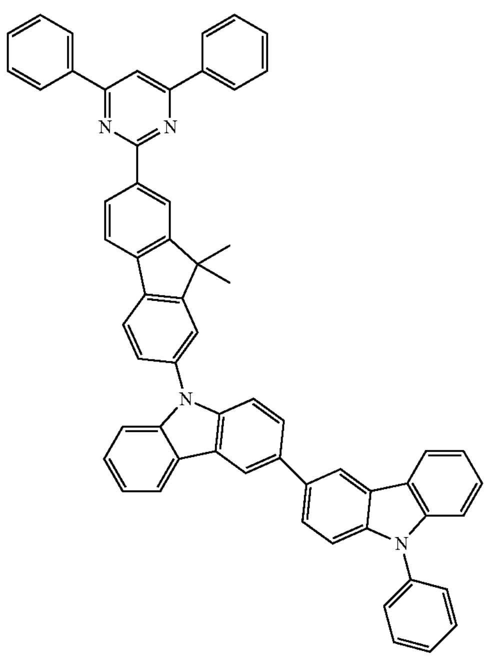
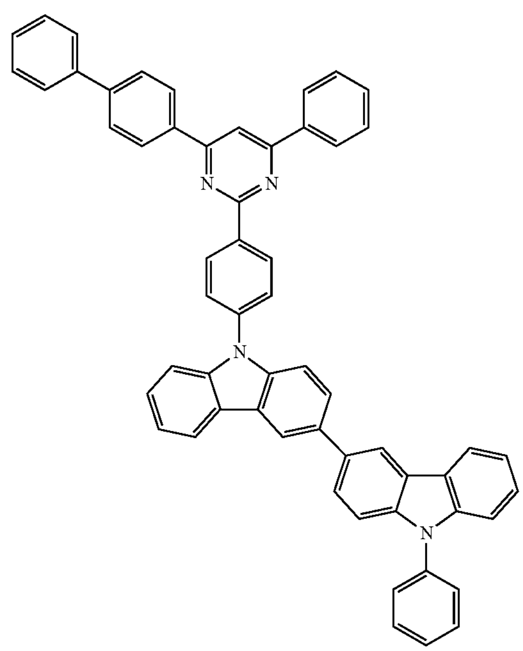

-continued
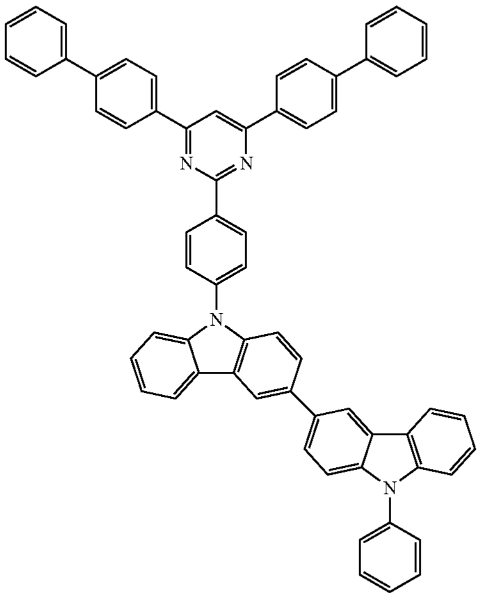
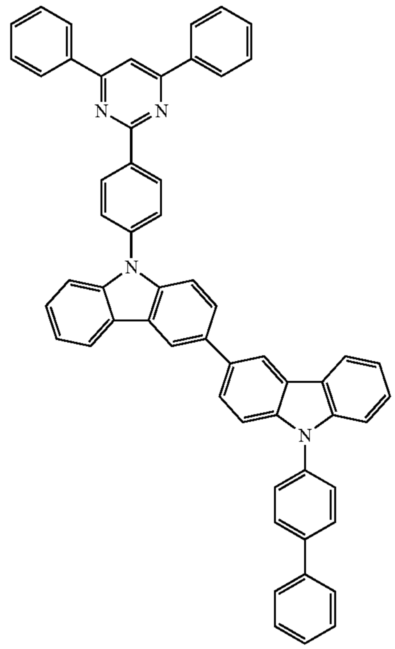
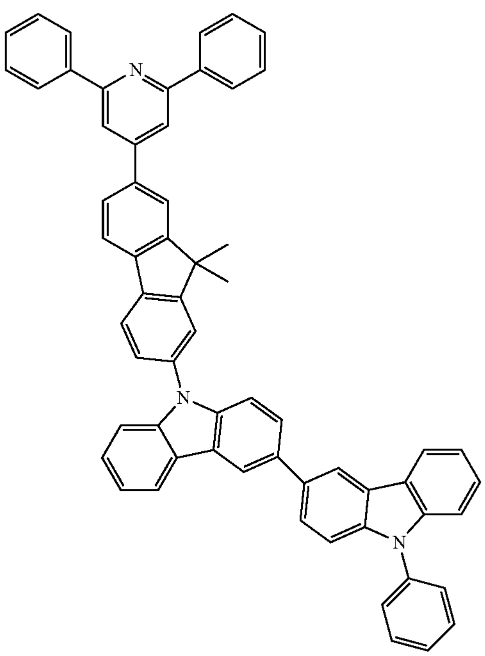
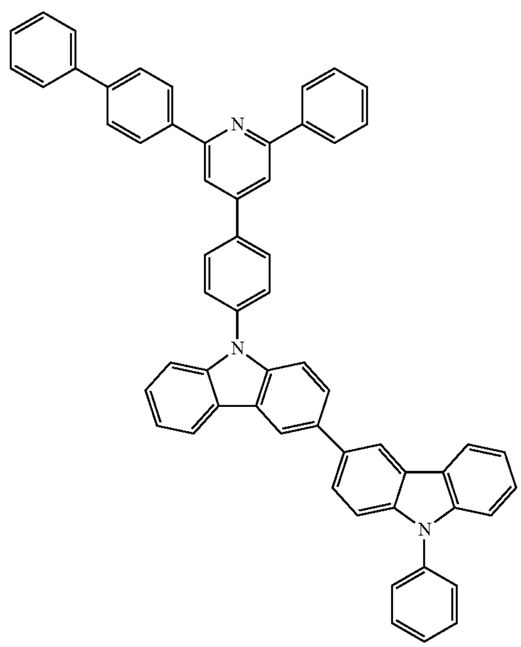

-continued
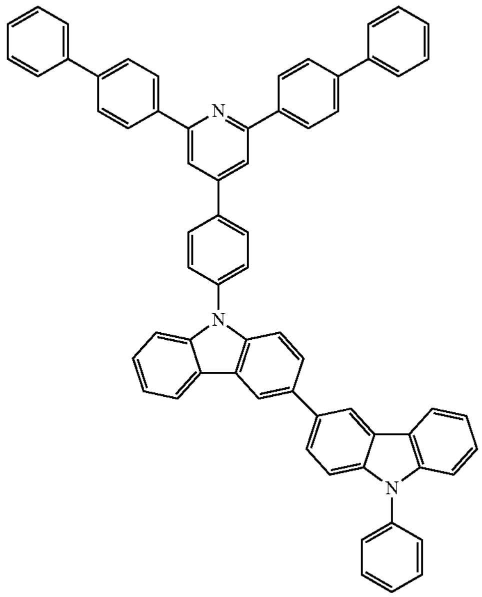
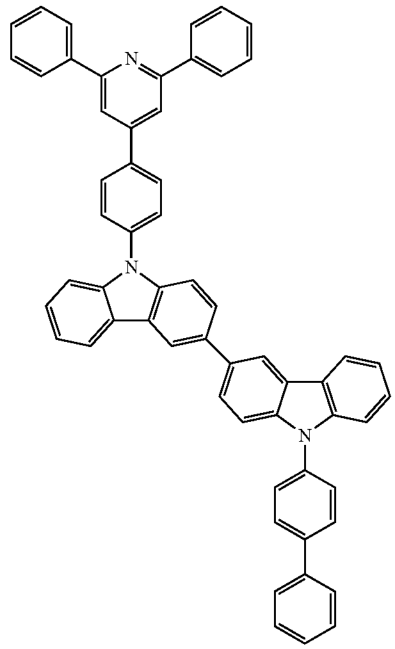
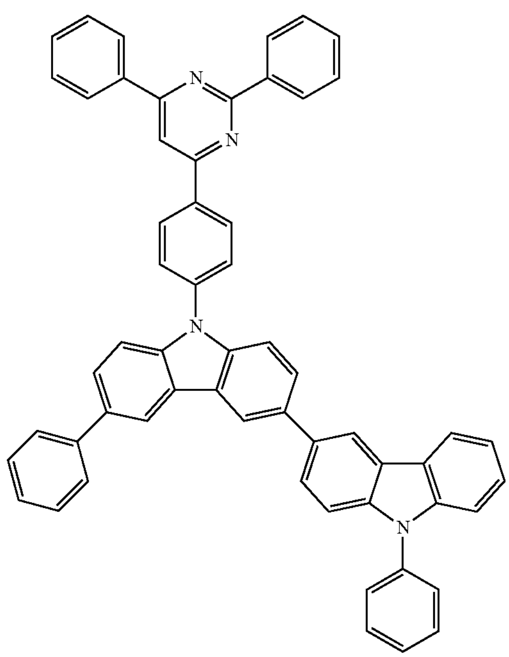
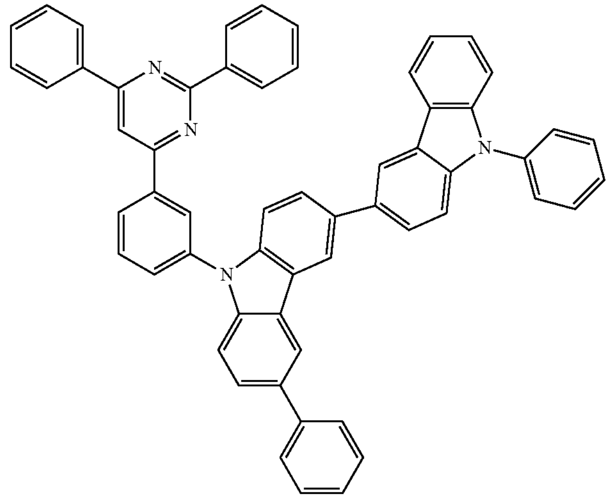

-continued
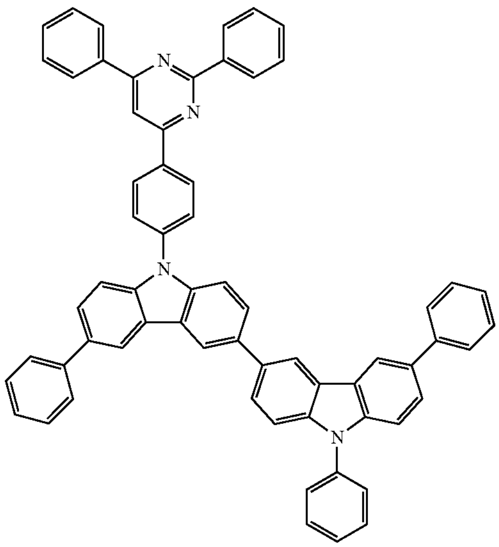
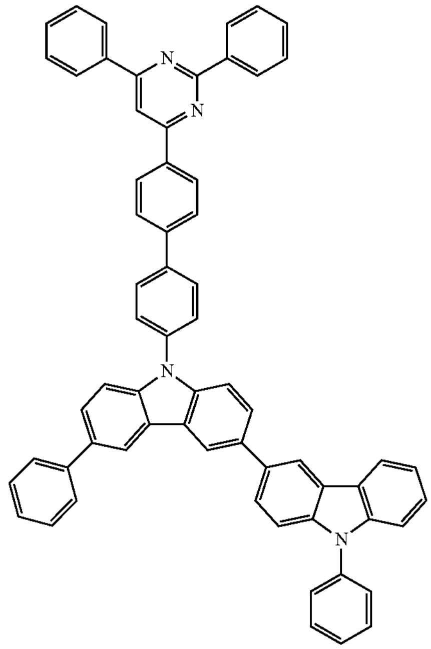
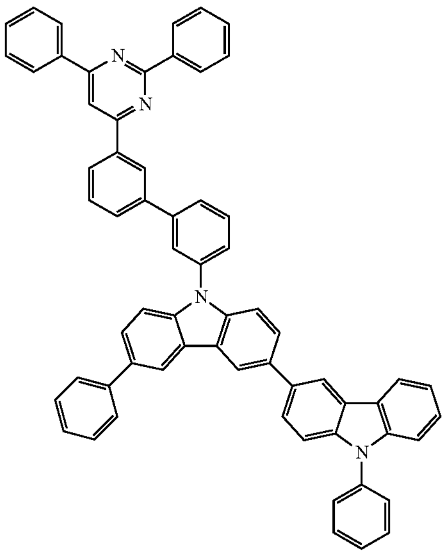
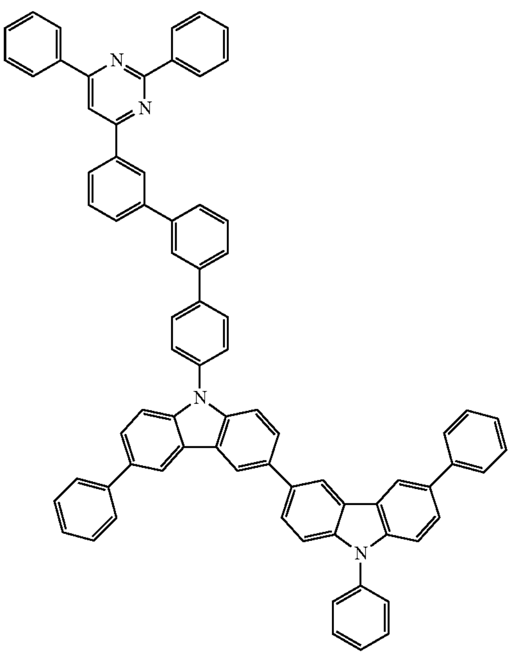

-continued
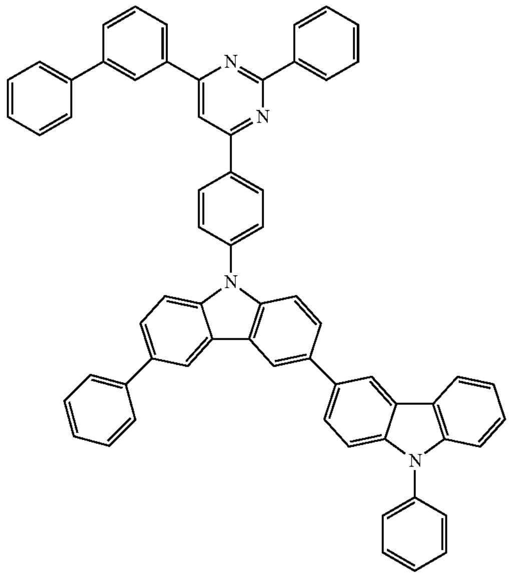
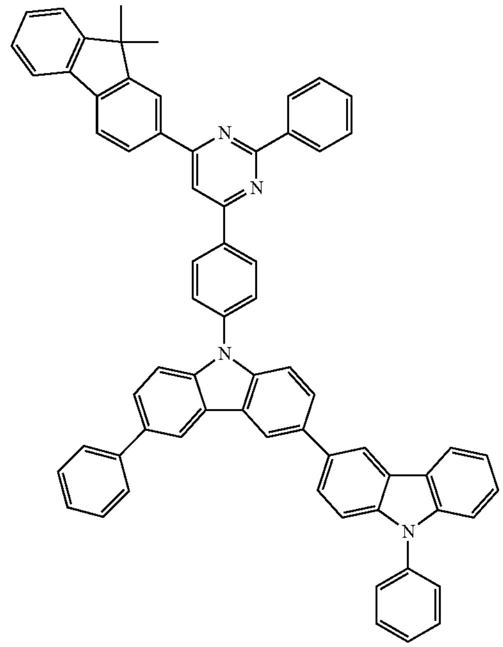
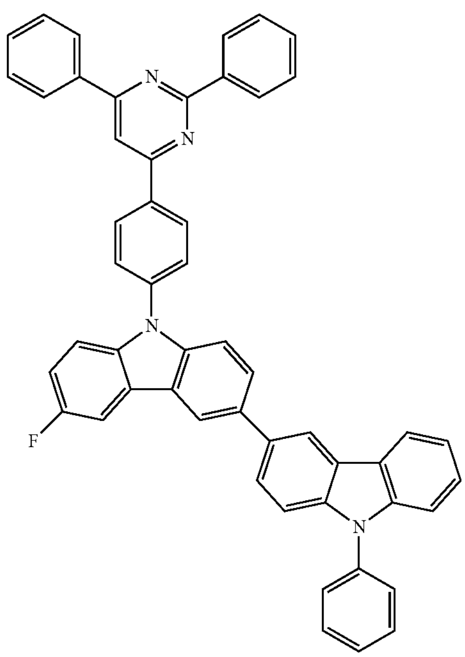
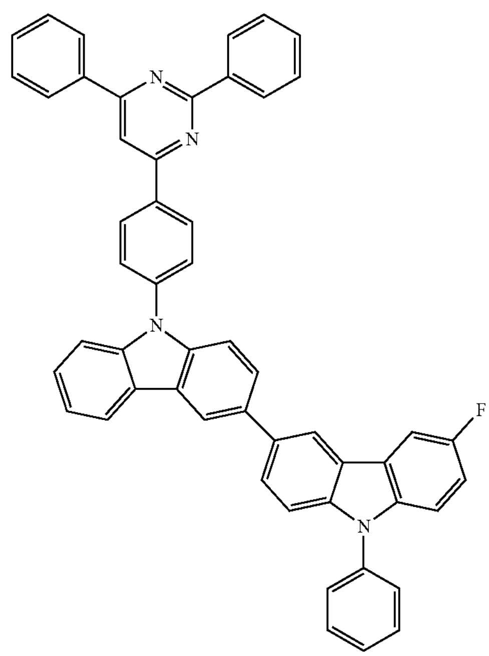

-continued
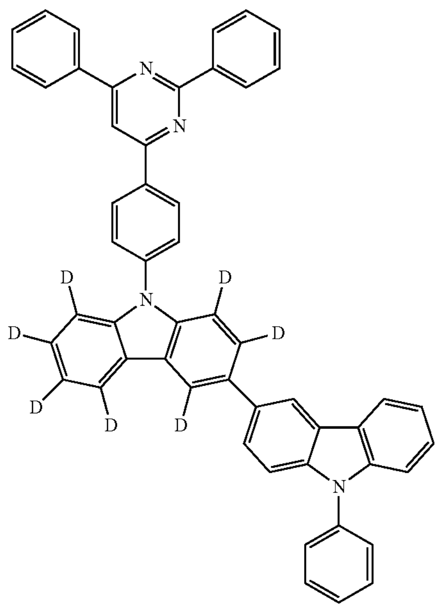
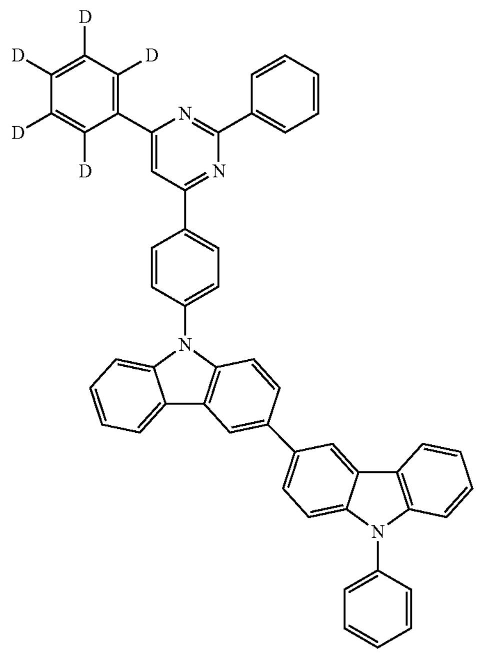
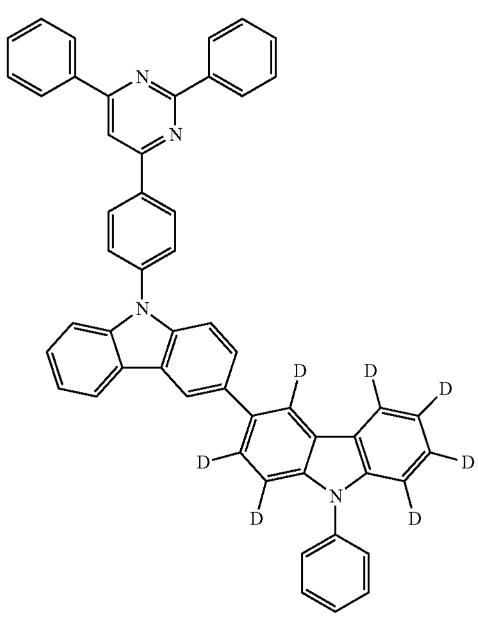
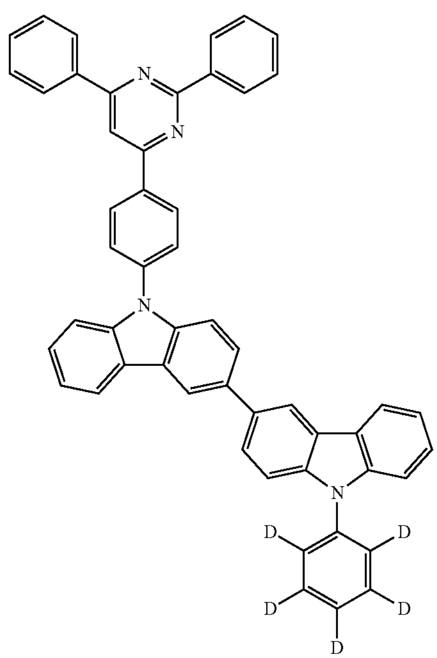

-continued
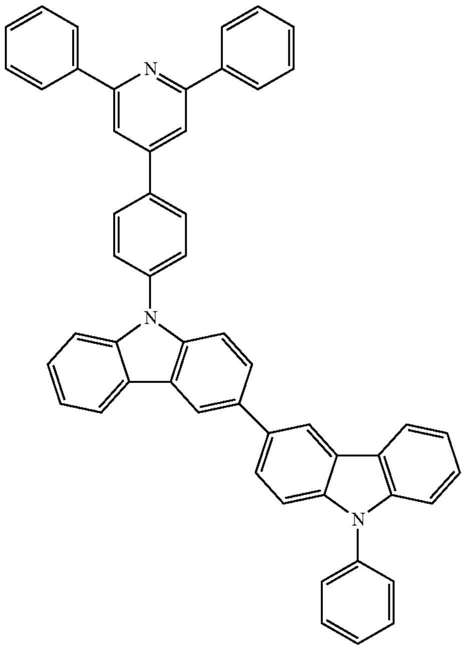
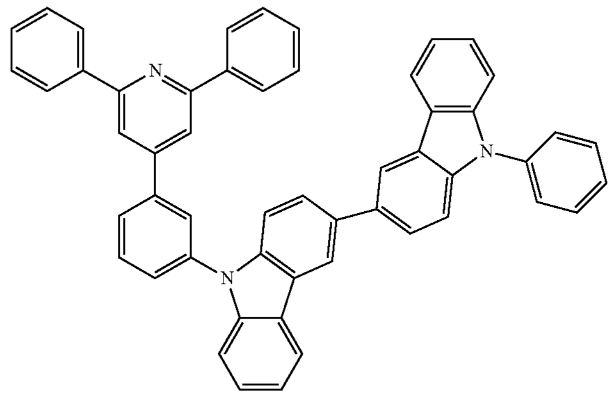
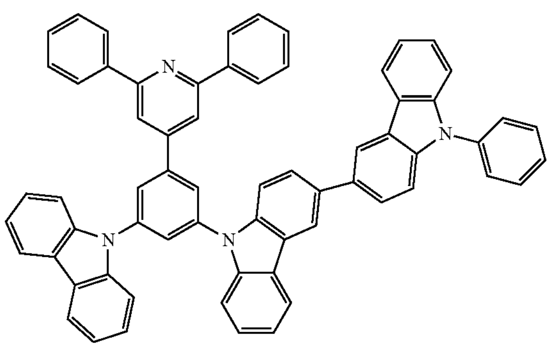
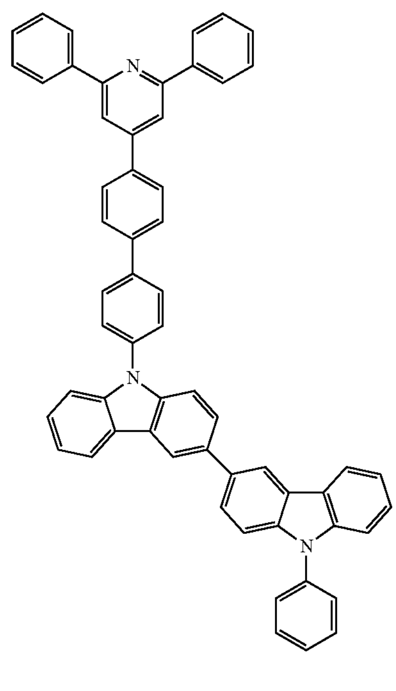

-continued
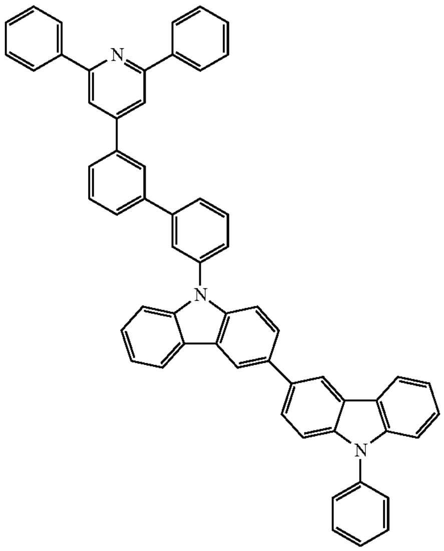
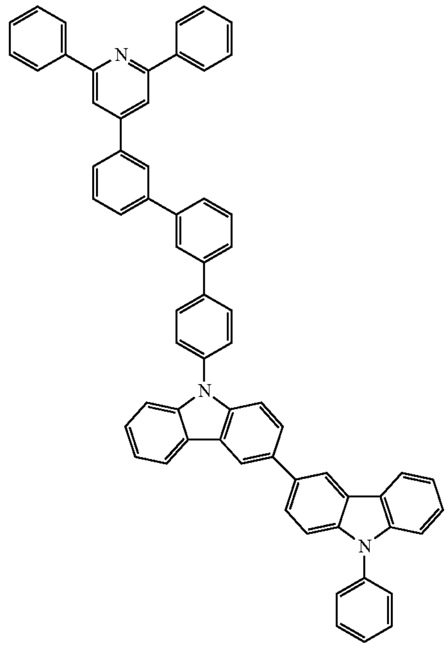
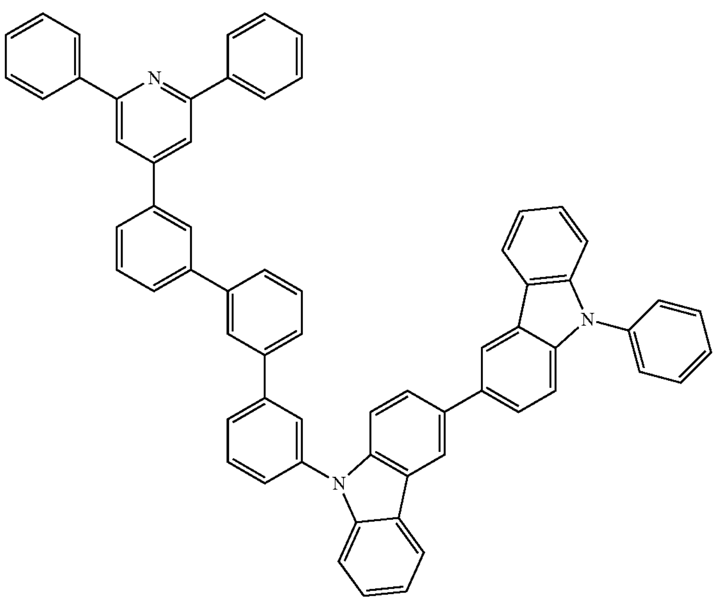

-continued
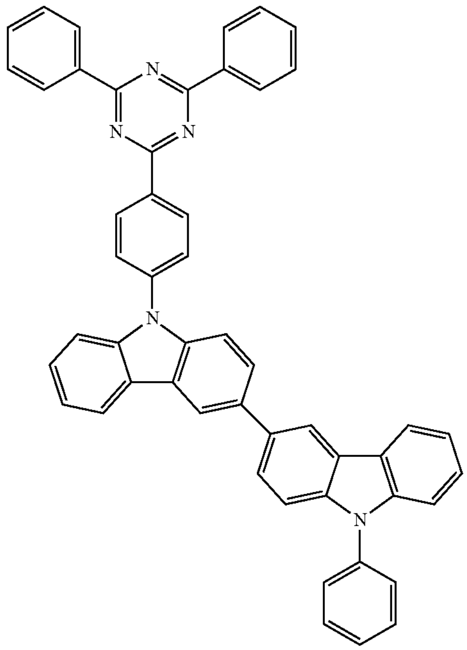
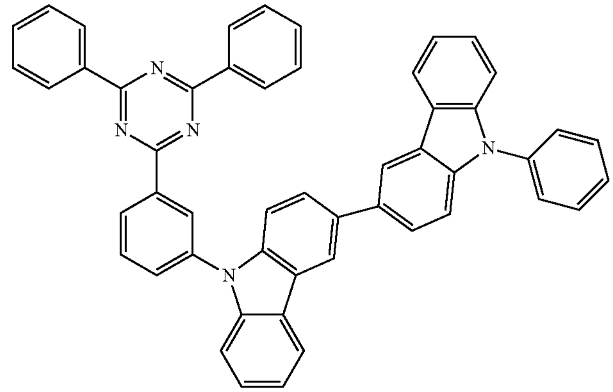
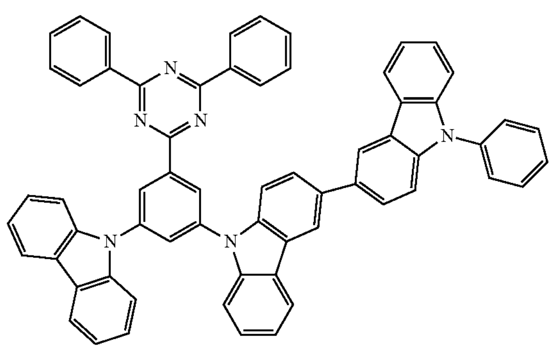
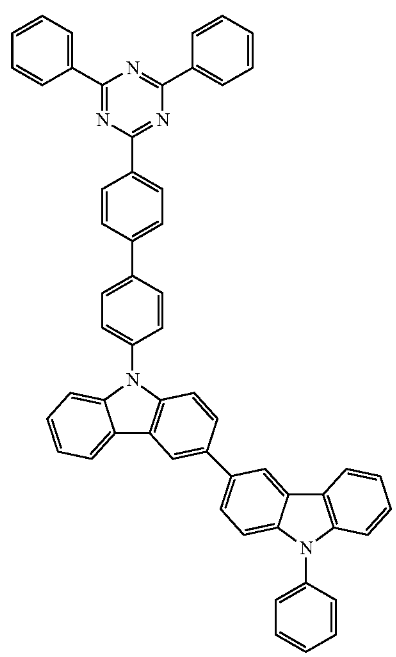

-continued
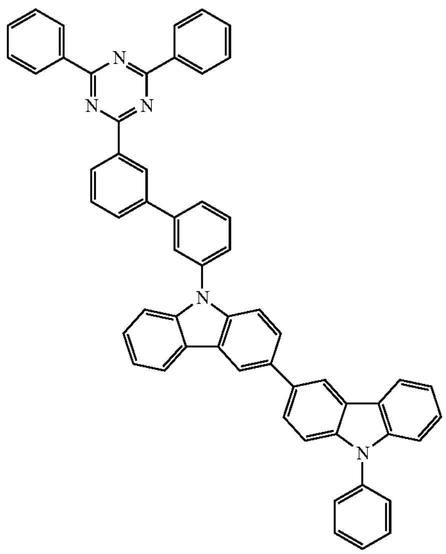
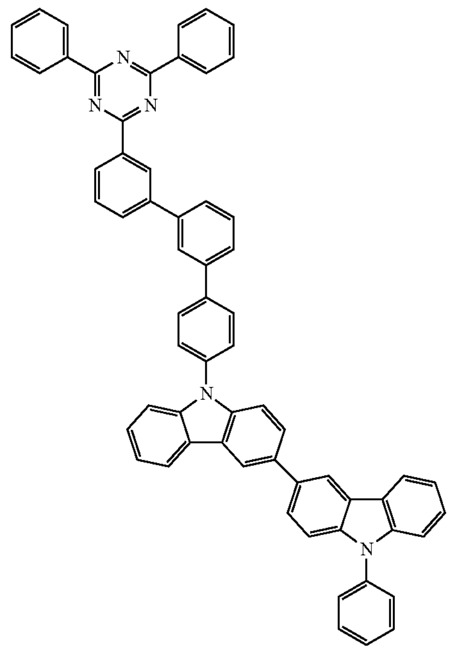
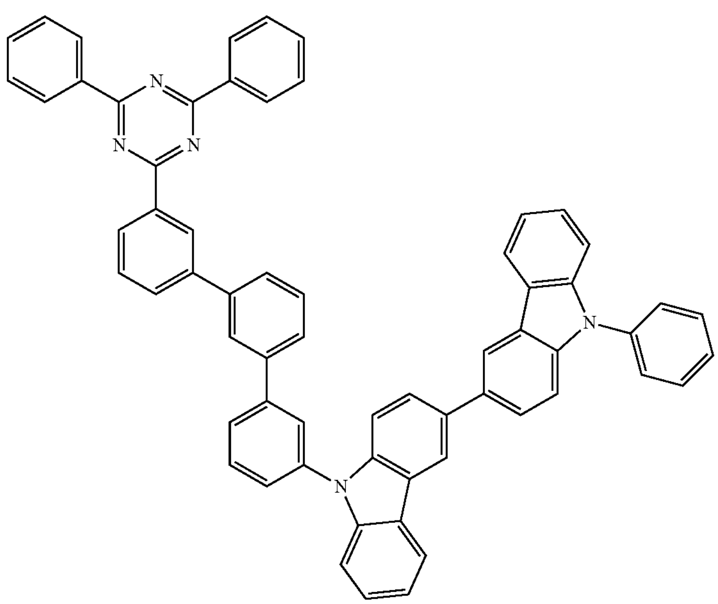

-continued
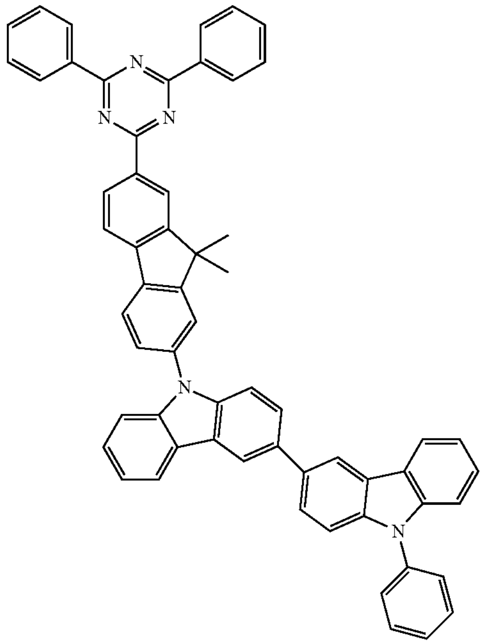
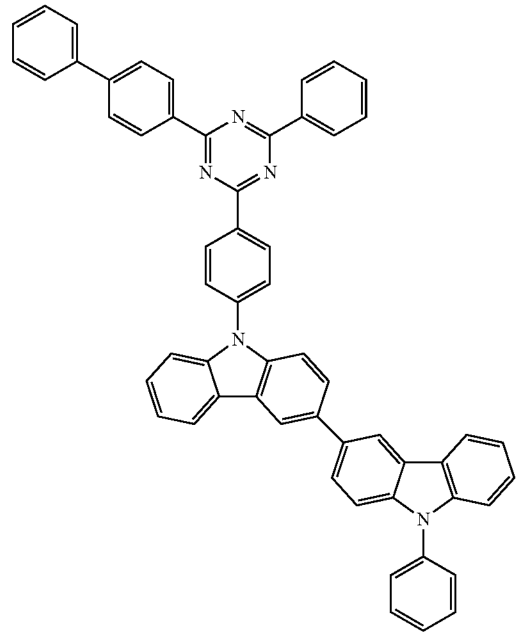
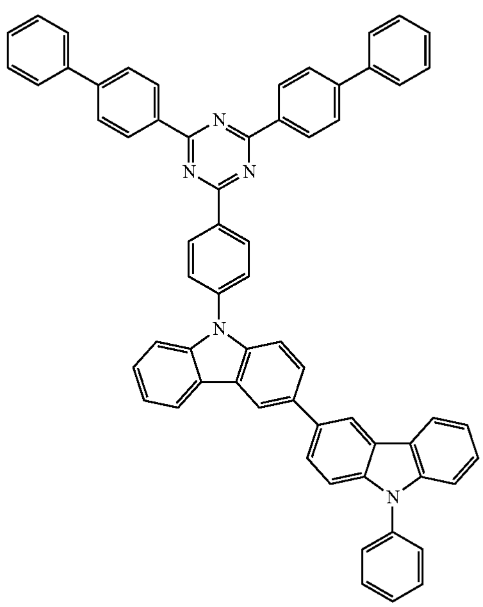
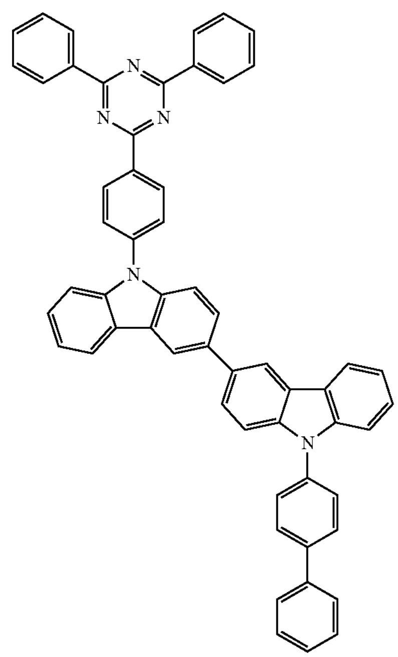

-continued
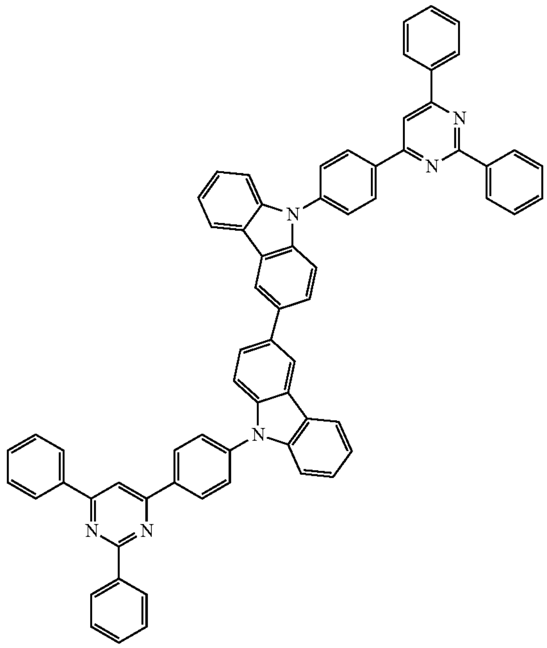
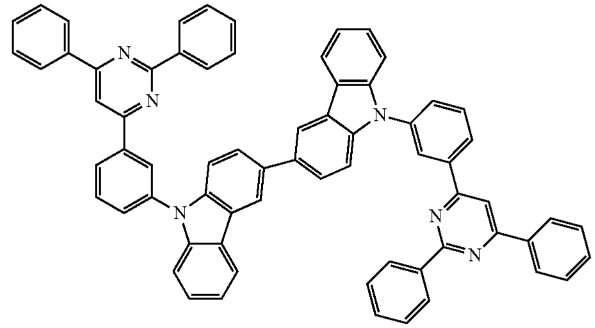
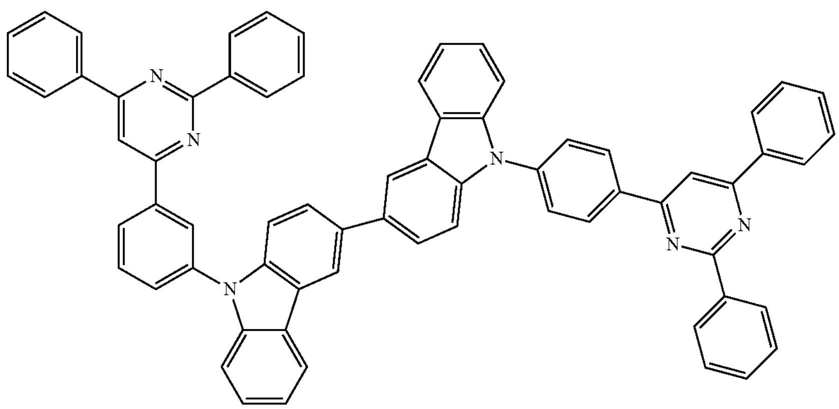
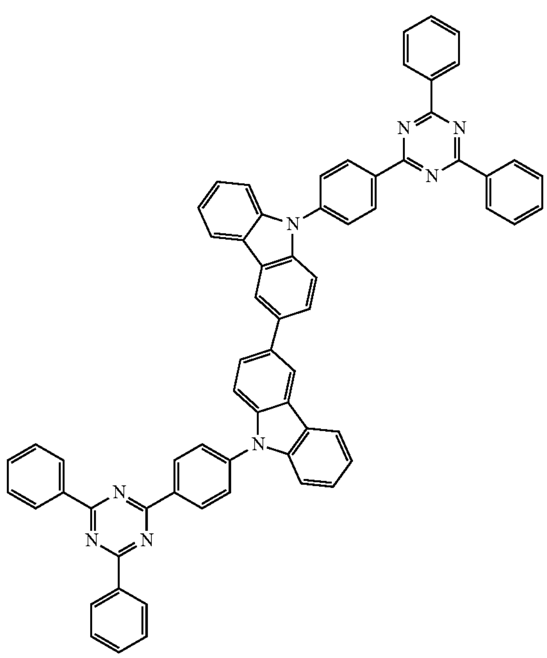
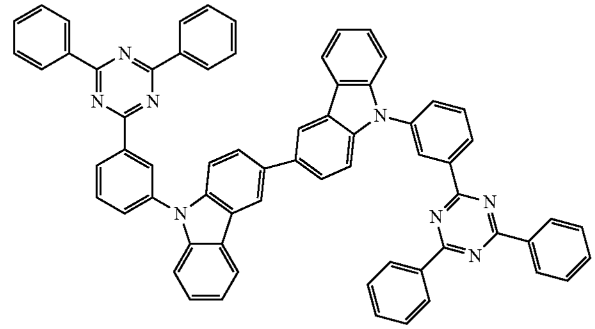

-continued
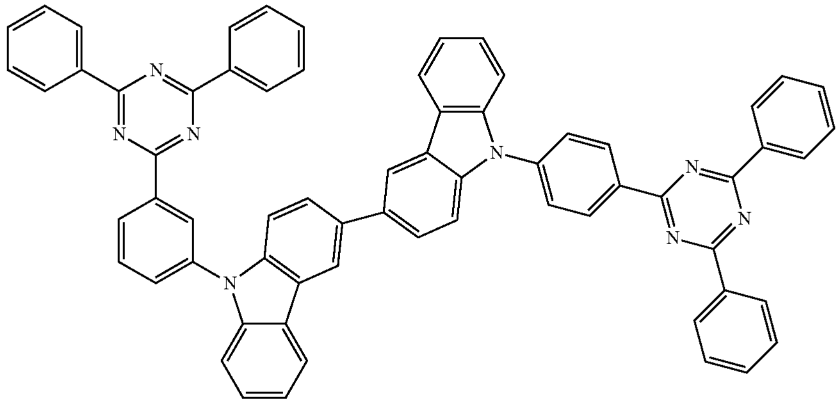
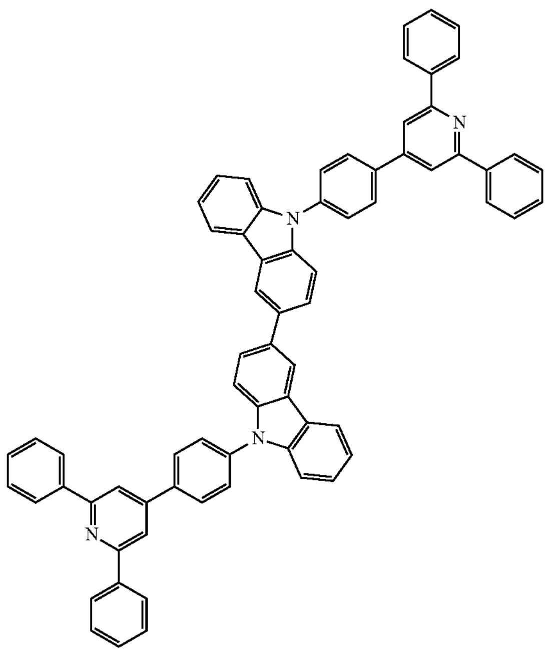
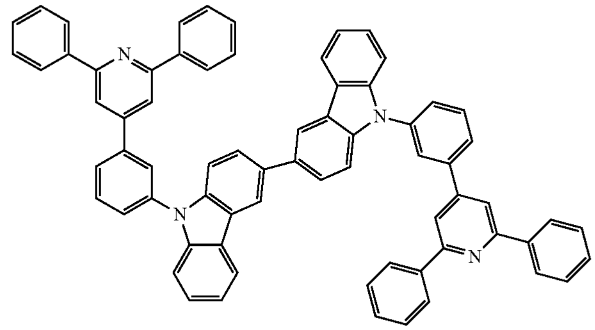
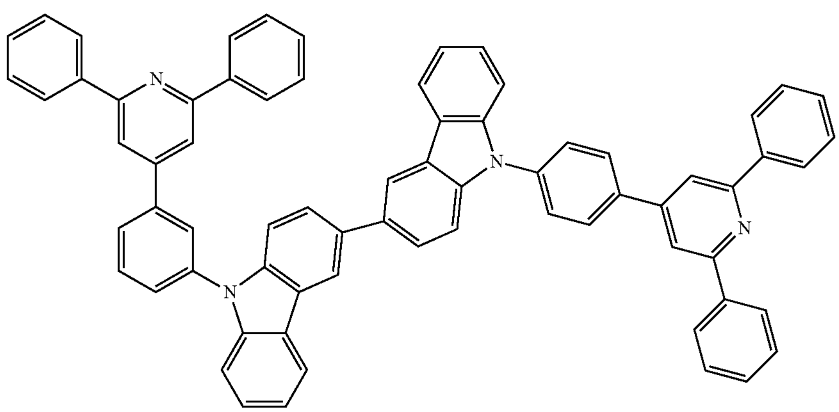

-continued
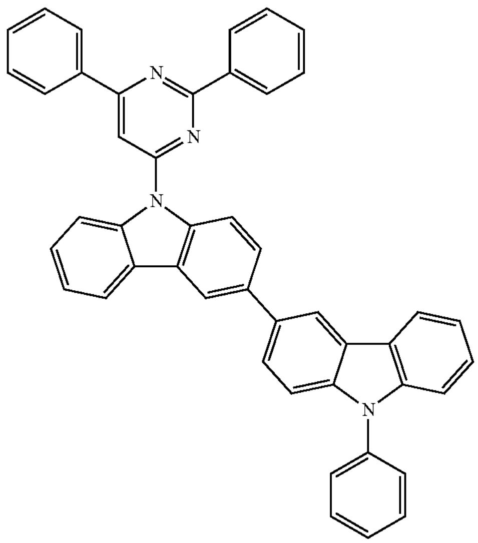
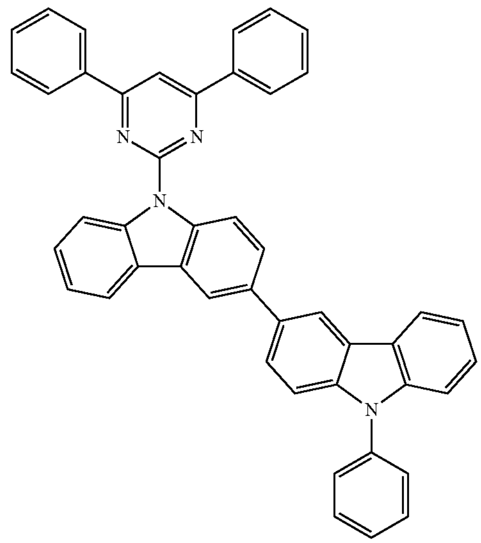
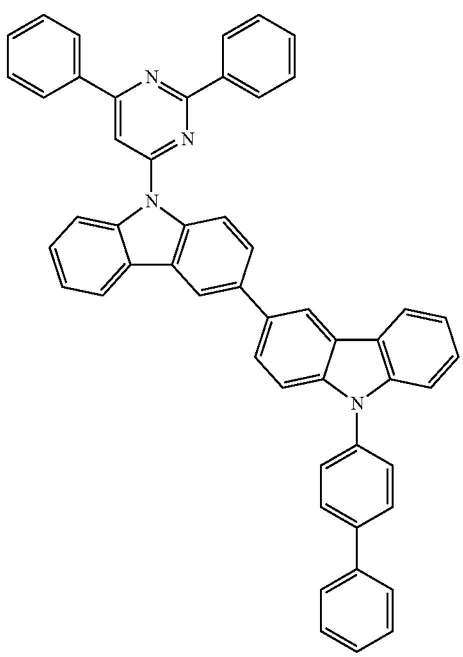
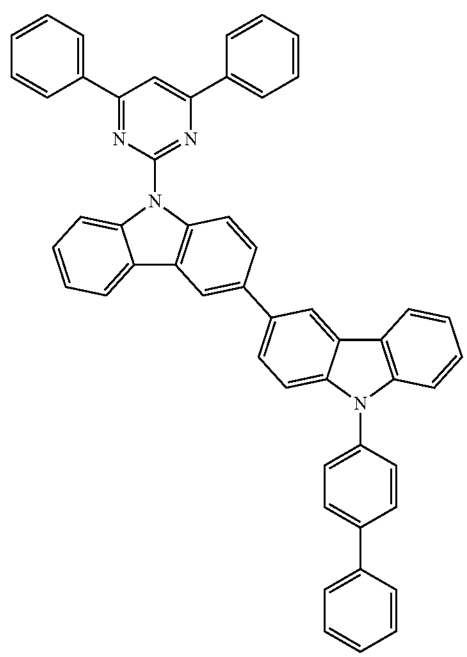

-continued
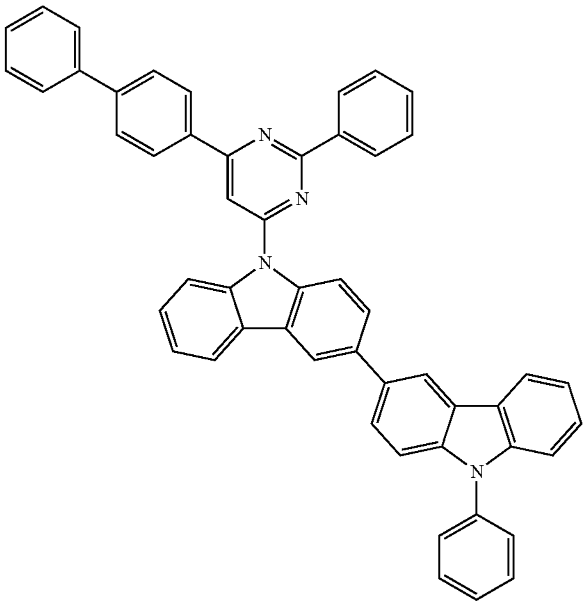
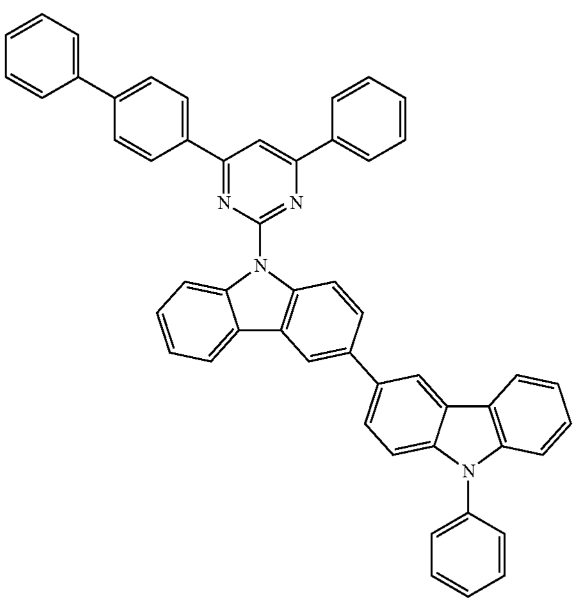
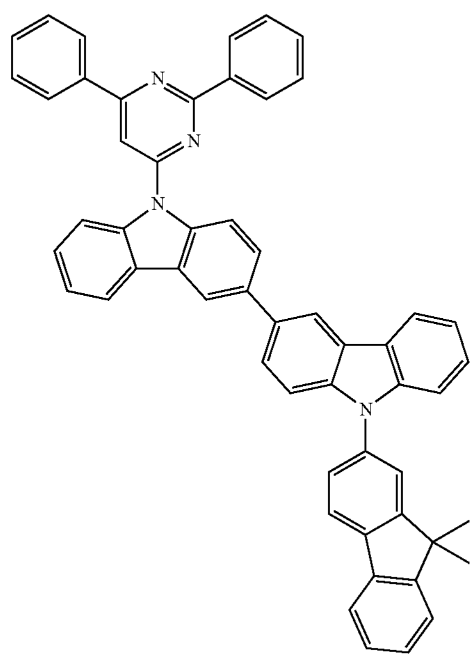

-continued
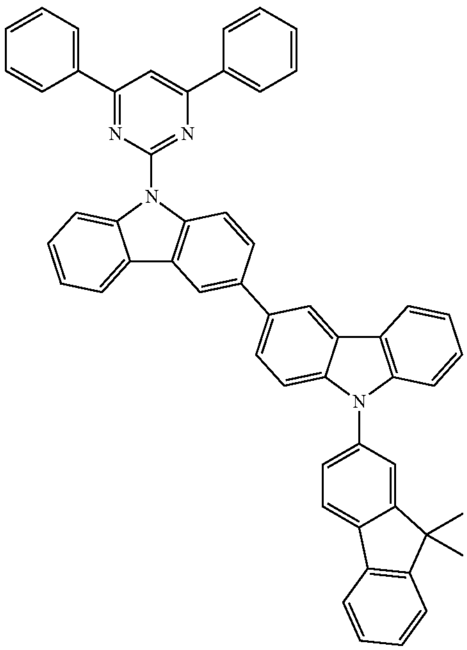
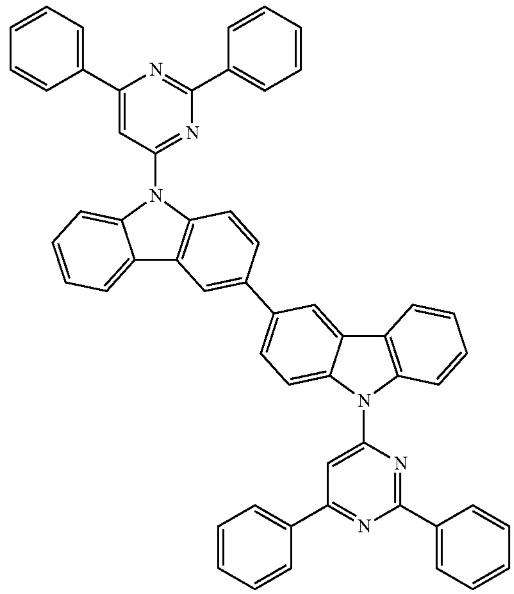
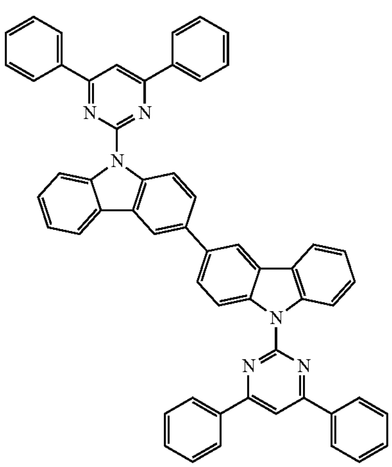
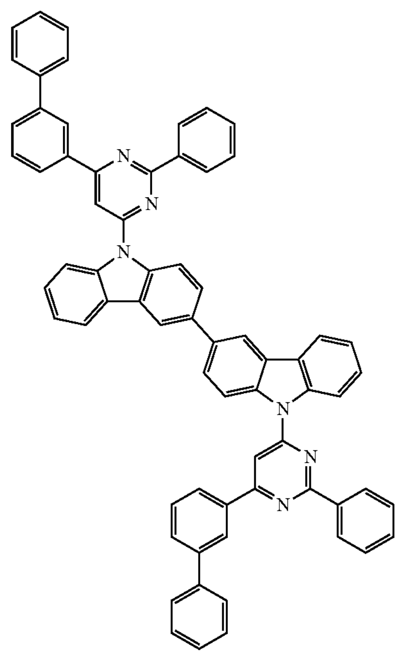

-continued
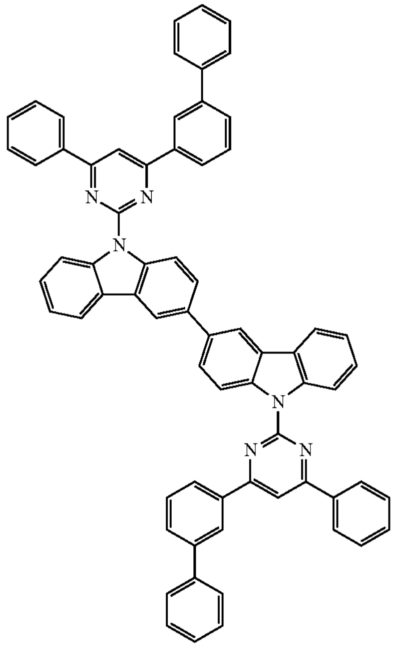
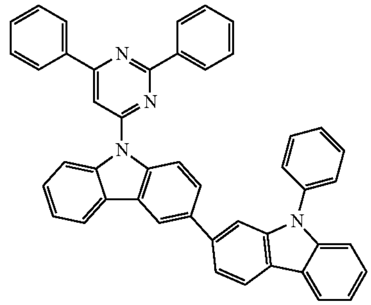
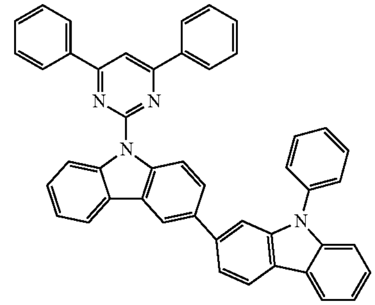
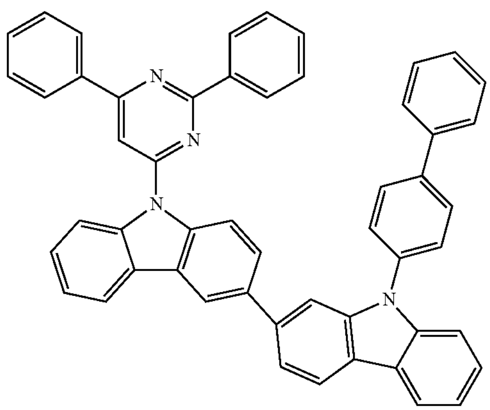
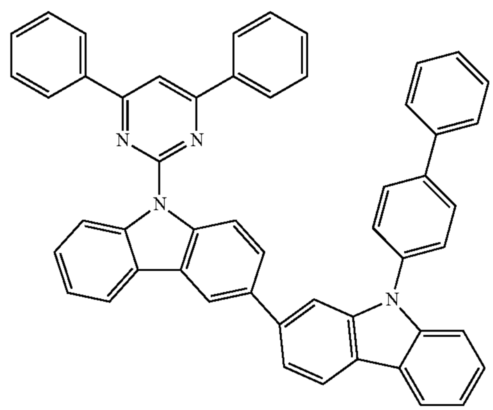
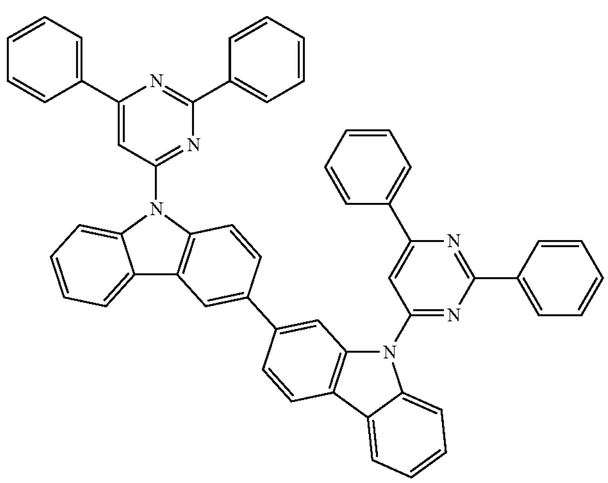

-continued
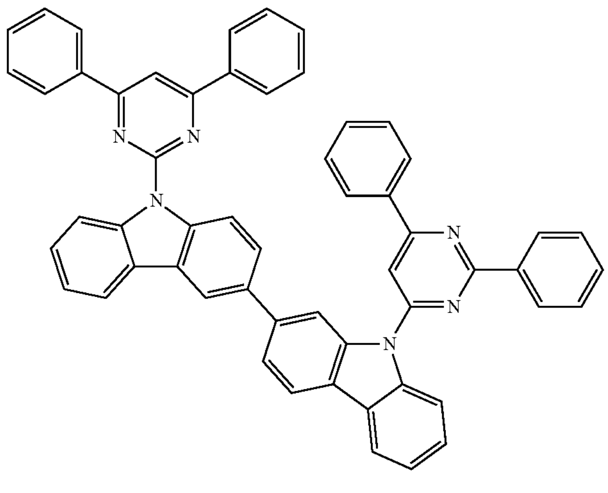
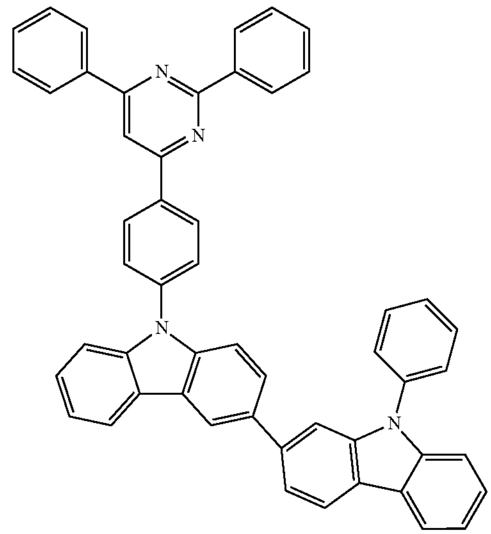
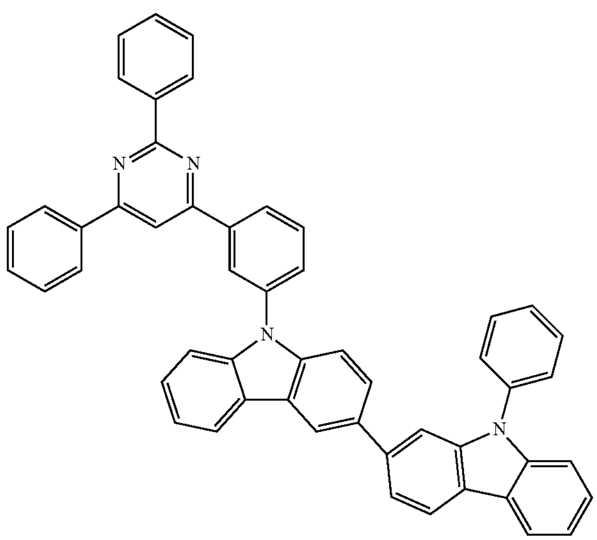
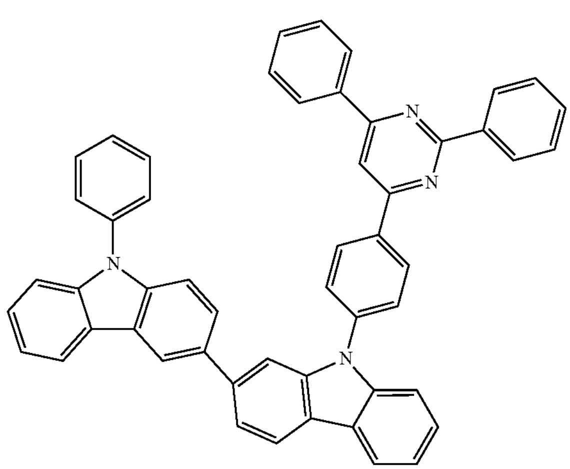

-continued
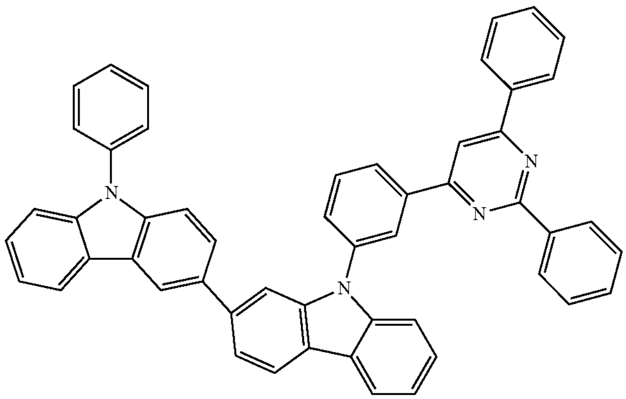
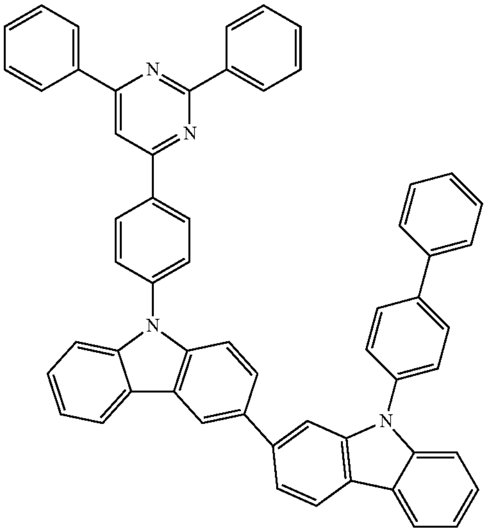
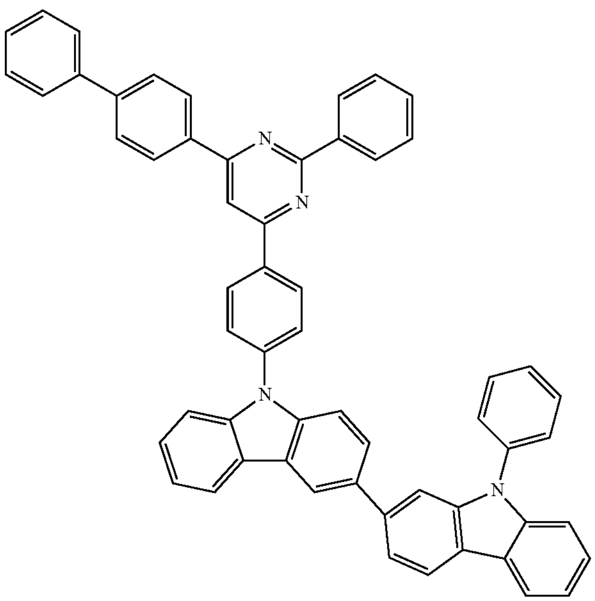
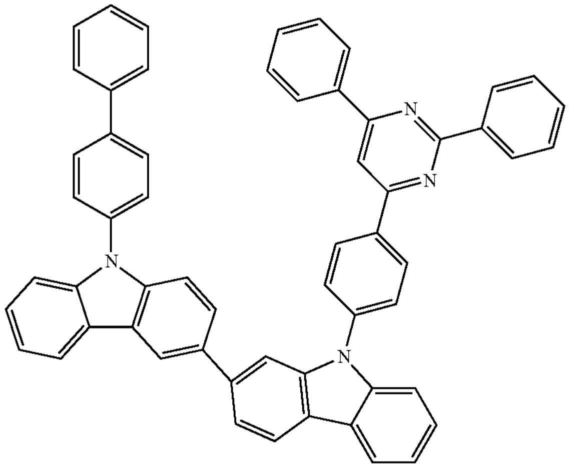
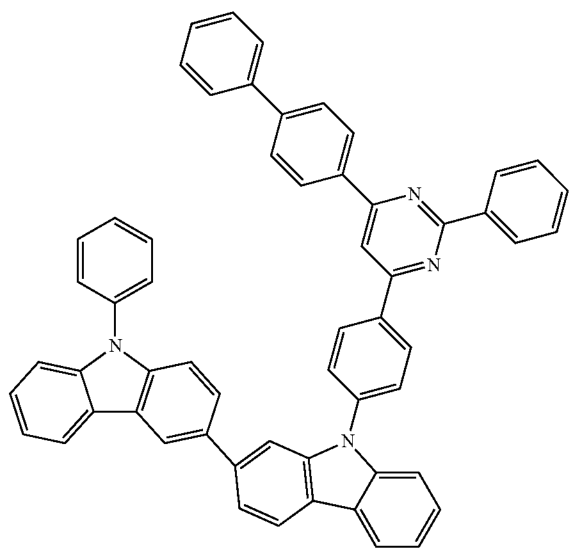

-continued
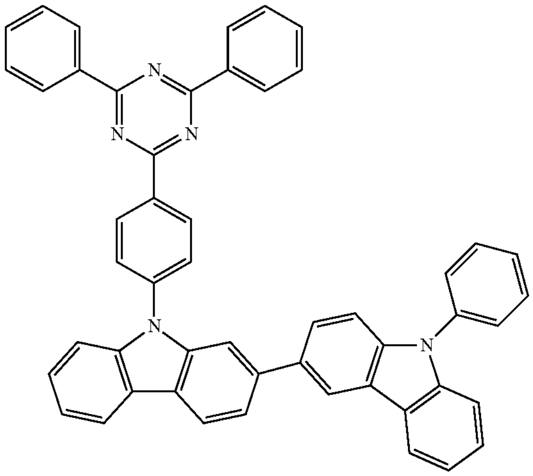
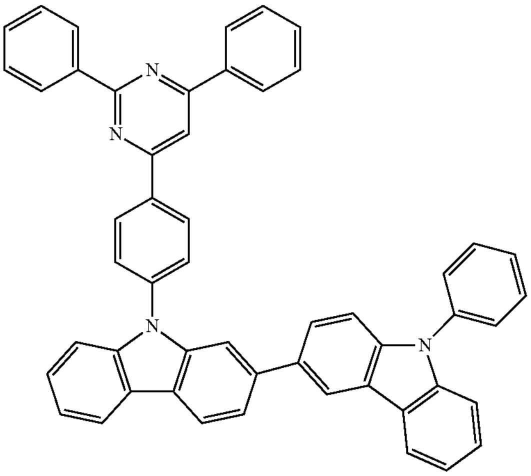
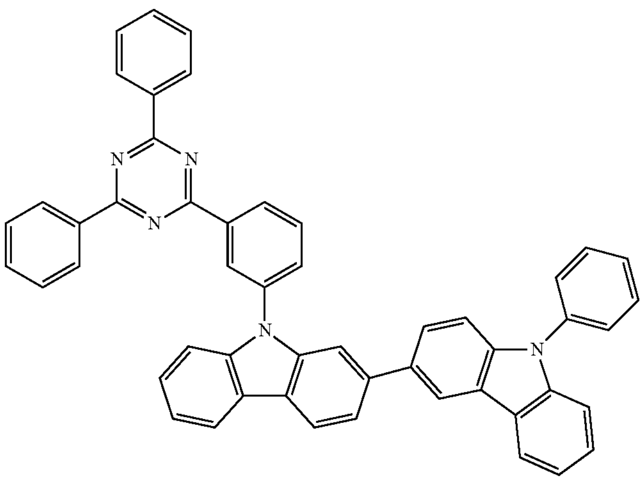
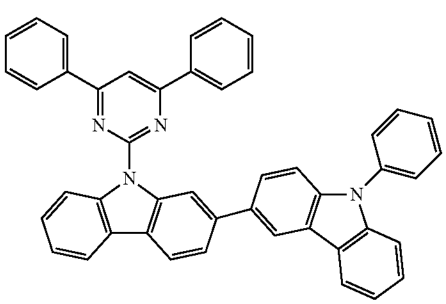
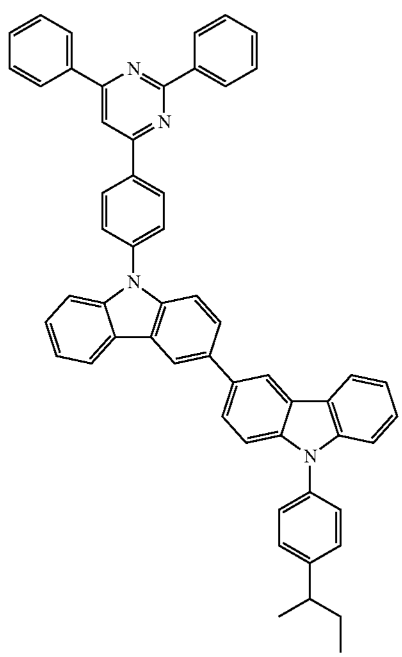

-continued
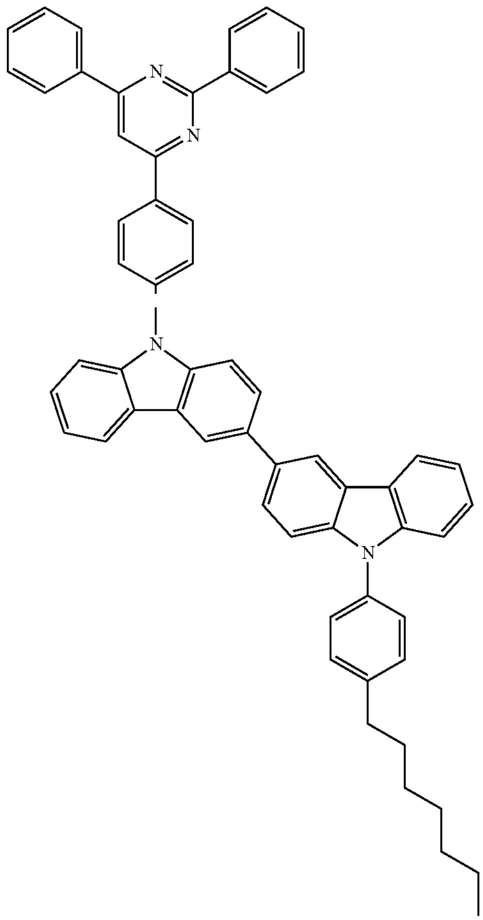
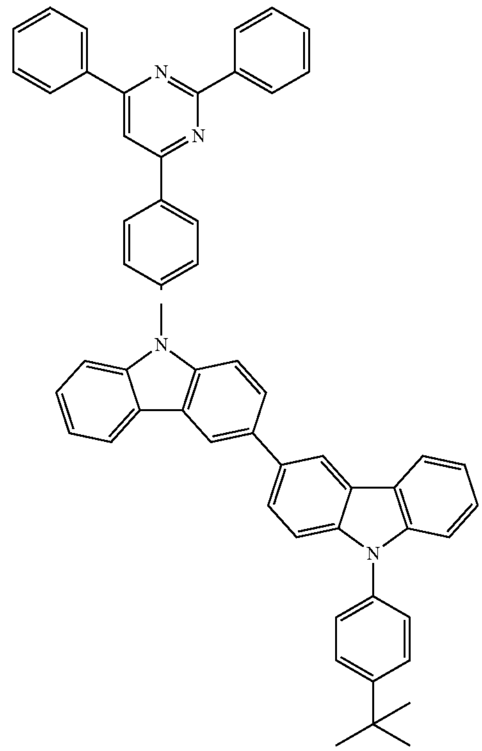
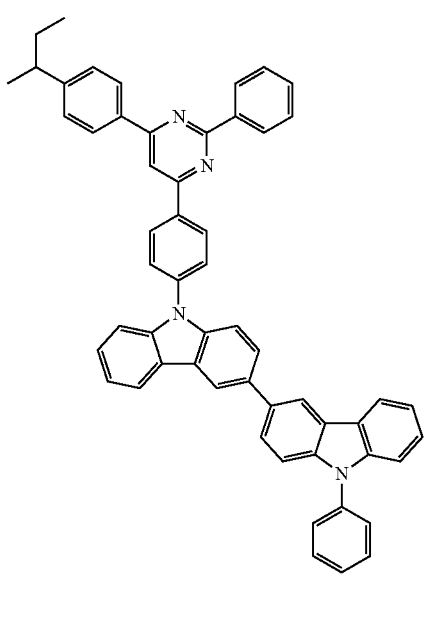
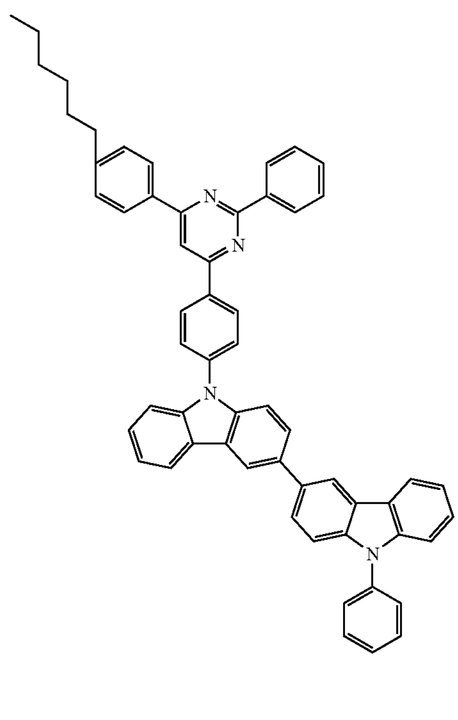

-continued
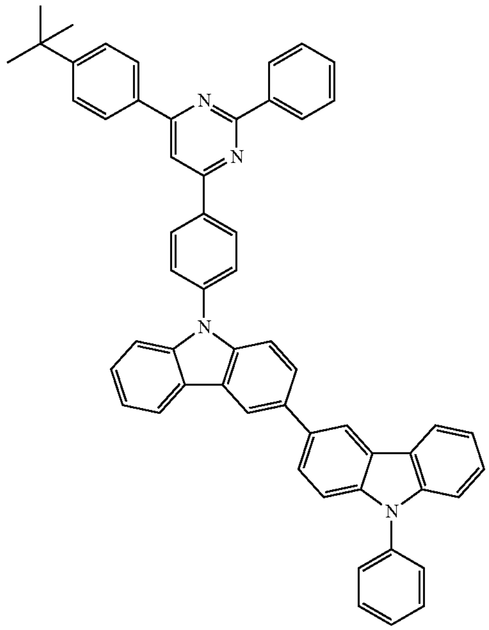
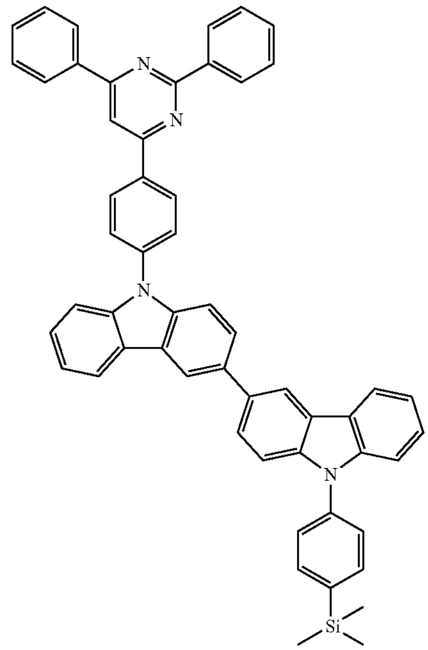
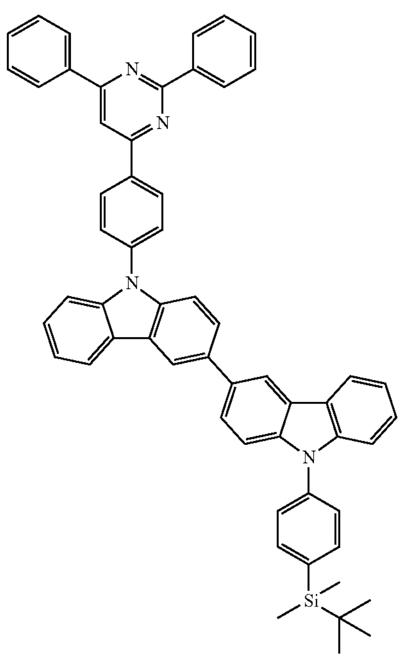
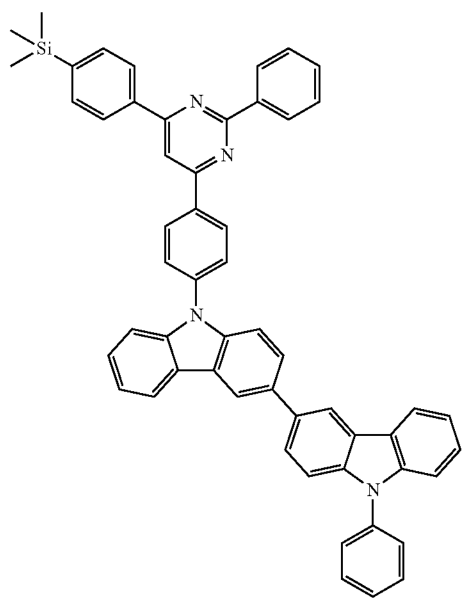

-continued
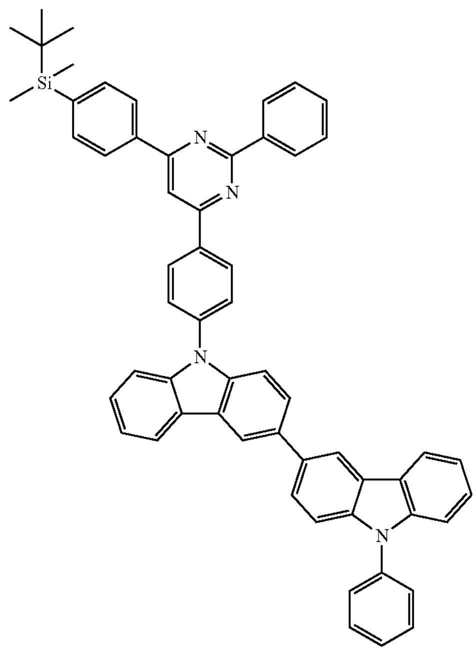
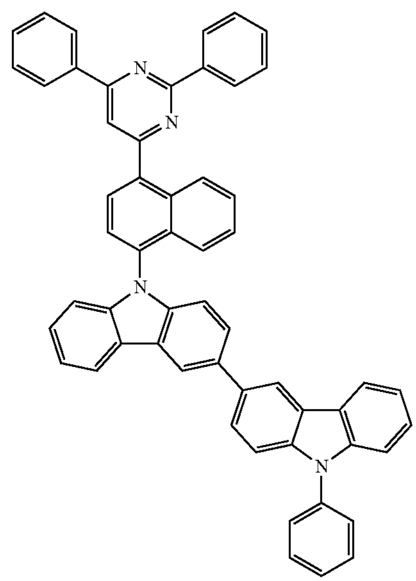
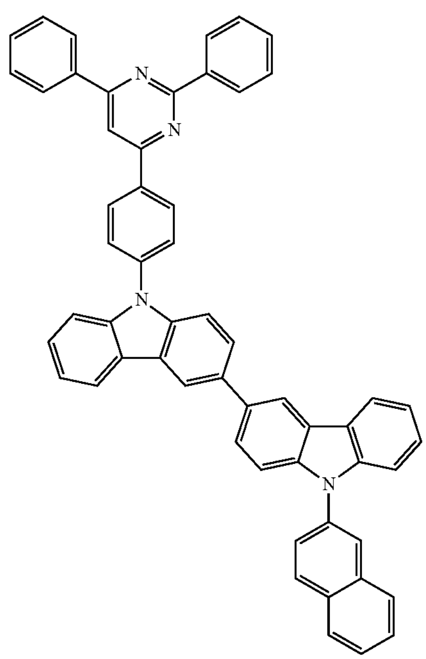
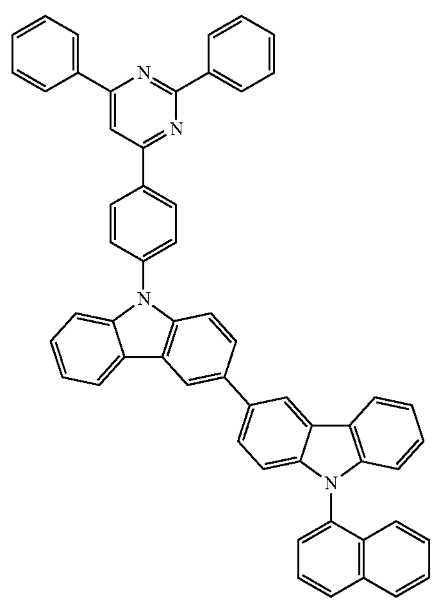

-continued
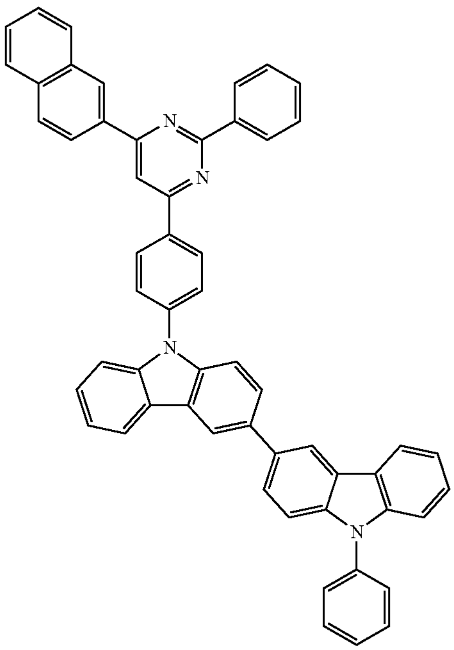
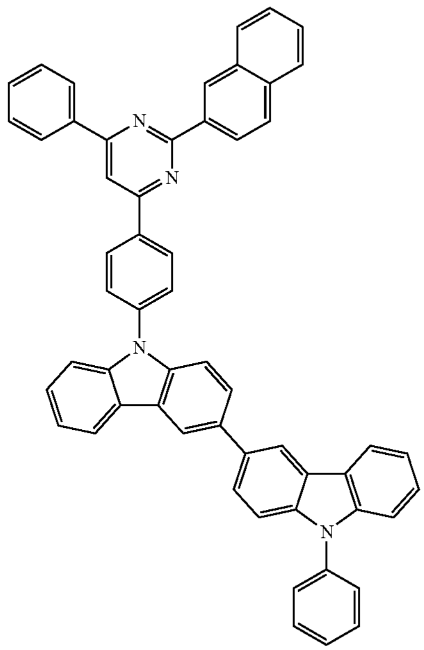
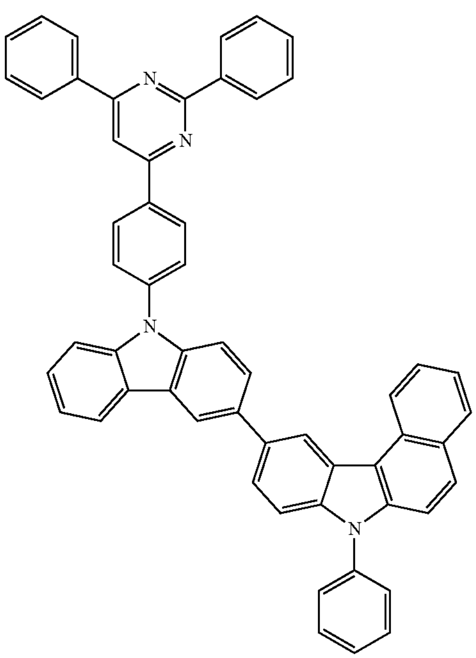
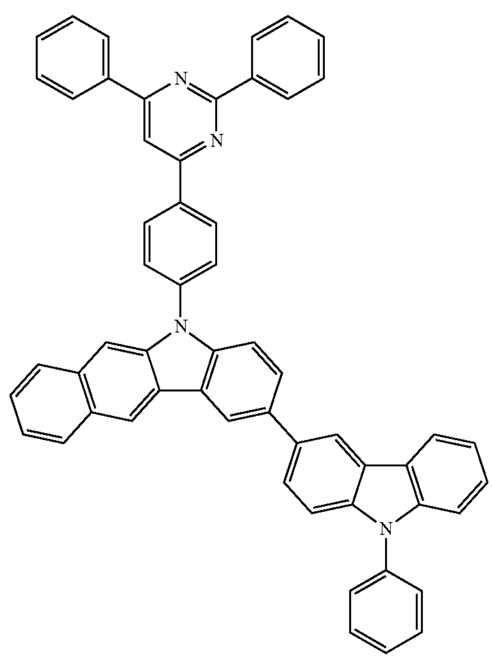

-continued
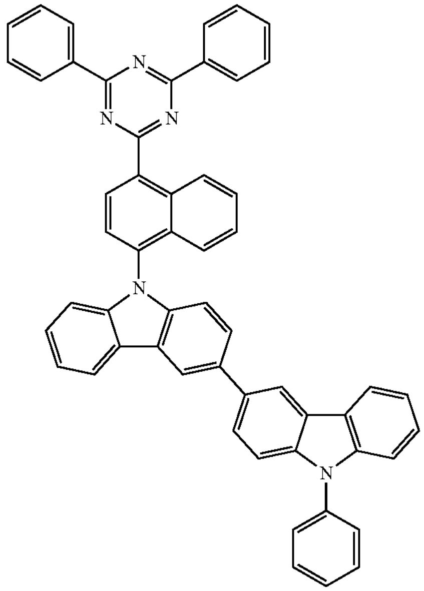
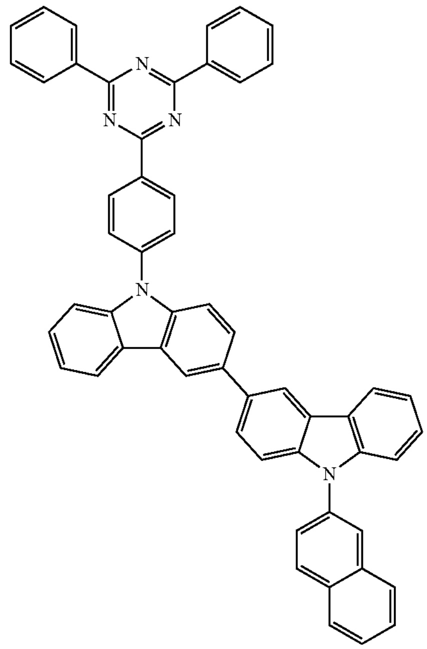
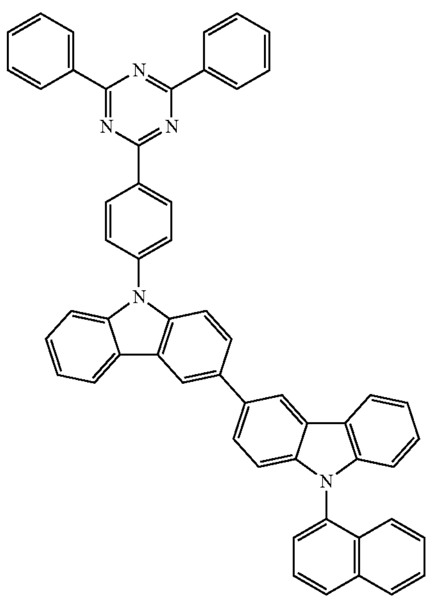
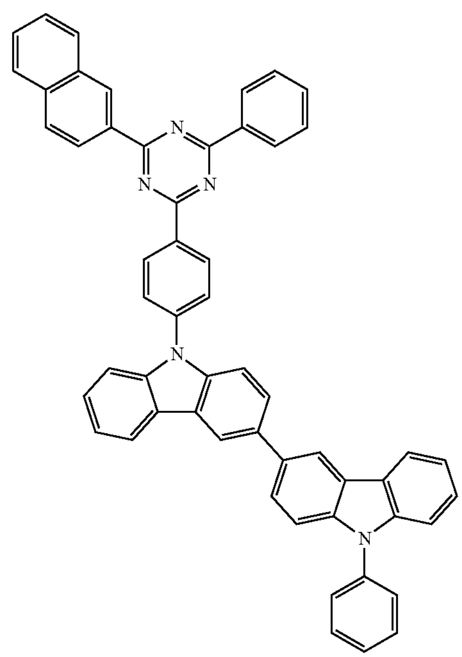

-continued
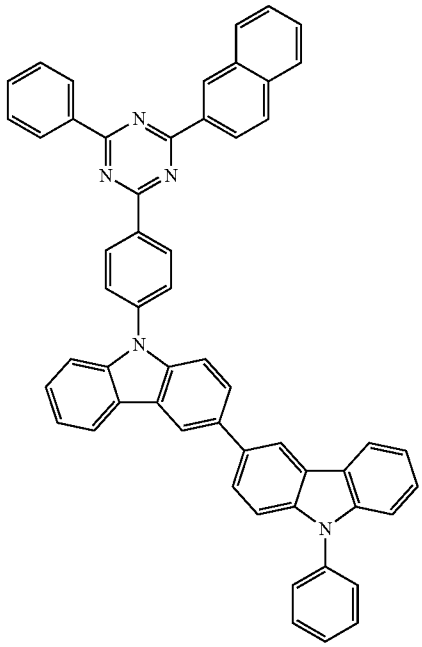
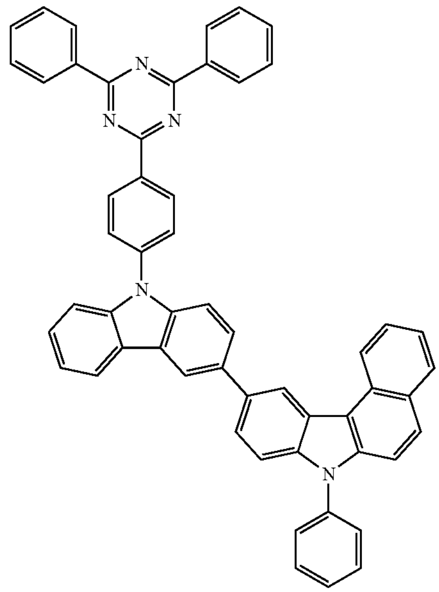
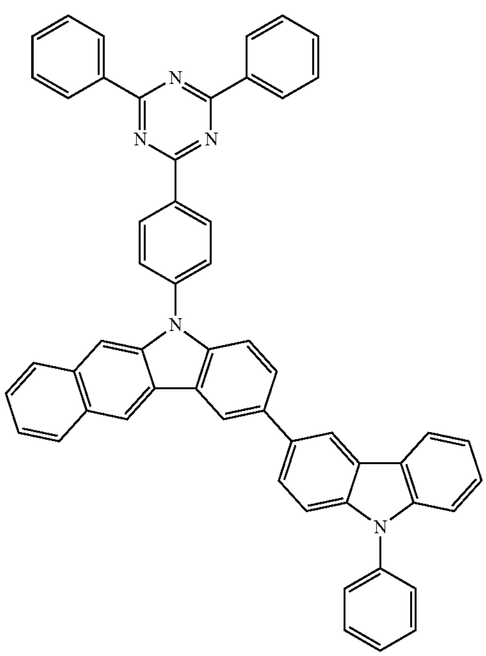
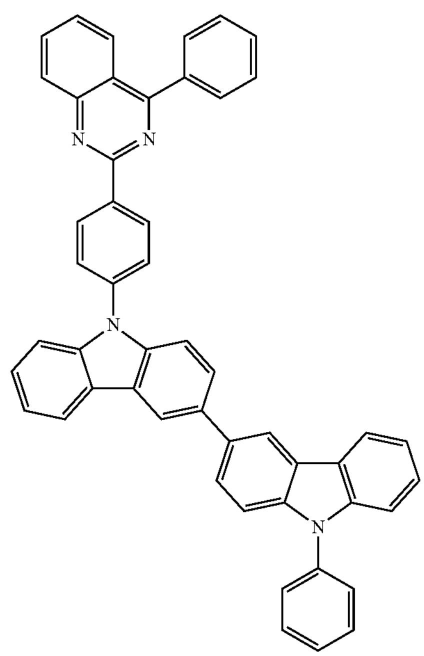

-continued
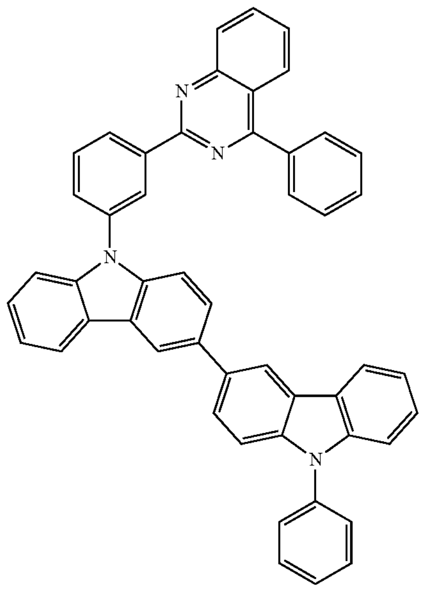
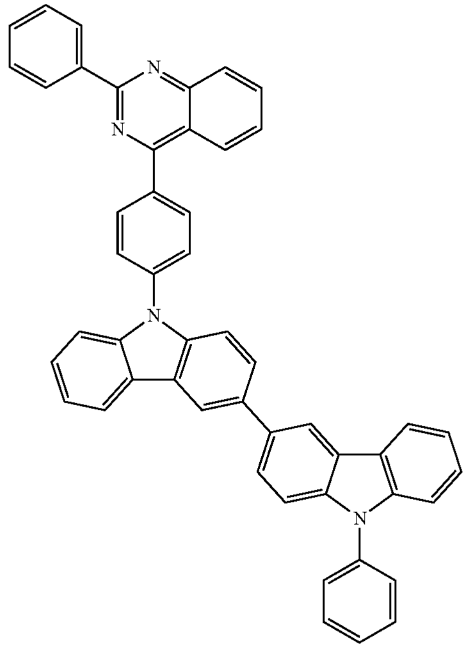
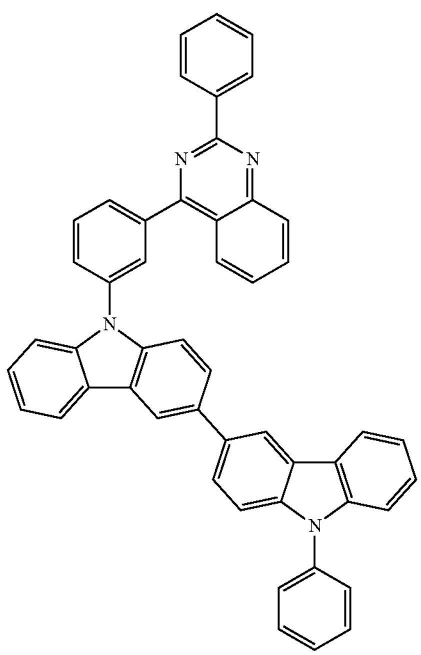
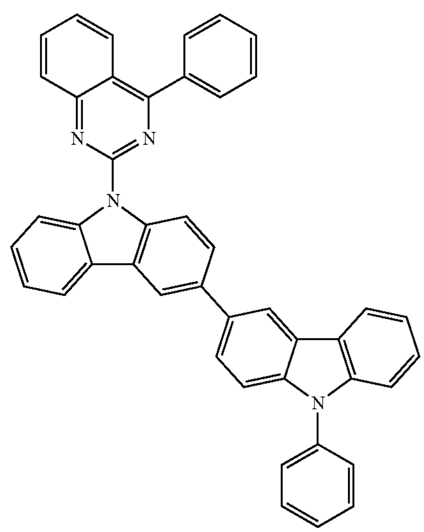

-continued
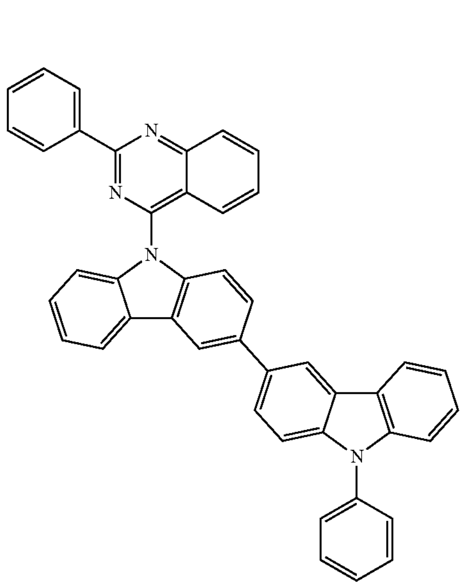
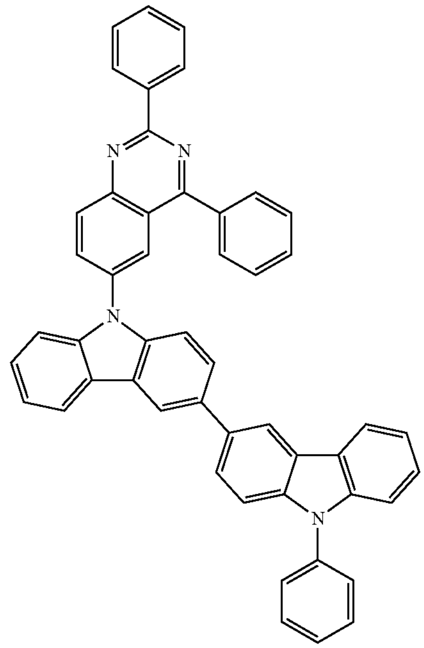
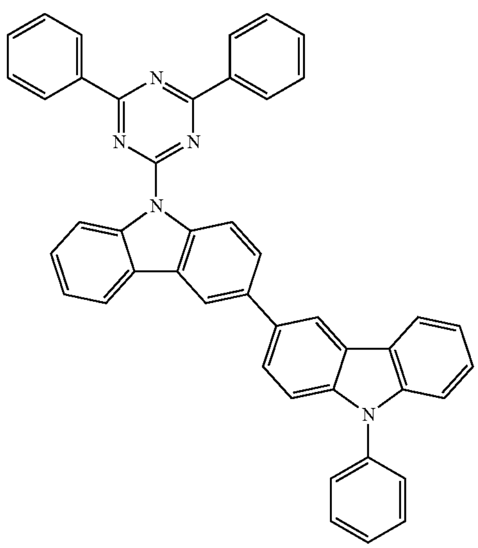
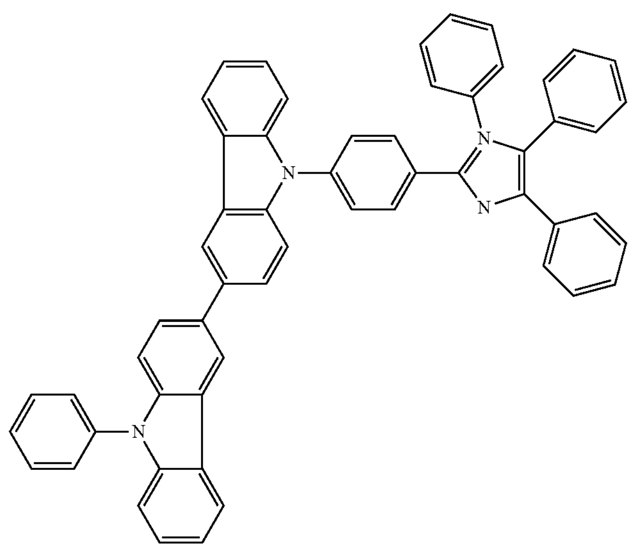

-continued
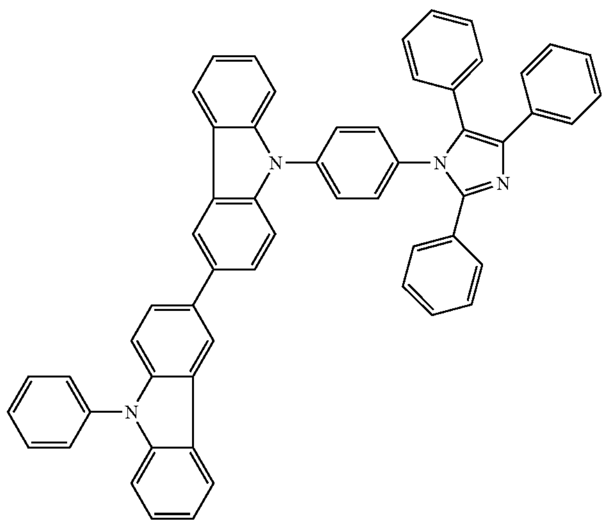
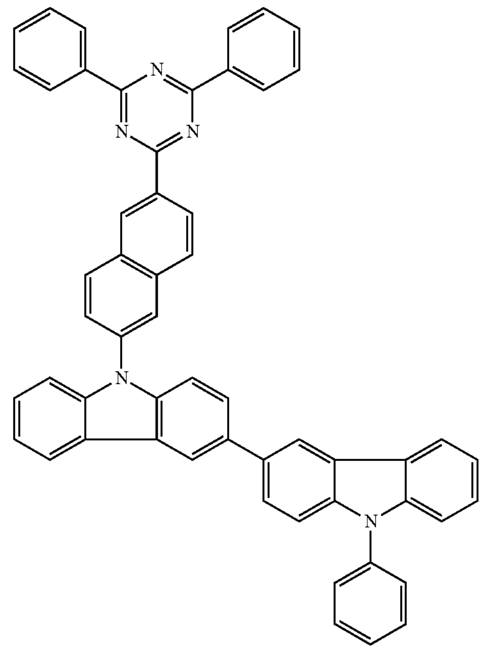
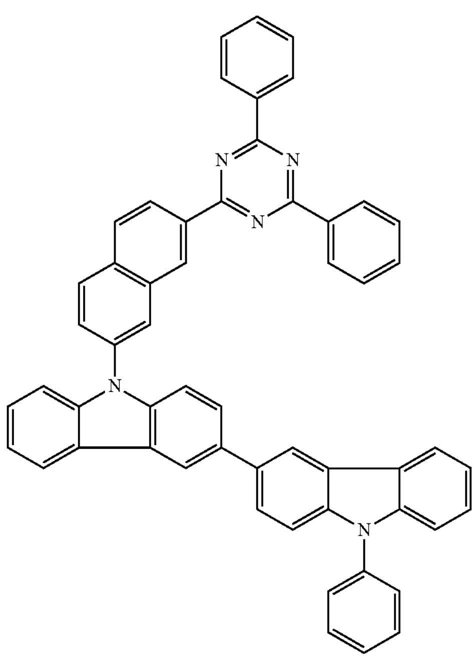
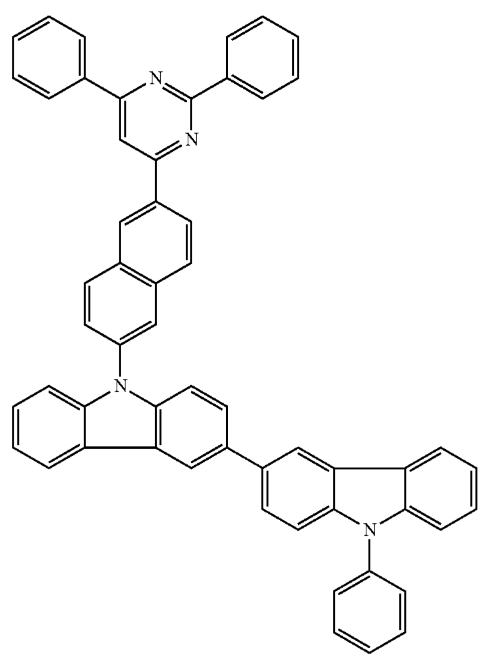

-continued
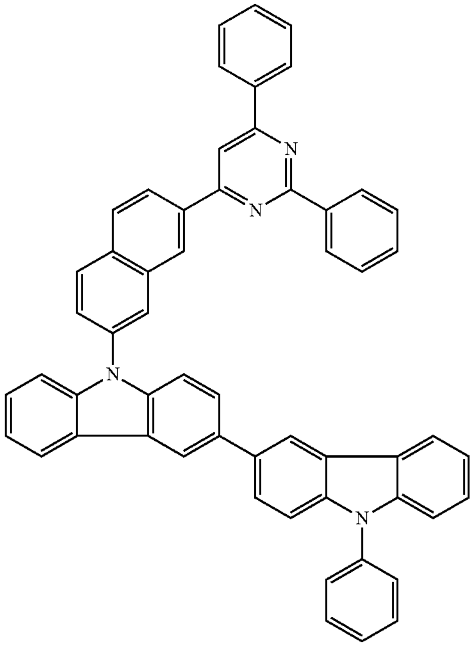
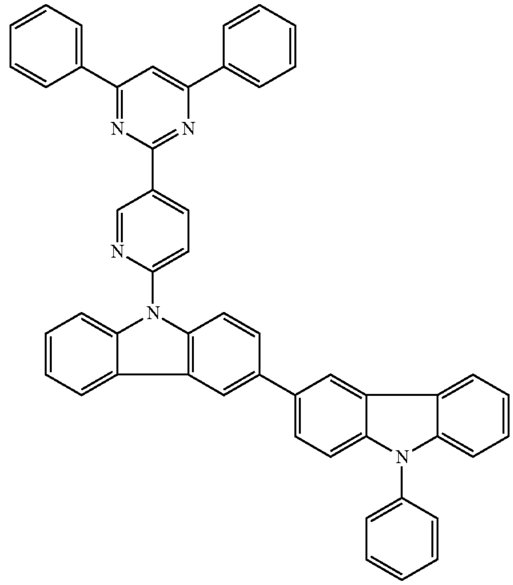
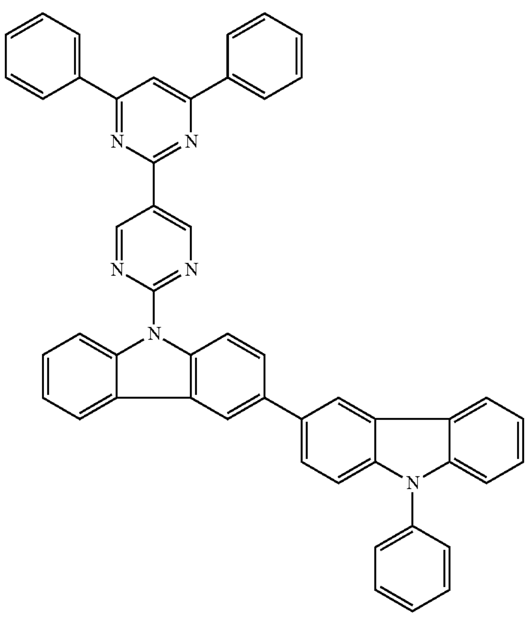
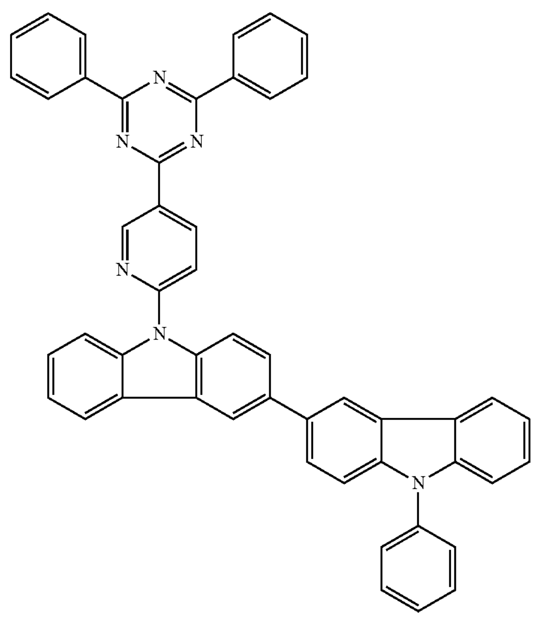

-continued
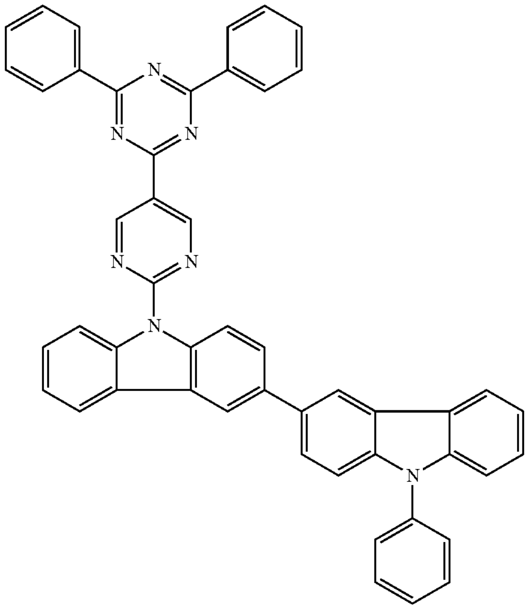
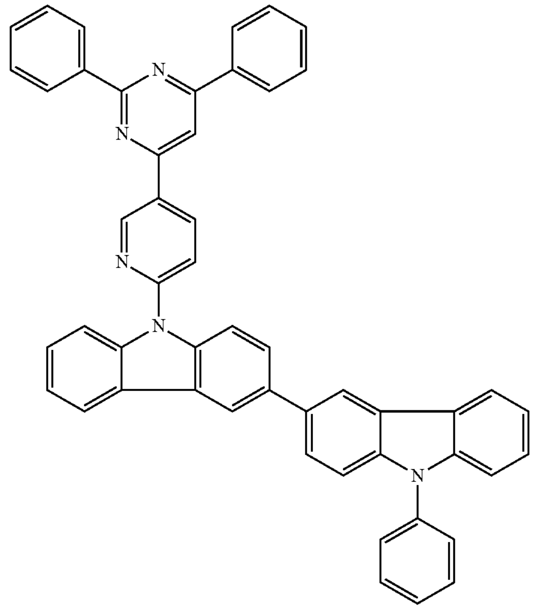
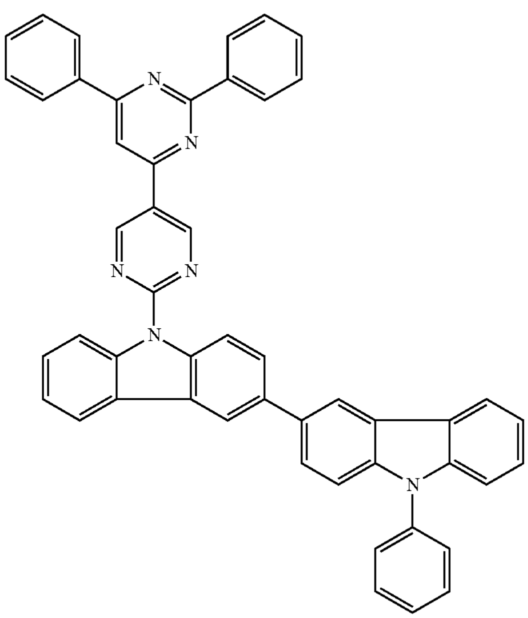
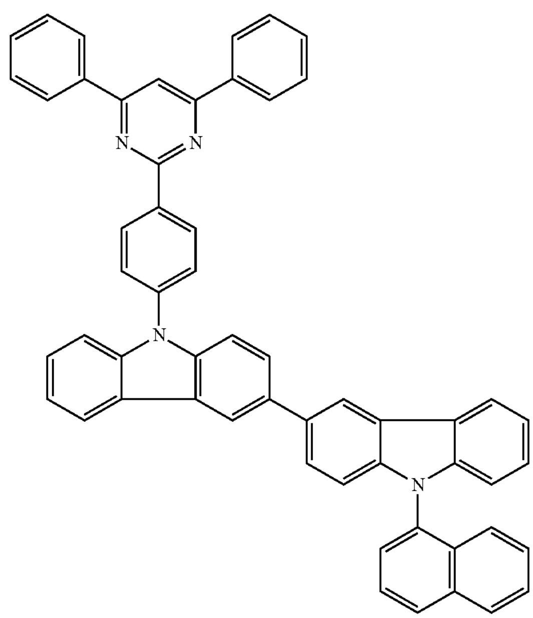

-continued
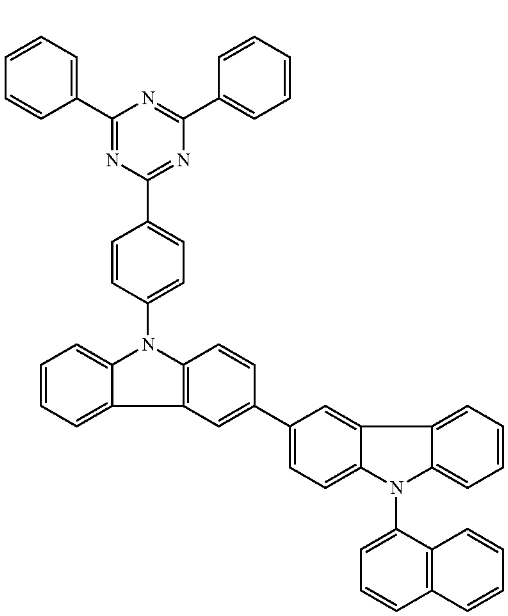
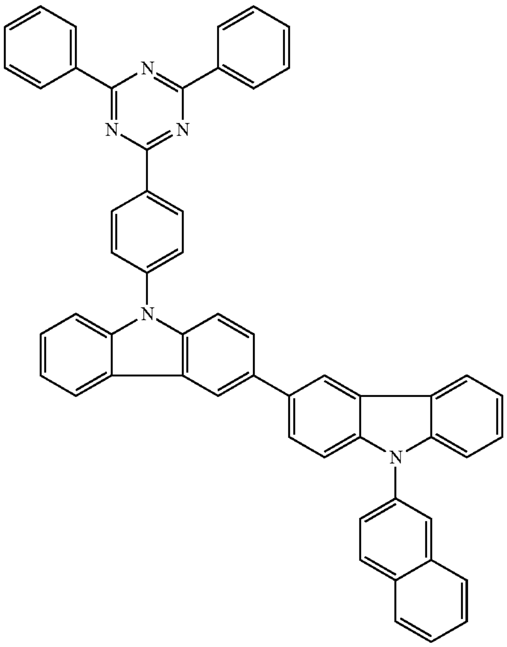
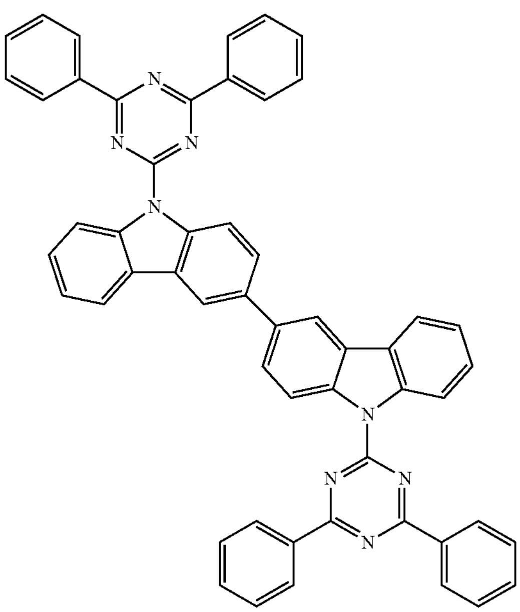
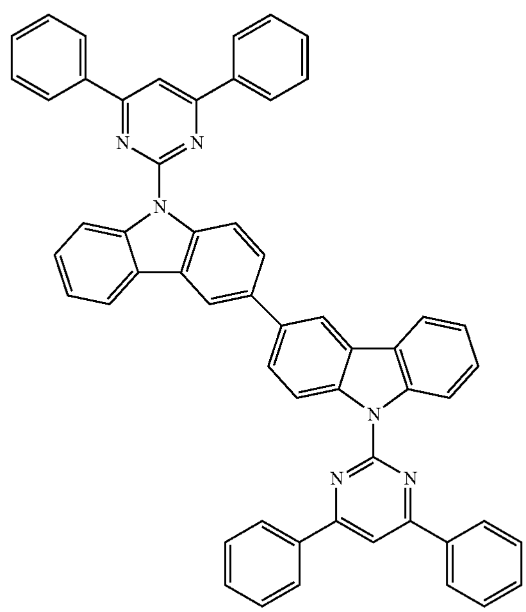

-continued
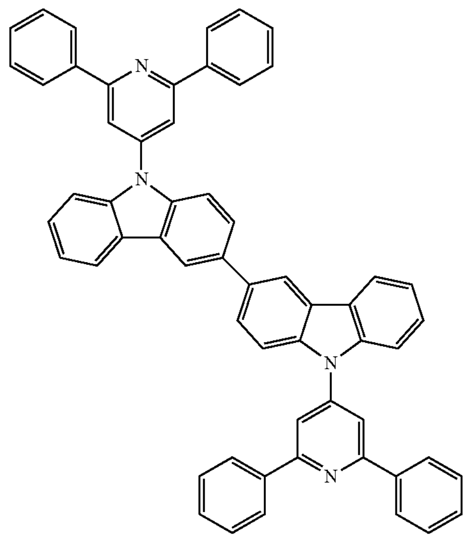
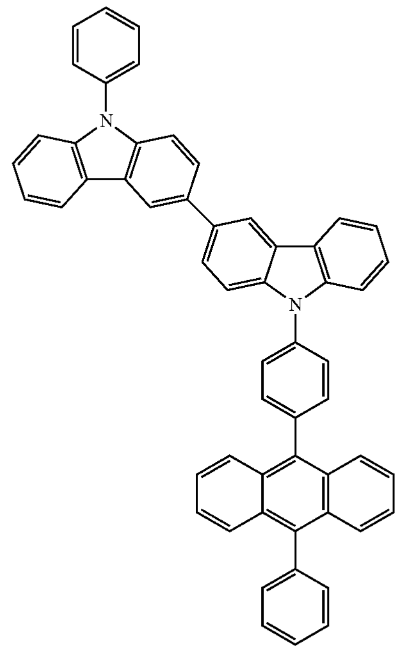
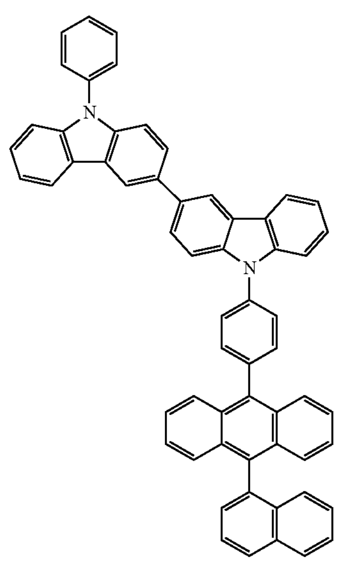
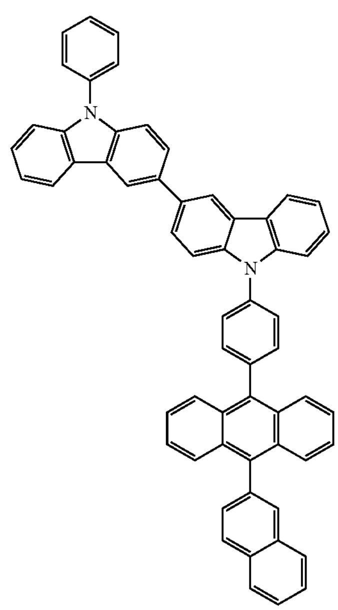
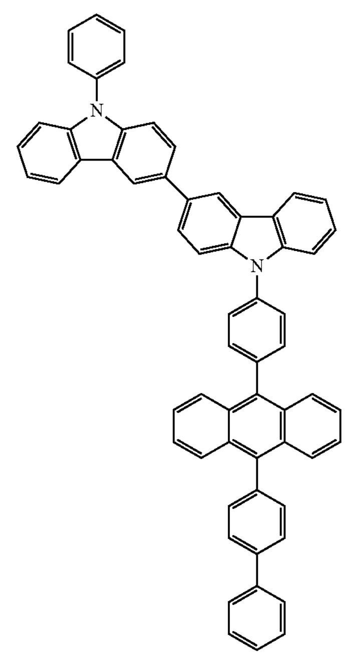

-continued
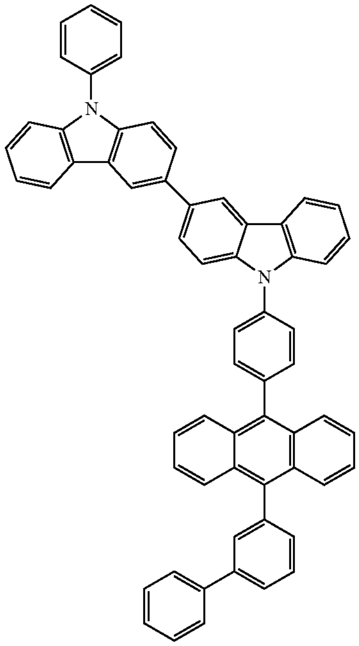
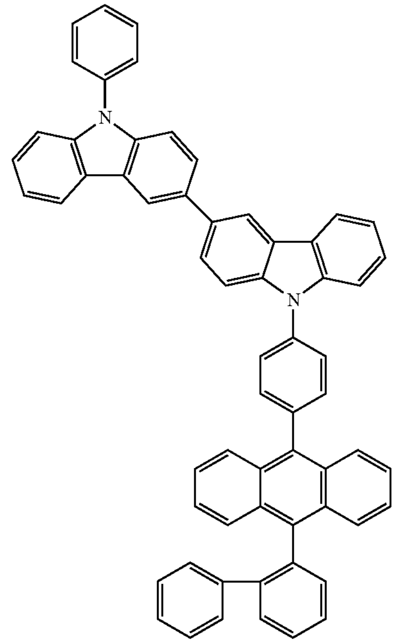
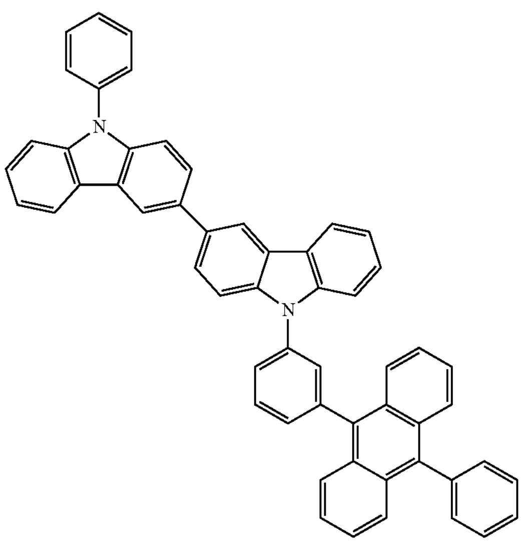
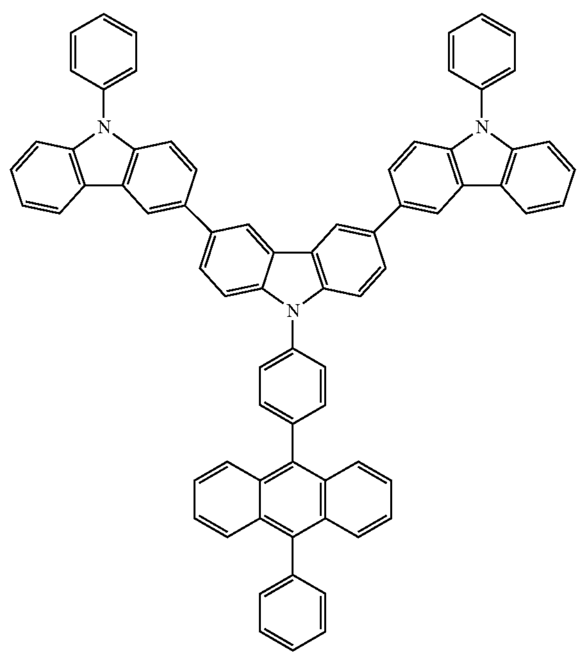
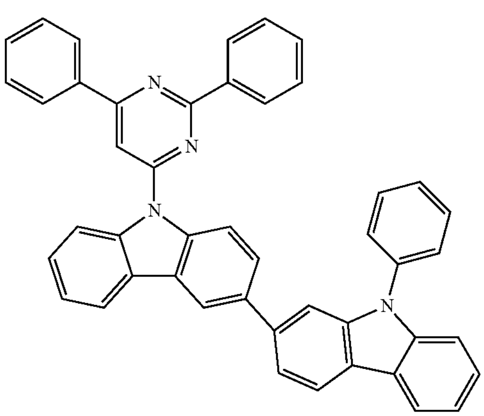
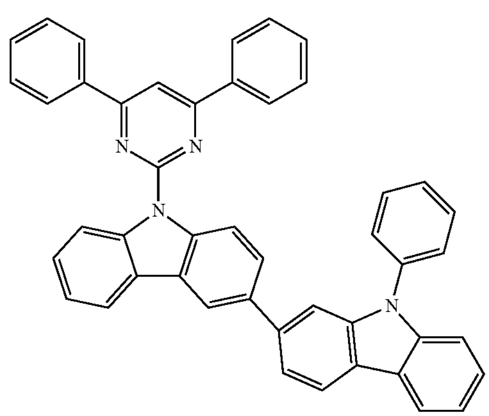

-continued
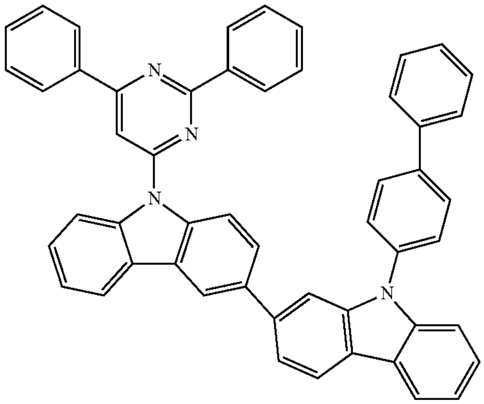
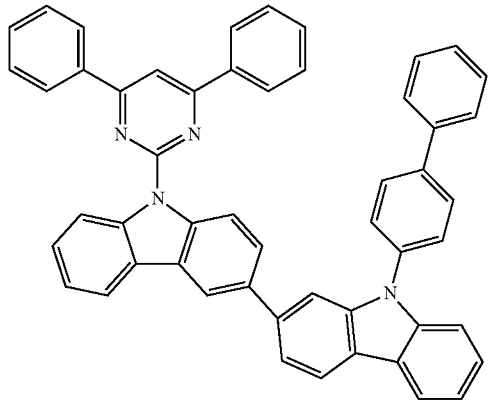
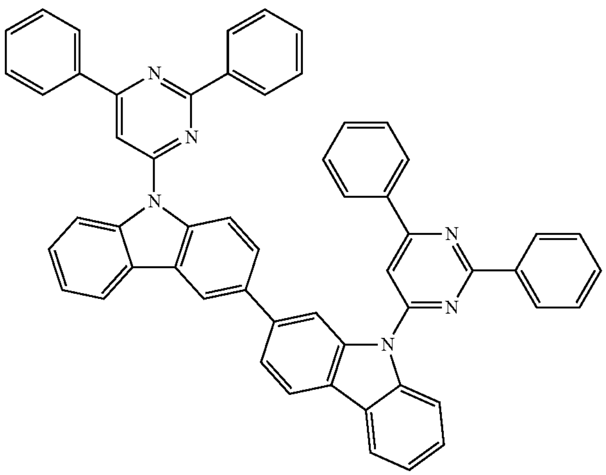
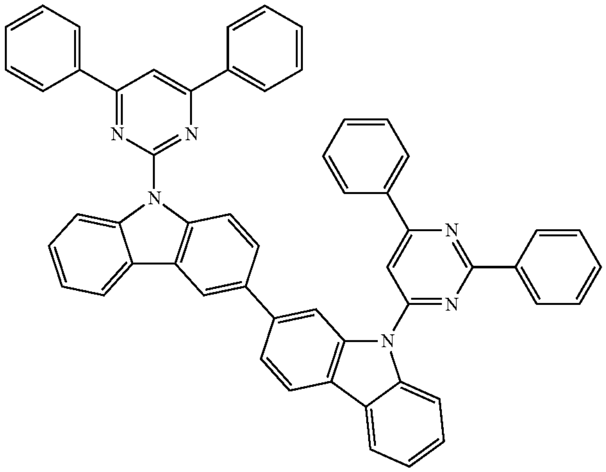
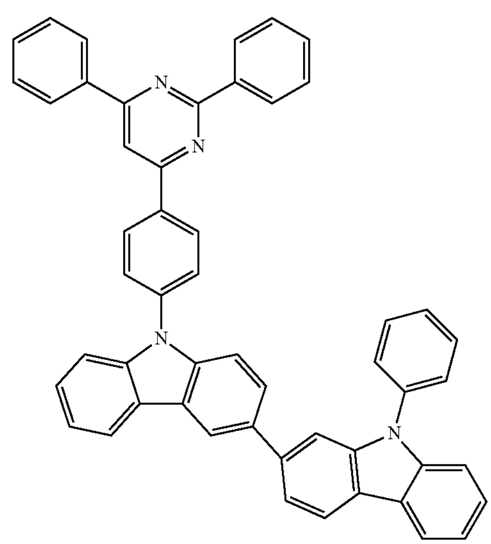

-continued
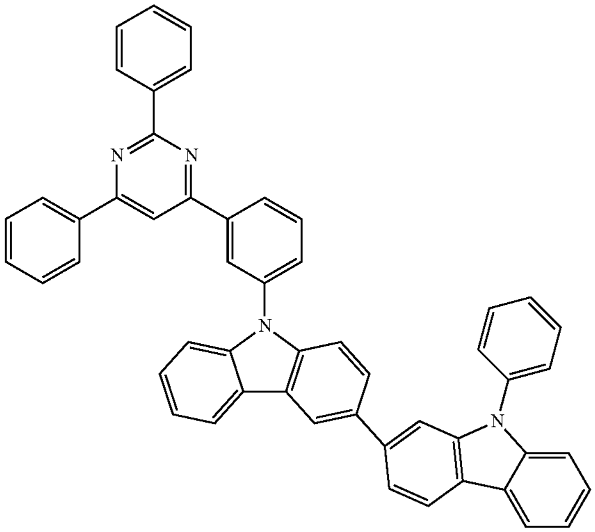
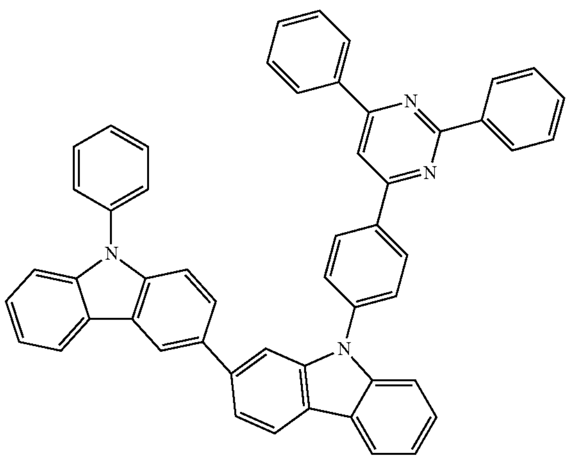
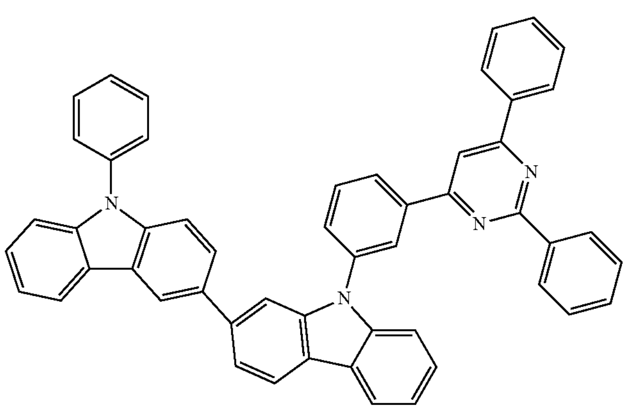
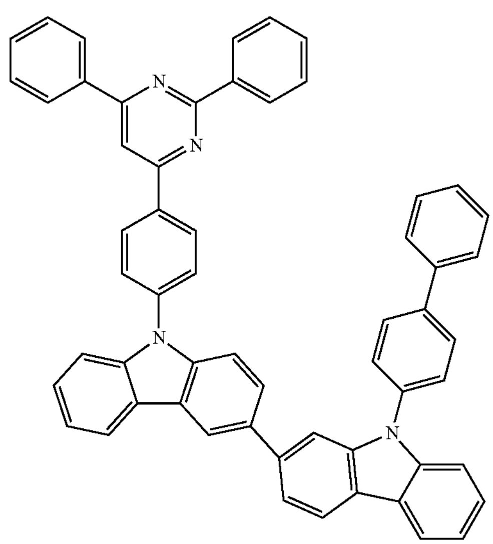

-continued
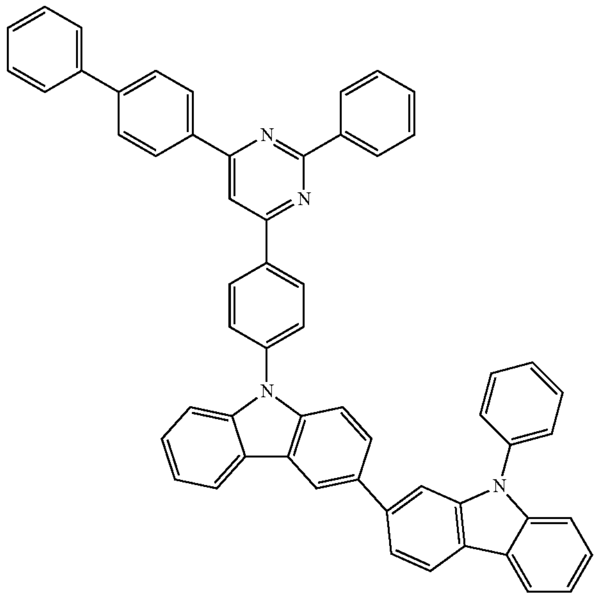
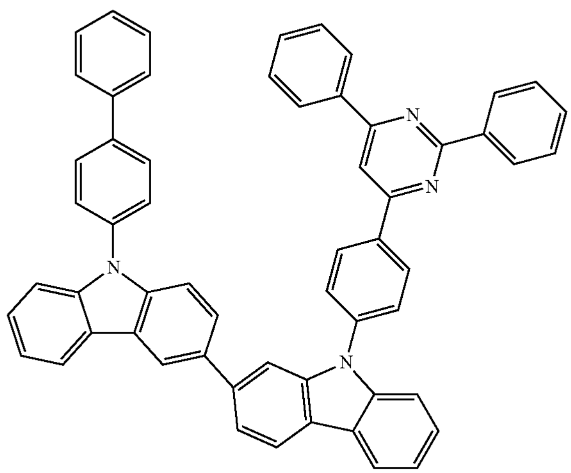
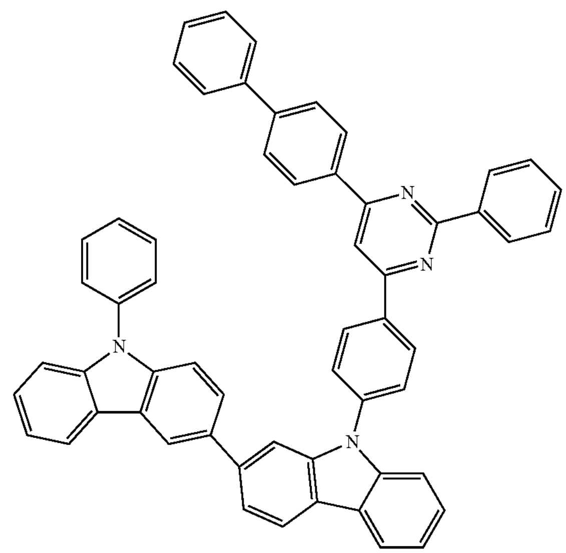
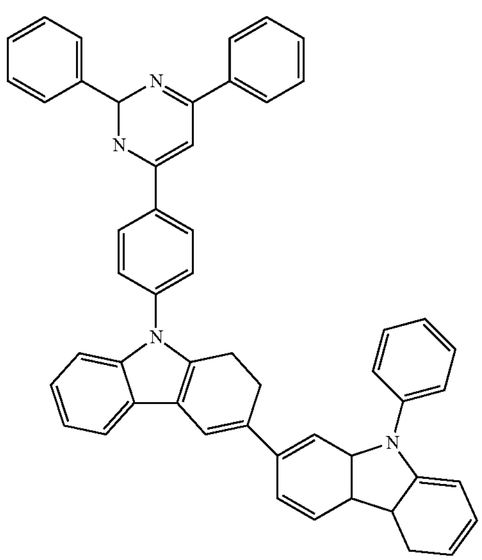
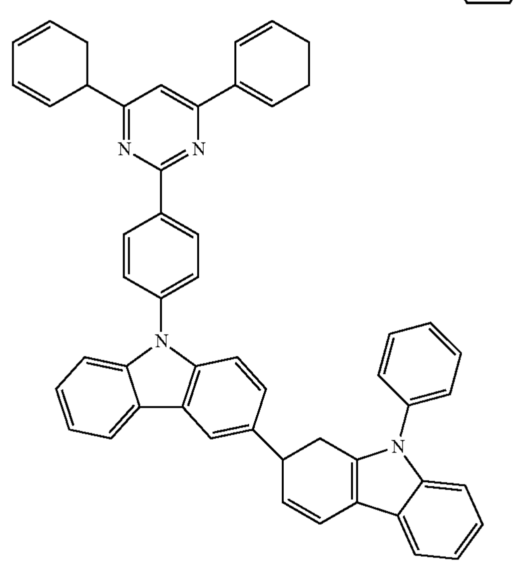

-continued
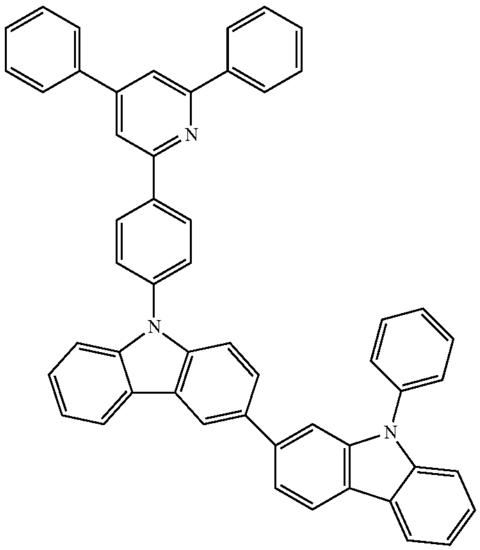
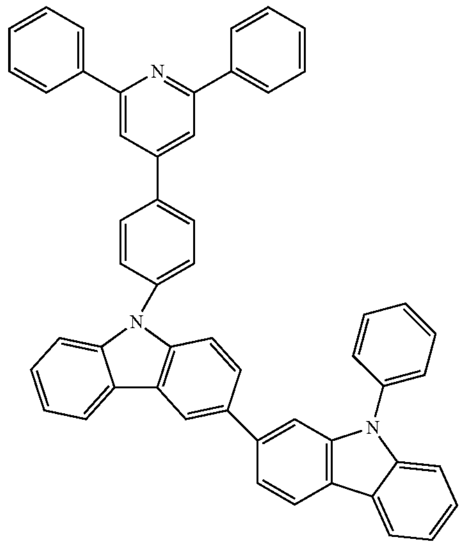
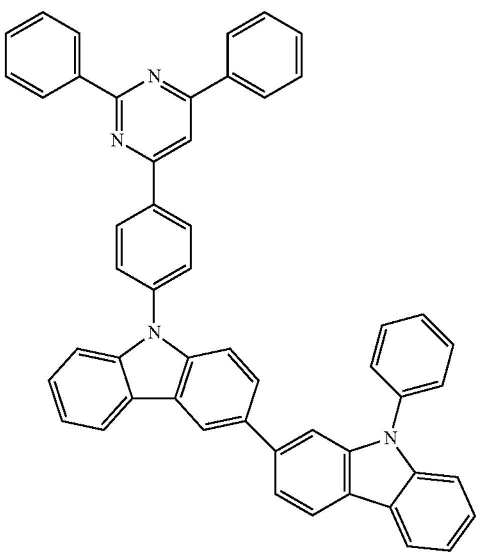
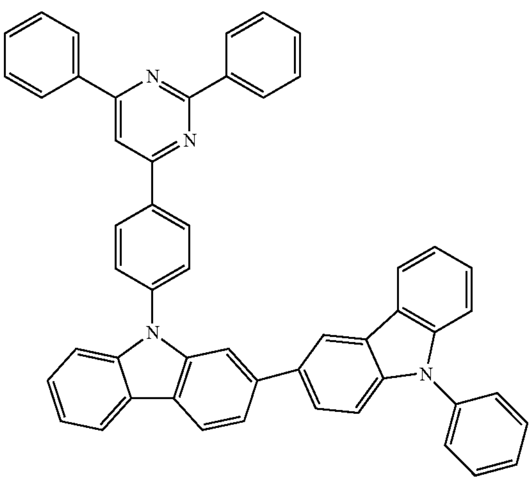
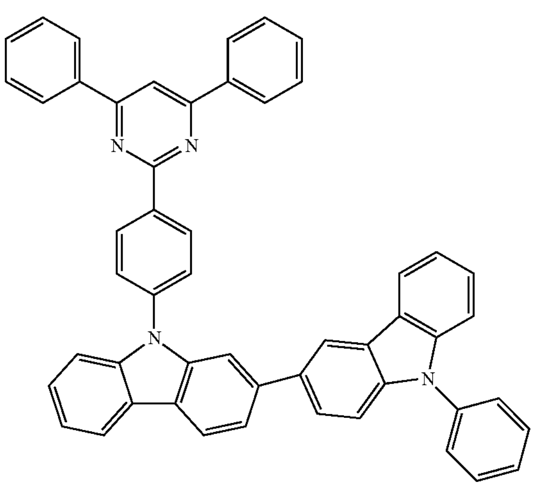
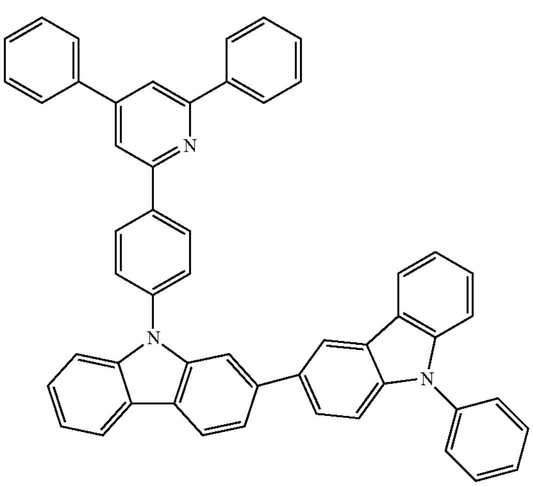

-continued
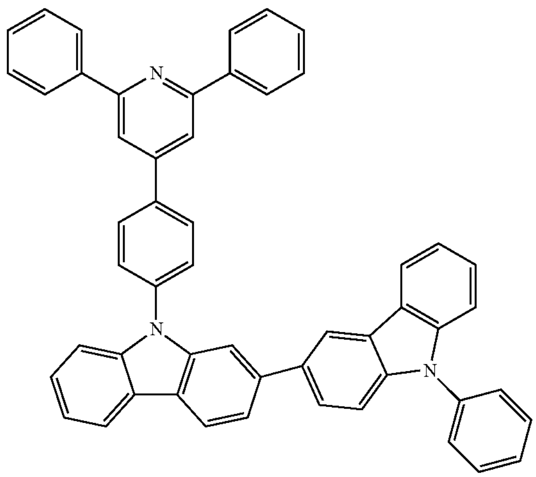
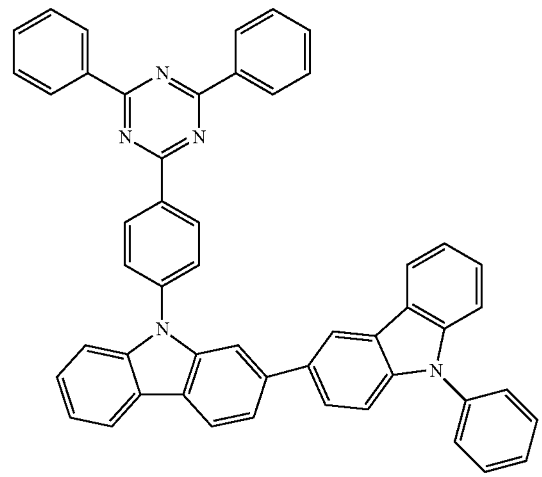
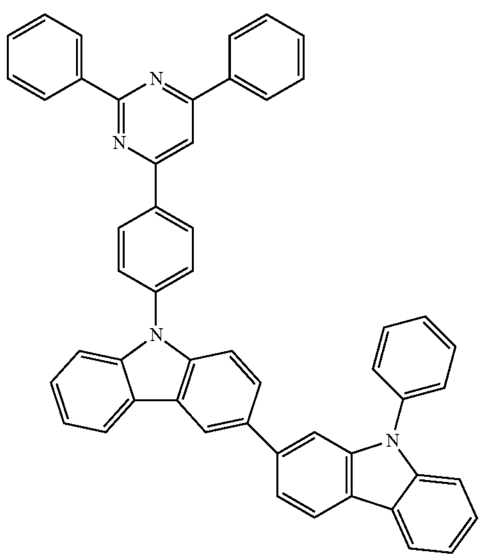
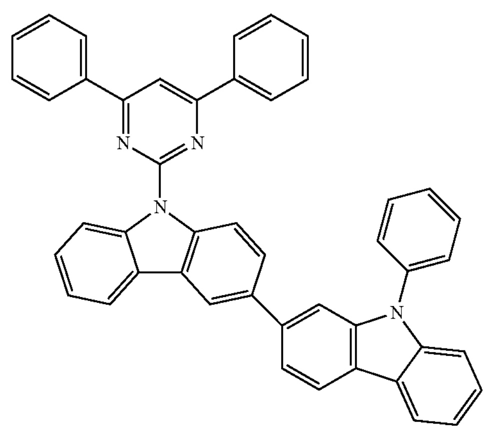
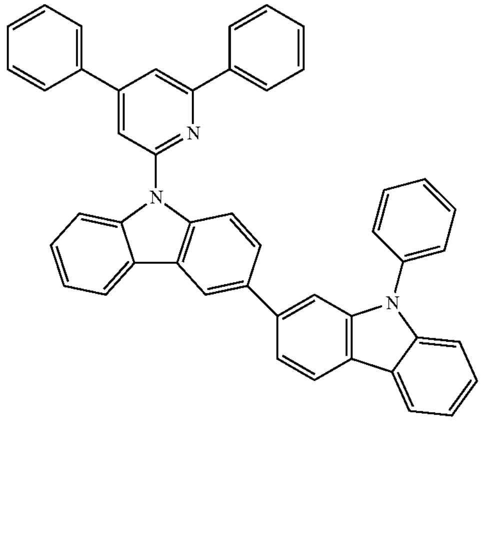
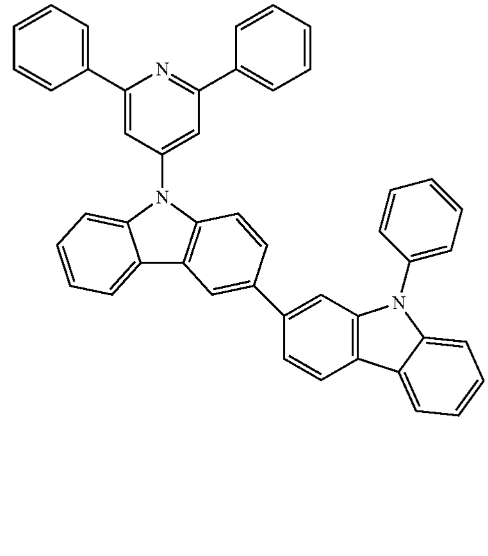

-continued
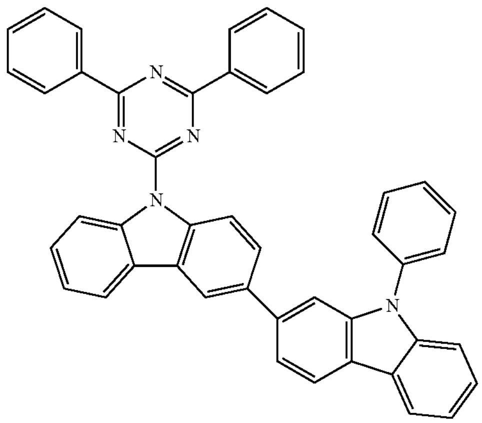
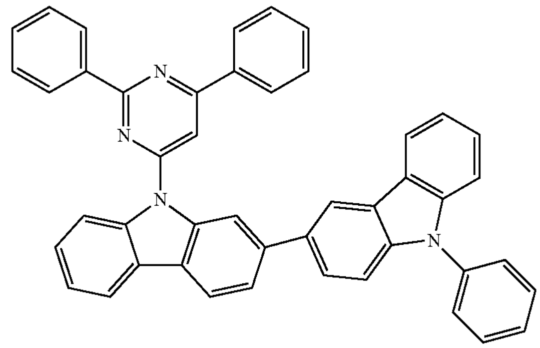
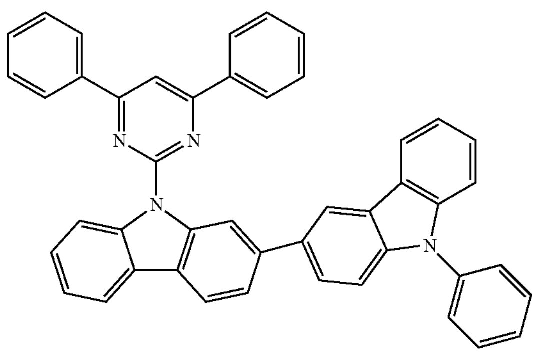
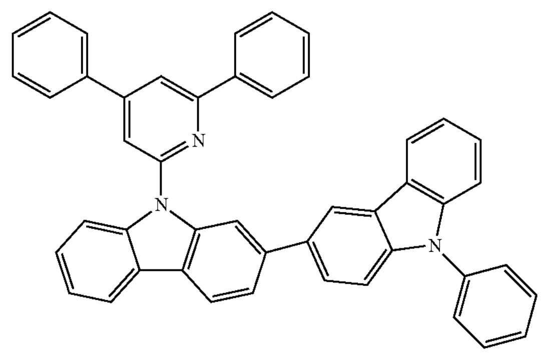
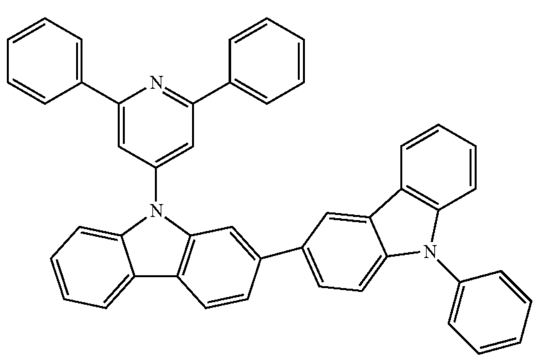
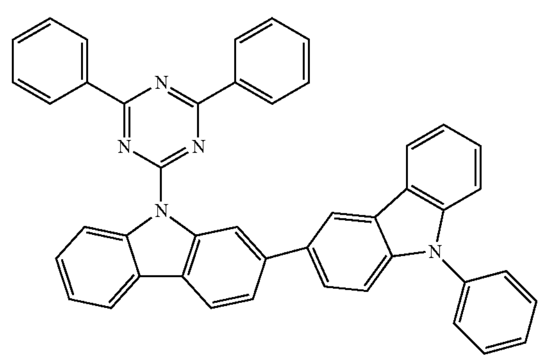

-continued
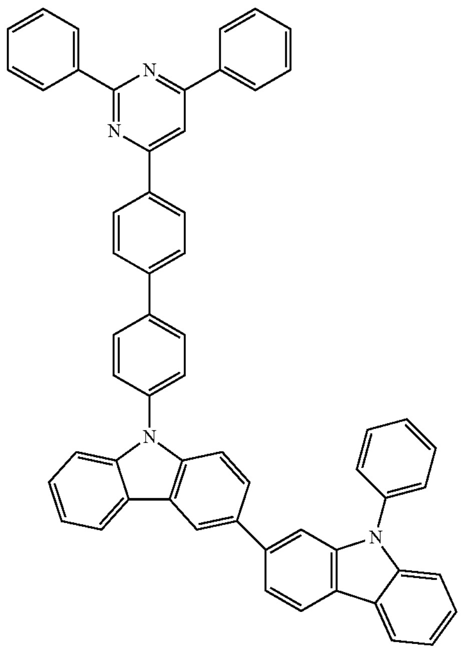
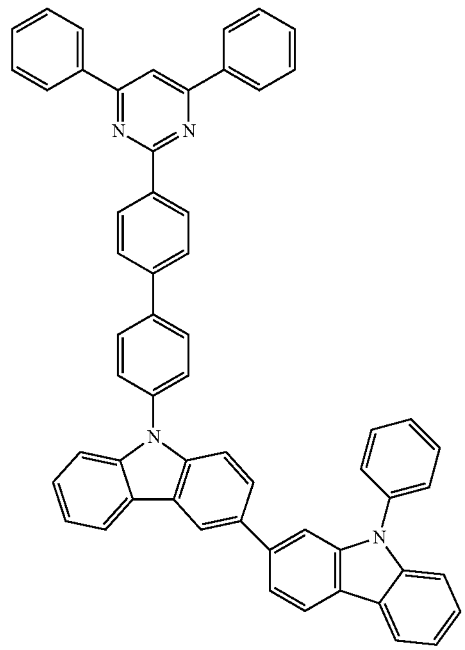
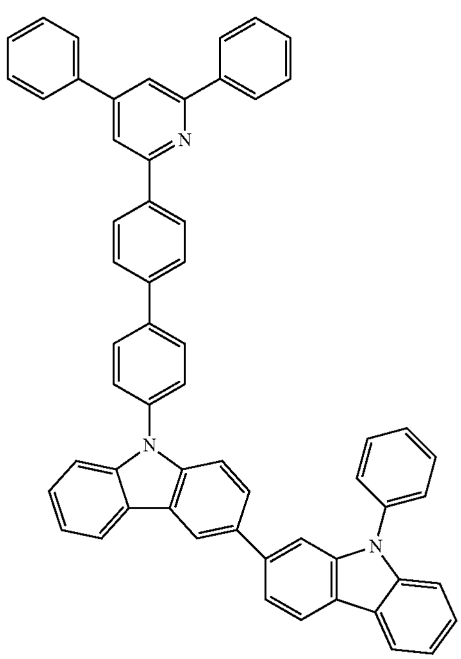
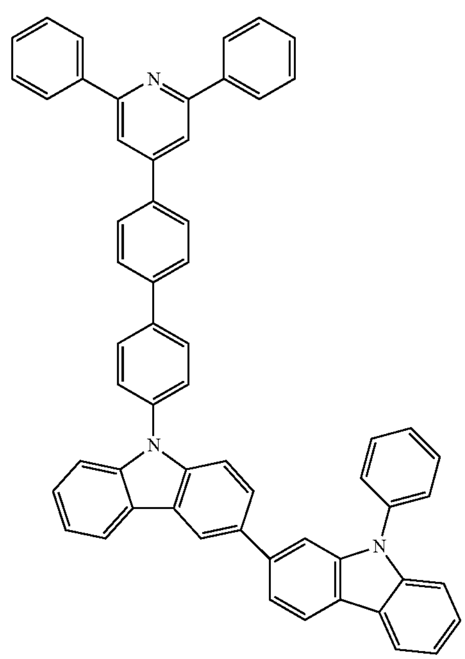

-continued
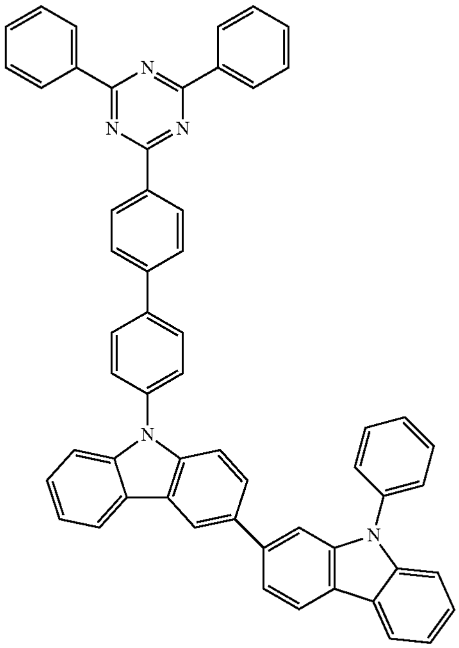
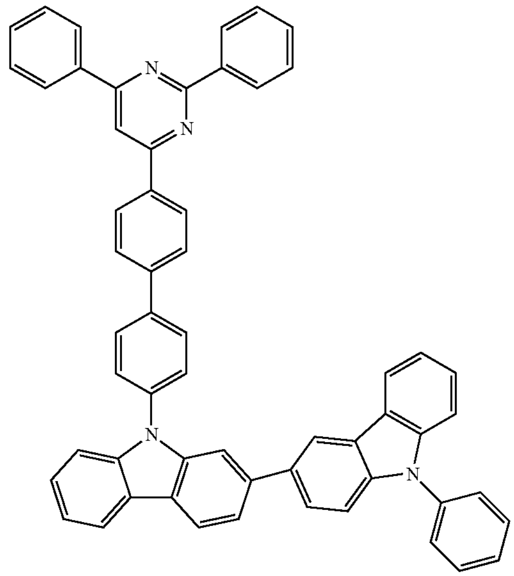
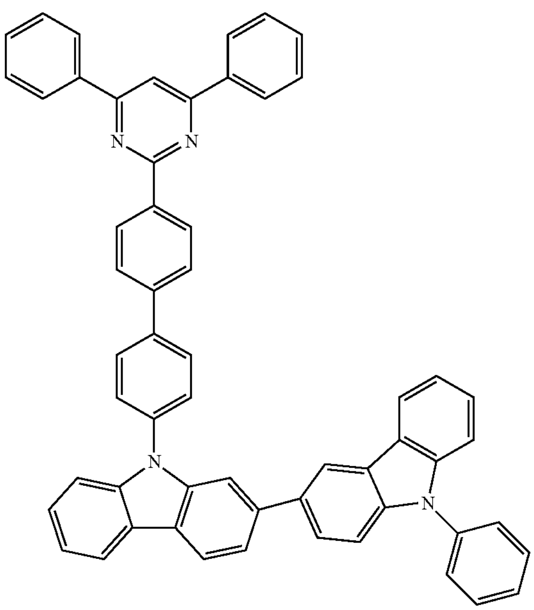
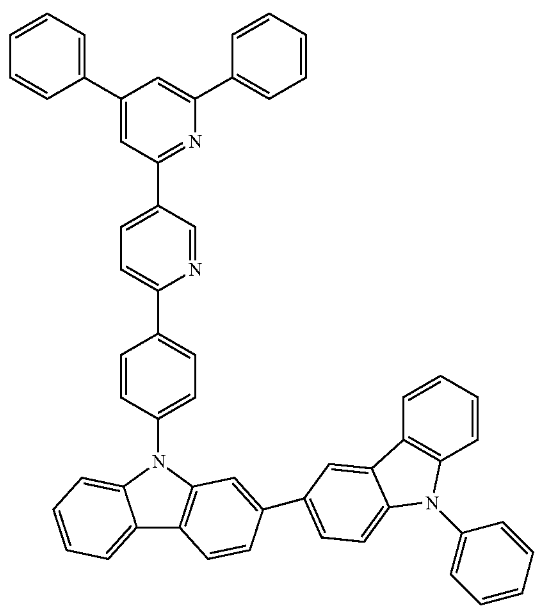

-continued
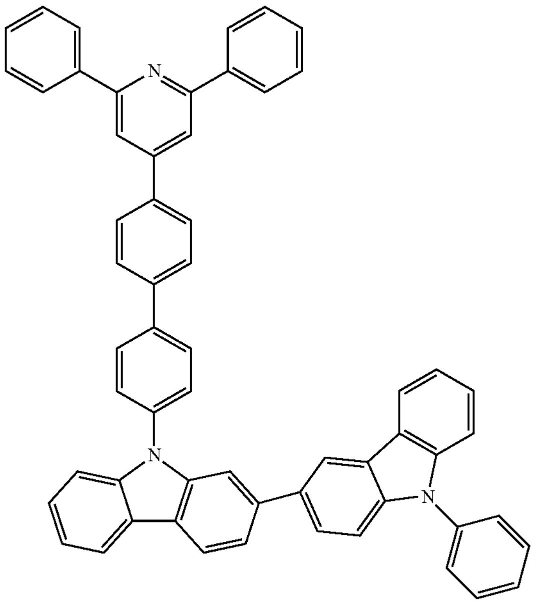
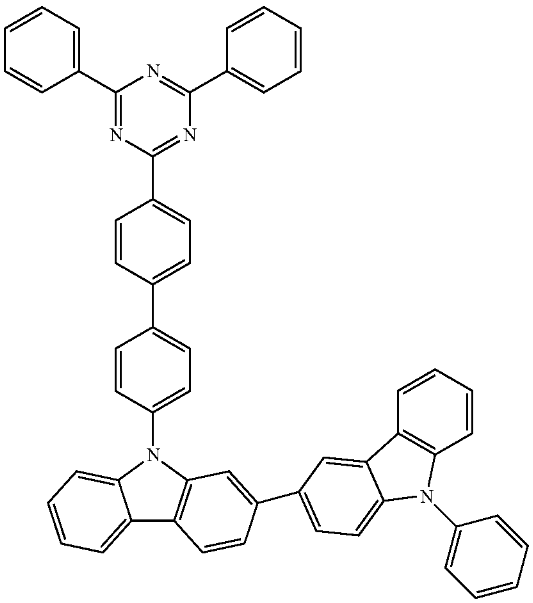
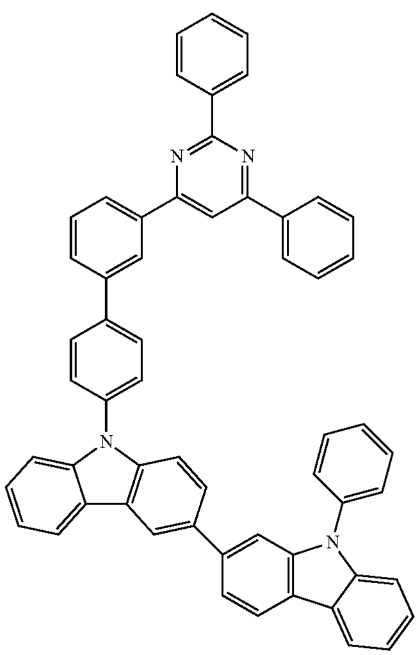
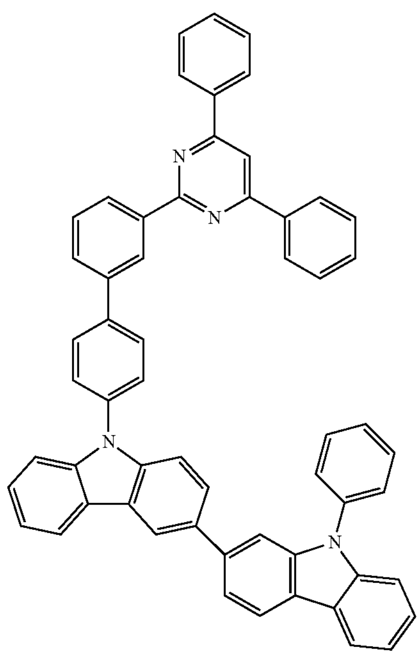

-continued
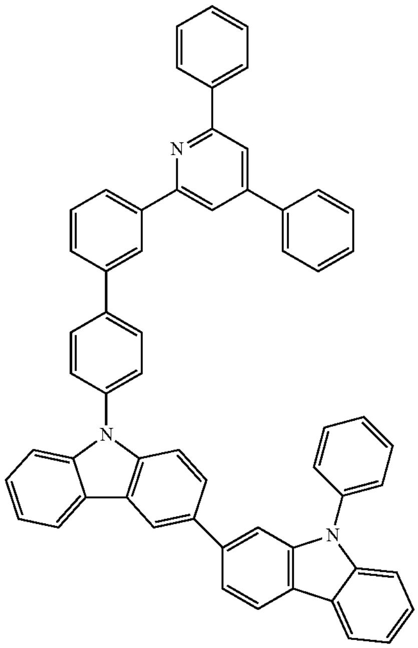
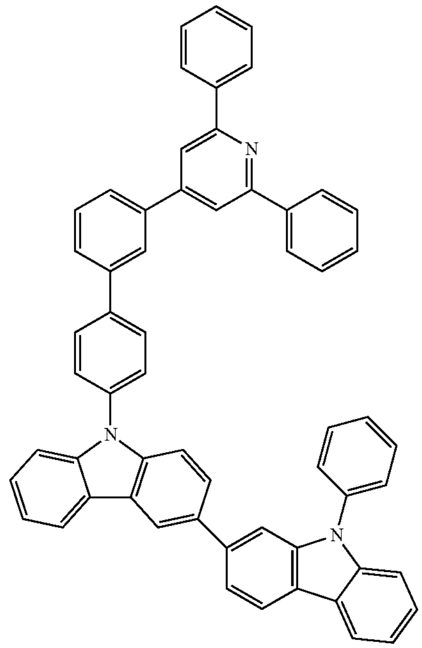
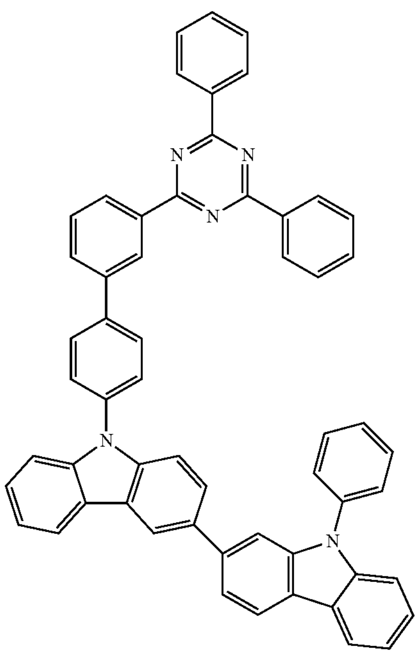
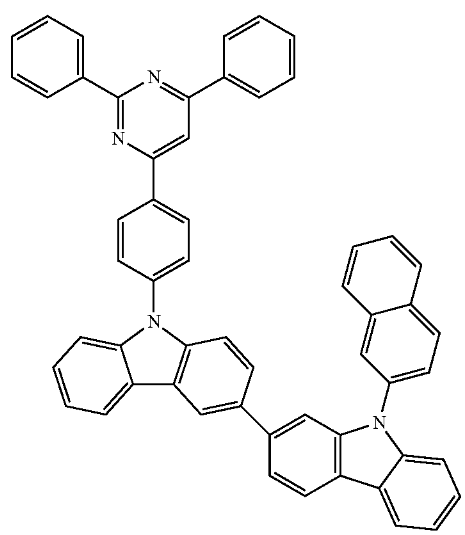

-continued
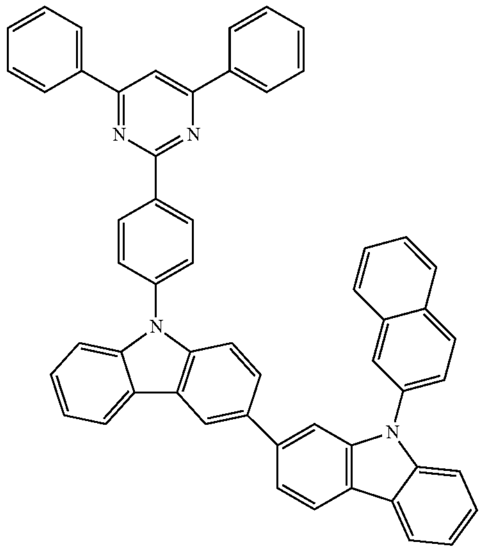
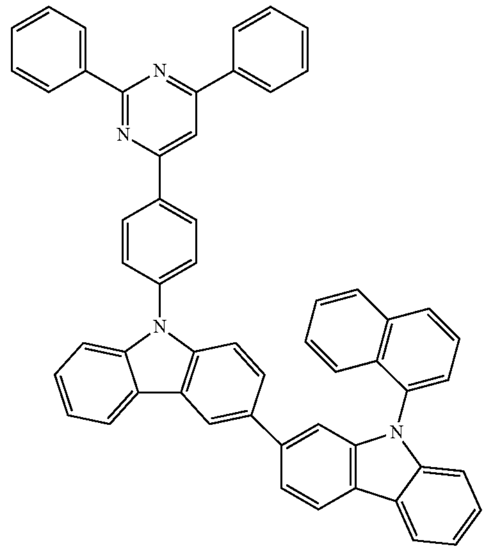
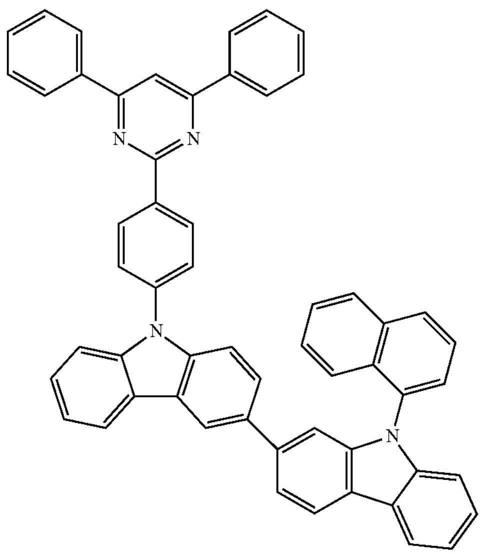
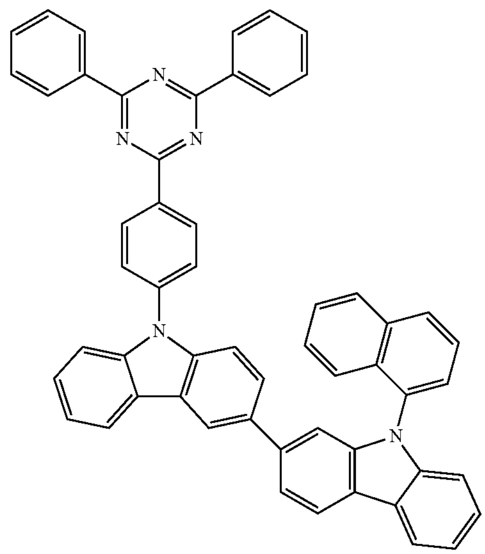
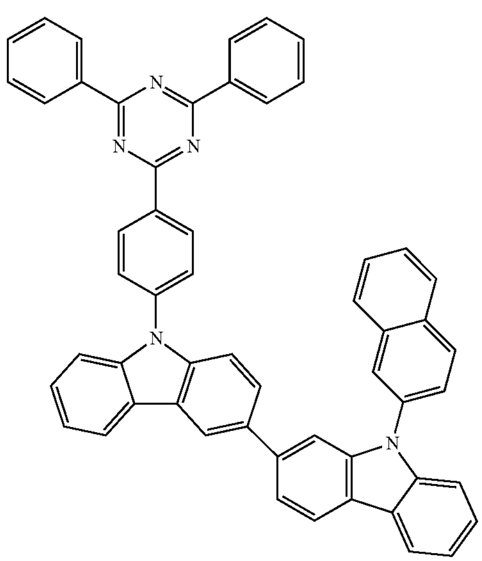
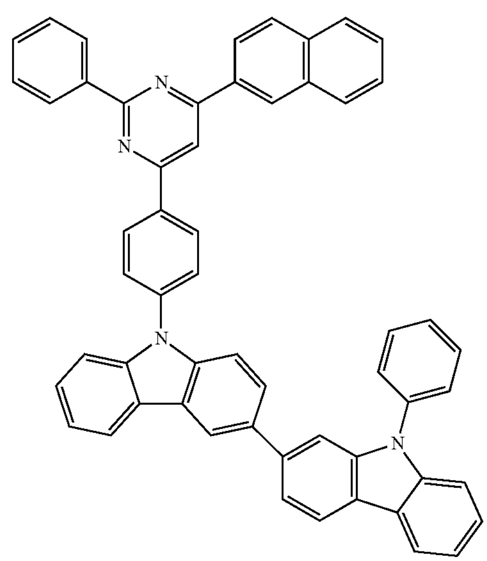

-continued
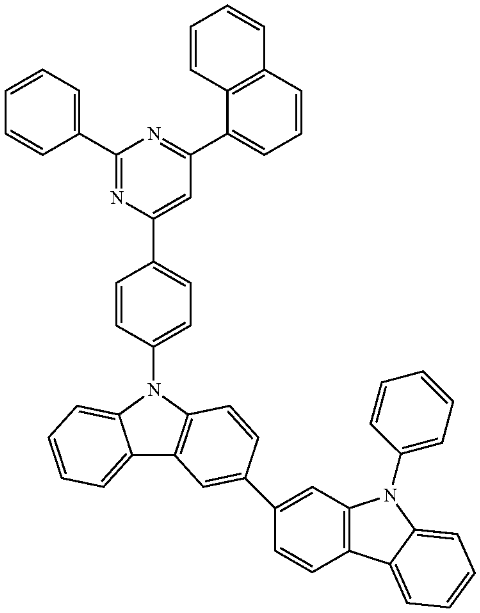
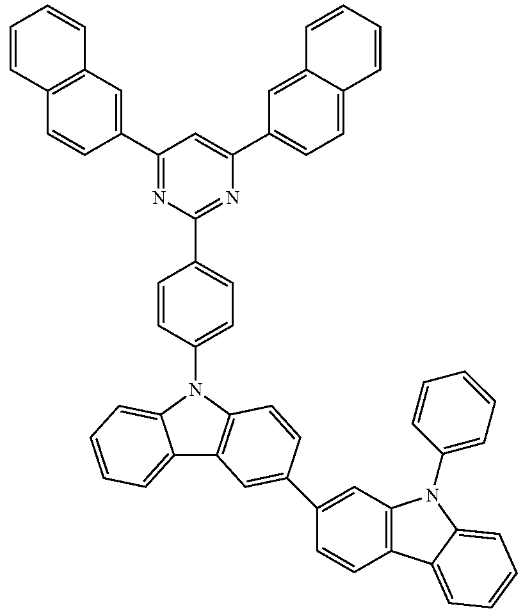
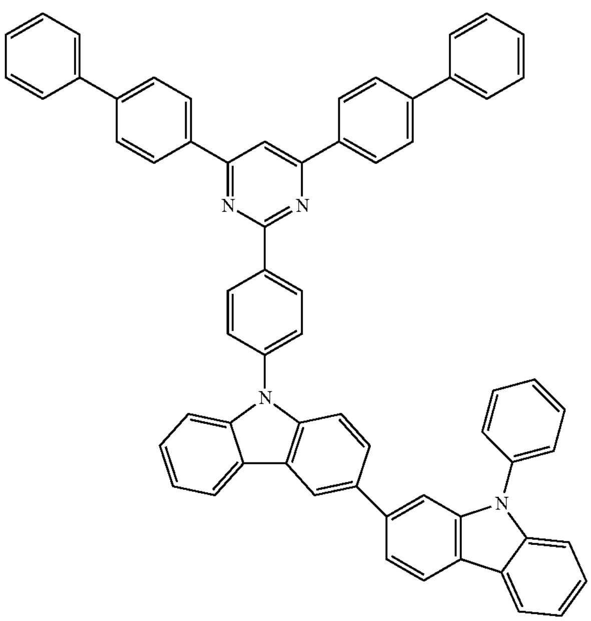
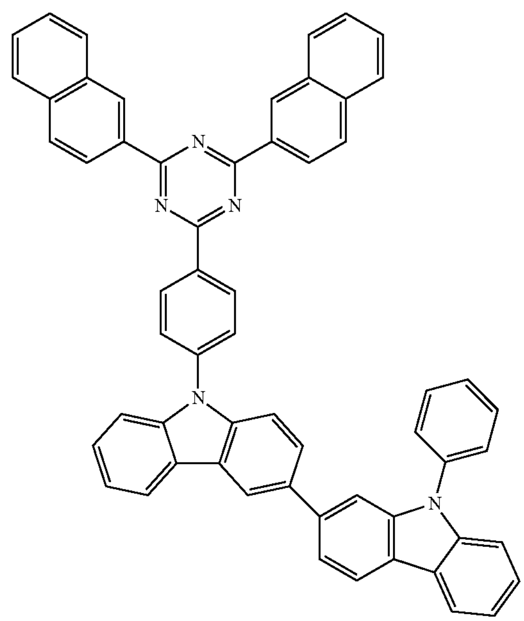

-continued
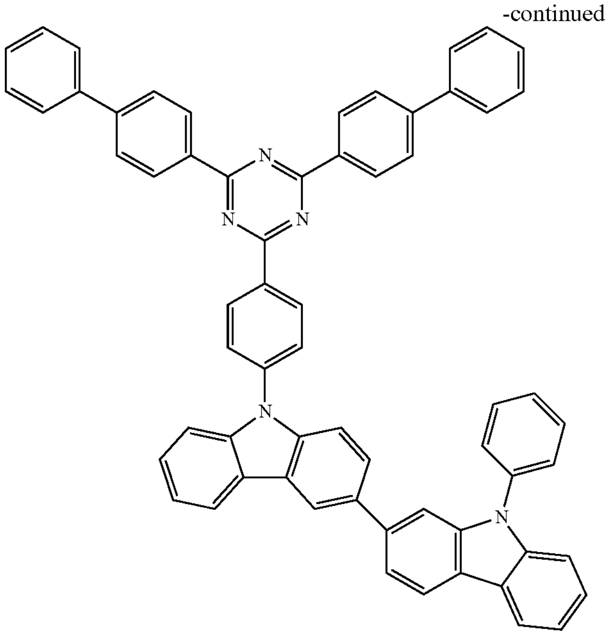
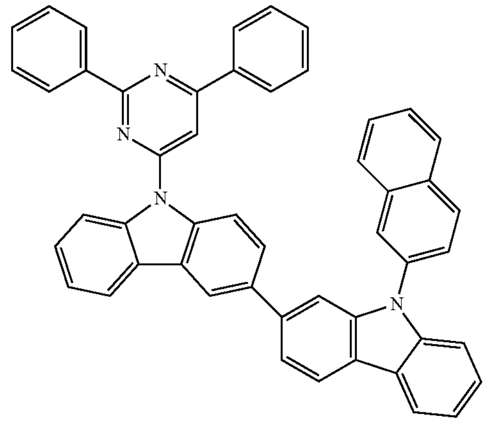
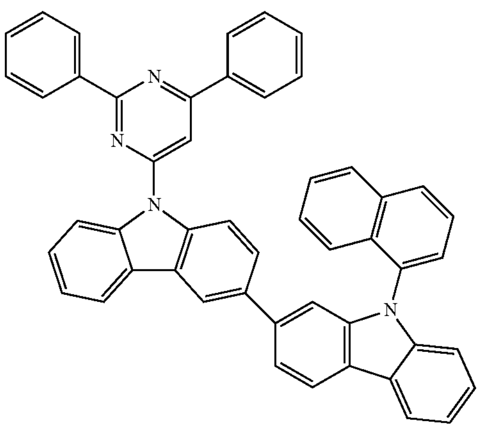
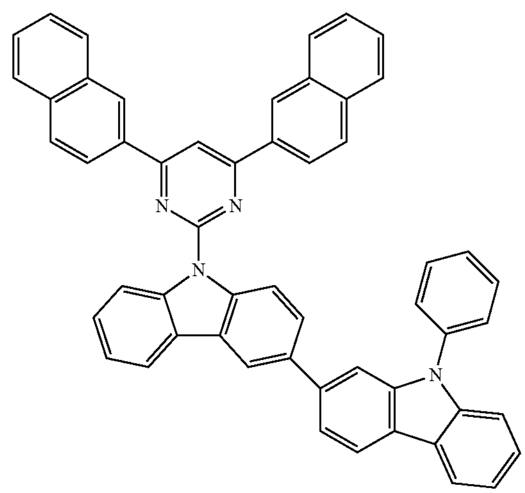
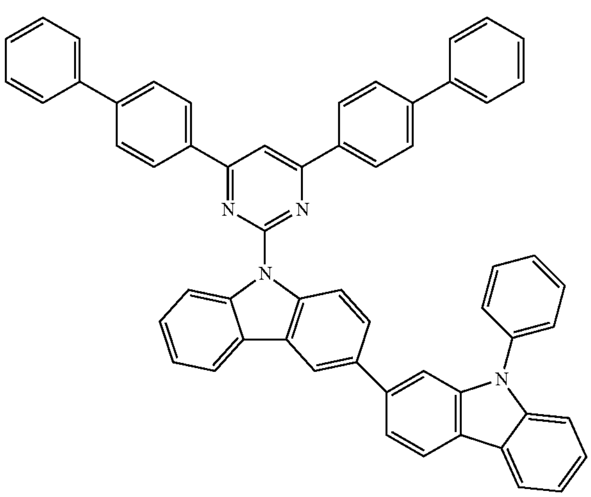
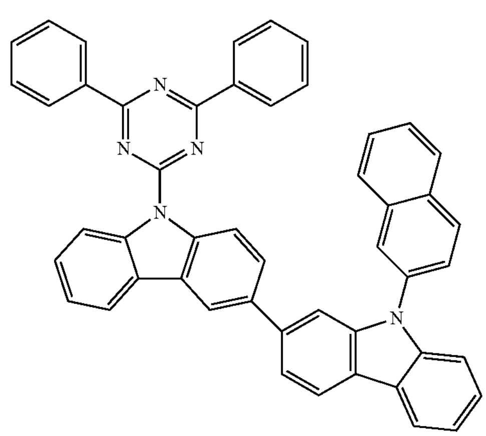

-continued
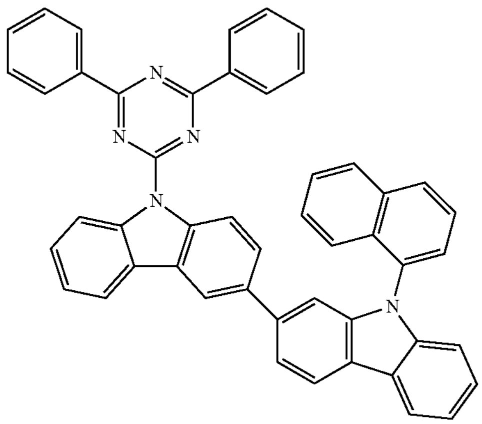
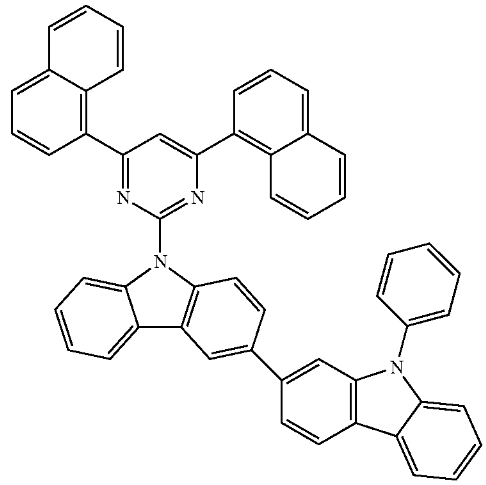
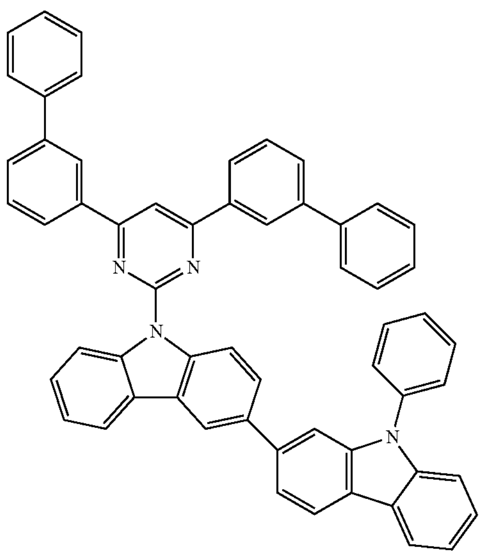
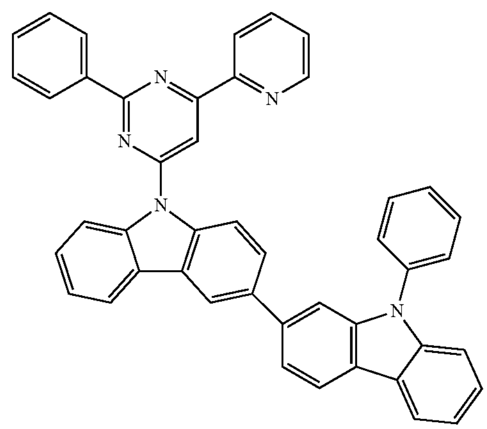
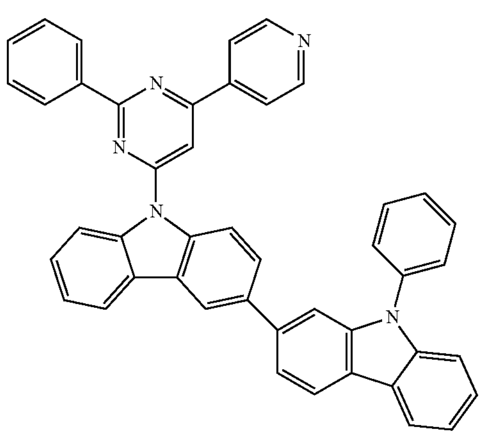
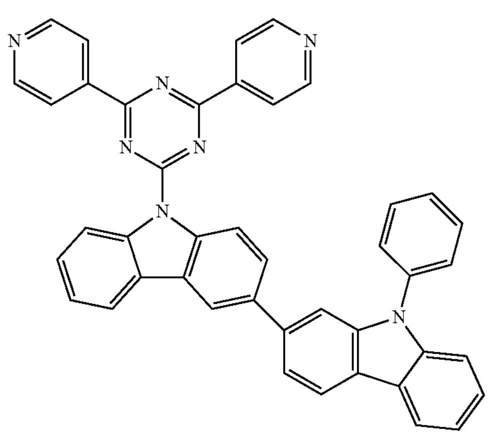

-continued
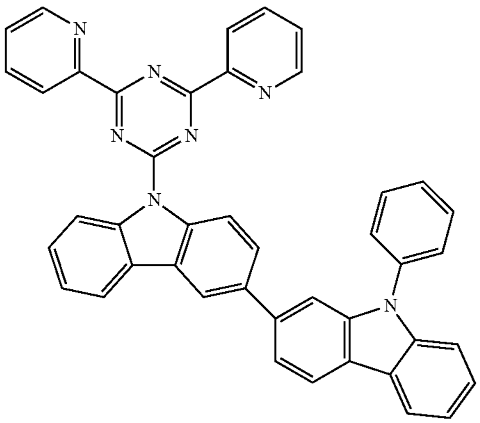
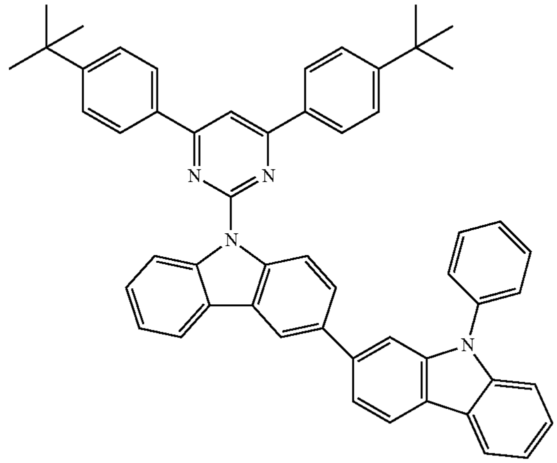
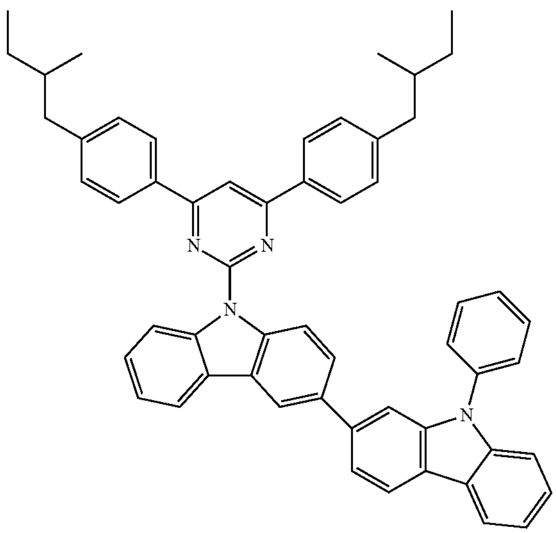
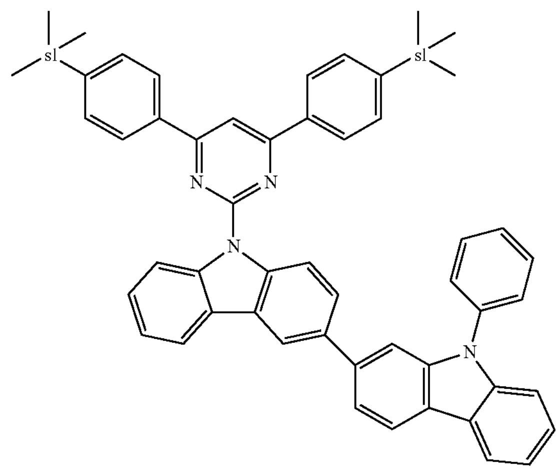
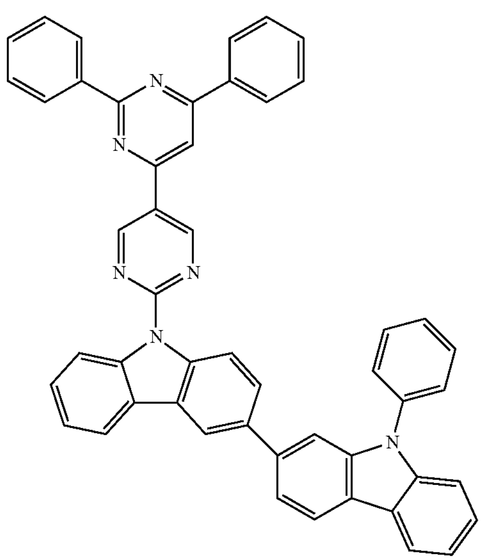
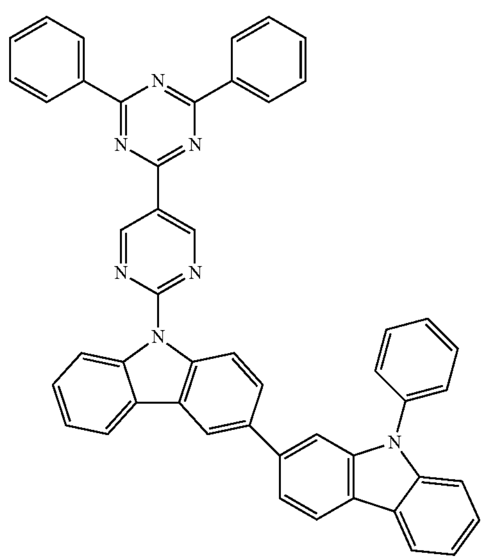

-continued
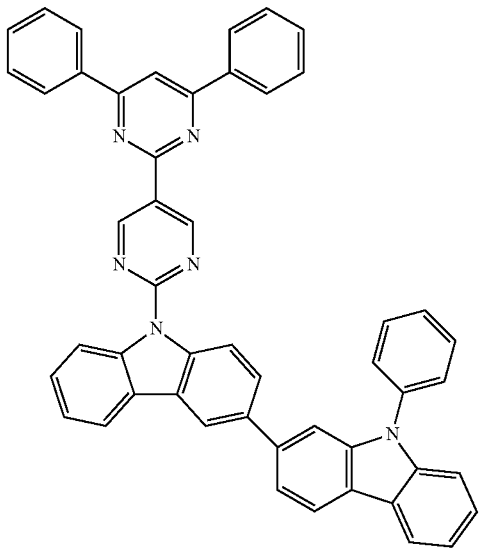
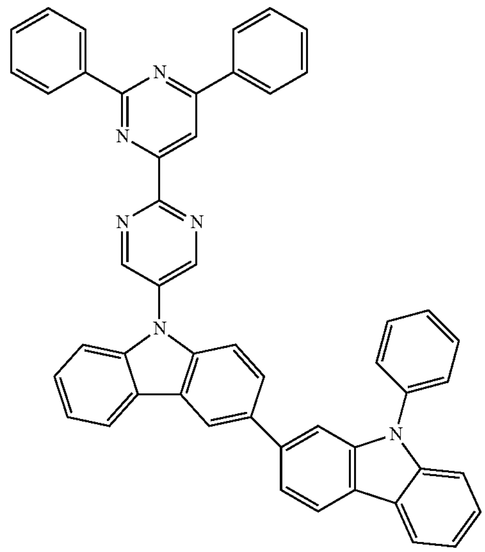
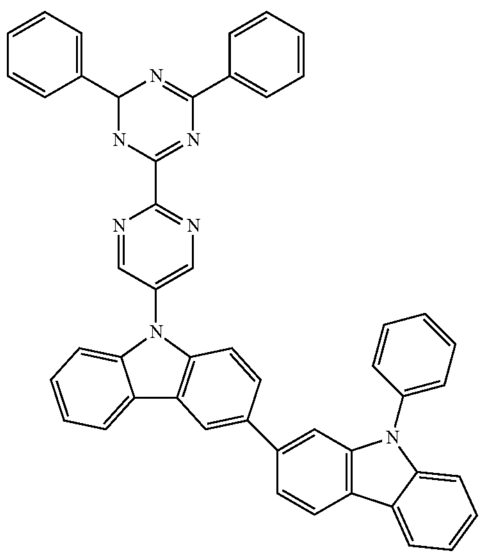
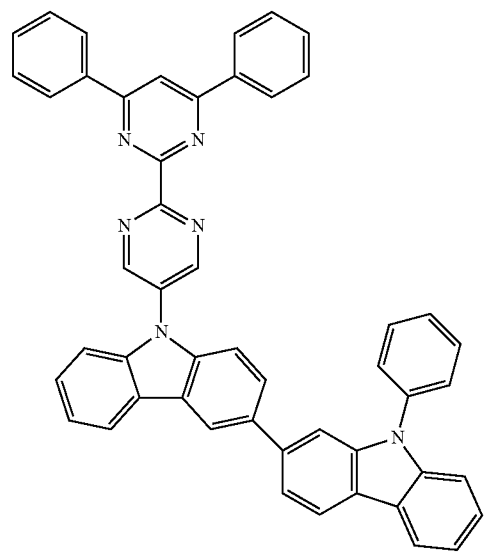
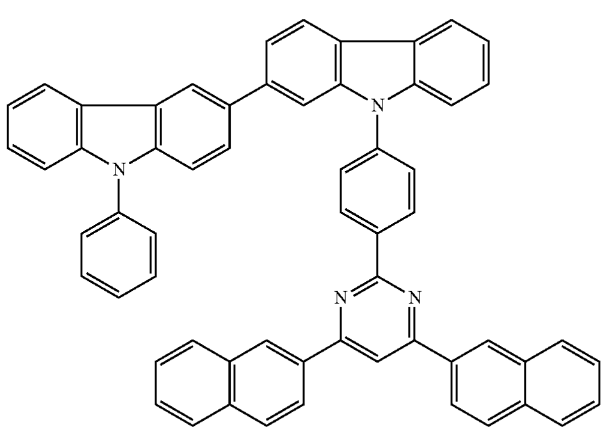
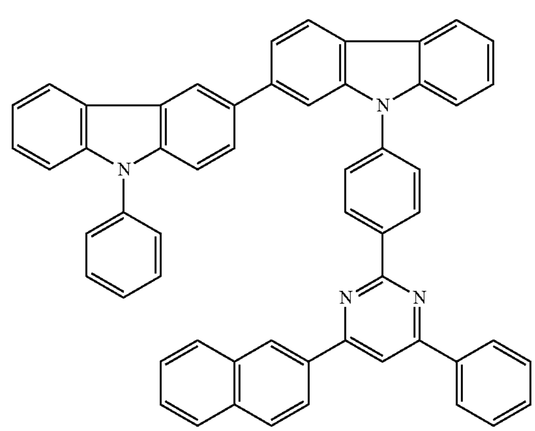

-continued
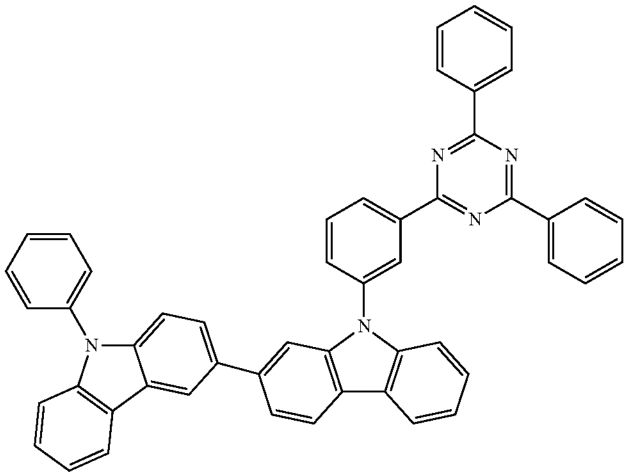
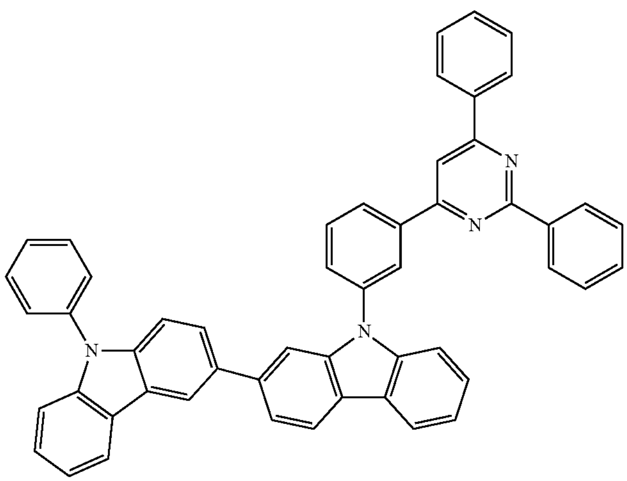
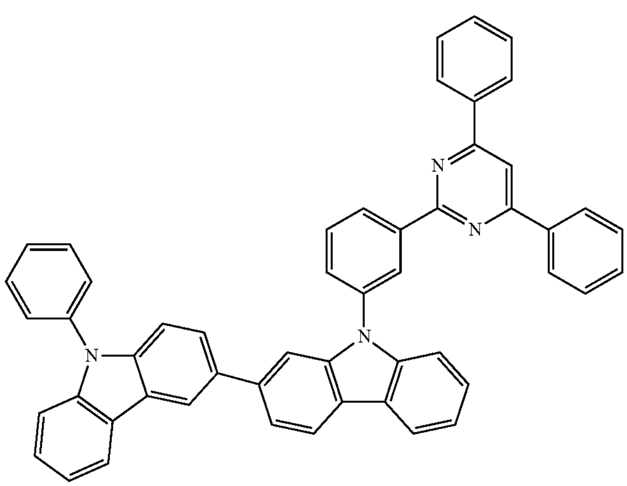

-continued
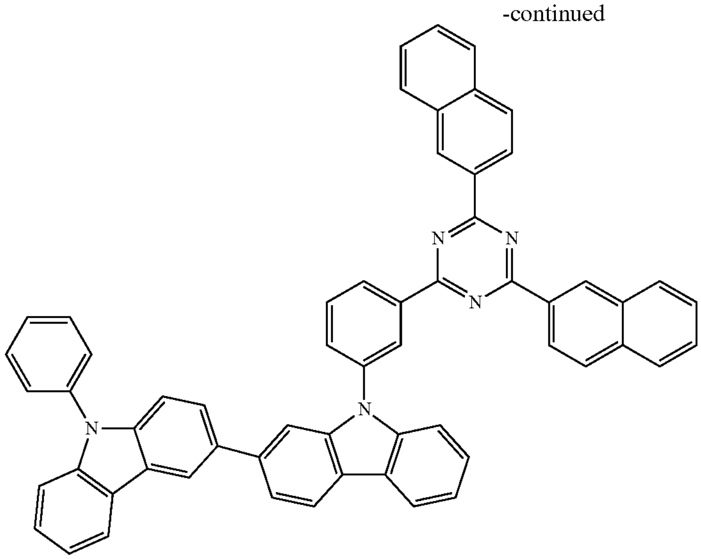
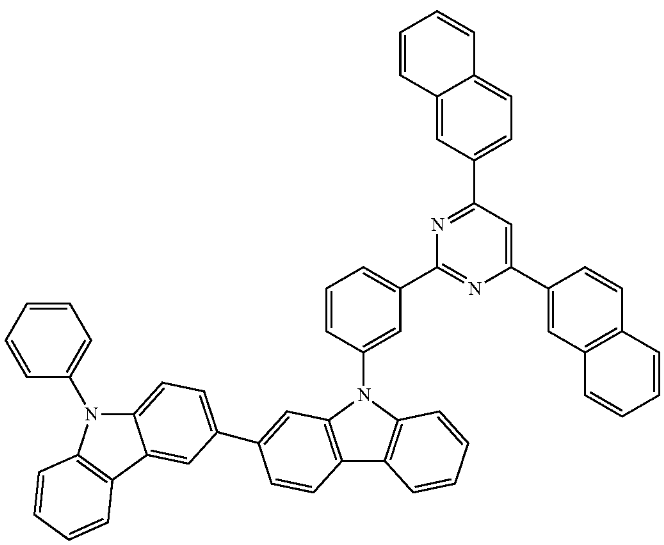
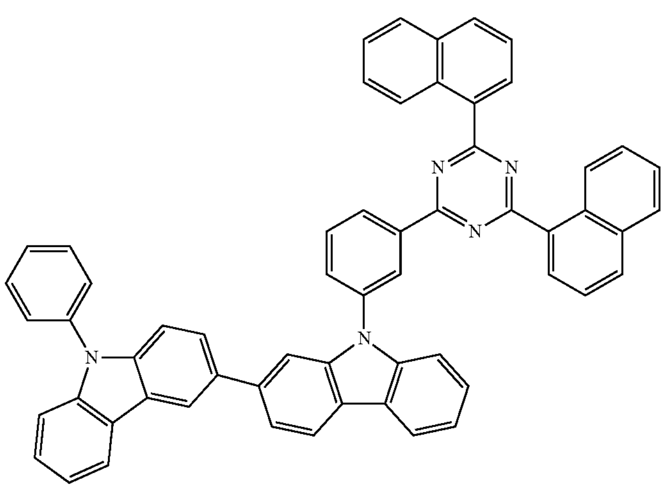

-continued
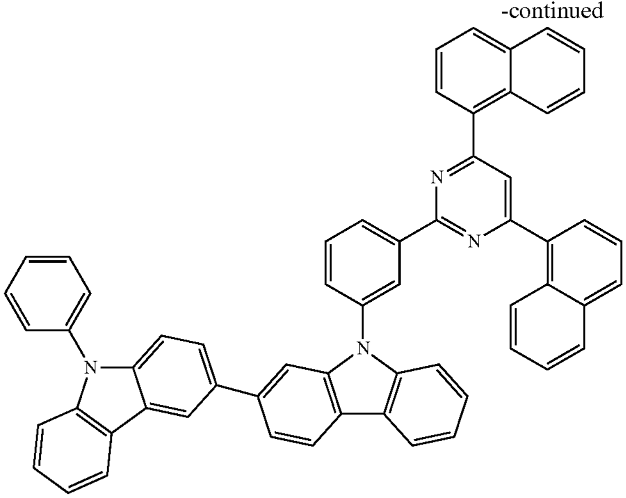
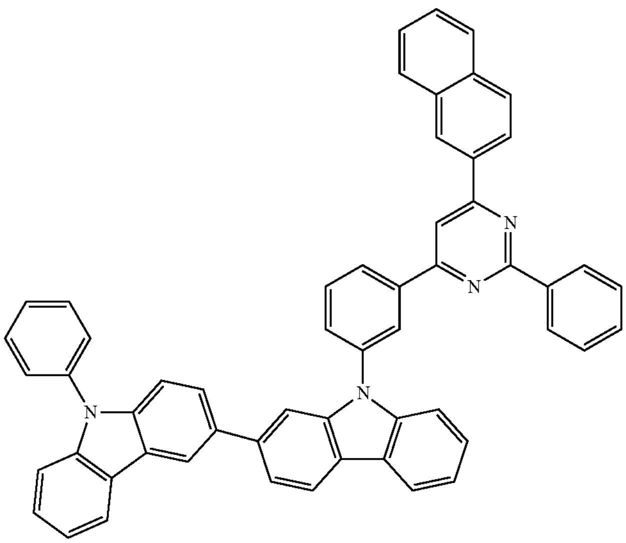
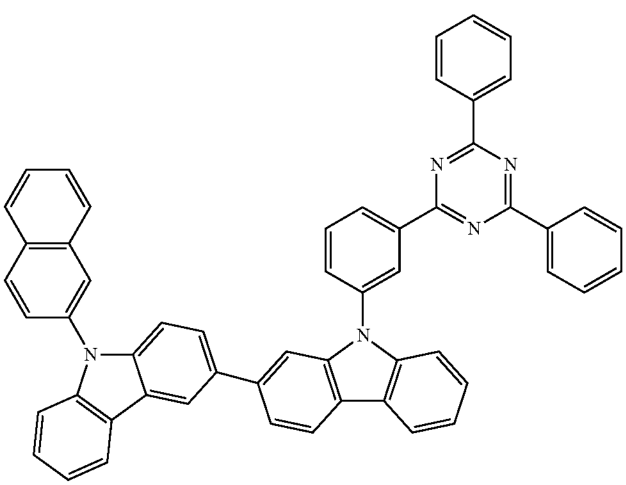
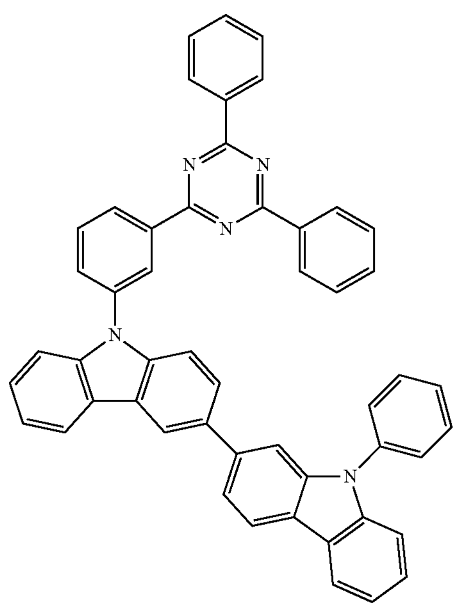

-continued
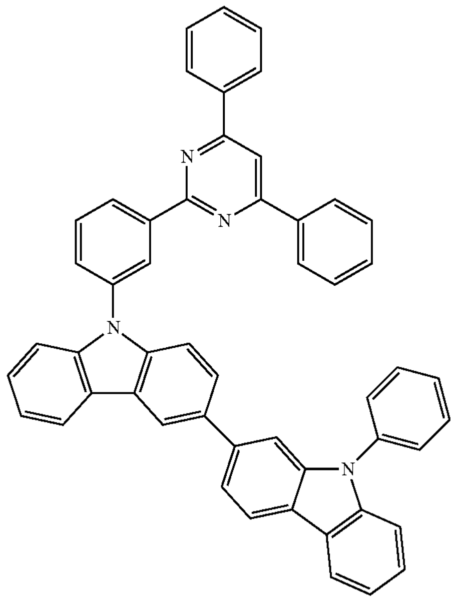
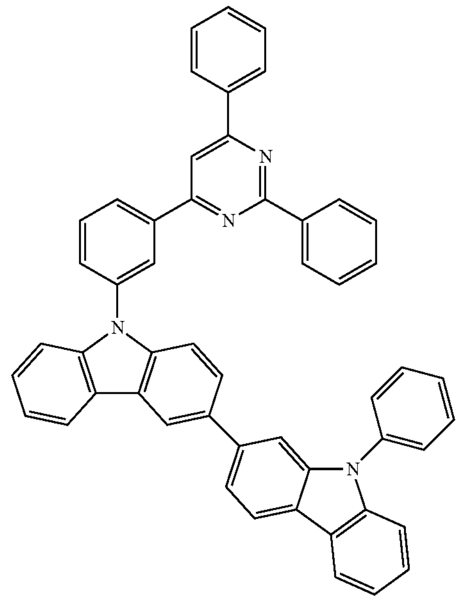
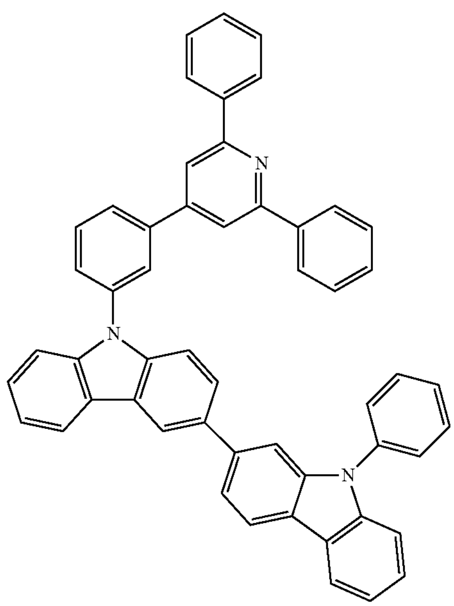
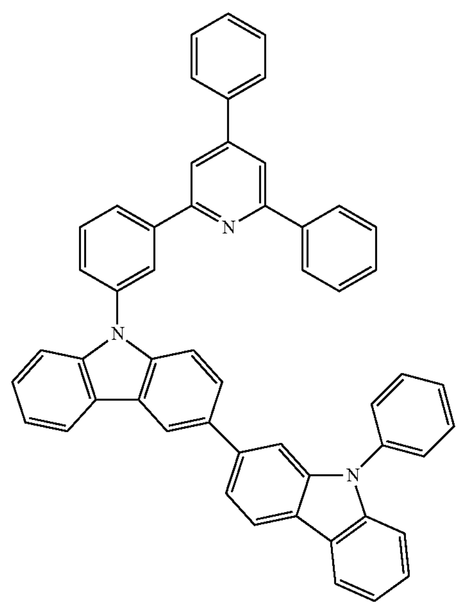

-continued
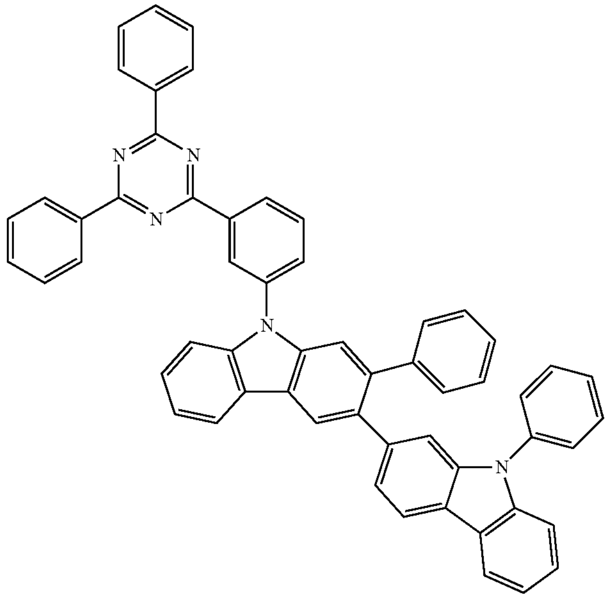
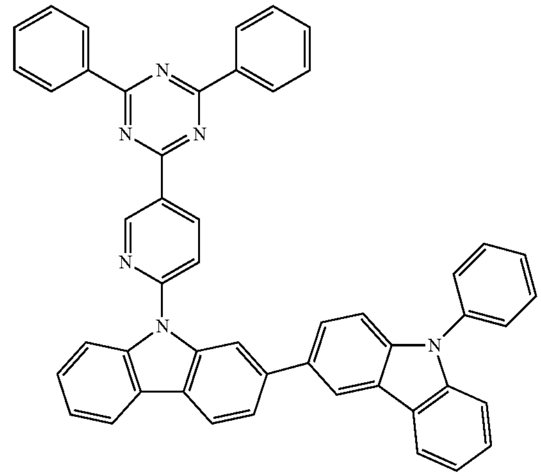
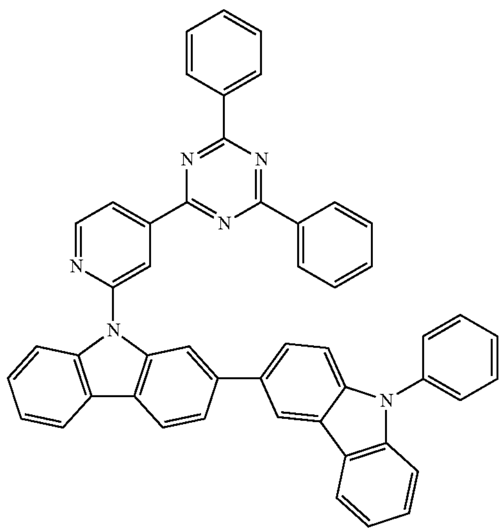
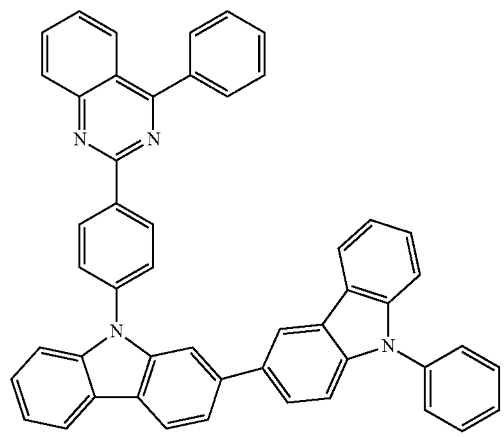
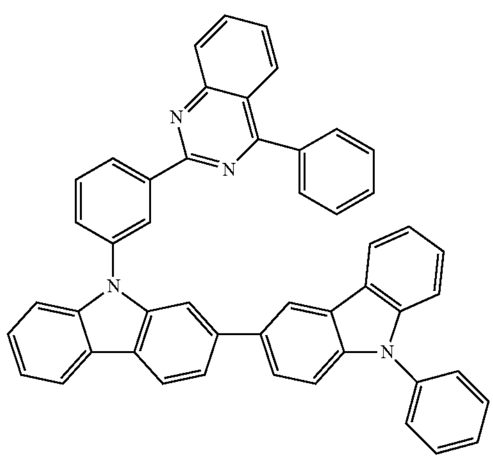
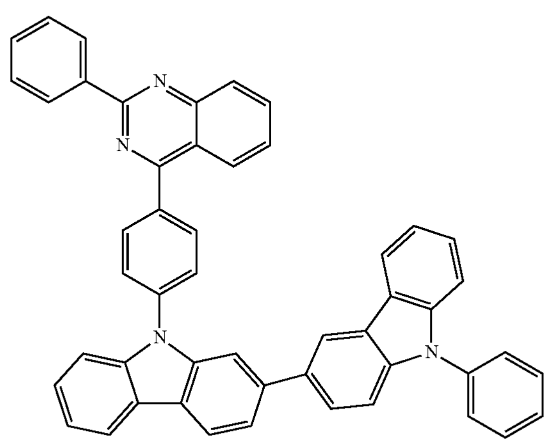

-continued
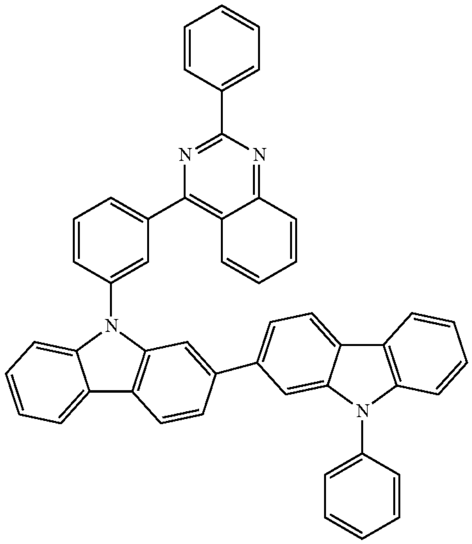
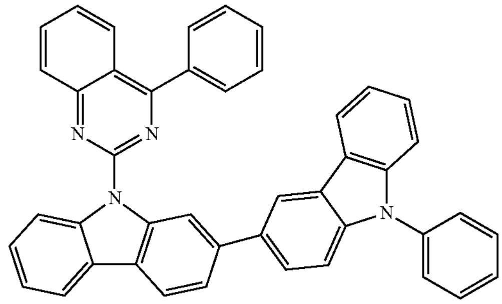
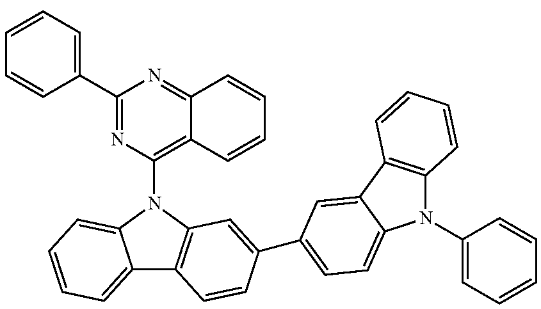
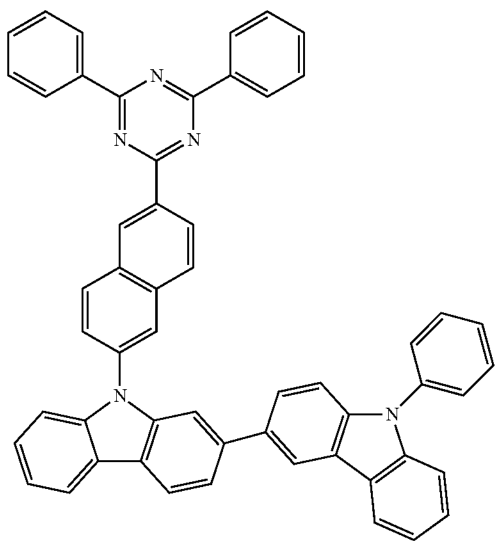
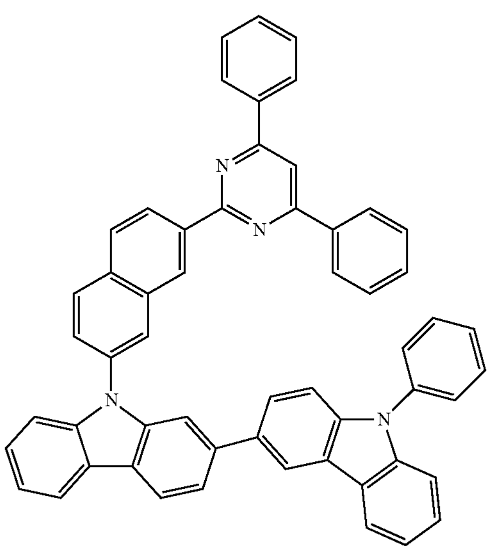
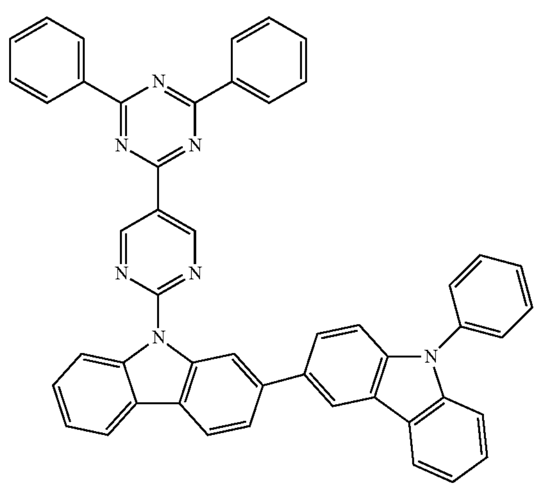

-continued
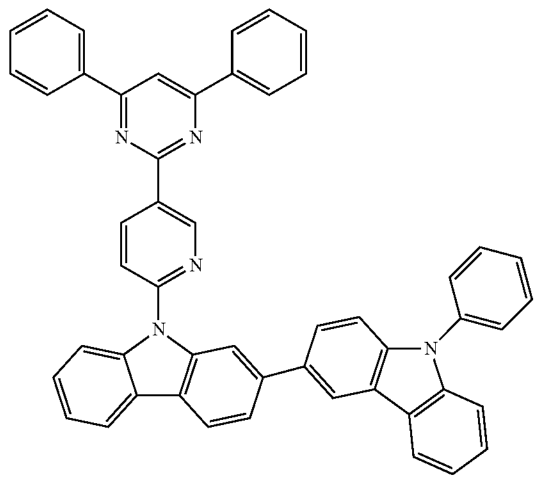
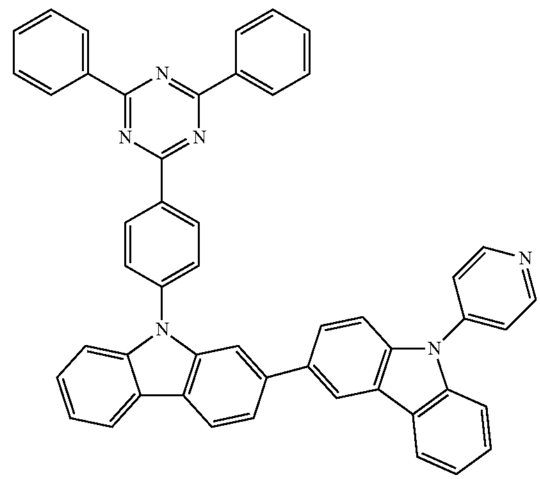
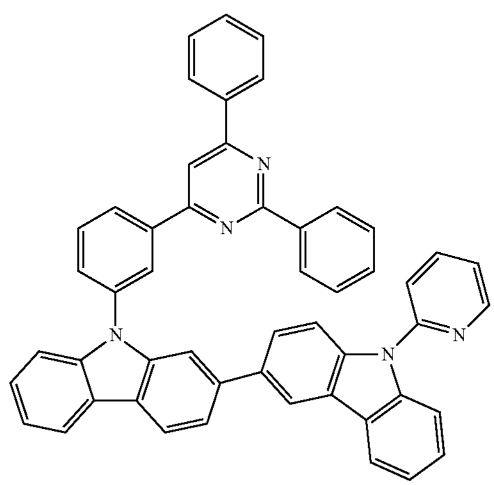
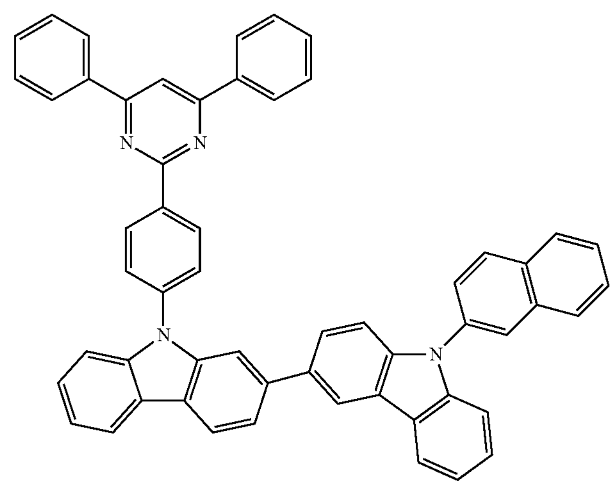
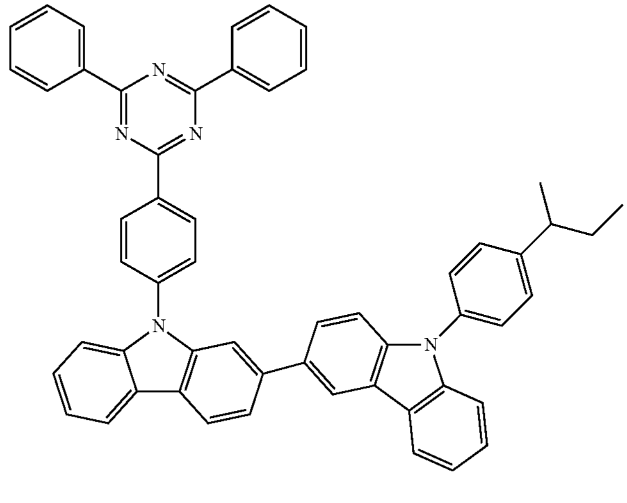

-continued
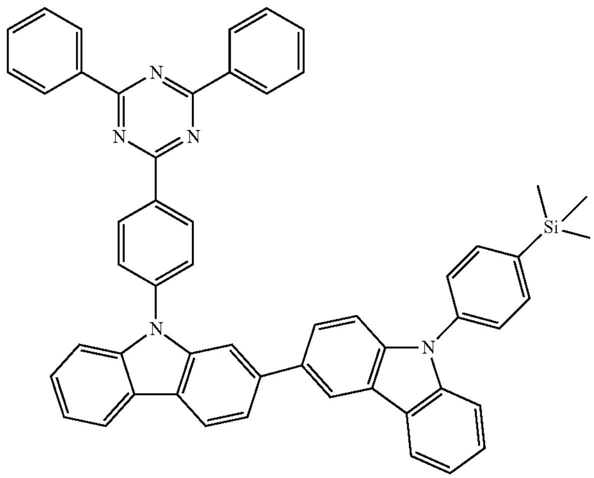
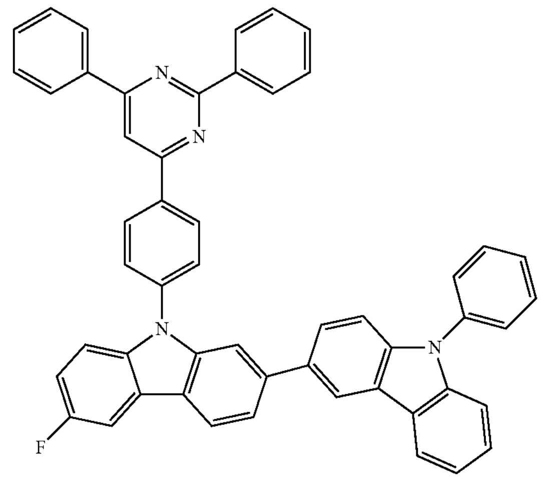
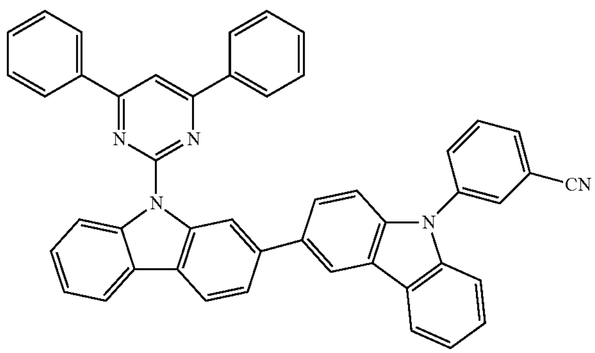
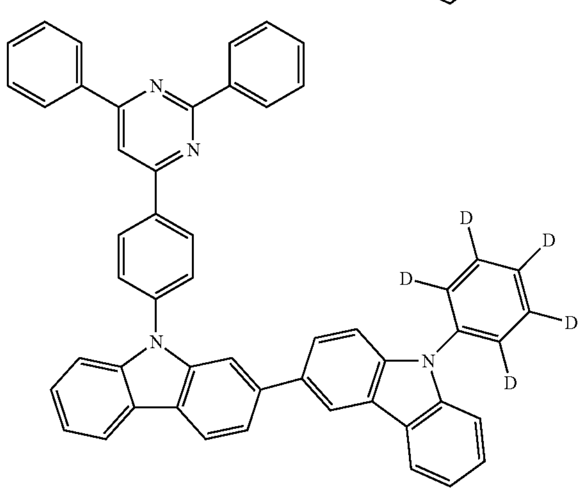
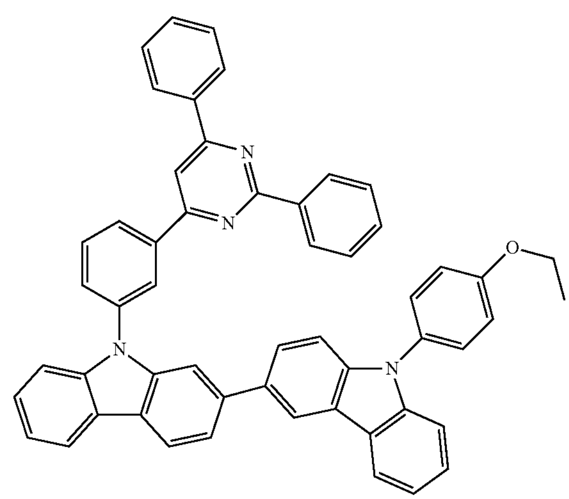
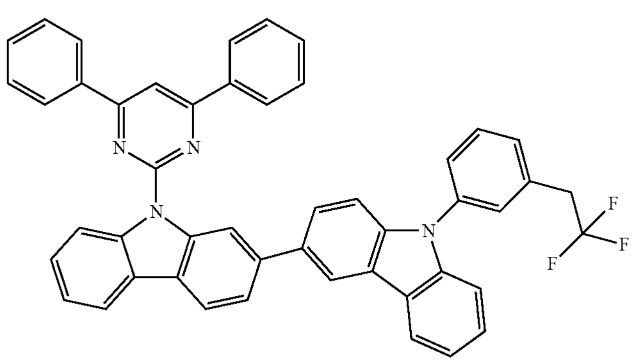

-continued
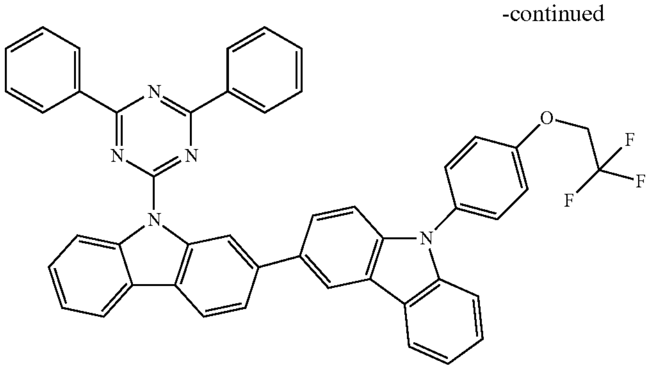
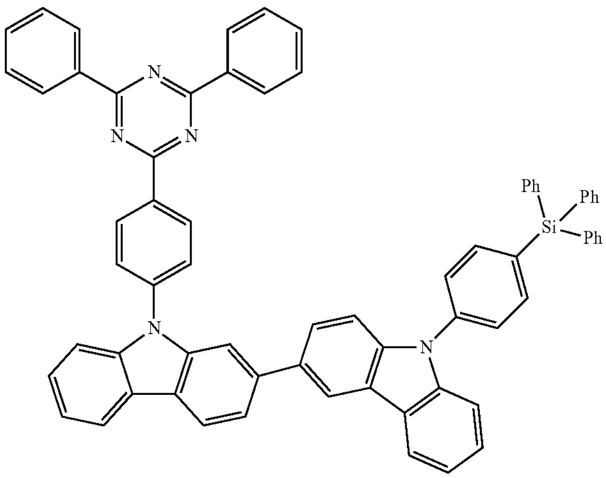
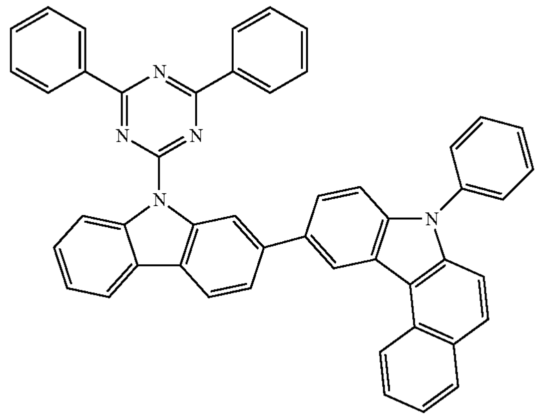
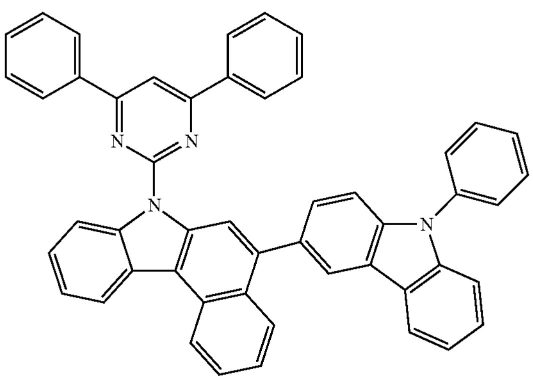
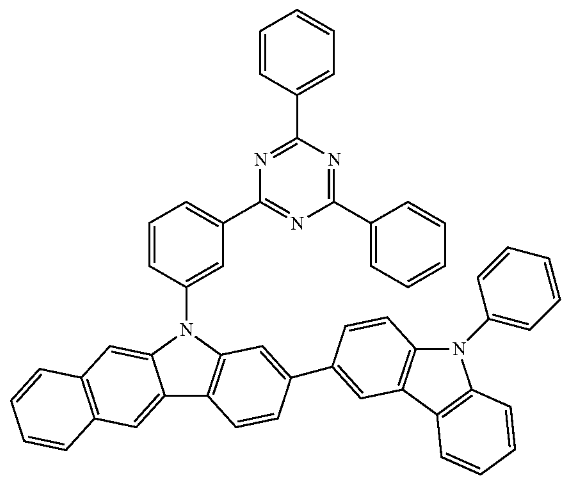
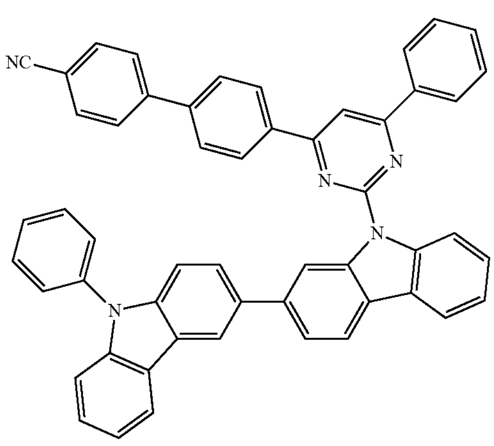
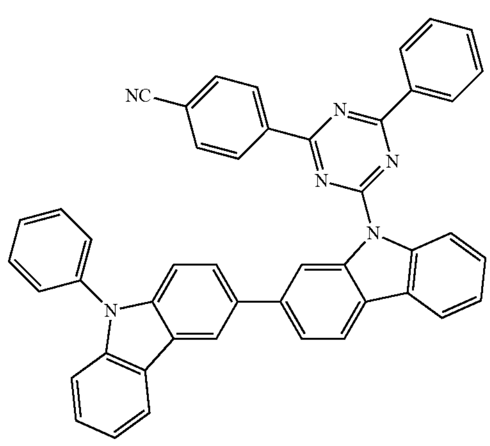

-continued
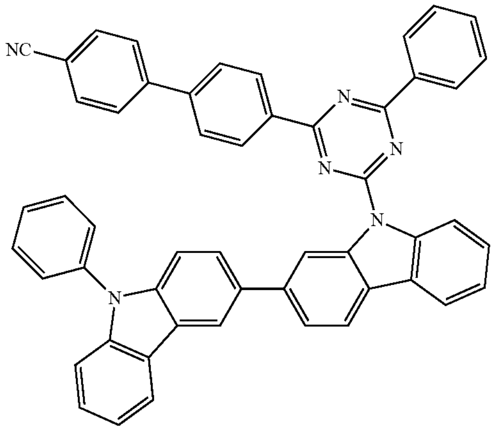
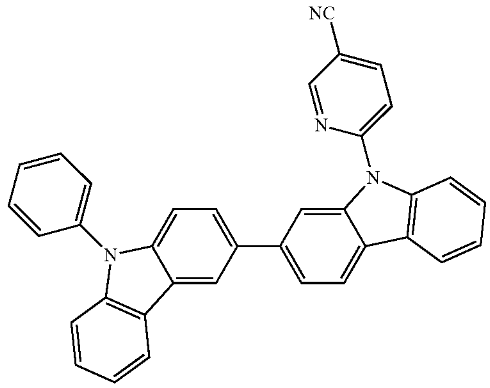
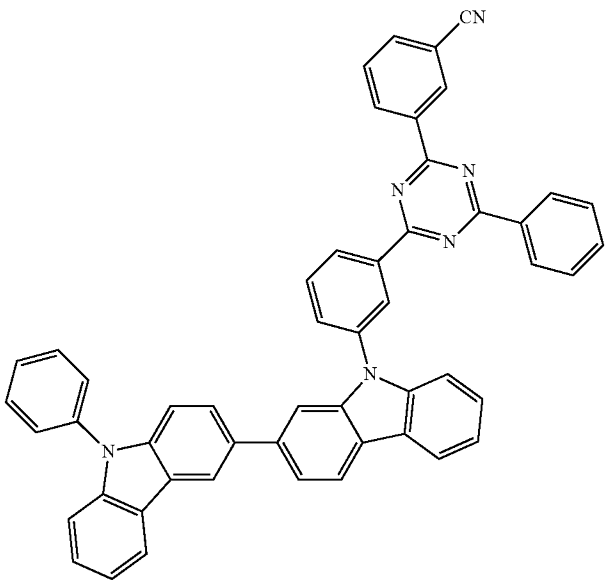
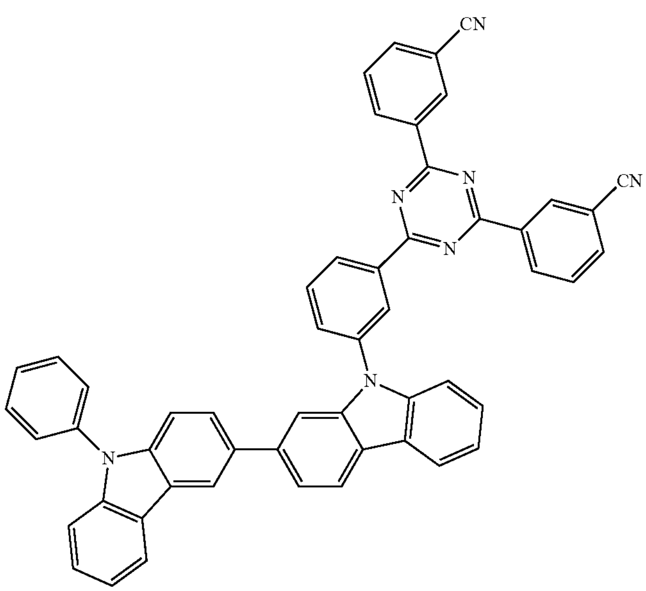

-continued
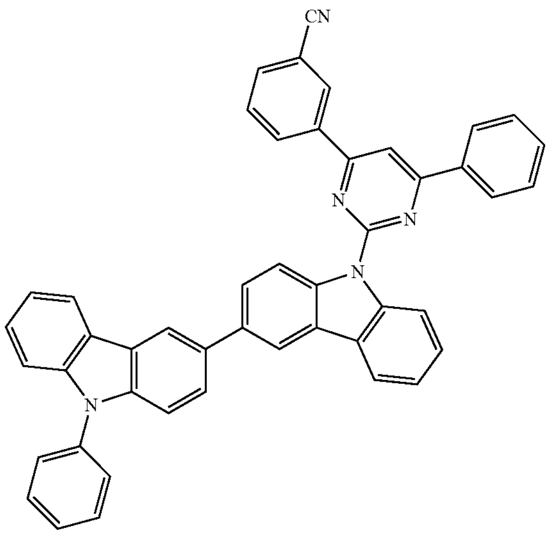
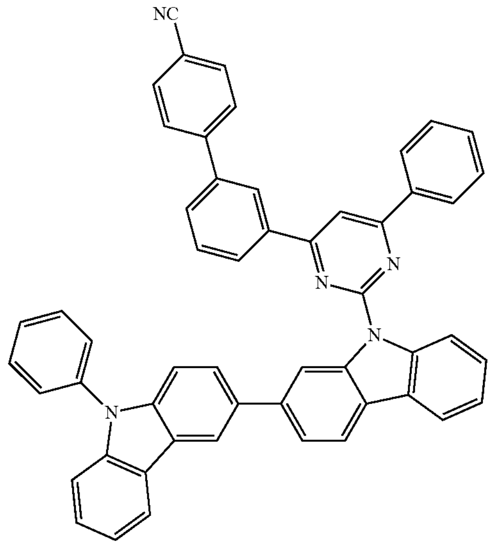
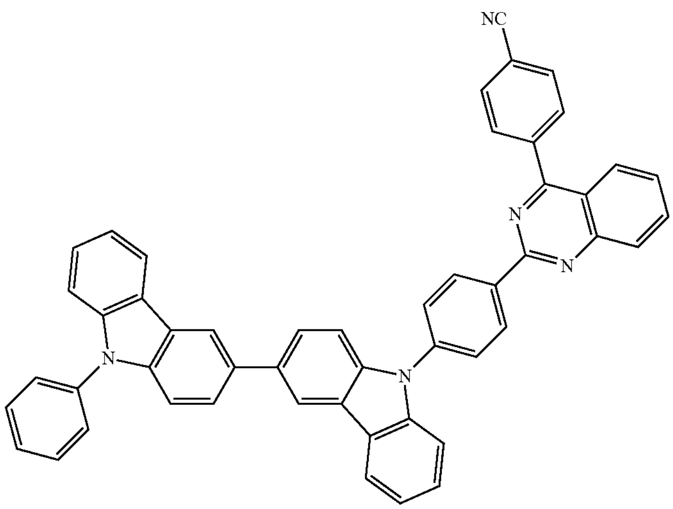
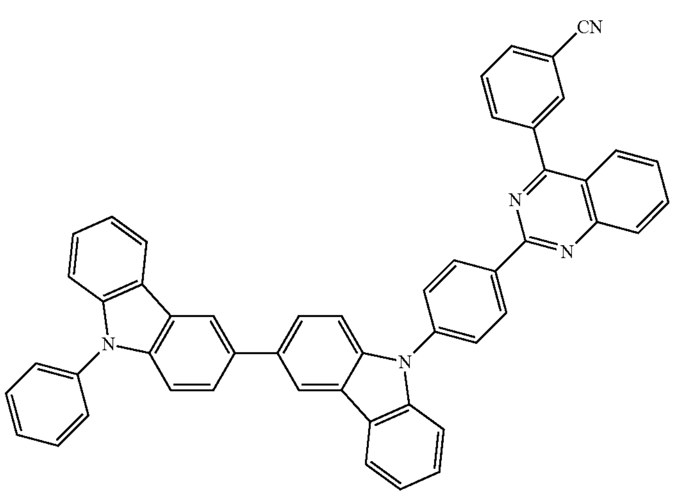

-continued
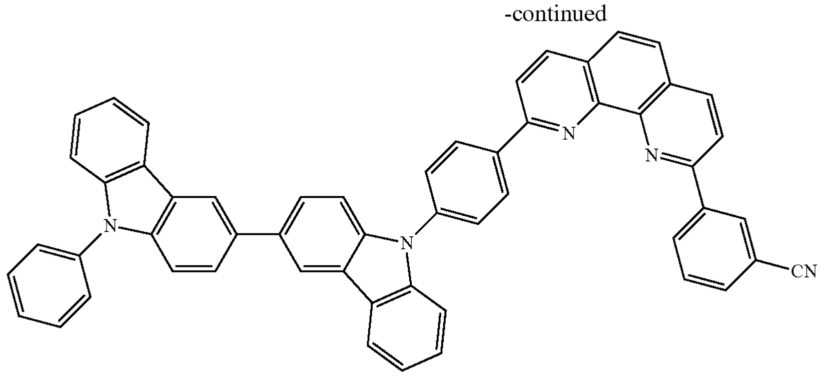
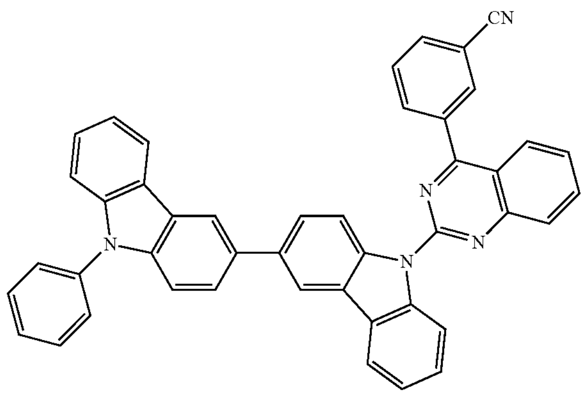
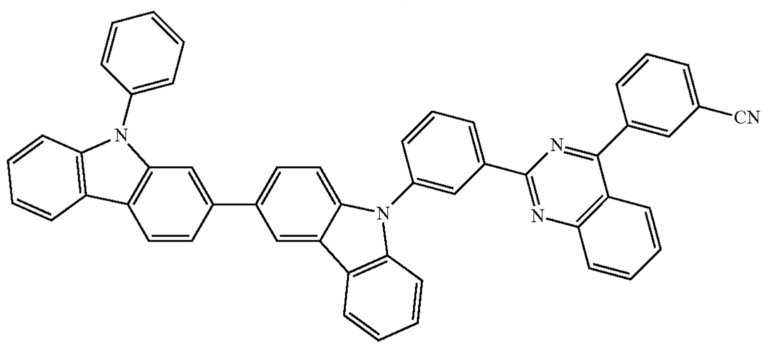
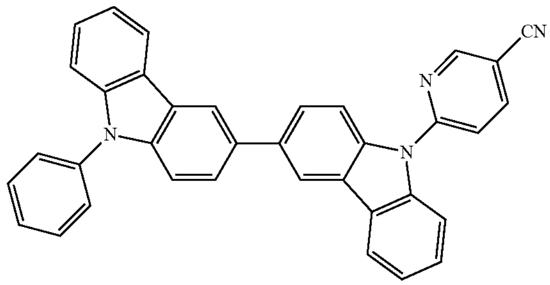
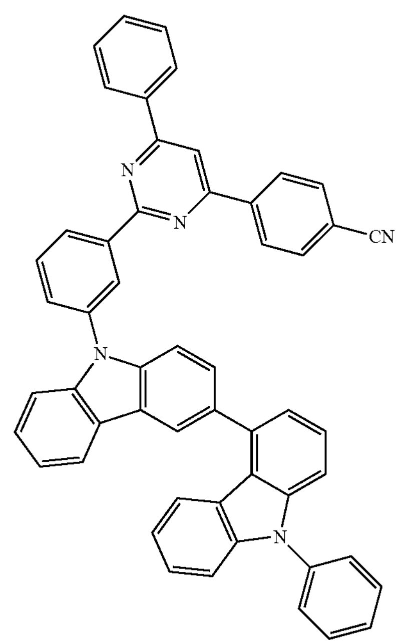

-continued
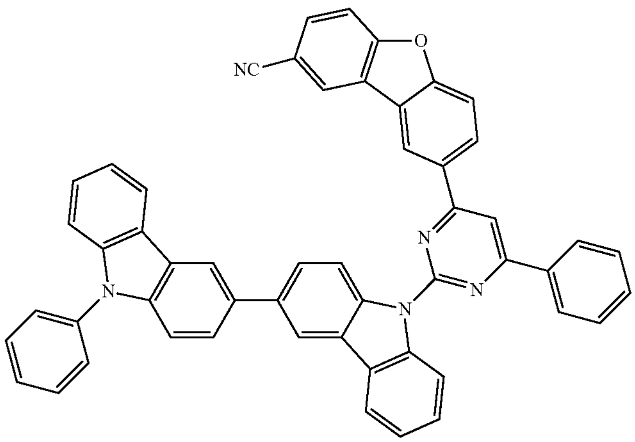
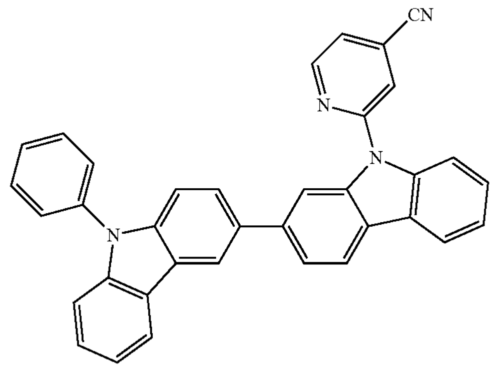
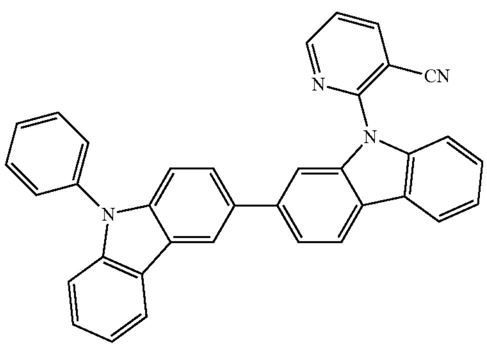
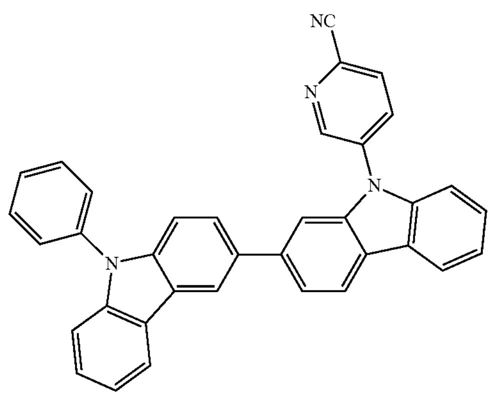
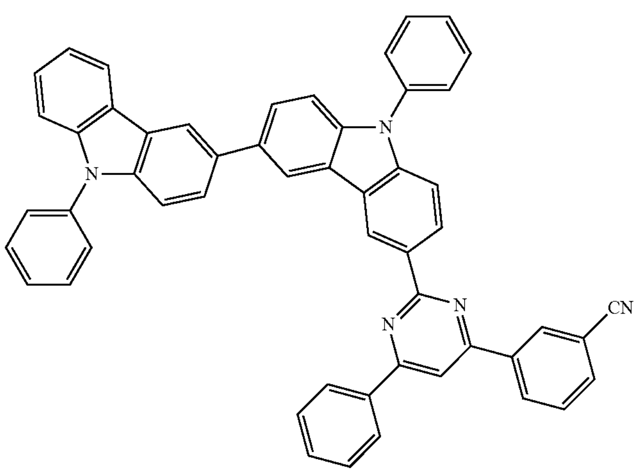

-continued
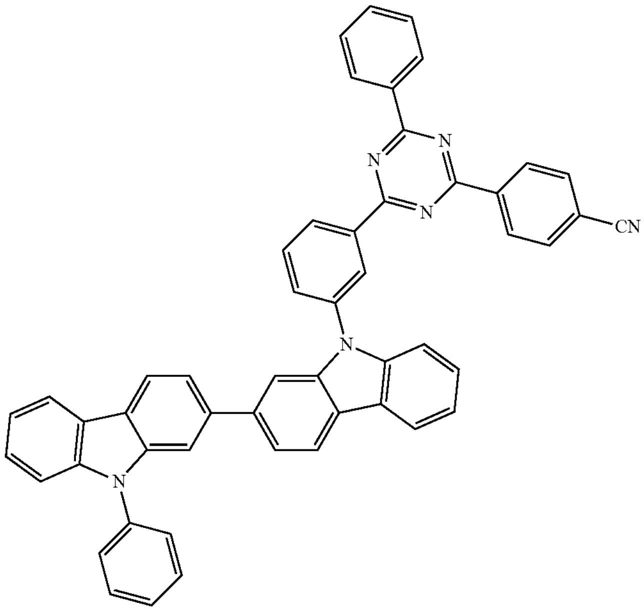
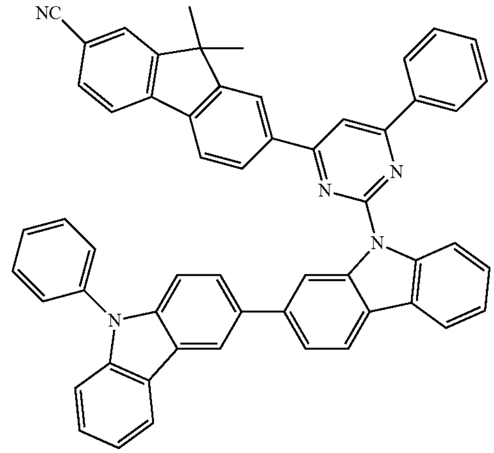
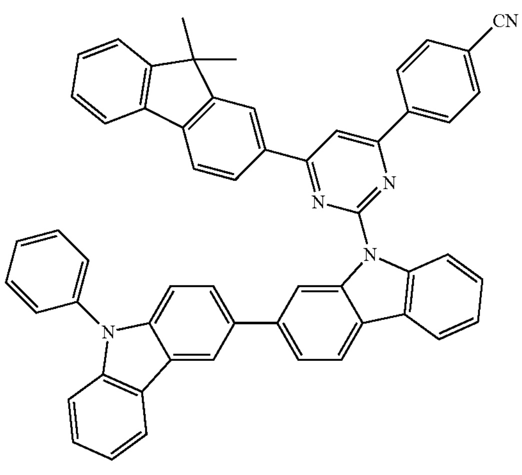
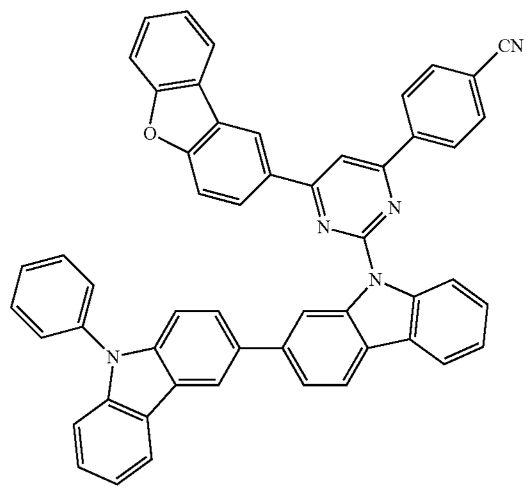
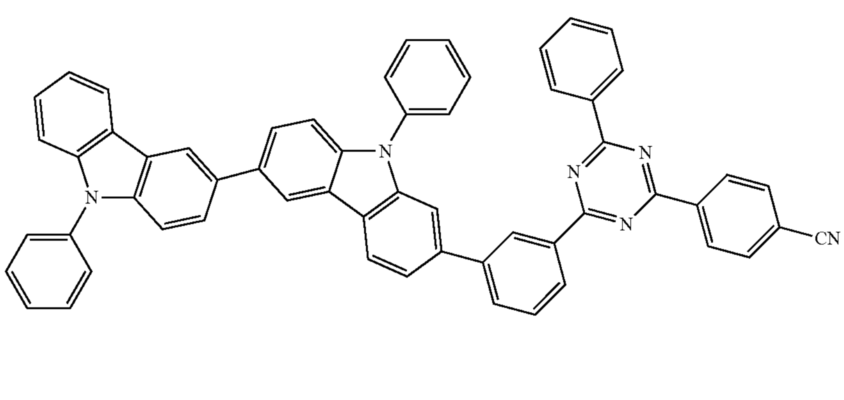

-continued
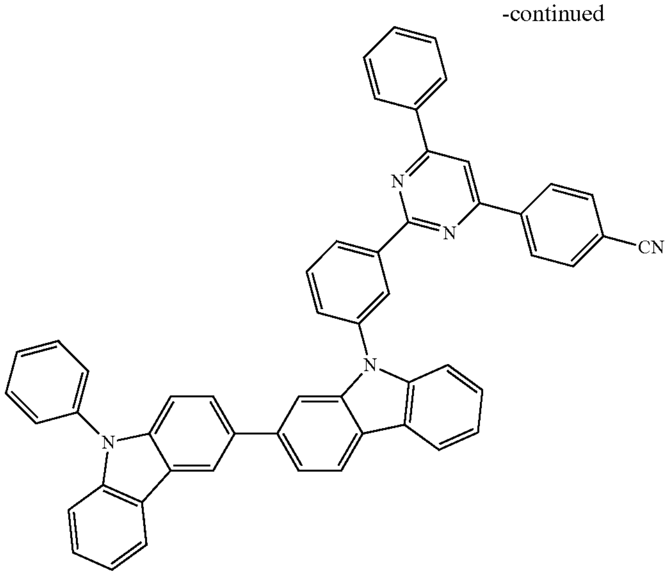
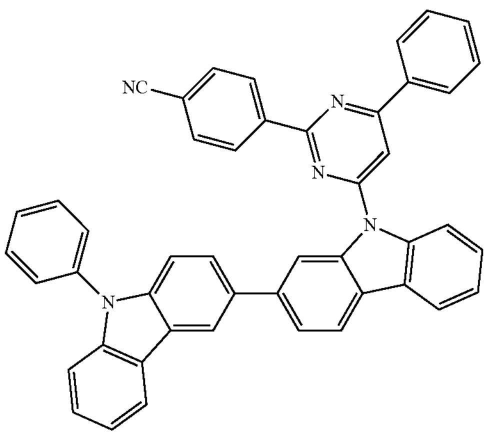
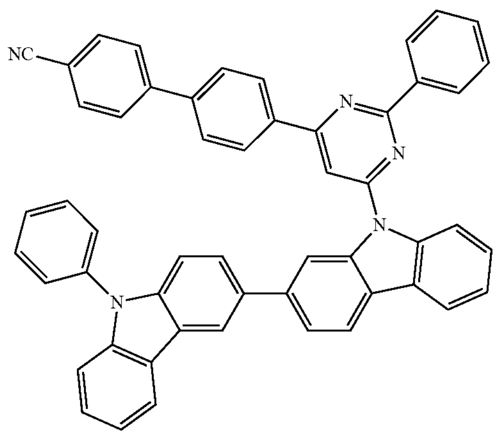
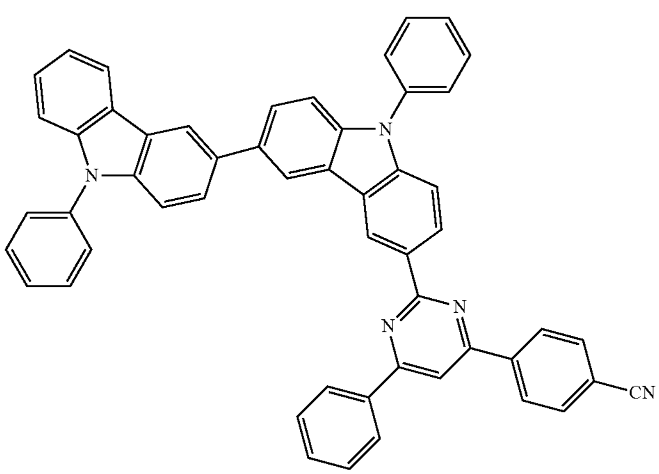
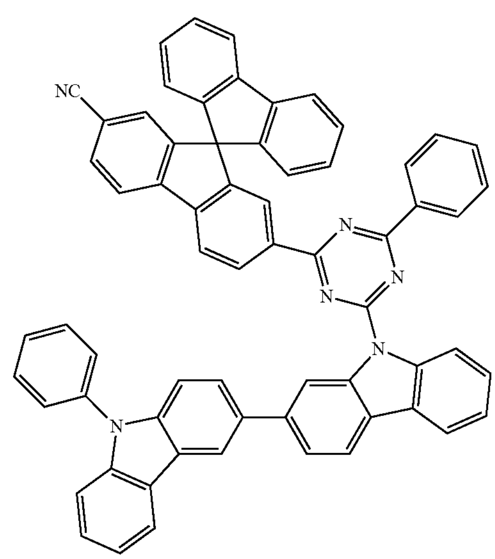

-continued
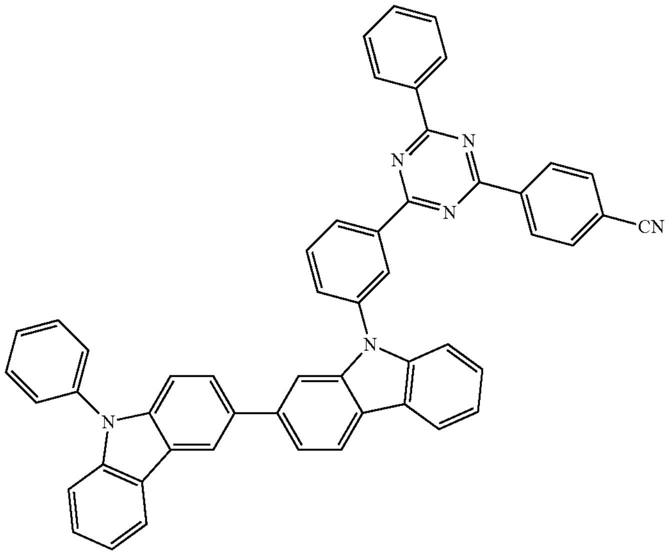
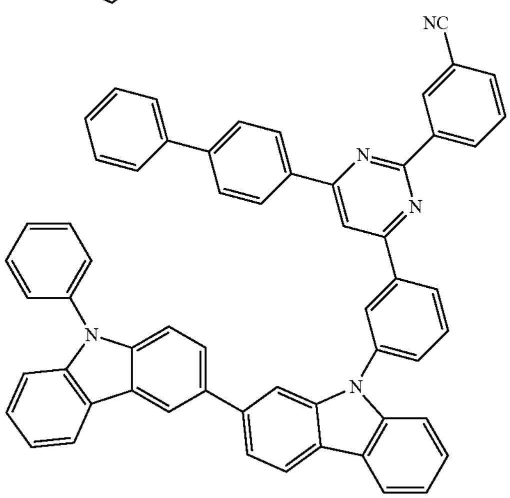
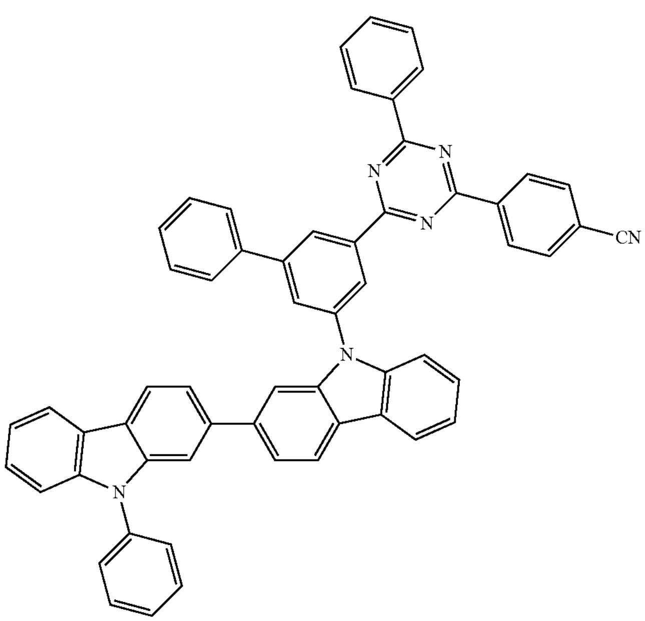
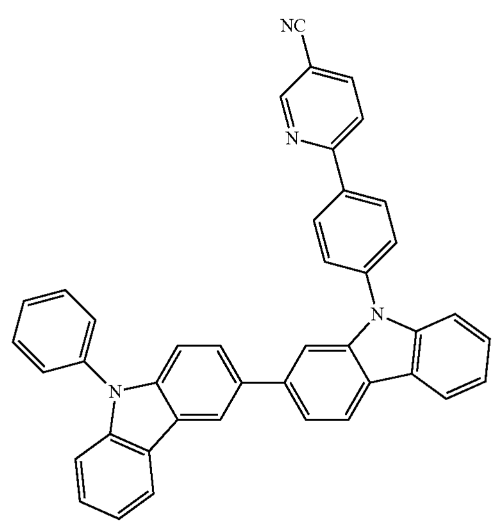

-continued
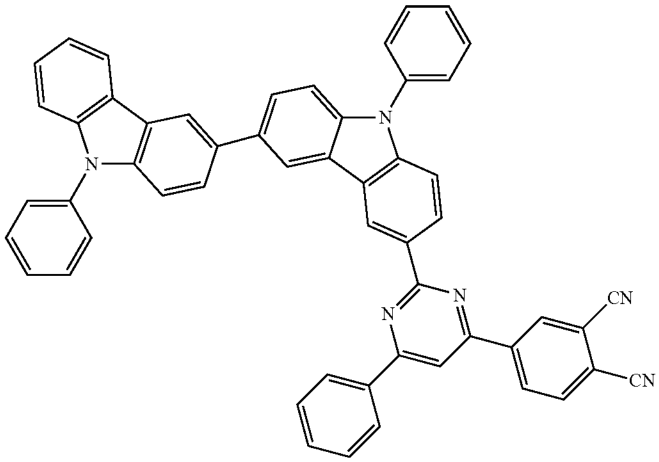
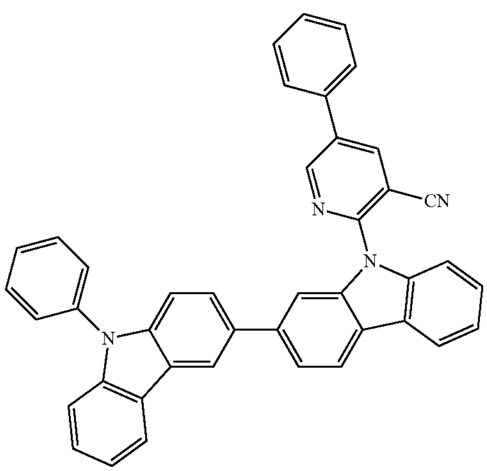
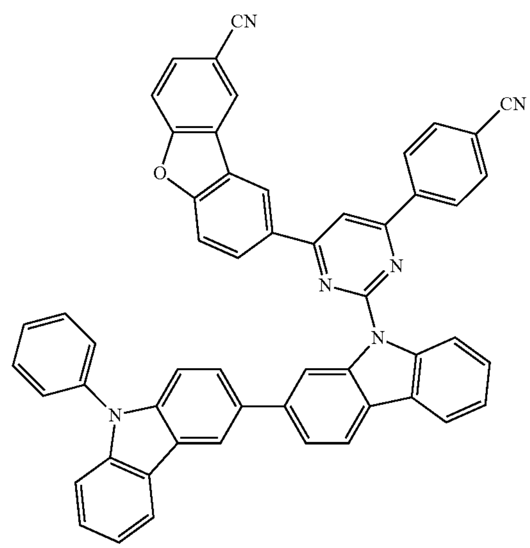
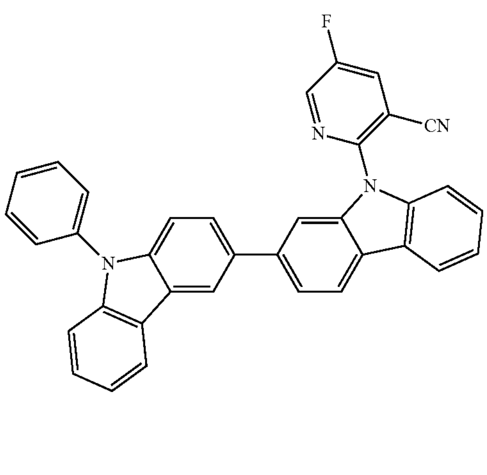
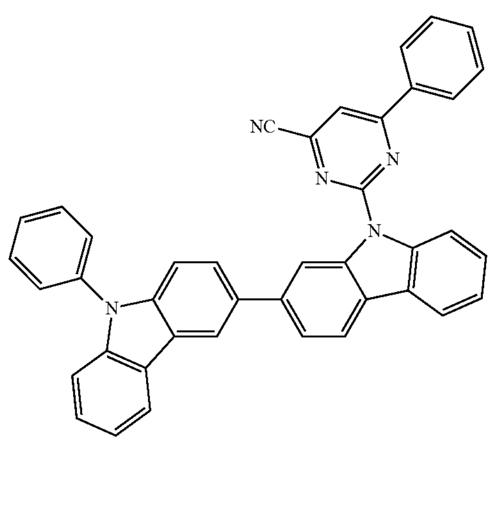

-continued
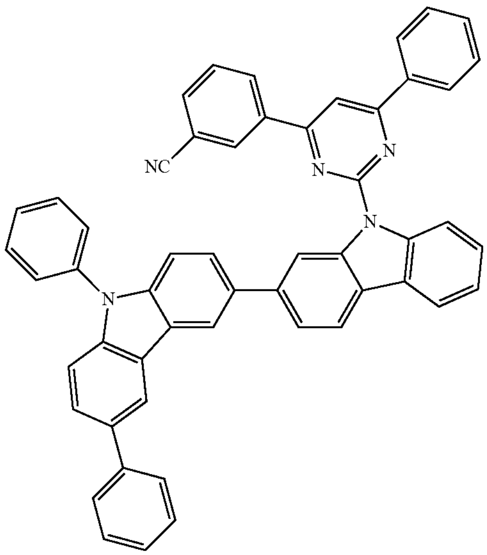
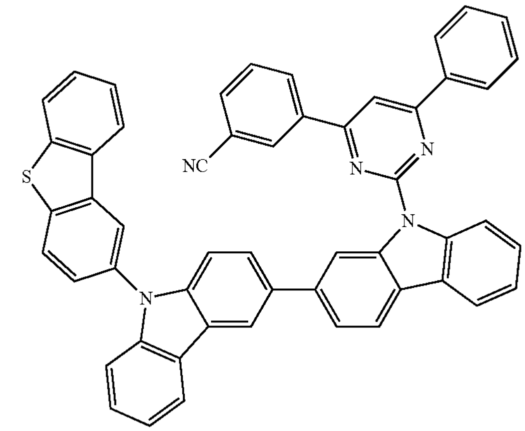
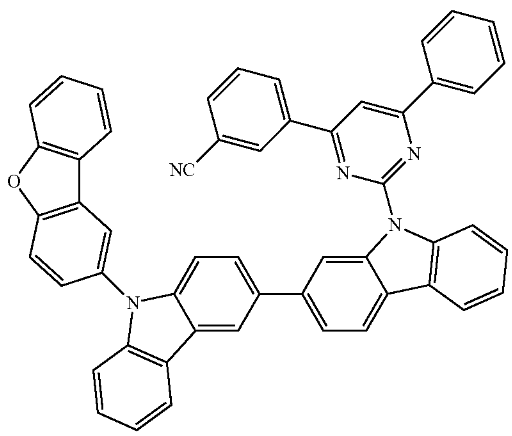
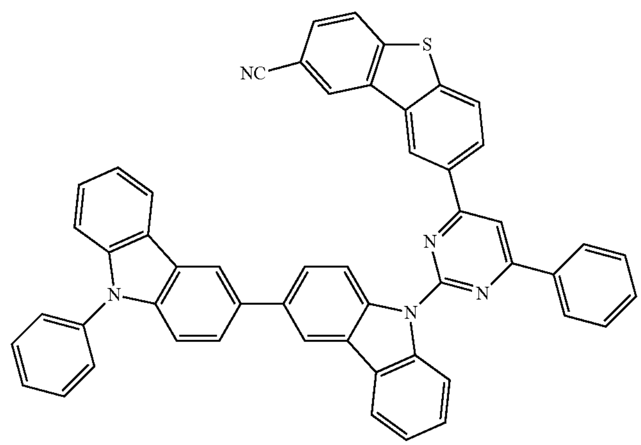
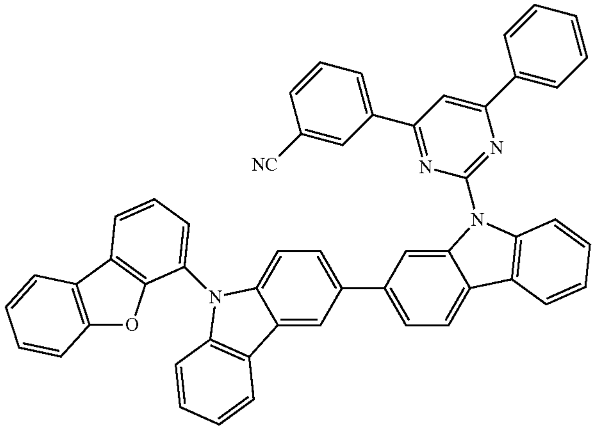

-continued
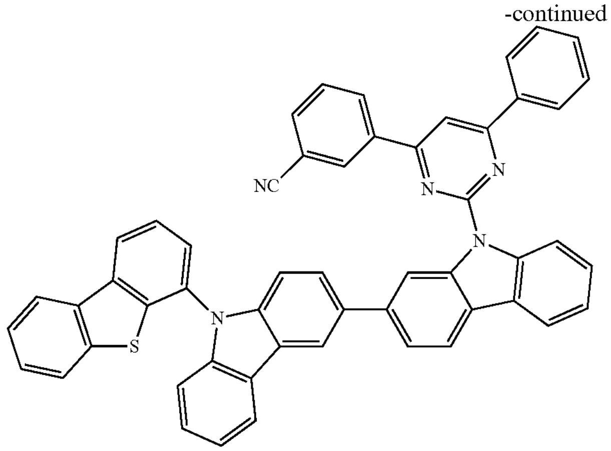
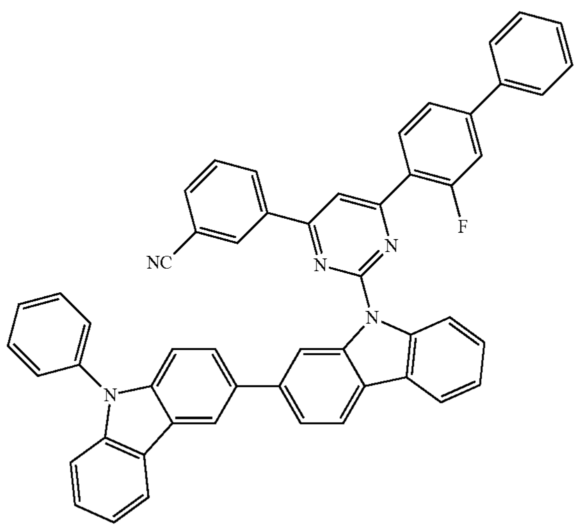
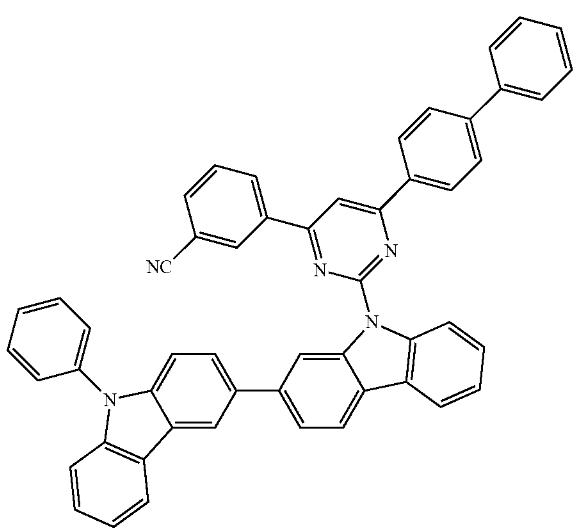

-continued
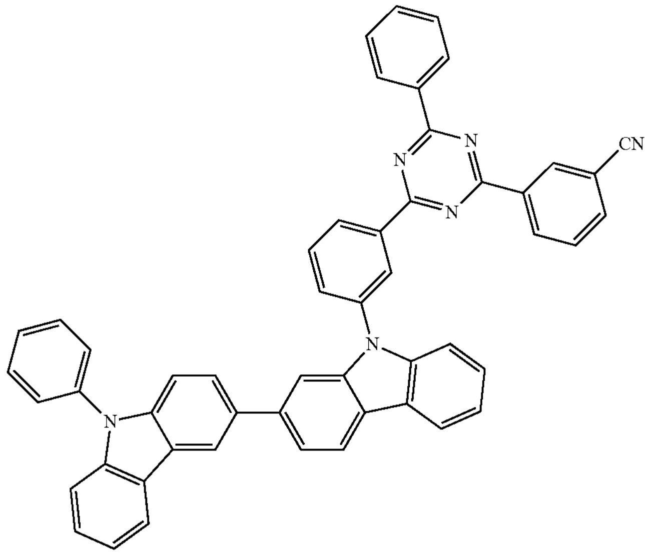
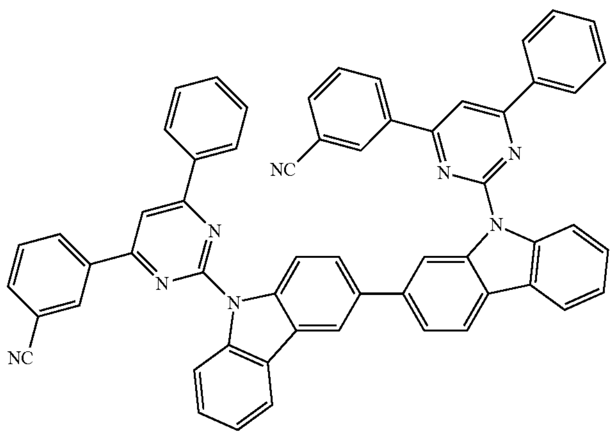
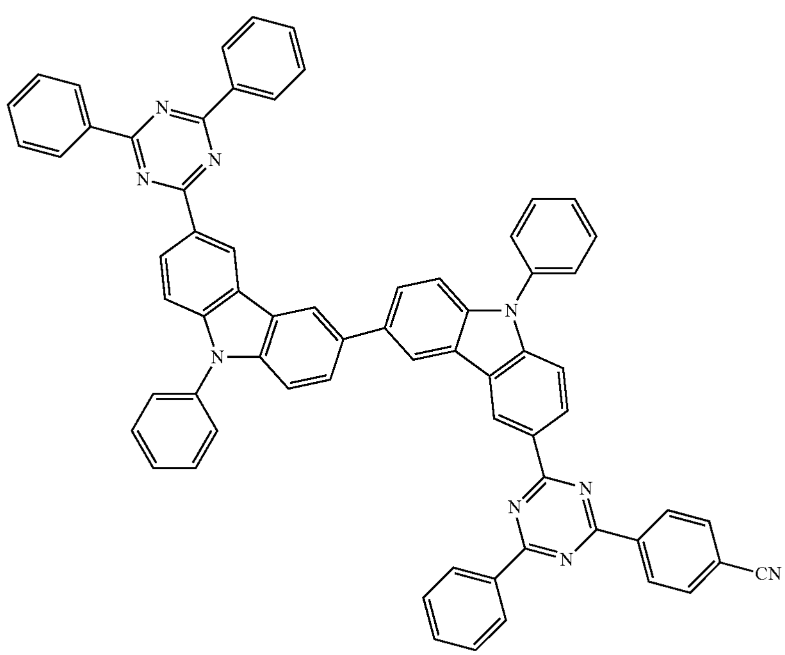

-continued
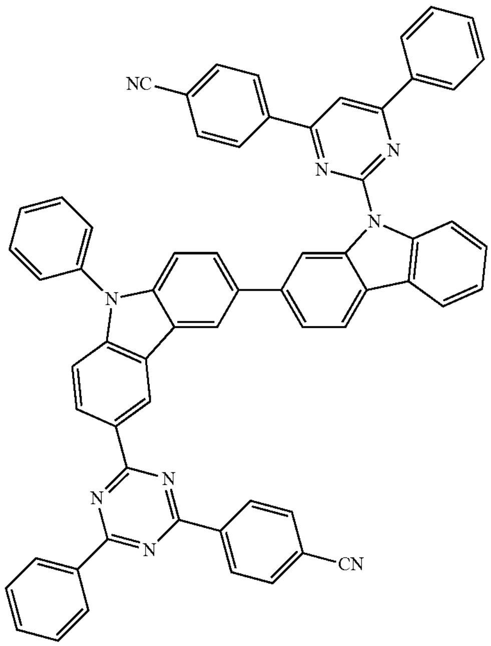
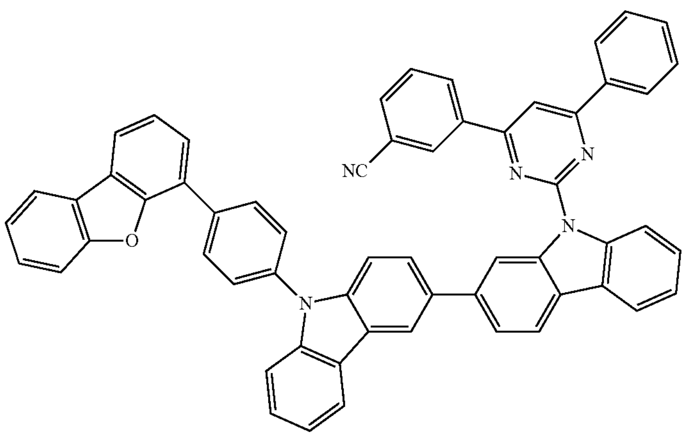
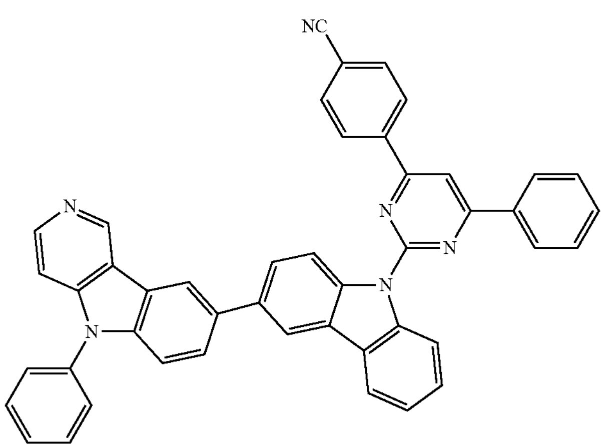

-continued

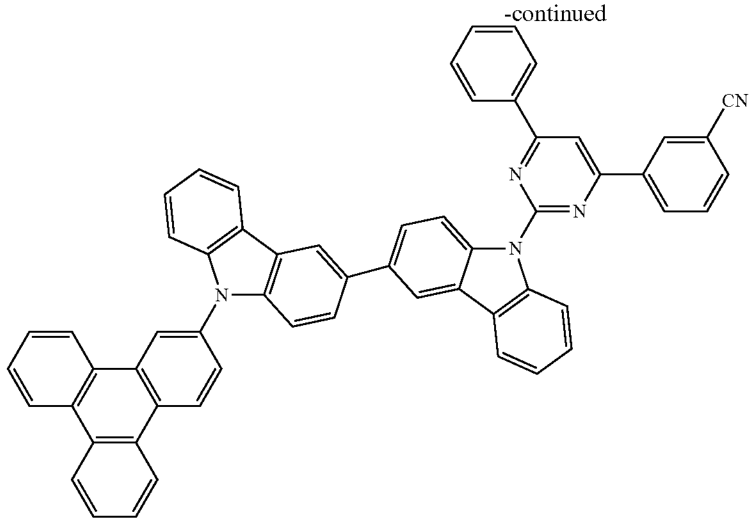

Organic EL Device

The organic EL device of the invention comprises a first organic thin-film layer and a second organic thin-film layer between a cathode and an anode in this order from the anode side. The first organic thin-film layer and the second organic thin-film layer are preferably in contact with each other.

The first organic thin-film layer is preferably a hole transporting layer or a space layer, and the second organic thin-film layer is preferably a light emitting layer.

The structure of the organic EL device of the invention will be described below.

The organic EL device of the invention may be any of a single color emitting device of phosphorescent type, a white-emitting device of fluorescent-phosphorescent hybrid type, an emitting device of a simple type having a single emission unit, and an emitting device of a tandem type having two or more emission units. The "emission unit" referred to herein is the smallest unit for emitting light by the recombination of injected holes and injected electrons, which comprises one or more organic layers wherein at least one layer is a light emitting layer.

Representative device structures of the simple-type organic EL device are shown below.

(1) Anode/Emission Unit/Cathode

The emission unit may be a laminate comprising two or more layers selected from a phosphorescent emitting layer and a fluorescent emitting layer. A space layer may be disposed between the light emitting layers to prevent the diffusion of excitons generated in the phosphorescent emitting layer into the fluorescent emitting layer. Representative layered structures of the emission unit are shown below.

(a) hole transporting layer/light emitting layer (/electron transporting layer);

(b) hole transporting layer/first phosphorescent emitting layer/second phosphorescent emitting layer (/electron transporting layer);

(c) hole transporting layer/phosphorescent emitting layer/space layer/fluorescent emitting layer (/electron transporting layer);

(d) hole transporting layer/first phosphorescent emitting layer/second phosphorescent emitting layer/space layer/fluorescent emitting layer (/electron transporting layer);

(e) hole transporting layer/first phosphorescent emitting layer/space layer/second phosphorescent emitting layer/space layer/fluorescent emitting layer (/electron transporting layer); and (f) hole transporting layer/phosphorescent emitting layer/space layer/first fluorescent emitting layer/second fluorescent emitting layer (/electron transporting layer).

The first organic thin-film layer and the second organic thin-film layer are not limited to particular layers as long as the first organic thin-film layer is disposed on the anode side with respect to the second organic thin-film layer, as described above. For example, in the device structure (e), the combination of the first organic thin-film layer and the second organic thin-film layer may be any of the combinations: the hole transporting layer and the first phosphorescent emitting layer; the first phosphorescent emitting layer and the space layer; the space layer and the second phosphorescent emitting layer; the second phosphorescent emitting layer and the space layer; and the space layer and the fluorescent emitting layer. The second organic thin-film layer is preferably a light emitting layer. When the second organic thin-film layer is a light emitting layer, the hole barrier to the light emitting layer is reduced to prevent the hole accumulation on the interface with the light emitting layer. Therefore, the generation of excitons is promoted and the generated excitons emit light efficiently without quenching.

The emission color of the phosphorescent light emitting layer and that of the fluorescent light emitting layer may be different. For example, the layered structure of the laminated light emitting layer (d) may be hole transporting layer/first phosphorescent light emitting layer (red emission)/second phosphorescent light emitting layer (green emission)/space layer/fluorescent light emitting layer (blue emission)/electron transporting layer.

An electron blocking layer may be disposed between the light emitting layer and the hole transporting layer or between the light emitting layer and the space layer, if necessary. Also, a hole blocking layer may be disposed between the light emitting layer and the electron transporting layer, if necessary. With such a electron blocking layer or a hole blocking layer, electrons and holes are confined in the light emitting layer to increase the degree of charge recombination in the light emitting layer, thereby improving the emission efficiency.

Representative device structure of the tandem-type organic EL device is shown below.

(2) Anode/First Emission Unit/Intermediate Layer/Second Emission Unit/Cathode

The layered structure of the first emission unit and the second emission unit may be selected from those described above with respect to the emission unit.

Generally, the intermediate layer is also called an intermediate electrode, an intermediate conductive layer, a charge generation layer, an electron withdrawing layer, a connecting layer, or an intermediate insulating layer. The intermediate layer may be formed by known materials so as to supply electrons to the first emission unit and holes to the second emission unit.

A schematic structure of an example of the organic EL device of the invention is shown in FIG. 1 wherein the organic EL device 1 is constructed by a substrate 2, an anode 3, a cathode 4, and an emission unit 10 disposed between the anode 3 and the cathode 4. The emission unit 10 includes a light emitting layer 5 which comprises at least one phosphorescent layer containing a phosphorescent host and a phosphorescent dopant. A hole transporting layer 6, etc. may be disposed between the light emitting layer 5 and the anode 3, and an electron transporting layer 7, etc. may be disposed between the light emitting layer 5 and the cathode 4. An electron blocking layer may be disposed on the anode 3 side of the light emitting layer 5, and a hole blocking layer may be disposed on the cathode 4 side of the light emitting layer 5. With these blocking layers, electrons and holes are confined in the light emitting layer 5 to increase the degree of exciton generation in the light emitting layer 5.

In the present invention, the host is referred to as a fluorescent host when combinedly used with a fluorescent dopant and as a phosphorescent host when combinedly used with a phosphorescent dopant. Therefore, the fluorescent host and the phosphorescent host are not distinguished from each other merely by the difference in their molecular structures. Namely, the term "phosphorescent host" means a material for constituting a phosphorescent emitting layer containing a phosphorescent dopant and does not mean that the material is not usable as a material for constituting a fluorescent emitting layer. The same also applies to the fluorescent host.

Substrate

The organic EL device of the invention is formed on a light-transmissive substrate. The light-transmissive substrate serves as a support for the organic EL device and preferably a flat substrate having a transmittance of 50% or more to 400 to 700 nm visible light. Examples of the substrate include a glass plate and a polymer plate. The glass plate may include a plate made of soda-lime glass, barium-strontium-containing glass, lead glass, aluminosilicate glass, borosilicate glass, barium borosilicate glass, or quartz. The polymer plate may include a plate made of polycarbonate, acryl, polyethylene terephthalate, polyether sulfide, or polysulfone.

Anode

The anode of the organic EL device injects holes to the hole transporting layer or the light emitting layer, and an anode having a work function of 4.5 eV or more is effective. Examples of material for anode include indium tin oxide alloy (ITO), tin oxide (NESA), indium zinc oxide alloy, gold, silver, platinum, and copper. The anode is formed by making the electrode material into a thin film by a method, such as a vapor deposition method or a sputtering method. When getting the light emitted from the light emitting layer through the anode, the transmittance of anode to visible light is preferably 10% or more. The sheet resistance of anode is preferably several hundreds Ω/□ or less. The film thickness of anode depends upon the kind of material and generally 10 nm to 1 μm, preferably 10 to 200 nm.

Cathode

The cathode injects electrons to the electron injecting layer, the electron transporting layer or the light emitting layer, and preferably formed from a material having a small work function. Examples of the material for cathode include, but not limited to, indium, aluminum, magnesium, magnesium-indium alloy, magnesium-aluminum alloy, aluminum-lithium alloy, aluminum-scandium-lithium alloy, and magnesium-silver alloy. Like the anode, the cathode is formed by making the material into a thin film by a method, such as the vapor deposition method and the sputtering method. The emitted light may be taken from the cathode, if appropriate.

Light Emitting Layer

The light emitting layer is an organic layer having a light emitting function. When a doping system is employed, the light emitting layer contains a host material and a dopant material. The major function of the host material is to promote the recombination of electrons and holes and confine excitons in the light emitting layer. The dopant material causes the excitons generated by recombination to emit light efficiently.

In a phosphorescent device, the major function of the host material is to confine the excitons generated on the dopant in the light emitting layer.

To control the carrier balance in the light emitting layer, a double host (host and co-host) system may be used for the light emitting layer, for example, by combinedly using an electron transporting host and a hole transporting host. The aromatic heterocyclic derivative B to be used in the second organic thin-film layer of the invention works as a hole transporting co-host.

The light emitting layer may be made into a double dopant layer, in which two or more kinds of dopant materials having high quantum yield are combinedly used and each dopant material emits light with its own color. For example, to obtain a yellow emission, a light emitting layer formed by co-depositing a host, a red-emitting dopant and a green-emitting dopant is used.

In a laminate of two or more light emitting layers, electrons and holes are accumulated in the interface between the light emitting layers, and therefore, the recombination region is localized in the interface between the light emitting layers, to improve the quantum efficiency.

The light emitting layer may be different in the hole injection ability and the electron injection ability, and also in the hole transporting ability and the electron transporting ability each being expressed by mobility.

The light emitting layer is formed, for example, by a known method, such as a vapor deposition method, a spin coating method, and LB method. Alternatively, the light emitting layer may be formed by making a solution of a binder, such as resin, and the material for the light emitting layer in a solvent into a thin film by a method such as spin coating.

The light emitting layer is preferably a molecular deposit film. The molecular deposit film is a thin film formed by depositing a vaporized material or a film formed by solidifying a material in the state of solution or liquid. The molecular deposit film can be distinguished from a thin film formed by LB method (molecular build-up film) by the differences in the assembly structures and higher order structures and the functional difference due to the structural differences.

The phosphorescent dopant (phosphorescent emitting material) is a compound which emits light by releasing the energy of excited triplet state and preferably a organometallic complex comprising at least one metal selected from Ir, Pt, Os, Au, Cu, Re, and Ru and a ligand, although not particularly limited thereto as long as emitting light by releasing the energy of excited triplet state. A ligand having an ortho metal bond is preferred. In view of obtaining a high phosphorescent quantum yield and further improving the external quantum efficiency of electroluminescence device, a metal complex comprising a metal selected from Ir, Os, and Pt is preferred, with an iridium complex, an osmium complex, and a platinum being more preferred, an iridium complex and a platinum complex being still more preferred, and an ortho metallated iridium complex being particularly preferred.

The content of the phosphorescent dopant in the light emitting layer is not particularly limited and selected according to the use of the device, and preferably 0.1 to 70% by mass, and more preferably 1 to 30% by mass. If being 0.1% by mass or more, the amount of light emission is sufficient. If being 70% by mass or less, the concentration quenching can be avoided.

Preferred examples of the organometallic complex are shown below.

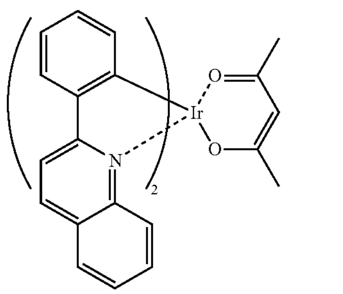

PQIr

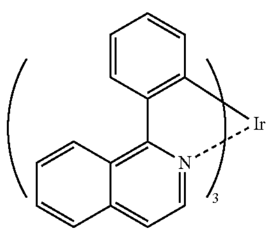

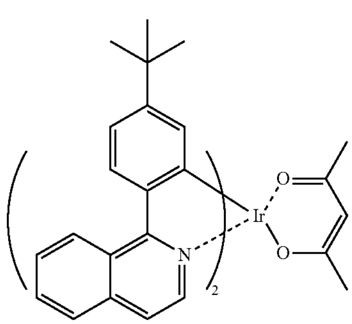

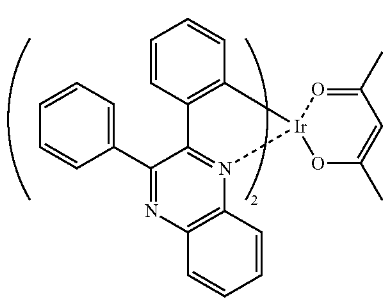

-continued

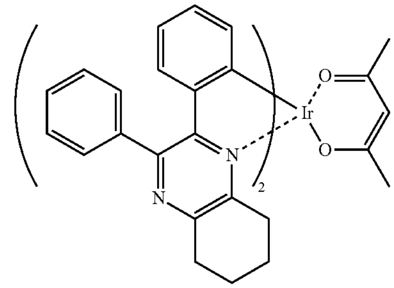

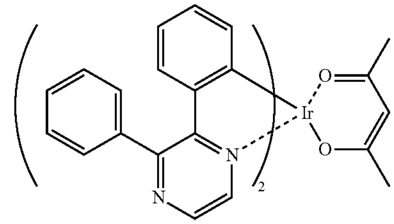

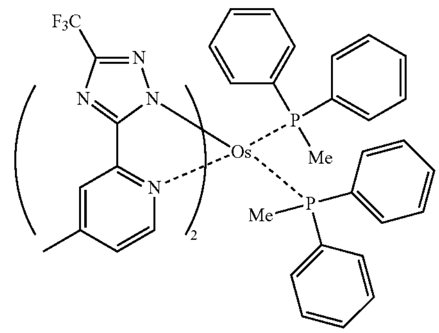

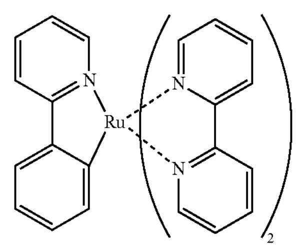

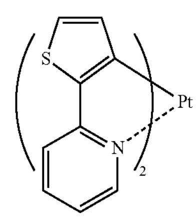

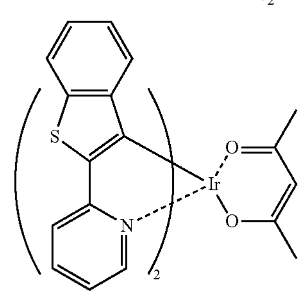

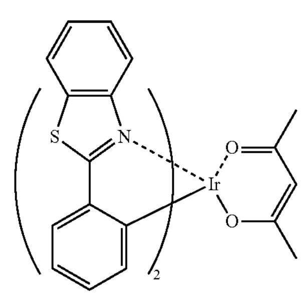

-continued
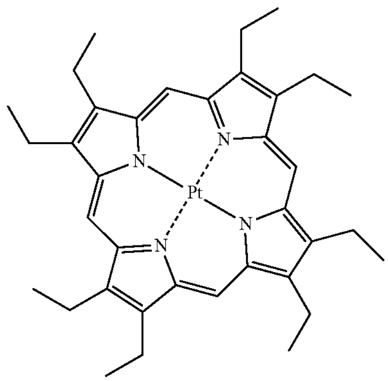
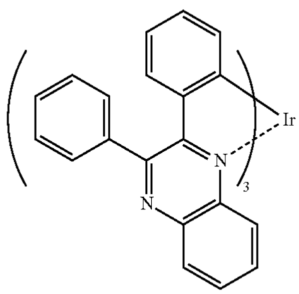
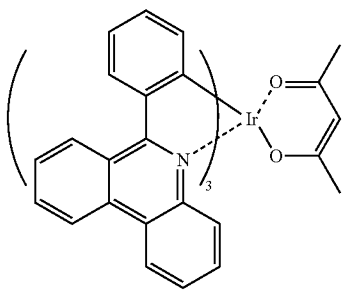
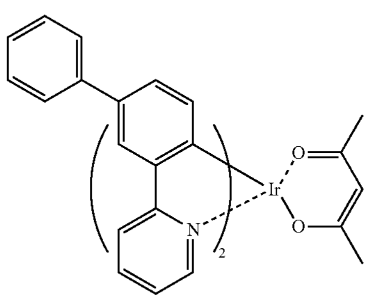
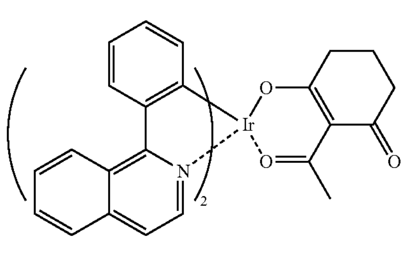
-continued
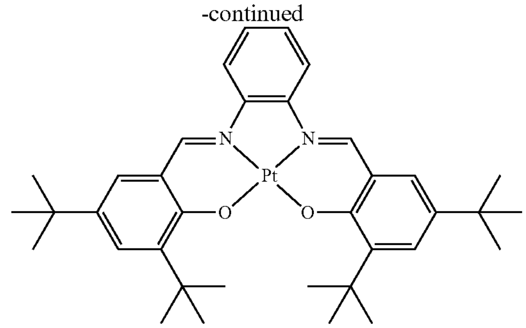
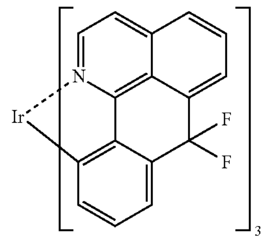
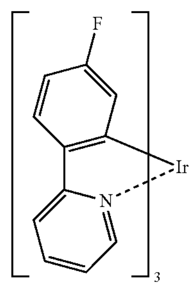
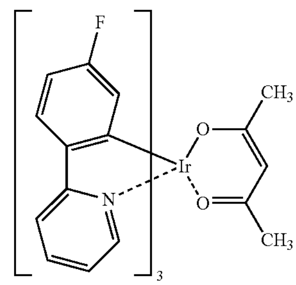
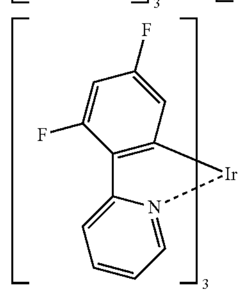
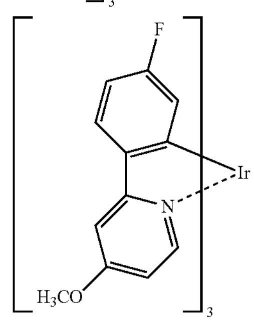
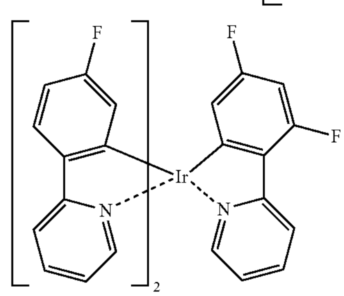
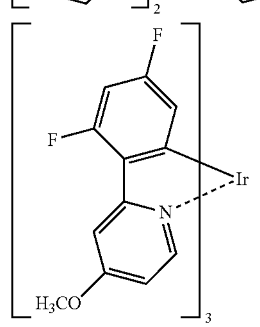

-continued
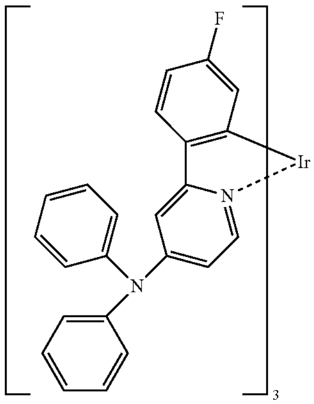
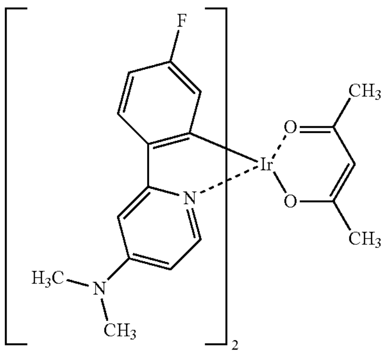
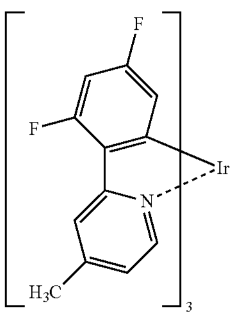
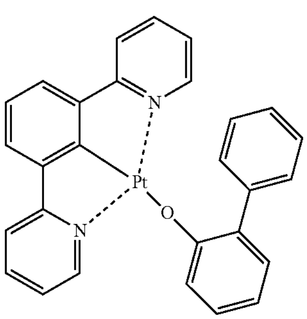
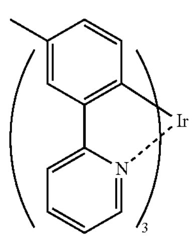
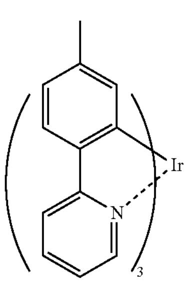
-continued
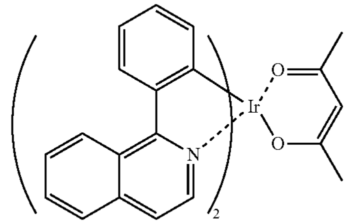
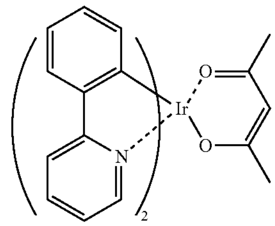
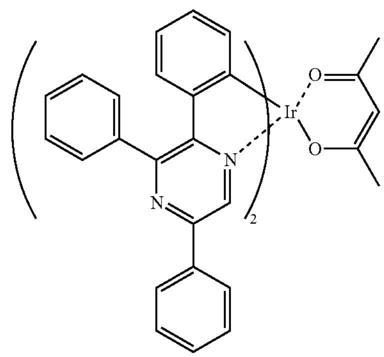
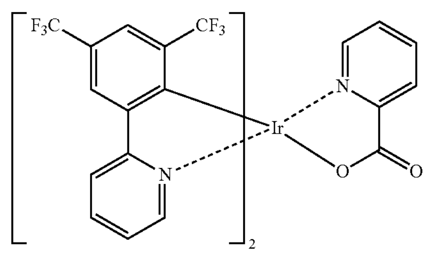
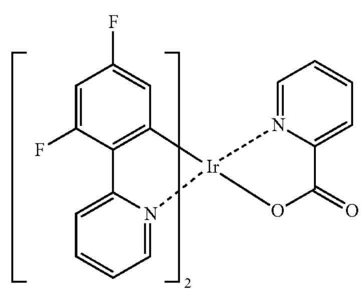
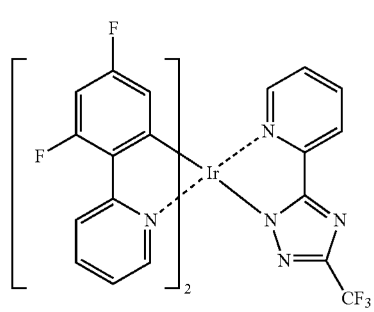

-continued
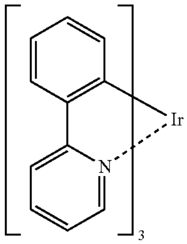
$Ir(ppy)_3$
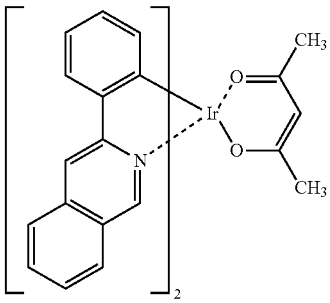
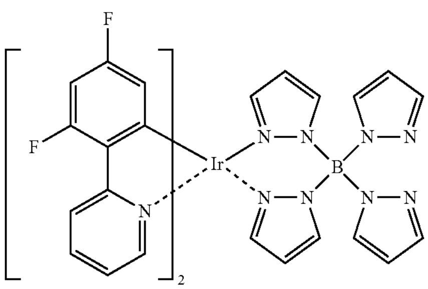
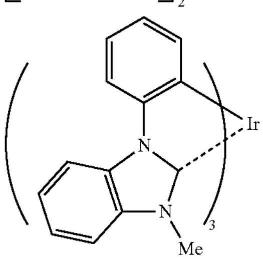
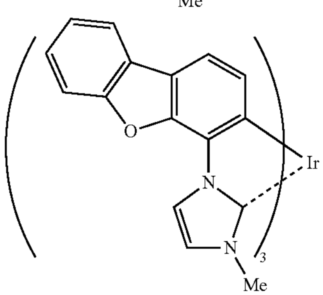
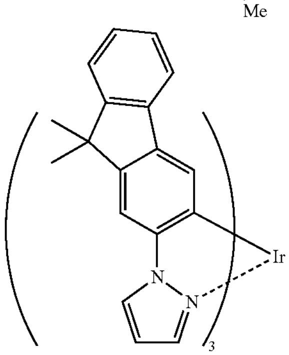
-continued
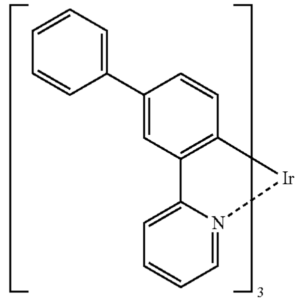
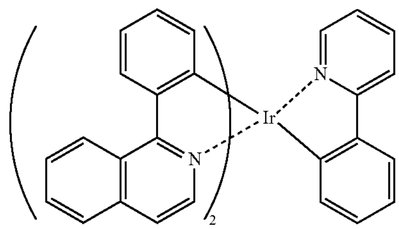
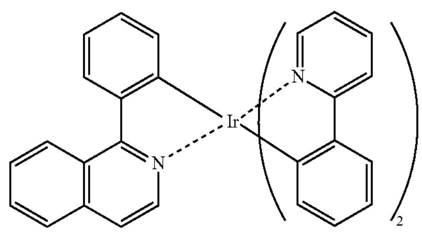
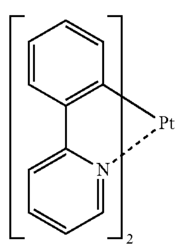
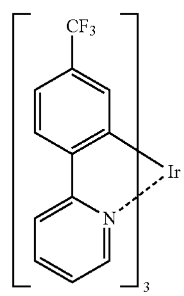
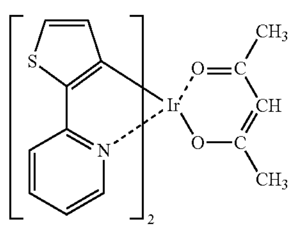
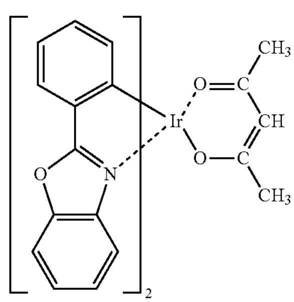

-continued

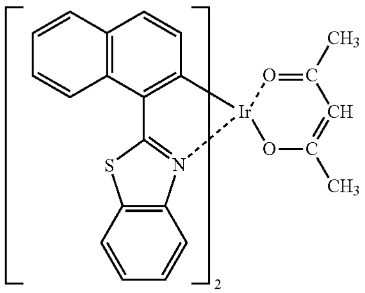

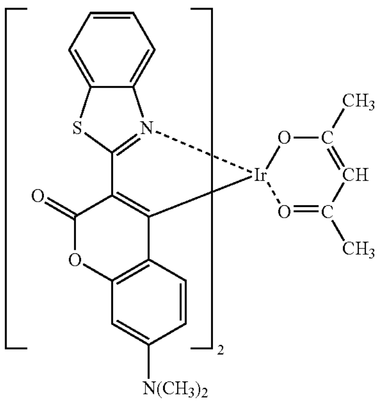

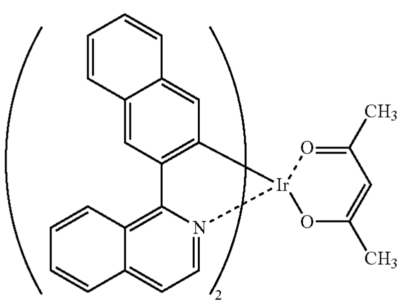

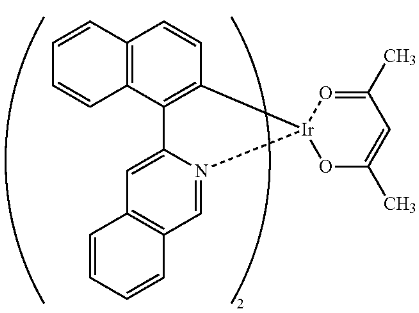

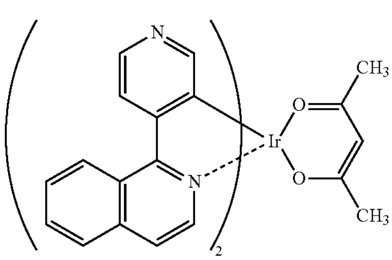

-continued

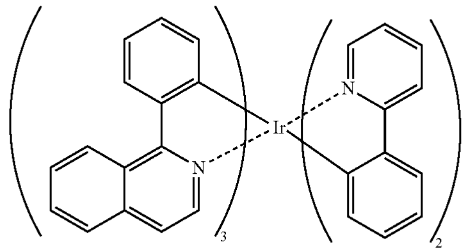

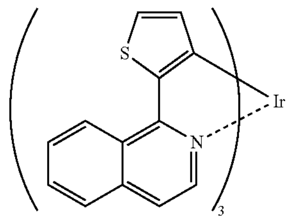

The phosphorescent host is a compound which confines the triplet energy of the phosphorescent dopant efficiently in the light emitting layer to cause the phosphorescent dopant to emit light efficiently. The phosphorescent host may be suitably selected according to the use of the device.

Examples of the phosphorescent host include a carbazole derivative, a triazole derivative, a oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene compound, a porphyrin compound, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, a tetracarboxylic anhydride of fused ring such as naphthalene and perylene, a phthalocyanine derivative, a metal complex of 8-quinolinol derivative, metal phthalocyanine, metal complexes having a ligand such as benzoxazole and benzothiazole, an electroconductive oligomer, such as a polysilane compound, a poly(N-vinylcarbazole) derivative, an aniline copolymer, thiophene oligomer, and a polythiophene, and a polymer such as a polythiophene derivative, a polyphenylene derivative, a polyphenylenevinylene derivative, and a polyfluorene derivative. These phosphorescent hosts may be used alone or in combination of two or more. Specific examples thereof are shown below.

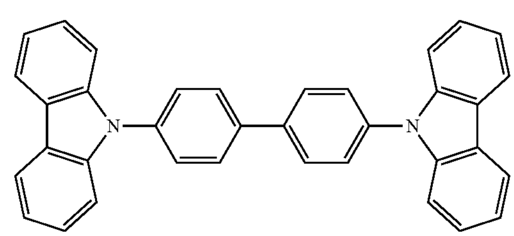

-continued

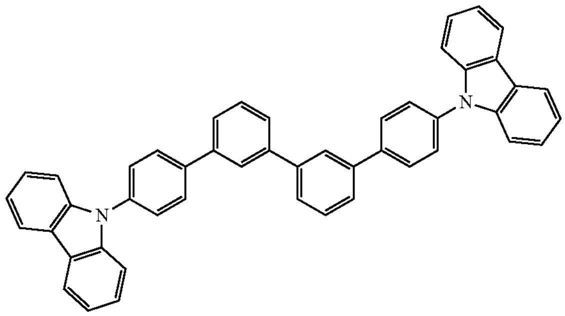

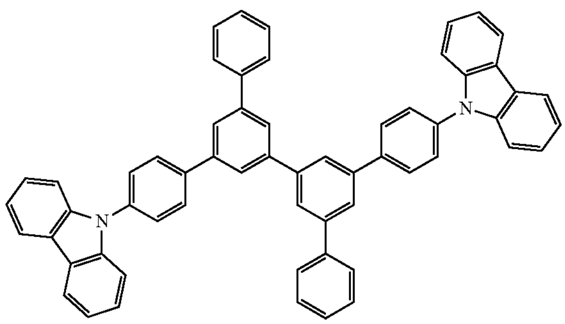

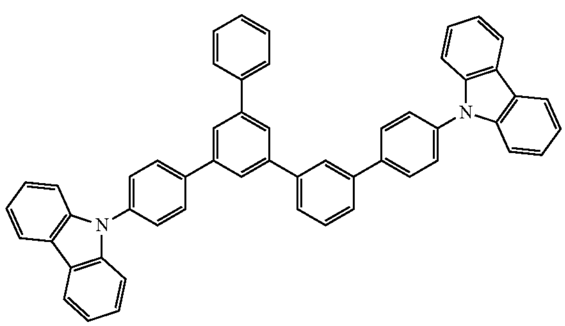

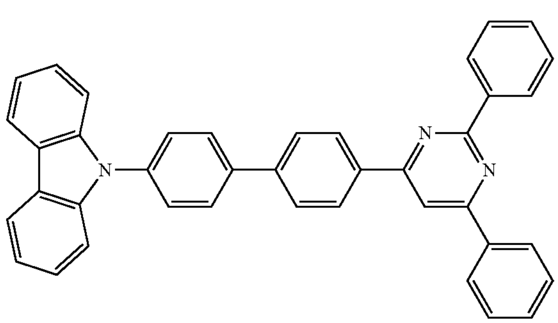

-continued

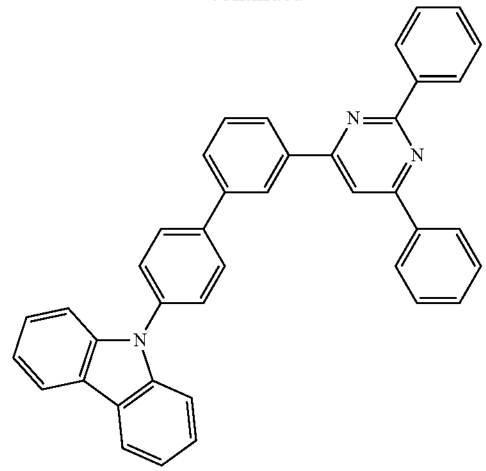 [SMILES: c1ccc(-c2cc(-c3cccc(-c4ccc(-n5c6ccccc6c6ccccc65)cc4)c3)nc(-c3ccccc3)n2)cc1]

The thickness of the light emitting layer is preferably 5 to 50 nm, more preferably 7 to 50 nm, and still more preferably 10 to 50 nm. If being 5 nm or more, the light emitting layer is easily formed. If being 50 nm or less, the increase in driving voltage is avoided.

Electron-Donating Dopant

It is preferred for the organic EL device of the invention to contain an electron-donating dopant in the interfacial region between the cathode and the light emitting unit. With such a construction, the organic EL device has an improved luminance and an elongated lifetime. The electron-donating dopant is a metal having a work function of 3.8 eV or less or a compound containing such metal. Examples thereof include at least one compound selected from alkali metal, alkali metal complex, alkali metal compound, alkaline earth metal, alkaline earth metal complex, alkaline earth metal compound, rare earth metal, rare earth metal complex, and rare earth metal compound.

Examples of the alkali metal include Na (work function: 2.36 eV), K (work function: 2.28 eV), Rb (work function: 2.16 eV), and Cs (work function: 1.95 eV), with those having a work function of 2.9 eV or less being particularly preferred. Of the above, preferred are K, Rb, and Cs, more preferred are Rb and Cs, and most preferred is Cs. Examples of the alkaline earth metal include Ca (work function: 2.9 eV), Sr (work function: 2.0 to 2.5 eV), and Ba (work function: 2.52 eV), with those having a work function of 2.9 eV or less being particularly preferred. Examples of the rare earth metal include Sc, Y, Ce, Tb, and Yb, with those having a work function of 2.9 eV or less being particularly preferred.

Examples of the alkali metal compound include alkali oxide, such as $Li_2O$, $Cs_2O$, $K_2O$, and alkali halide, such as LiF, NaF, CsF, and KF, with LiF, $Li_2O$, and NaF being preferred. Examples of the alkaline earth metal compound include BaO, SrO, CaO, and mixture thereof, such as $Ba_xSr_{1-x}O$ ($0<x<1$) and $Ba_xCa_{1-x}O$ ($0<x<1$), with BaO, SrO, and CaO being preferred. Examples of the rare earth metal compound include $YbF_3$, $ScF_3$, $ScO_3$, $Y_2O_3$, $Ce_2O_3$, $GdF_3$, and $TbF_3$, with $YbF_3$, $ScF_3$, and $TbF_3$ being preferred.

Examples of the alkali metal complex, alkaline earth metal complex, and rare earth metal complex are not particularly limited as long as containing at least one metal ion selected from alkali metal ions, alkaline earth metal ions, rare earth metal ions, respectively. The ligand is preferably, but not limited to, quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfulborane, bipyridyl, phenanthroline, phthalocyanine, porphyrin, cyclopentadiene, β-diketones, azomethines, and derivative thereof.

The electron-donating dopant is added to the interfacial region preferably into a form of layer or island. The electron-donating dopant is added preferably by co-depositing the electron-donating dopant with the organic compound (light emitting material, electron injecting material, etc.) for forming the interfacial region by a resistance heating deposition method, thereby dispersing the electron-donating dopant into the organic material. The disperse concentration expressed by the molar ratio of the organic material and the electron-donating dopant is 100:1 to 1:100 and preferably 5:1 to 1:5.

When the electron-donating dopant is formed into a form of layer, a light emitting material or an electron injecting material is made into a layer which serves as an organic layer in the interface, and then, the electron-donating dopant alone is deposited by a resistance heating deposition method into a layer having a thickness preferably 0.1 to 15 nm. When the electron-donating dopant is formed into a form of island, a light emitting material or an electron injecting material is made into a form of island which serves as an organic layer in the interface, and then, the electron-donating dopant alone is deposited by a resistance heating deposition method into a form of island having a thickness preferably 0.05 to 1 nm.

The molar ratio of the main component and the electron-donating dopant in the organic electroluminescence device of the invention is preferably 5:1 to 1:5 and more preferably 2:1 to 1:2.

Electron Transporting Layer

The electron transporting layer is an organic layer disposed between the light emitting layer and the cathode and transports electrons from the cathode to the light emitting layer. If two or more electron transporting layers are provided, the organic layer closer to the cathode may be called an electron injecting layer in some cases. The electron injecting layer injects electrons from the cathode to the organic layer unit efficiently.

An aromatic heterocyclic compound having one or more heteroatoms in its molecule is preferably used as the electron transporting material for the electron transporting layer, with a nitrogen-containing ring derivative being particularly preferred. The nitrogen-containing ring derivative is preferably an aromatic ring compound having a nitrogen-containing 6- or 5-membered ring or a condensed aromatic ring compound having a nitrogen-containing 6- or 5-membered ring.

The nitrogen-containing ring derivative is preferably, for example, a chelate metal complex having a nitrogen-containing ring represented by formula (A)

(A)

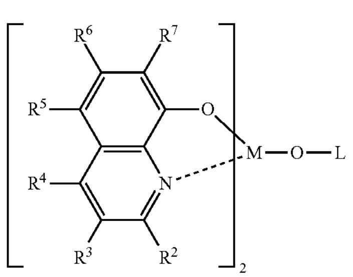

$R^2$ to $R^7$ of formula (A) each independently represent a hydrogen atom, a deuterium atom, a halogen atom, a hydroxyl group, an amino group, a hydrocarbon group having 1 to 40 carbon atoms, an alkoxy group having 1 to 40 carbon atoms, an aryloxy group having 6 to 50 carbon atoms, an alkoxycarbonyl group, or a heterocyclic group having 5 to 50 carbon atoms, each being optionally substituted.

The halogen atom may include fluorine, chlorine, bromine, and iodine.

The substituted amino group may include an alkylamino group, an arylamino group, and an aralkylamino group.

The alkylamino group and the aralkylamino group are represented by —$NQ^1Q^2$, wherein $Q^1$ and $Q^2$ each independently represent an alkyl group having 1 to 20 carbon atoms or an aralkyl group having 1 to 20 carbon atoms. One of $Q^1$ and $Q^2$ may be a hydrogen atom or a deuterium atom.

The arylamino group is represented by —$NAr^1Ar^2$, wherein $Ar^1$ and $Ar^2$ each independently represent a non-condensed aromatic hydrocarbon group or a condensed aromatic hydrocarbon group each having 6 to 50 carbon atoms. One of $Ar^1$ and $Ar^2$ may be a hydrogen atom or a deuterium atom.

The hydrocarbon group having 1 to 40 carbon atoms may include an alkyl group, an alkenyl group, a cycloalkyl group, an aryl group, and an aralkyl group.

The alkoxycarbonyl group is represented by —COOY', wherein Y' is an alkyl group having 1 to 20 carbon atoms.

M is aluminum (Al), gallium (Ga), or indium (In), with In being preferred.

L is a group represented by formula (A') or (A"):

(A')

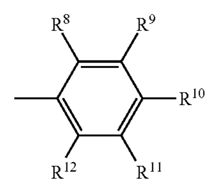

(A")

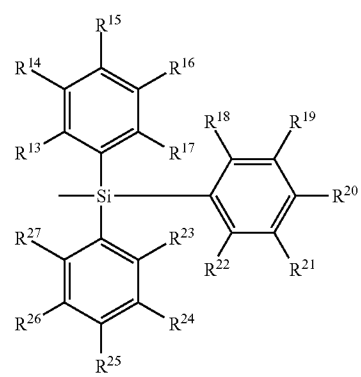

$R^8$ to $R^{12}$ in formula (A') each independently represent a hydrogen atom, a deuterium atom, or a substituted or unsubstituted hydrocarbon group having 1 to 40 carbon atoms. The adjacent two groups may form a ring structure. $R^{13}$ to $R^{27}$ in formula (A") each independently represent a hydrogen atom, a deuterium atom, or a substituted or unsubstituted hydrocarbon group having 1 to 40 carbon atoms. The adjacent two groups may form a ring structure.

Examples of the hydrocarbon group having 1 to 40 carbon atoms for $R^8$ to $R^{12}$ and $R^{13}$ to $R^{27}$ in formulae (A') and (A") are the same as those described above with respect to $R^2$ to $R^7$ of formula (A). Examples of the divalent group formed by the adjacent two groups of $R^8$ to $R^{12}$ and $R^{13}$ to $R^{27}$ which completes the ring structure include tetramethylene group, pentamethylene group, hexamethylene group, diphenylmethane-2,2'-diyl group, diphenylethane-3,3'-diyl group, and diphenylpropane-4,4'-diyl group.

The electron transporting compound for the electron transporting layer is preferably a metal complex including 8-hydroxyquinoline or its derivative, an oxadiazole derivative, and a nitrogen-containing heterocyclic derivative. Examples of the metal complex including 8-hydroxyquinoline or its derivative include a metal chelate oxinoid including a chelated oxine (generally, 8-quinolinol or 8-hydroxyquinoline), for example, tris(8-quinolinol)aluminum. Examples of the oxadiazole derivative are shown below.

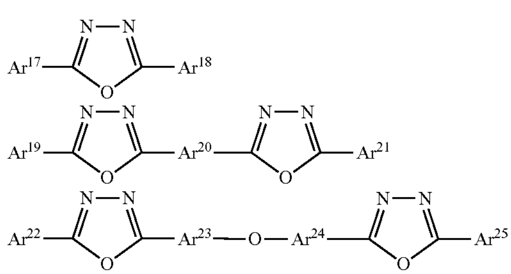

In the above formulae, each of $Ar^{17}$, $Ar^{18}$, $Ar^{19}$, $Ar^{21}$, $Ar^{22}$, and $Ar^{25}$ is a substituted or unsubstituted aromatic hydrocarbon group or a substituted or unsubstituted condensed aromatic hydrocarbon group each having 6 to 50 carbon atoms, and $Ar^{17}$ and $Ar^{18}$, $Ar^{19}$ and $Ar^{21}$, and $Ar^{22}$ and $Ar^{25}$ may be the same or different. Examples of the aromatic hydrocarbon group and the condensed aromatic hydrocarbon group include phenyl group, naphthyl group, biphenyl group, anthranyl group, perylenyl group, and pyrenyl group. The optional substituent may be an alkyl group having 1 to 10 carbon atoms, an alkoxyl group having 1 to 10 carbon atoms or a cyano group.

Each of $Ar^{20}$, $Ar^{23}$, and $Ar^{24}$ is a substituted or unsubstituted bivalent aromatic hydrocarbon group or a substituted or unsubstituted bivalent condensed aromatic hydrocarbon group each having 6 to 50 carbon atoms, and $Ar^{23}$ and $Ar^{24}$ may be the same or different. Examples of the bivalent aromatic hydrocarbon group or the bivalent condensed aromatic hydrocarbon group include phenylene group, naphthylene group, biphenylene group, anthranylene group, perylenylene group, and pyrenylene group. The optional substituent may be an alkyl group having 1 to 10 carbon atoms, an alkoxyl group having 1 to 10 carbon atoms or a cyano group.

Electron transporting compounds which have a good thin film-forming property are preferably used. Examples of the electron transporting compound are shown below.

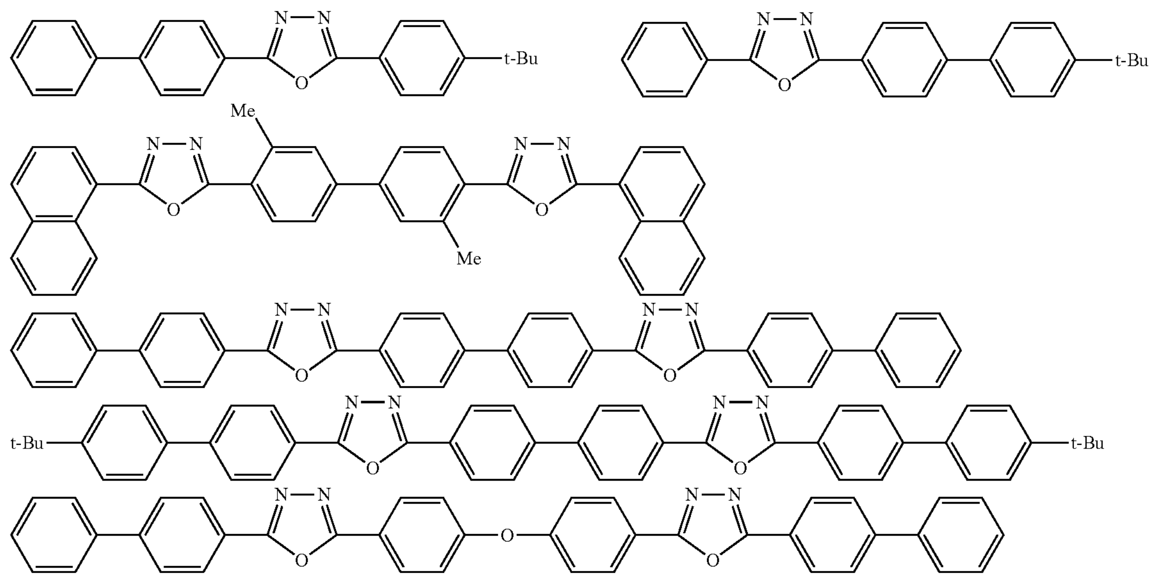

Examples of the nitrogen-containing heterocyclic derivative for use as the electron transporting compound include a nitrogen-containing heterocyclic derivative having the following formulae but exclusive of metal complex, for example, a compound having a 5- or 6-membered ring which has the skeleton represented by formula (B) or having the structure represented by formula (C).

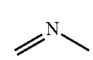

(B)

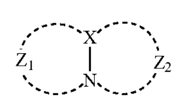

(C)

In formula (C), X is a carbon atom or a nitrogen atom. $Z_1$ and $Z_2$ each independently represent a group of atoms for completing the nitrogen-containing heteroring.

The nitrogen-containing heterocyclic derivative is more preferably an organic compound which has a nitrogen-containing aromatic polycyclic ring comprising a 5-membered ring or a 6-membered ring. If two or more nitrogen atoms are included, the nitrogen-containing aromatic polycyclic compound preferably has a skeleton of a combination of (B) and (C) or a combination of (B) and (D).

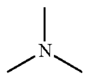

(D)

The nitrogen-containing group of the nitrogen-containing aromatic polycyclic compound is selected, for example, from the nitrogen-containing heterocyclic groups shown below.

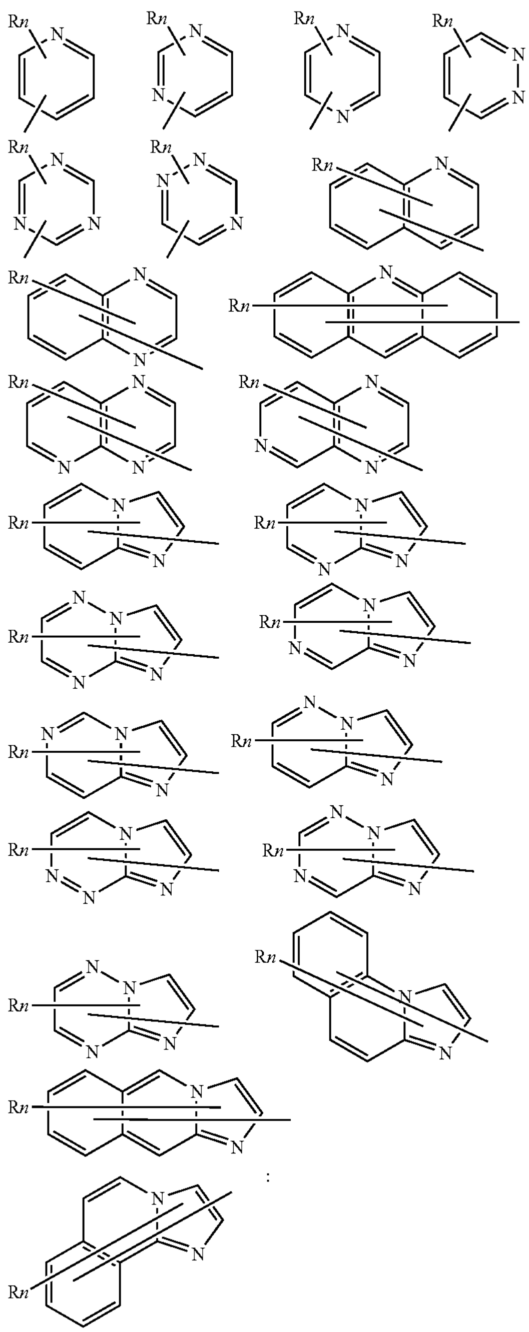

:

In the above formulae, R is an aromatic hydrocarbon group or a condensed aromatic hydrocarbon group each having 6 to 40 carbon atoms, an aromatic heterocyclic group or a condensed aromatic heterocyclic group each having 3 to 40 carbon atoms, an alkyl group having 1 to 20 carbon atoms, or an alkoxy group having 1 to 20 carbon atoms; and n is an integer of 0 to 5. If n is an integer of 2 or more, R groups may be the same or different.

More preferred is a nitrogen-containing heterocyclic derivative represented by the following formula:

$$HAr\text{-}L^1\text{-}Ar^1\text{—}Ar^2$$

wherein HAr is a substitute or unsubstituted nitrogen-containing heterocyclic group having 3 to 40 carbon atoms; $L^1$ is a single bond, a substituted or unsubstituted aromatic hydrocarbon group or condensed aromatic hydrocarbon group each having 6 to 40 carbon atoms, or a substituted or unsubstituted aromatic heterocyclic group or condensed aromatic heterocyclic group each having 3 to 40 carbon atoms; $Ar^1$ is a substitute or unsubstituted divalent aromatic hydrocarbon group having 6 to 40 carbon atoms; and Are is a substitute or unsubstituted aromatic hydrocarbon group or condensed aromatic hydrocarbon group each having 6 to 40 carbon atoms or a substituted or unsubstituted aromatic heterocyclic group or condensed aromatic heterocyclic group each having 3 to 40 carbon atoms.

HAr is selected, for example, from the following groups:

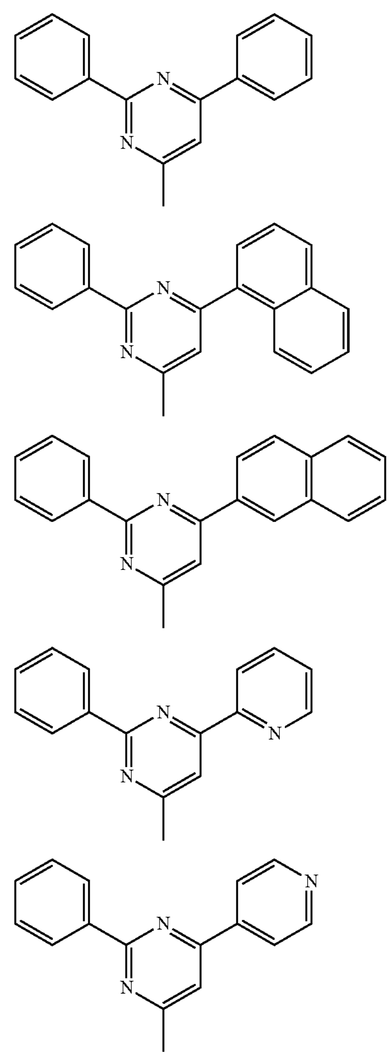

-continued

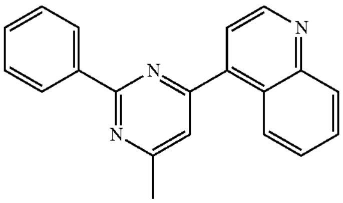

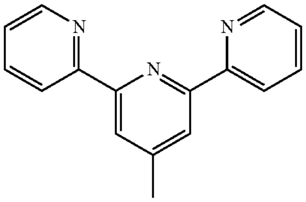

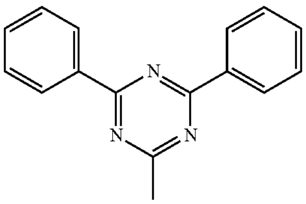

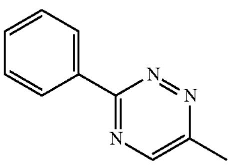

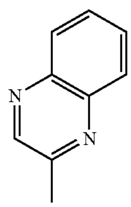

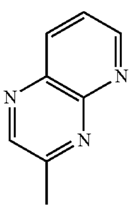

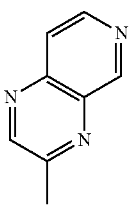

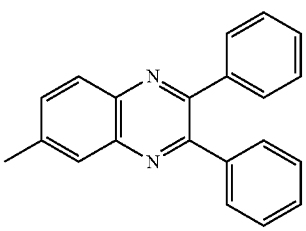

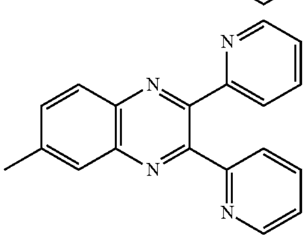

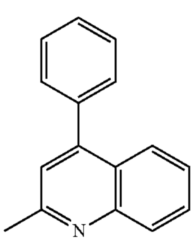

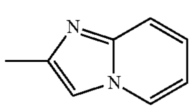

-continued

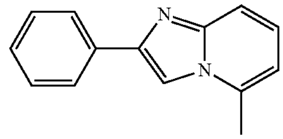

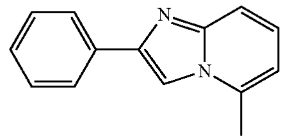

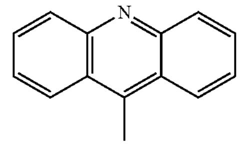

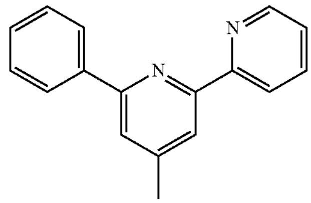

$L^1$ is selected, for example, from the following groups:

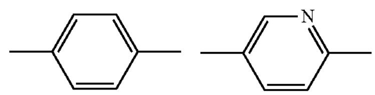

$Ar^1$ is selected, for example, from the following arylanthranyl groups:

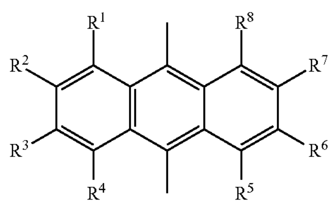

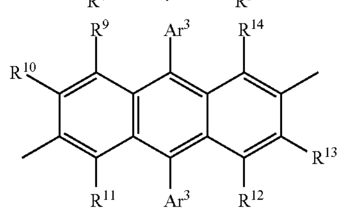

In the above formulae, $R^1$ to $R^{14}$ are each independently a hydrogen atom, a deuterium atom, a halogen atom, an alkyl group having 1 to 20 carbon atoms, an alkoxy group having 1 to 20 carbon atoms, an aryloxy group having 6 to 40 carbon atoms, a substituted or unsubstituted aromatic hydrocarbon group or condensed aromatic hydrocarbon group each having 6 to 40 carbon atoms, or a substituted or unsubstituted aromatic heterocyclic group or condensed aromatic heterocyclic group each having 3 to 40 carbon atoms; and $Ar^3$ is a substituted or unsubstituted aromatic hydrocarbon group or condensed aromatic hydrocarbon group each having 6 to 40 carbon atoms or a substituted or unsubstituted aromatic heterocyclic group or condensed aromatic heterocyclic group each having 3 to 40 carbon atoms. $R^1$ to $R^8$ may be all selected from a hydrogen atom and a deuterium atom.

$Ar^2$ is selected, for example, from the following groups:

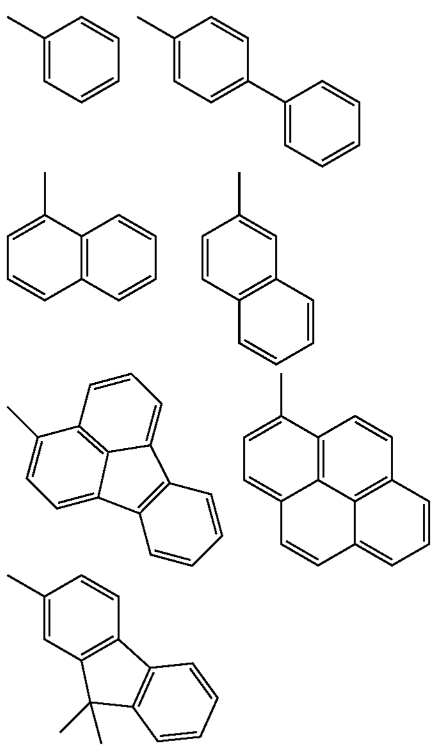

In addition, the following compound is preferably used as the nitrogen-containing aromatic polycyclic compound for use as the electron transporting compound.

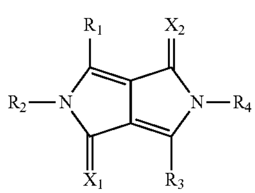

In the above formula, $R_1$ to $R_4$ each independently represent a hydrogen atom, a deuterium atom, a substituted or unsubstituted aliphatic group having 1 to 20 carbon atoms, a substituted or unsubstituted alicyclic group having 3 to 20 carbon atoms, a substituted or unsubstituted aromatic group having 6 to 50 carbon atoms, or a substituted or unsubstituted heterocyclic group having 3 to 50 carbon atoms; and $X_1$ and $X_2$ each independently represent an oxygen atom, a sulfur atom, or a dicyanomethylene group.

Further, the following compound is also suitable as the electron transporting compound.

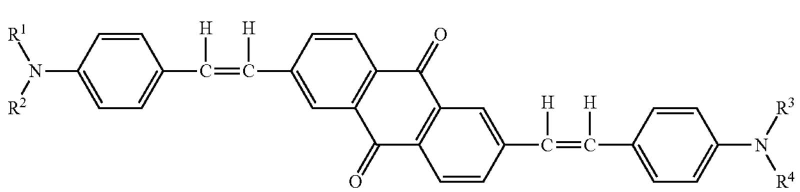

In the above formula, $R^1$, $R^2$, $R^3$, and $R^4$ may be the same or different and each represents an aromatic hydrocarbon group or a condensed aromatic hydrocarbon group each represented by the following formula:

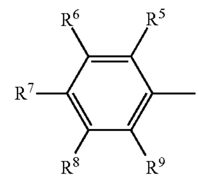

wherein $R^5$, $R^6$, $R^7$, $R^8$, and $R^9$ may be the same or different and each represents a hydrogen atom, a deuterium atom, a saturated or unsaturated alkoxyl group having 1 to 20 carbon atoms, a saturated or unsaturated alkyl group having 1 to 20 carbon atoms, an amino group, or an alkylamino group having 1 to 20 carbon atoms. At least one of $R^5$, $R^6$, $R^7$, $R^8$, and $R^9$ is a group other than hydrogen atom and deuterium atom.

Further, a polymer having the nitrogen-containing heterocyclic group or the nitrogen-containing heterocyclic derivative is also usable as the electron transporting compound.

It is particularly preferred for the electron transporting layer of the organic EL of the invention to contain at least one of the nitrogen-containing heterocyclic derivatives represented by the following formulae (60) to (62):

(60)

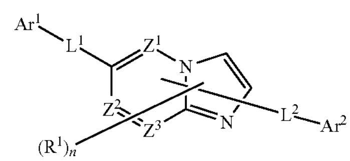

(61)

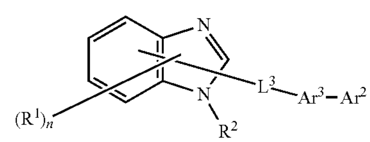

(62)

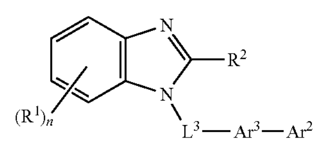

wherein $Z^1$, $Z^2$, and $Z^3$ each independently represent a nitrogen atom or a carbon atom;

$R^1$ and $R^2$ each independently represent a substituted or unsubstituted aryl group having 6 to 50 ring carbon atoms, a substituted or unsubstituted heteroaryl group having 5 to 50 ring atoms, a substituted or unsubstituted alkyl group having 1 to 20 carbon atoms, a substituted or unsubstituted haloalkyl group having 1 to 20 carbon atoms, or a substituted or unsubstituted alkoxyl group having 1 to 20 carbon atoms;

the subscript n is an integer of 0 to 5. If n is an integer of 2 or more, $R^1$ groups may be the same or different from each other. The adjacent two $R^1$ groups may bond to each other to form a substituted or unsubstituted hydrocarbon ring.

$Ar^1$ represents a substituted or unsubstituted aryl group having 6 to 50 ring carbon atoms or a substituted or unsubstituted heteroaryl group having 5 to 50 ring atoms;

$Ar^2$ represents a hydrogen atom, a substituted or unsubstituted alkyl group having 1 to 20 carbon atoms, a substituted or unsubstituted haloalkyl group having 1 to 20 carbon atoms, a substituted or unsubstituted alkoxyl group having 1 to 20 carbon atoms, a substituted or unsubstituted aryl group having 6 to 50 ring carbon atoms, or a substituted or unsubstituted heteroaryl group having 5 to 50 ring atoms;

provided that one of $Ar^1$ and $Ar^2$ is a substituted or unsubstituted condensed aromatic hydrocarbon group having 10 to 50 ring carbon atoms or a substituted or unsubstituted condensed aromatic heterocyclic group having 9 to 50 ring atoms;

$Ar^3$ represents a substituted or unsubstituted arylene group having 6 to 50 ring carbon atoms or a substituted or unsubstituted heteroarylene group having 5 to 50 ring atoms; and $L^1$, $L^2$, and $L^3$ each independently represent a single bond, a substituted or unsubstituted arylene group having 6 to 50 ring carbon atoms or a substituted or unsubstituted divalent condensed aromatic heterocyclic group having 9 to 50 ring atoms.

Examples of the aryl group having 6 to 50 ring carbon atoms include a phenyl group, a naphthyl group, an anthryl group, a phenanthryl group, a naphthacenyl group, a chrysenyl group, a pyrenyl group, a biphenyl group, a terphenyl group, a tolyl group, a fluoranthenyl group, and a fluorenyl group.

Examples of the heteroaryl group having 5 to 50 ring atoms include a pyrrolyl group, a furyl group, a thienyl group, a silolyl group, a pyridyl group, a quinolyl group, a isoquinolyl group, a benzofuryl group, an imidazolyl group, a pyrimidyl group, a carbazolyl group, a selenophenyl group, an oxadiazolyl group, a triazolyl group, a pyrazinyl group, a pyridazinyl group, a triazinyl group, a quinoxalinyl group, an acridinyl group, an imidazo[1,2-a]pyridinyl group, and an imidazo[1,2-a]pyrimidinyl.

Examples of the alkyl group having 1 to 20 carbon atoms include a methyl group, an ethyl group, a propyl group, a butyl group, a pentyl group, and a hexyl group.

Examples of the haloalkyl group having 1 to 20 carbon atoms include the groups obtained by replacing one or more hydrogen atoms of the alkyl group mentioned above with at least one halogen atom selected from fluorine, chlorine, iodine, and bromine.

Examples of the alkyl moiety of the alkoxyl group having 1 to 20 carbon atoms include the alkyl group mentioned above.

Examples of the arylene groups include the groups obtained by removing one hydrogen atom from the aryl group mentioned above.

Examples of the divalent condensed aromatic heterocyclic group having 9 to 50 ring atoms include the groups obtained by removing one hydrogen atom from the condensed aromatic heterocyclic group mentioned above as the heteroaryl group.

The thickness of the electron transporting layer is preferably 1 to 100 nm, although not particularly limited thereto.

The electron injecting layer which may be formed adjacent to the electron transporting layer preferably includes an inorganic compound, such as an insulating material and a semiconductor in addition to the nitrogen-containing ring derivative. The insulating material or semiconductor incorporated into the electron injecting layer effectively prevents the leak of electric current to enhance the electron injecting properties.

The insulating material is preferably at least one metal compound selected from the group consisting of alkali metal chalcogenides, alkaline earth metal chalcogenides, alkali metal halides and alkaline earth metal halides. The alkali metal chalcogenide, etc. incorporated into the electron injecting layer further enhances the electron injecting properties. Preferred examples of the alkali metal chalcogenides include $Li_2O$, $K_2O$, $Na_2S$, $Na_2Se$ and $Na_2O$, and preferred examples of the alkaline earth metal chalcogenides include CaO, BaO, SrO, BeO, BaS and CaSe. Preferred examples of the alkali metal halides include LiF, NaF, KF, LiCl, KCl and NaCl. Examples of the alkaline earth metal halides include fluorides such as $CaF_2$, $BaF_2$, $SrF_2$, $MgF_2$ and $BeF_2$ and halides other than fluorides.

Examples of the semiconductor may include oxide, nitride or oxynitride each containing at least one element selected from the group consisting of Ba, Ca, Sr, Yb, Al, Ga, In, Li, Na, Cd, Mg, Si, Ta, Sb and Zn. The semiconductor may be used singly or in combination of two or more. The inorganic compound forming the electron injecting layer preferably forms a microcrystalline or amorphous insulating thin film. When the electron injecting layer is formed from such an insulating thin film, the thin film is made more uniform to decrease the pixel defects such as dark spots. Examples of such inorganic compound include alkali metal chalcogenides, alkaline earth metal chalcogenides, alkali metal halides and alkaline earth metal halide, each being described above.

The thickness of the layer including the insulating material or the semiconductor is preferably about 0.1 to 15 nm. The electron injecting layer may be included with the electron-donating dopant described above.

Hole Transporting Layer

The hole transporting layer is an organic layer formed between the light emitting layer and the anode and has a function of transporting holes from the anode to the light emitting layer. When the hole transporting layer is formed by two or more layers, the layer closer to the anode may be defined as the hole injecting layer in some cases. The hole injecting layer has a function of efficiently injecting holes from the anode to the organic layer unit.

An aromatic amine compound, for example, the aromatic amine derivative represented by formula (I), is also preferably used as the material for forming the hole transporting layer.

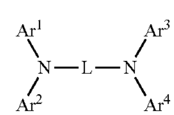

(I)

In the formula (I), each of $Ar^1$ to $Ar^4$ represents a substituted or unsubstituted aromatic hydrocarbon group or condensed aromatic hydrocarbon group having 6 to 50 ring carbon atoms, a substituted or unsubstituted aromatic heterocyclic group or condensed aromatic heterocyclic group having 5 to 50 ring atoms, or a group wherein the aromatic hydrocarbon group or condensed aromatic hydrocarbon group and the aromatic heterocyclic group or condensed aromatic heterocyclic group are boned to each other.

L represents a substituted or unsubstituted aromatic hydrocarbon group or condensed aromatic hydrocarbon group each having 6 to 50 ring carbon atoms or a substituted or unsubstituted aromatic heterocyclic group or condensed aromatic heterocyclic group each having 5 to 50 ring atoms.

Specific examples of the compound represented by formula (I) are shown below.

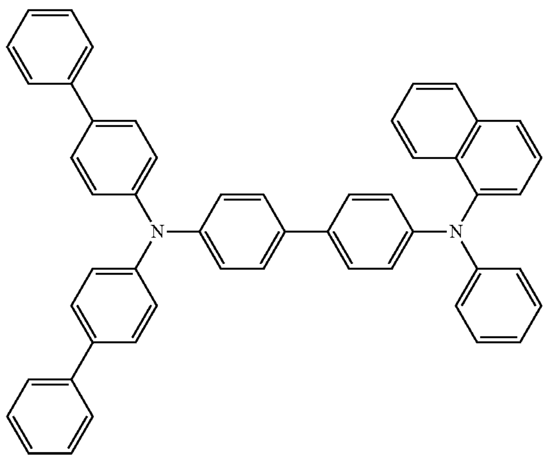

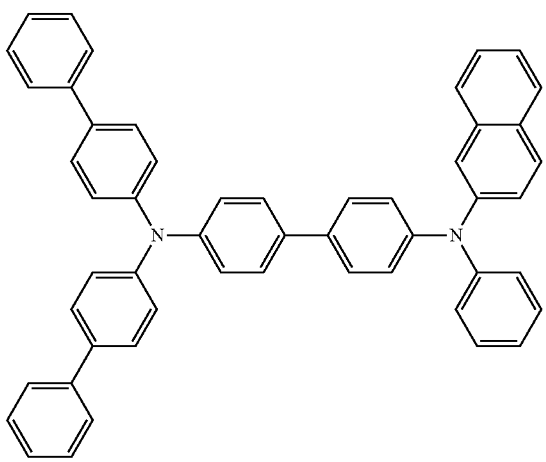

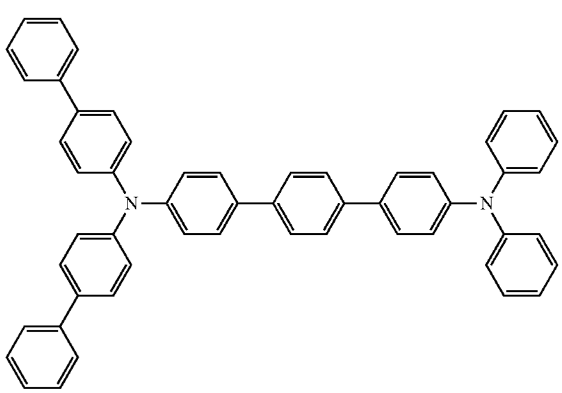

-continued

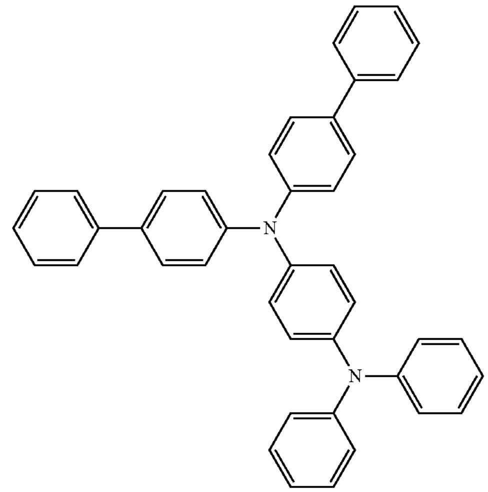

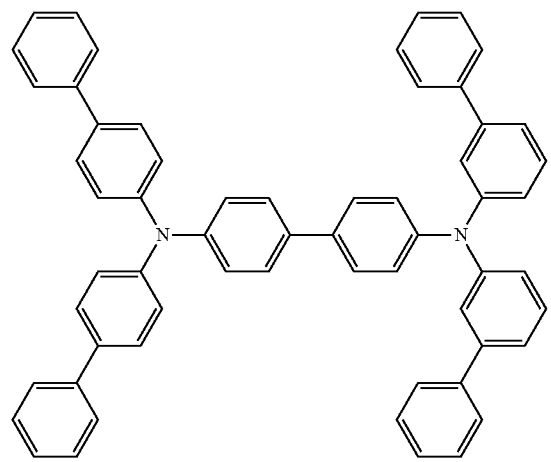

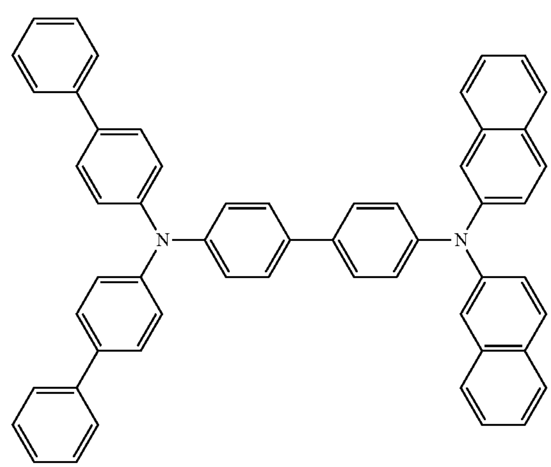

-continued
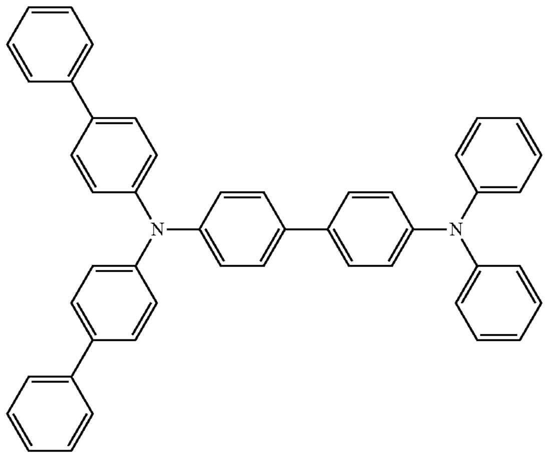
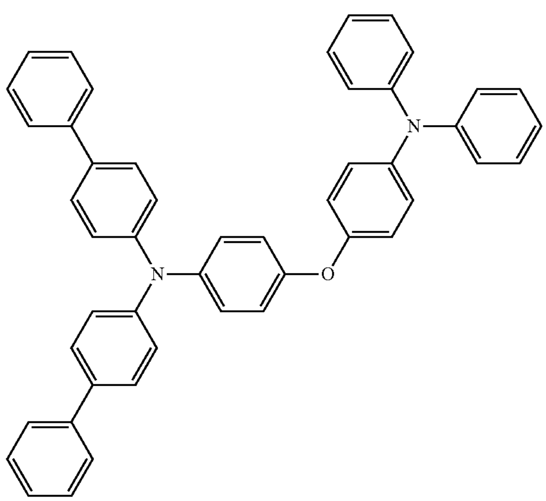
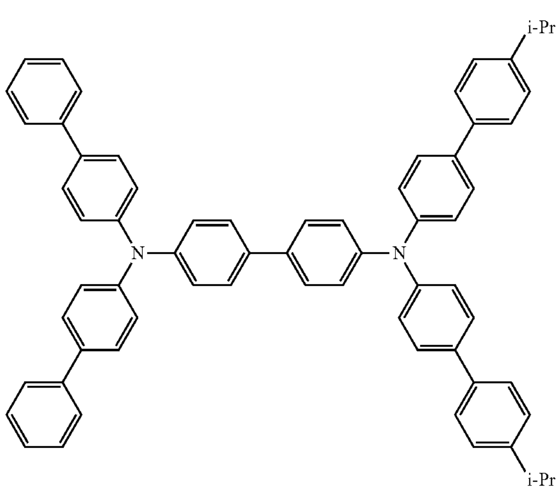
-continued
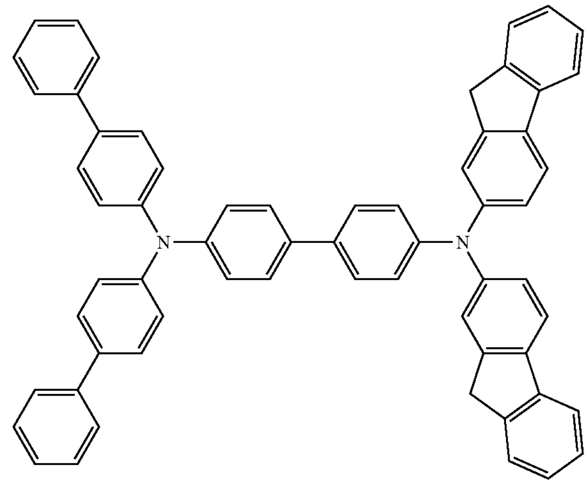
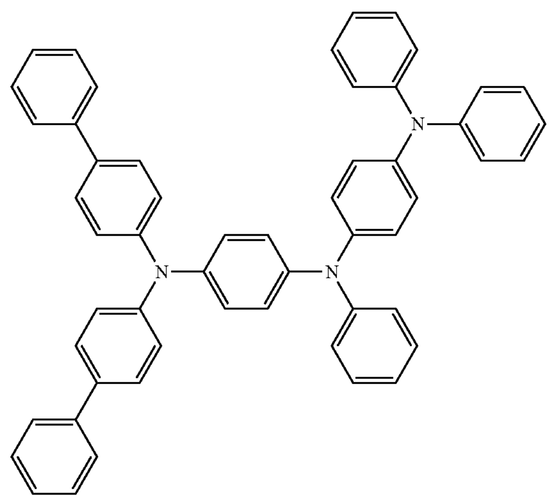
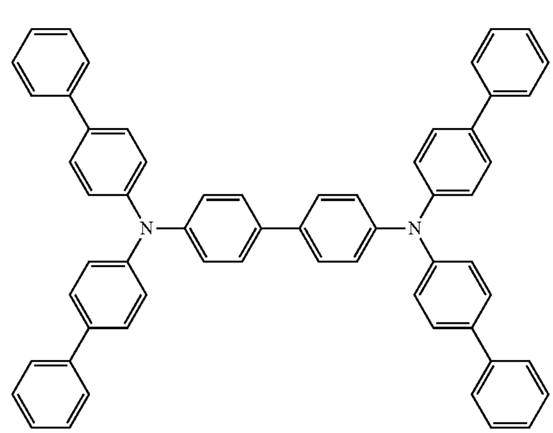

-continued
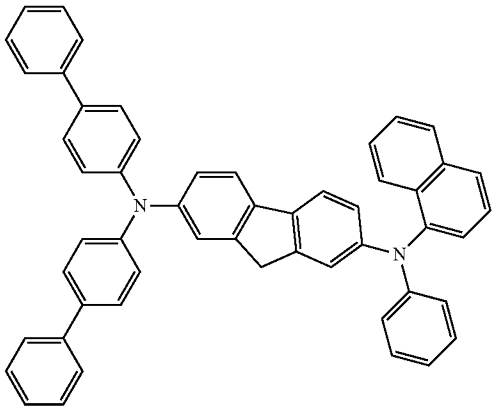
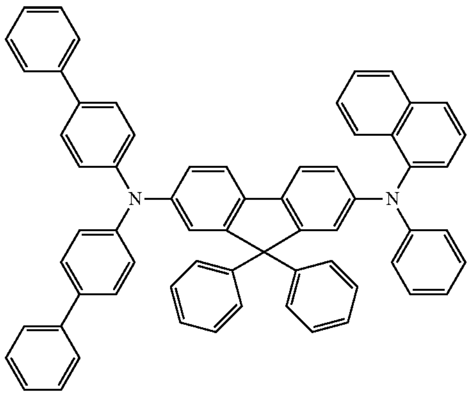
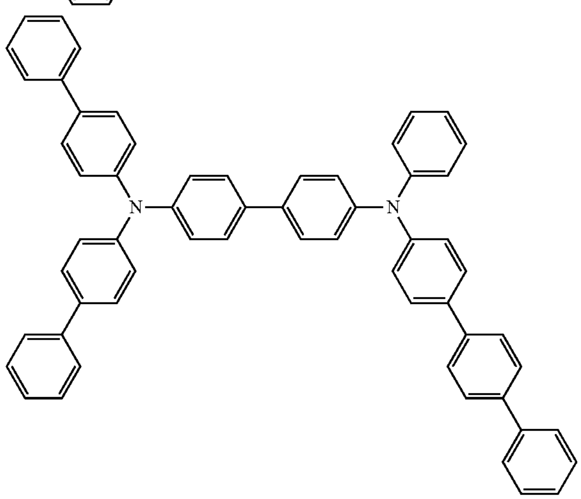
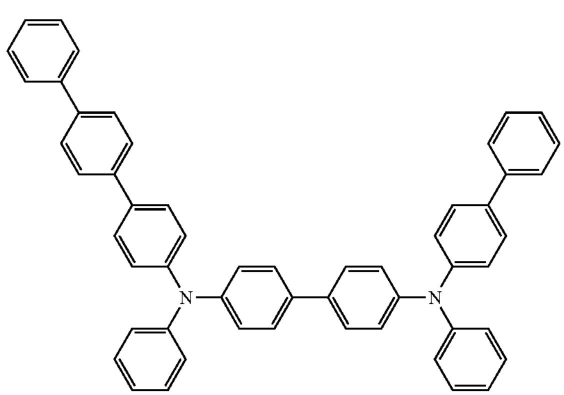
-continued
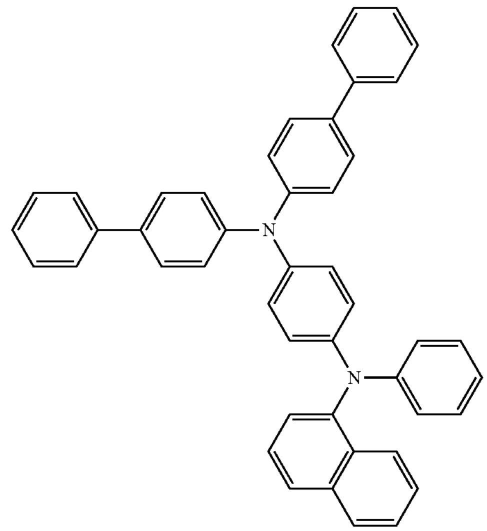
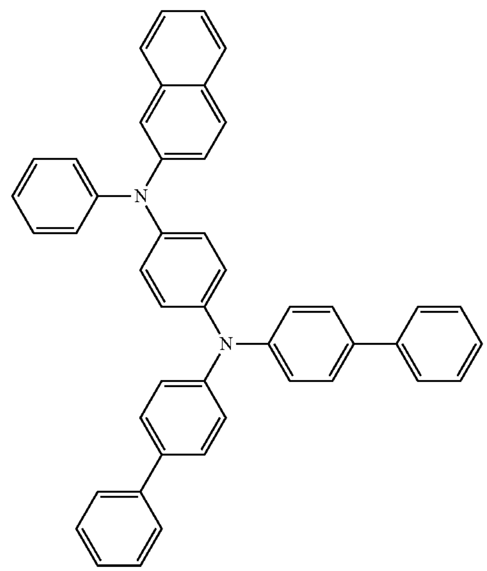
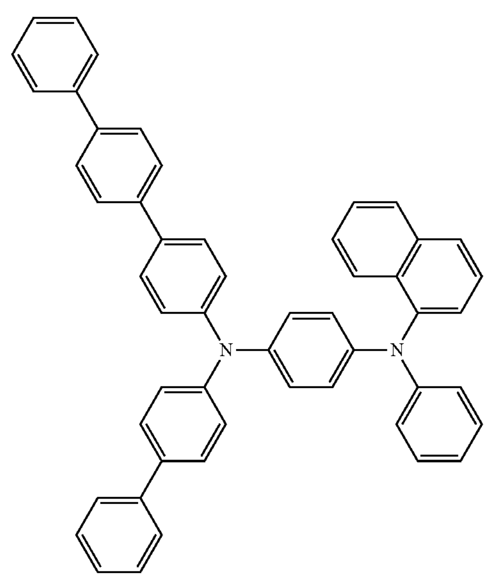

-continued
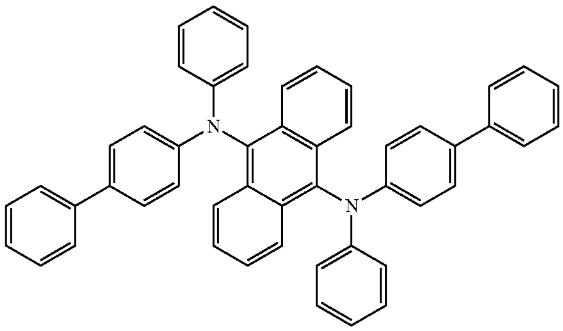
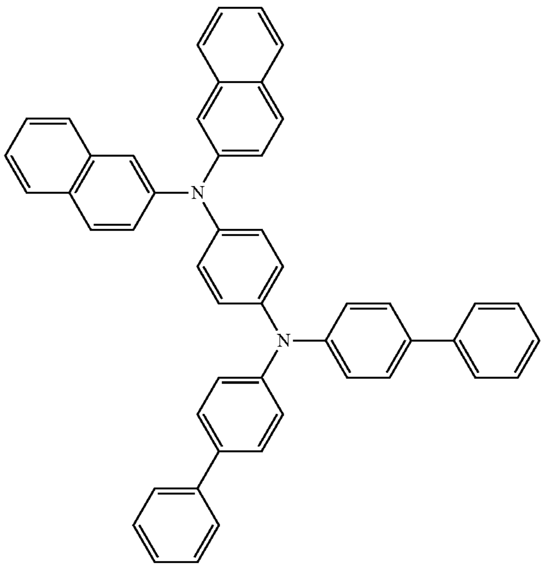
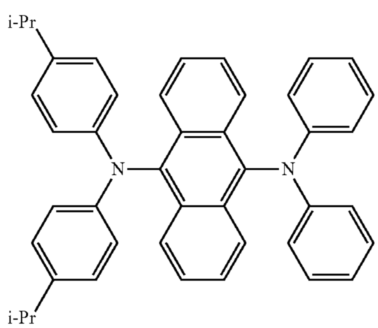
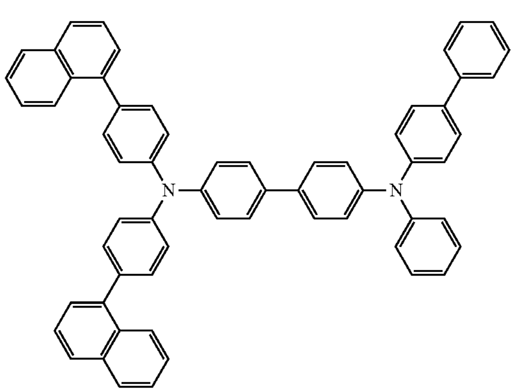
-continued
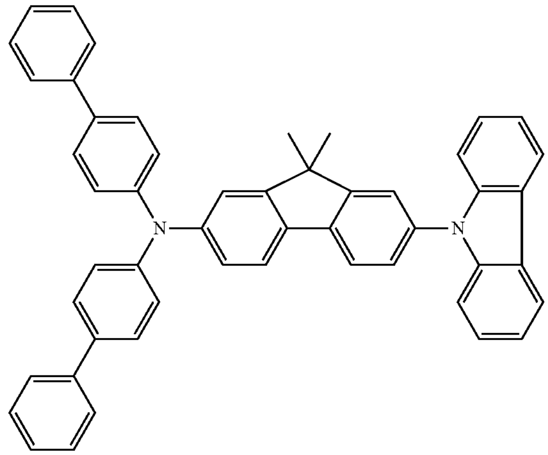
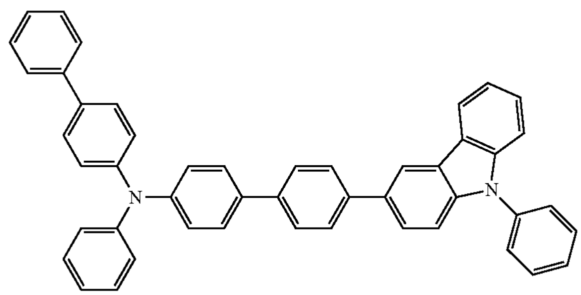
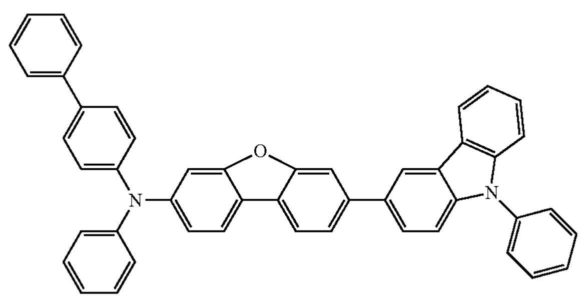
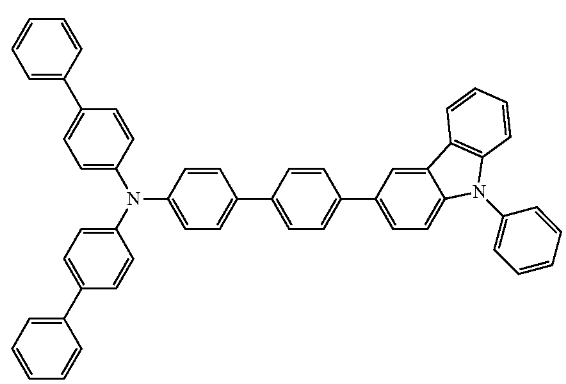

-continued
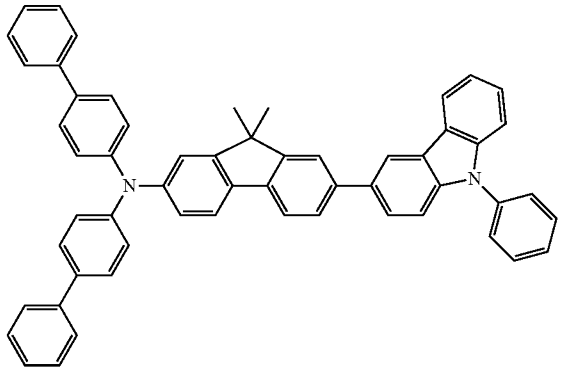
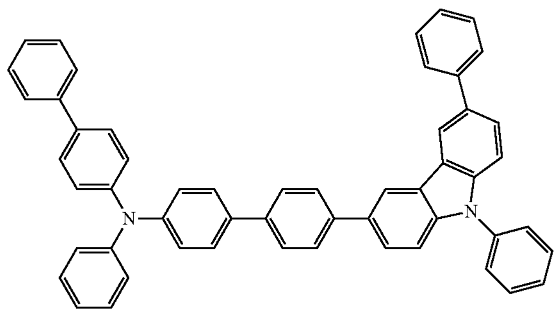
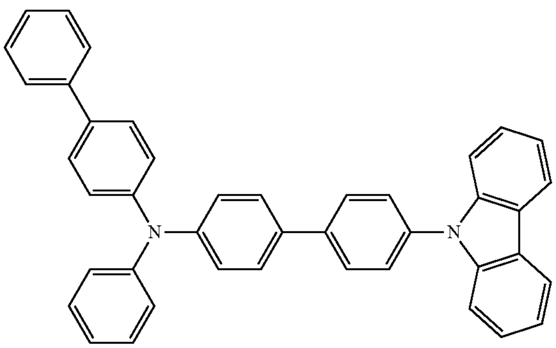
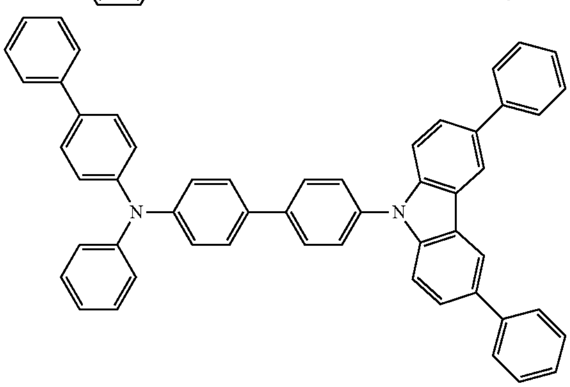
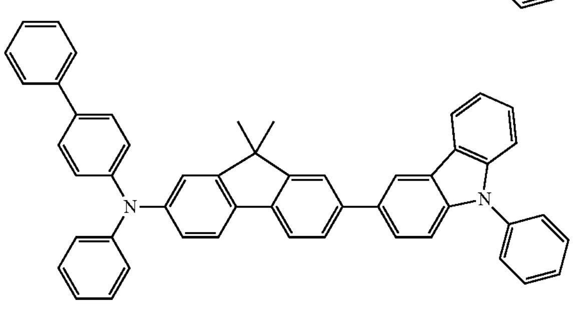
The aromatic amine represented by formula (II) is also preferably used as the material for forming the hole transporting layer:
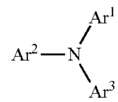
(II)
wherein each of $Ar^1$ to $Ar^3$ is as defined above with respect to $Ar^1$ to $Ar^4$ of the formula (I). The specific examples of the compounds represented by formula (II) are shown below, although not limited thereto.
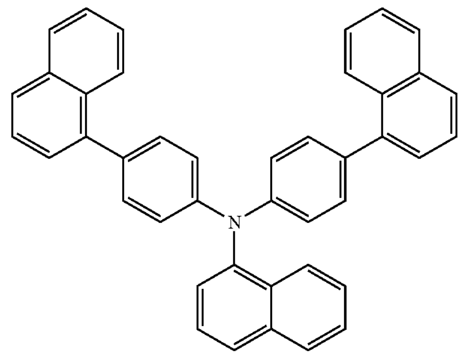
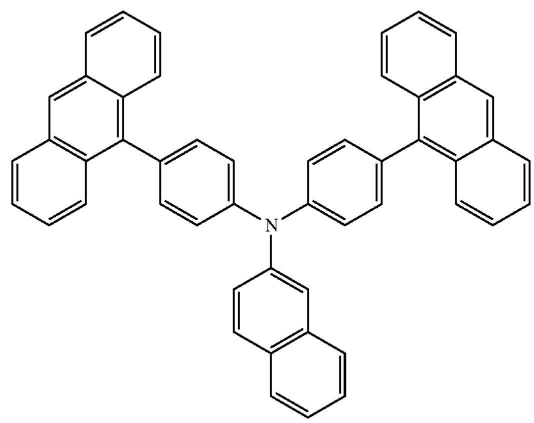
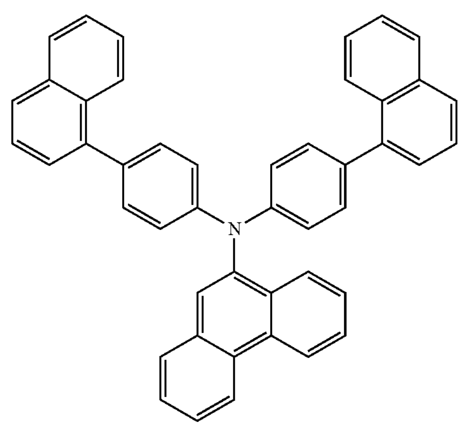

-continued
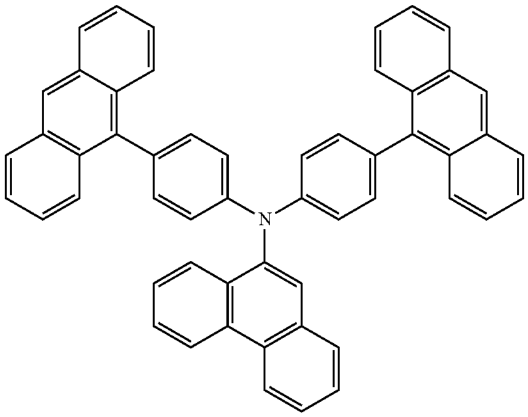
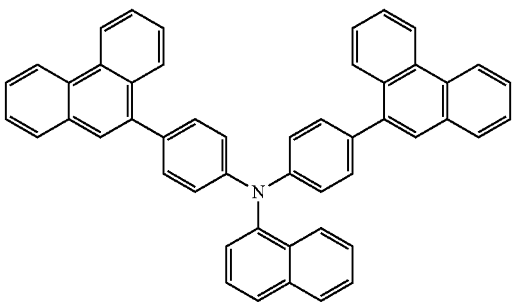
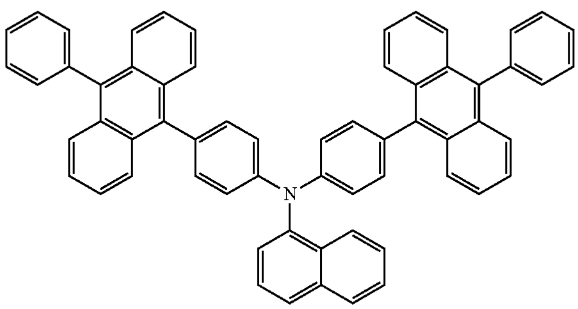
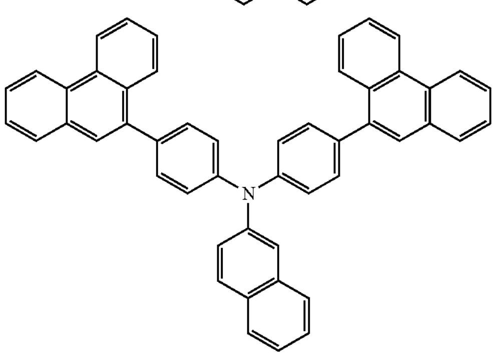
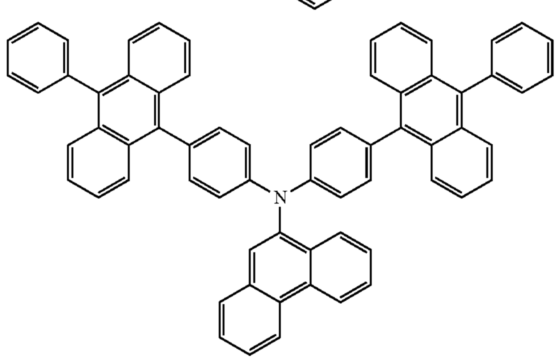
-continued
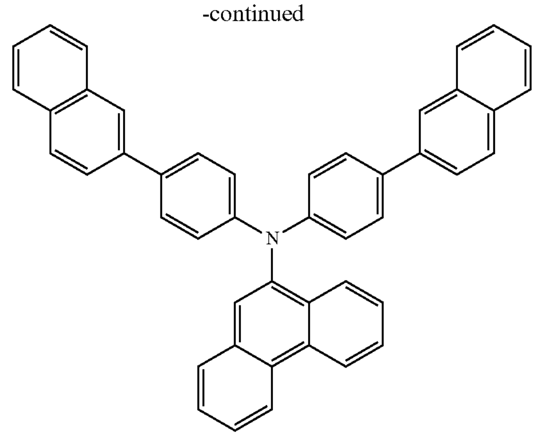
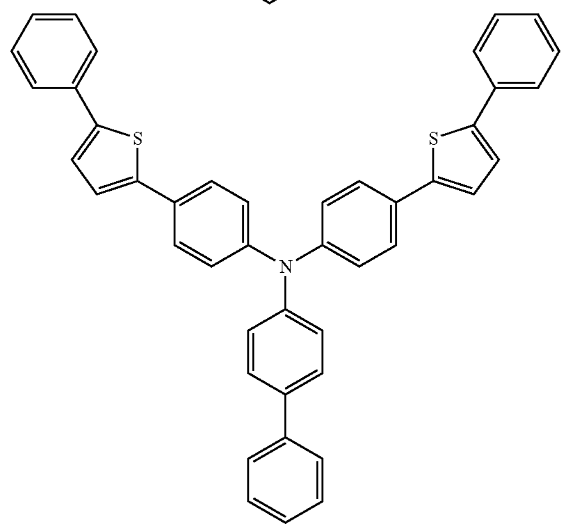
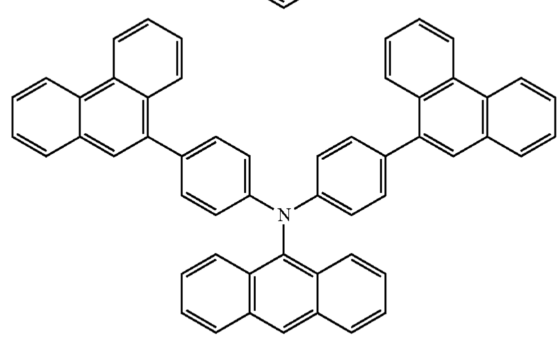
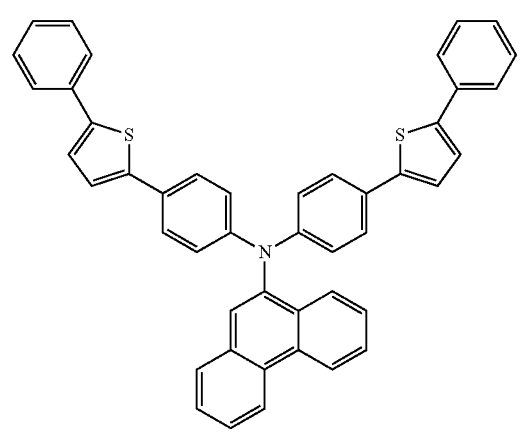

-continued

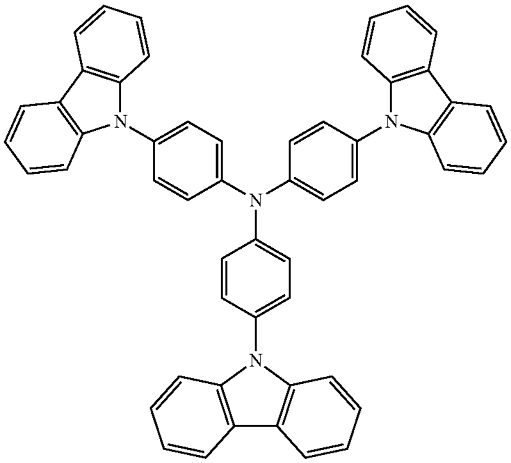

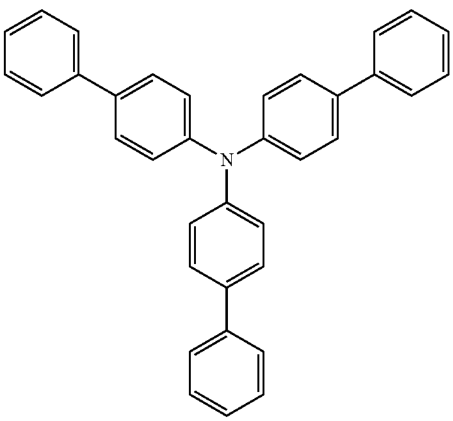

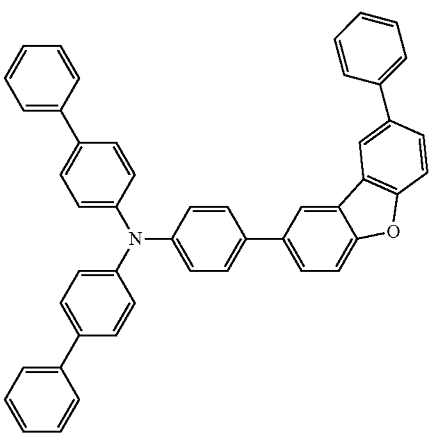

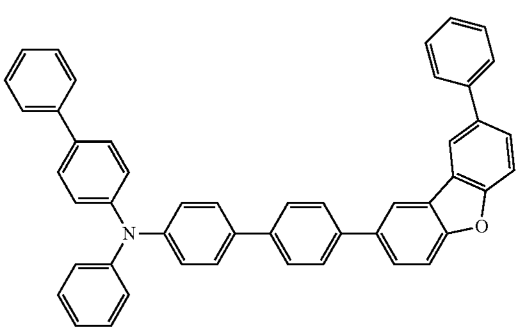

-continued

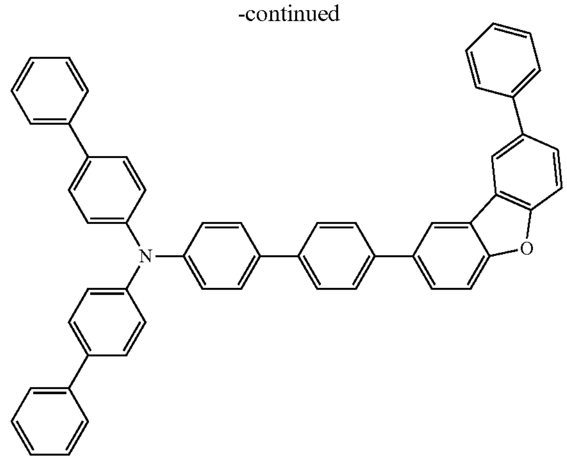

The hole transporting layer of the organic EL device of the invention may be made into two-layered structure including a first hole transporting layer (anode side) and a second hole transporting layer (cathode side).

The thickness of the hole transporting layer is preferably 10 to 200 nm, although not particularly limited thereto.

The organic EL device of the invention may have a layer comprising an electron-accepting compound, which is attached to the anode side of each of the hole transporting layer or the first hole transporting layer. With such a layer, it is expected that the driving voltage is lowered and the production cost is reduced.

The electron-accepting compound is preferably a compound represented by formula (10):

(10)

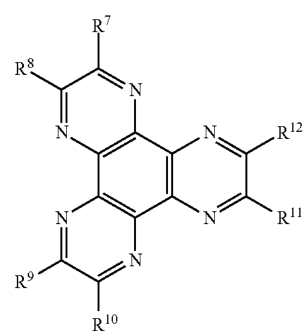

wherein $R^7$ to $R^{12}$ may be the same or different and each independently represent a cyano group, —$CONH_2$, a carboxyl group, or —$COOR^{13}$ wherein $R^{13}$ represents an alkyl group having 1 to 20 carbon atoms or a cycloalkyl group having 3 to 20 carbon atoms, provided that one or more of a pair of $R^7$ and $R^8$, a pair of $R^9$ and $R^{10}$, and a pair of $R^{11}$ and $R^{12}$ may bond to each other to form a group represented by —CO—O—CO—.

Examples of $R^{13}$ include a methyl group, an ethyl group, a n-propyl group, an isopropyl group, a n-butyl group, an isobutyl group, a t-butyl group, a cyclopentyl group, and a cyclohexyl group.

The thickness of the layer comprising the electron-accepting compound is preferably 5 to 20 nm, although not particularly limited thereto.

N/P Doping

The carrier injecting properties of the hole transporting layer and the electron transporting layer can be controlled by, as described in JP 3695714B, the doping (n) with a donor material or the doping (p) with an acceptor material.

A typical example of the n-doping is an electron transporting material doped with a metal, such as Li and Cs, and a typical example of the p-doping is a hole transporting material doped with an acceptor material such as, $F_4TCNQ$.

Space Layer

For example, in an organic EL device wherein a fluorescent light emitting layer and a phosphorescent light emitting layer are laminated, a space layer is disposed between the fluorescent light emitting layer and the phosphorescent light emitting layer to prevent the diffusion of excitons generated in the phosphorescent light emitting layer to the fluorescent light emitting layer or to control the carrier balance. The space layer may be disposed between two or more phosphorescent light emitting layers.

Since the space layer is disposed between the light emitting layers, a material combining the electron transporting ability and the hole transporting ability is preferably used for forming the space layer. To prevent the diffusion of triplet energy in the adjacent phosphorescent light emitting layer, the triplet energy of the material for the space layer is preferably 2.6 eV or more. The materials described with respect to the hole transporting layer are usable as the material for the space layer.

Blocking Layer

The organic EL device of the invention preferably has a blocking layer, such as an electron blocking layer, a hole blocking layer, and a triplet blocking layer, which is disposed adjacent to the light emitting layer. The electron blocking layer is a layer which prevents the diffusion of electrons from the light emitting layer to the hole transporting layer. The hole blocking layer is a layer which prevents the diffusion of holes from the light emitting layer to the electron transporting layer.

The triplet blocking layer prevents, as described below, the diffusion of triplet excitons generated in the light emitting layer to adjacent layers and has a function of confining the triplet excitons in the light emitting layer, thereby preventing the deactivation of energy on molecules other than the emitting dopant of triplet excitons, for example, on molecules in the electron transporting layer.

If a phosphorescent device having a triplet blocking layer satisfies the following energy relationship:

$$E^T_d < E^T_{TB}$$

wherein $E^T_d$ is the triplet energy of the phosphorescent dopant in the light emitting layer and $E^T_{TB}$ is the triplet energy of the compound forming the triplet blocking layer, the triplet excitons of phosphorescent dopant are confined (not diffuse to other molecules). Therefore, the energy deactivation process other than the emission on the phosphorescent dopant may be prevented to cause the emission with high efficiency. However, even in case of satisfying the relationship of $E^T_d < E^T_{TB}$, the triplet excitons may move into other molecules if the energy difference ($\Delta ET = E^T_{TB} - E^T_d$) is small, because the energy difference $\Delta E^T$ may be overcome by the absorption of ambient heat energy when driving a device at around room temperature as generally employed in practical drive of device. As compared with the fluorescent emission, the phosphorescent emission is relatively likely to be affected by the diffusion of excitons due to the heat absorption because the lifetime of triplet excitons is longer. Therefore, as for the energy difference $\Delta E^T$, the larger as compared with the heat energy of room temperature, the better. The energy difference $\Delta E^T$ is more preferably 0.1 eV or more and particularly preferably 0.2 eV or more.

The triplet energy referred to herein was determined as follows.

A sample was dissolved in EPA solvent (diethyl ether: isopentane:ethanol=5:5:2 (by volume)) in a concentration of 10 μmol/L to prepare a specimen for phosphorescence measurement. The specimen for phosphorescence measurement was placed in a quartz cell and irradiated with excitation ray at 77 K, and the emitted phosphorescence was measured. Using the measured result, the triplet energy was determined as the value calculated from the following conversion formula:

$$E^T(\mathrm{eV}) = 1239.85/\lambda_{edge}$$

wherein $\lambda_{edge}$ is determined as follows.

On the phosphorescence spectrum with a vertical axis of phosphorescent intensity and a horizontal axis of wavelength, a line tangent to the rising portion at the short-wavelength side of the phosphorescent spectrum was drawn, and the wavelength (nm) at the intersection of the tangent line and the horizontal axis was expressed by "$\lambda_{edge}$."

A material satisfying the following relationship:

$$A_b - A_h \leq 0.1 \text{ eV}$$

wherein $A_b$ is the affinity of the blocking layer material and $A_h$ is the affinity of the host material in the light emitting layer, is preferably used as the host material in the light emitting layer.

The electron affinity is defined as the amount of energy released or absorbed when one electron is added to a molecule. The affinity level is expressed by a positive sign when the energy is released and a negative sign when the energy is absorbed. Using the ionization potential Ip and the optical energy gap Eg(S), the affinity Af is expressed by:

$$Af = Ip - Eg(S).$$

The ionization potential Ip is the amount of energy required to remove an electron from a compound to ionize the compound. In the present invention, Ip is a positive value measured by a photoelectronic spectrophotometer (AC-3, manufactured by Riken Keiki Co., Ltd.) in the atmosphere. The optical energy gap Eg(S) is the difference between the conduction level and the valence level. In the present invention, Eg(S) is a positive value which is determined by measuring an ultraviolet/visible absorption spectrum of a diluted dichloromethane solution of a material, drawing a line tangent to the spectrum at the long-wavelength side, and converting the wavelength of the intersection between the tangent line and the base line (zero absorption) to the unit of energy.

The electron mobility of the material for the triplet blocking layer is preferably $10^{-6}$ $cm^2/Vs$ or more at an electric field strength in a range of 0.04 to 0.5 MV/cm. There are several methods for measuring the electron mobility of organic material, for example, Time of Flight method. In the present invention, the electron mobility is determined by impedance spectroscopy.

The electron mobility of the electron injecting layer is preferably $10^{-6}$ $cm^2/Vs$ or more at an electric field strength in a range of 0.04 to 0.5 MV/cm. Within the above range, the injection of electrons from the cathode to the electron transporting layer is promoted and the injection of electrons to the adjacent blocking layer and light emitting layer is also promoted, thereby enabling to drive a device at lower voltage.

EXAMPLES

The present invention will be described in more detail with reference to the examples. However, it should be noted that the scope of the invention is not limited to the following examples.

Synthesis Example 1

Synthesis of Intermediate 1

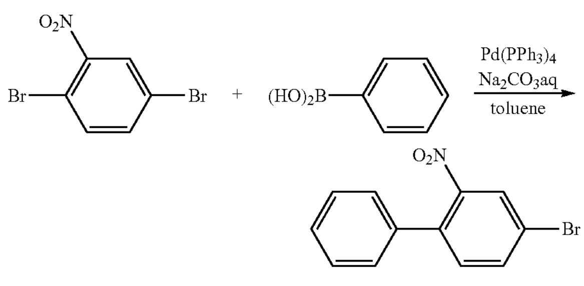

Intermediate 1

In an argon atmosphere, a mixture obtained by successively adding 2-nitro-1,4-dibromobenzene (11.2 g, 40 mmol), phenylboronic acid (4.9 g, 40 mmol), tetrakis(triphenylphosphine)palladium (1.39 g, 1.2 mmol), toluene (120 mL), and a 2 M aqueous solution of sodium carbonate (60 mL) was refluxed for 8 h under heating.

After cooling the reaction solution to room temperature, the organic layer was separated and the organic solvent was removed by evaporation under reduced pressure. The obtained residue was purified by silica gel column chromatography to obtain a product (6.6 g, yield: 59%), which was identified as Intermediate 1 by FD-MS (Field Desorption Mass Spectrometry) analysis.

Synthesis of Intermediate 2

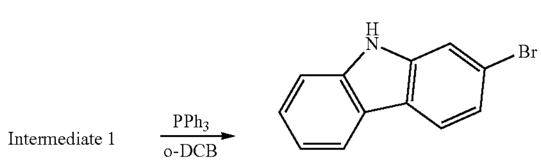

Intermediate 2

In an argon atmosphere, a mixture obtained by successively adding Intermediate 1 (6.6 g, 23.7 mmol), triphenylphosphine (15.6 g, 59.3 mmol), and o-dichlorobenzene (24 mL) was heated for 8 h at 180° C.

After cooling to room temperature, the reaction solution was purified by silica gel column chromatography to obtain a product (4 g, yield: 68%), which was identified as Intermediate 2 by FD-MS (Field Desorption Mass Spectrometry) analysis.

Synthesis of Intermediate 3

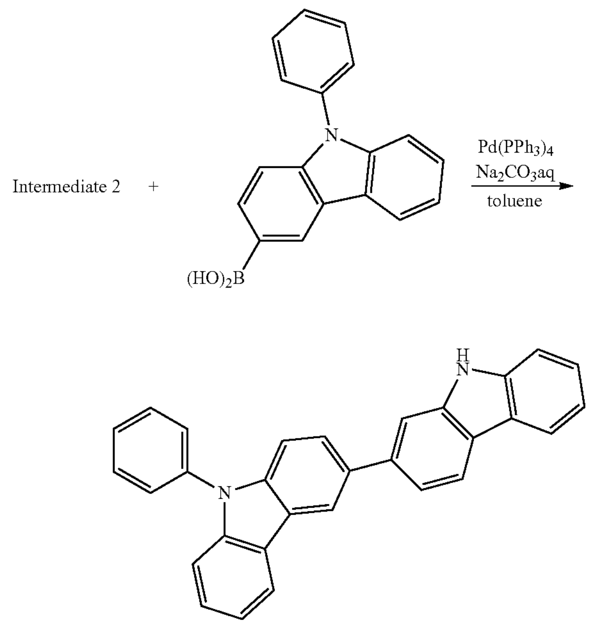

Intermediate 3

The procedure of Synthesis of Intermediate 1 was repeated except for using Intermediate 2 in place of 2-nitro-1,4-dibromobenzene and using 9-phenyl-9H-carbazol-3-ylboronic acid in place of phenylboronic acid. The product was identified as Intermediate 3 by FD-MS (Field Desorption Mass Spectrometry) analysis.

Synthesis of Intermediate 4

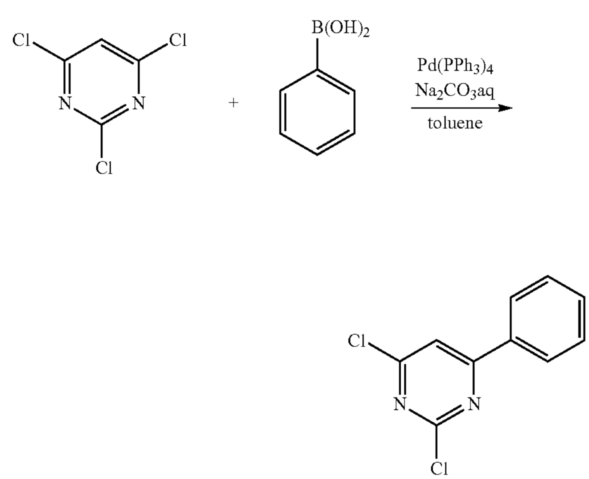

Intermediate 4

The procedure of Synthesis of Intermediate 1 was repeated except for using 2,4,6-trichloropyrimidine in place of 2-nitro-1,4-dibromobenzene. The product was identified as Intermediate 4 by FD-MS (Field Desorption Mass Spectrometry) analysis.

Synthesis of Intermediate 5

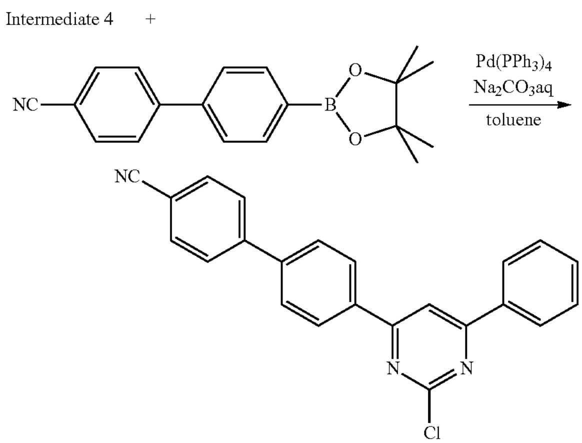

Intermediate 5

The procedure of Synthesis of Intermediate 1 was repeated except for using Intermediate 4 in place of 2-nitro-1,4-dibromobenzene and using 4'-(4,4,5,5-tetramethyl-1,3,2-dioxaborolan-2-yl)biphenyl-4-carbonitrile in place of phenylboronic acid. The product was identified as Intermediate 5 by FD-MS (Field Desorption Mass Spectrometry) analysis.

Synthesis of Compound B3

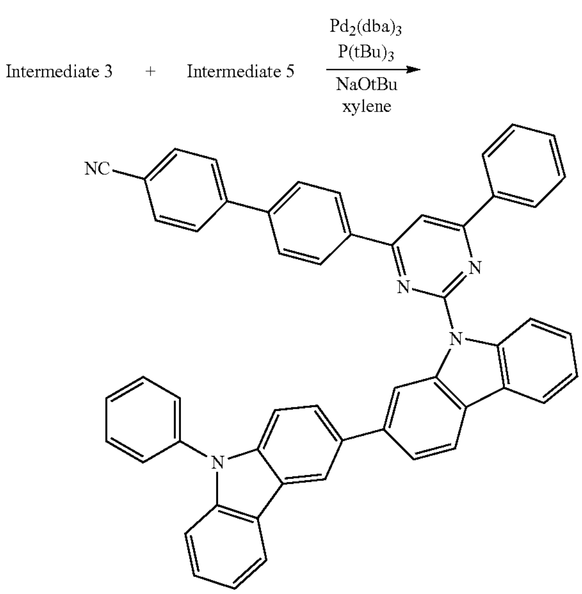

B3

In an argon atmosphere, a mixture obtained by successively adding Intermediate 3 (6.93 g, 17.0 mmol), Intermediate 5 (7.50 g, 20.4 mmol), tris(dibenzylideneacetone)dipalladium (623 mg, 0.680 mmol), tri-t-butylphosphine (343 mg, 1.7 mmol), sodium t-butoxide (3.27 g, 34.0 mmol), and dehydrated xylene (85 mL) was refluxed for 8 h under heating.

After cooling the reaction solution to room temperature, the organic layer was separated and the organic solvent was removed by evaporation under reduced pressure. The obtained residue was purified by silica gel column chromatography to obtain 11.1 g of a pale yellow solid (Compound B3).

The result of FD-MS (Field Desorption Mass Spectrometry) analysis of the obtained compound was shown below.

FDMS: calcd. for C53H33N5=739, found m/z=739 (M+)

Example 1

Production of Organic EL Device

A glass substrate with an ITO transparent electrode having a size of 25 mm×75 mm×1.1 mm (manufactured by GEOMATEC Co., Ltd.) was ultrasonically cleaned in isopropyl alcohol for 5 min and then UV (ultraviolet)/ozone cleaned for 30 min.

The cleaned glass substrate with the transparent electrode line was mounted on the substrate holder of a vacuum deposition apparatus. First, the following electron-accepting compound (A) was vapor-deposited onto the surface where the transparent electrode line was formed so as to cover the transparent electrode, thereby forming a film A having a thickness of 5 nm. On the film A, the following aromatic amine derivative (X1) as a first hole transporting material was vapor-deposited to form a first hole transporting layer having a thickness of 120 nm. Successively after the formation of the first hole transporting layer, the following carbazole derivative (H1) as a second hole transporting material was vapor-deposited to form a second hole transporting layer having a thickness of 47 nm.

On the hole transporting layer, the compound (B1) (host for phosphorescence) and $Ir(ppy)_3$ (dopant for phosphorescence) were vapor co-deposited into a film having a thickness of 40 nm, to form a phosphorescent light emitting layer. The concentration of $Ir(ppy)_3$ was 10% by mass.

Then, a film of the compound (C) having a thickness of 20 nm, a film of LiF having a thickness of 1 nm, and a film of metallic Al having a thickness of 80 nm were successively deposited to form a cathode. The LiF film as the electron injecting electrode was formed at a film-forming speed of 1 Å/min.

(A)
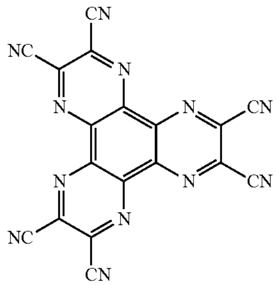
(X1)
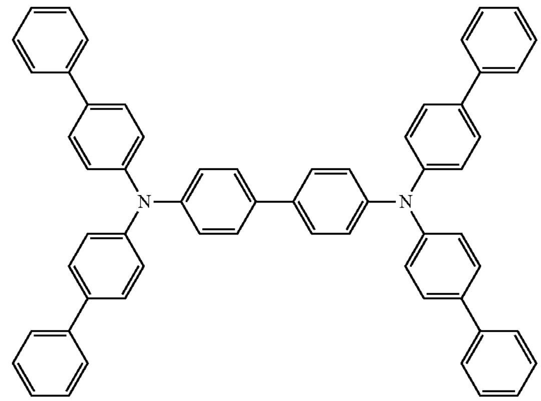
(H1)
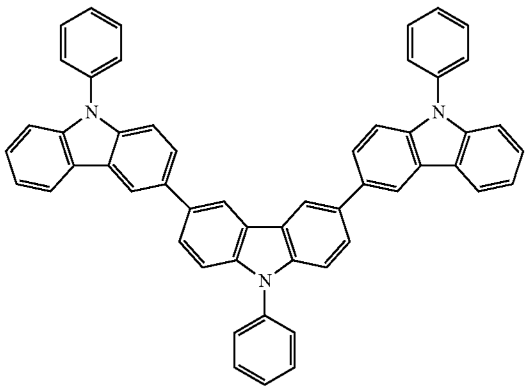
(H2)
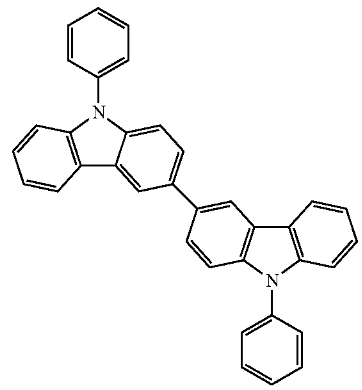
(H3)
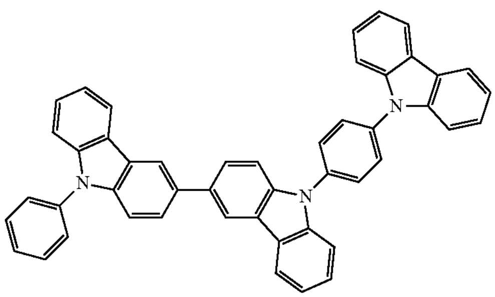
(H4)
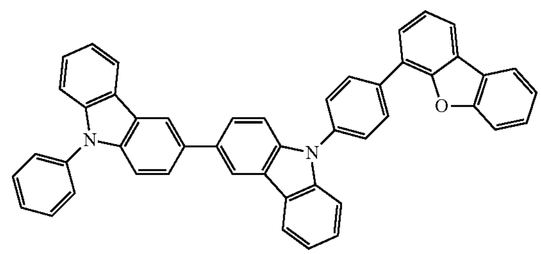
(H5)
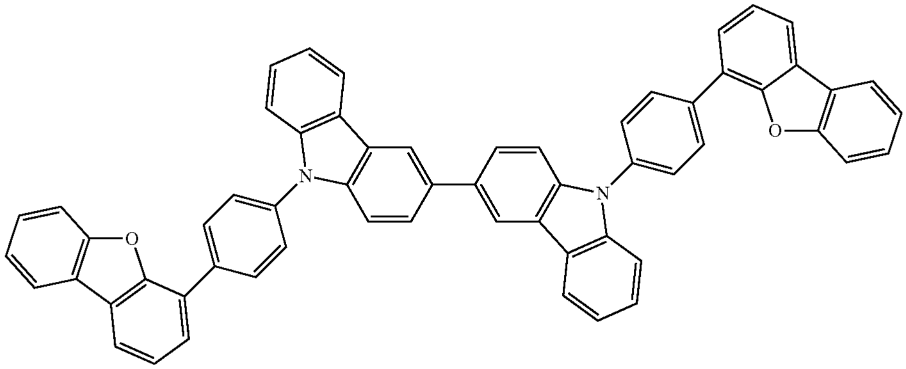

-continued
(H6)
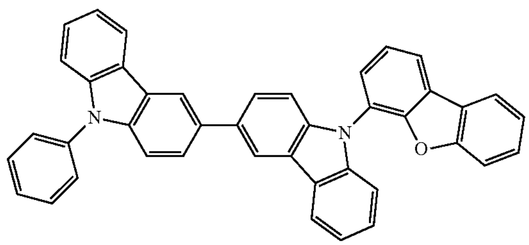
(H7)
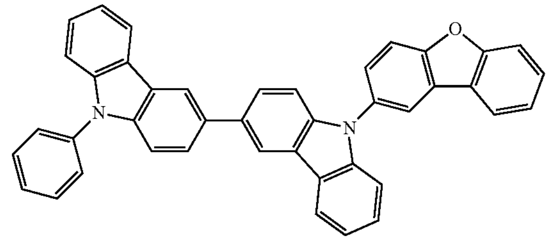
(H8)
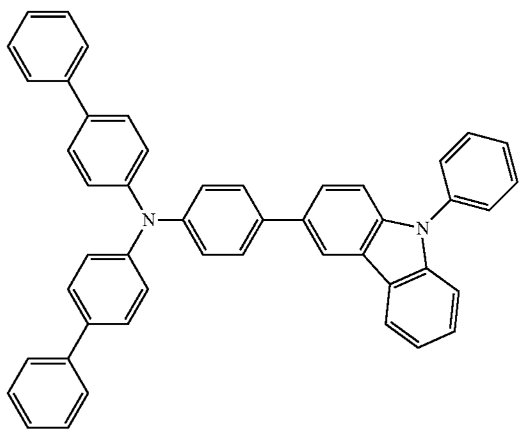
(H9)
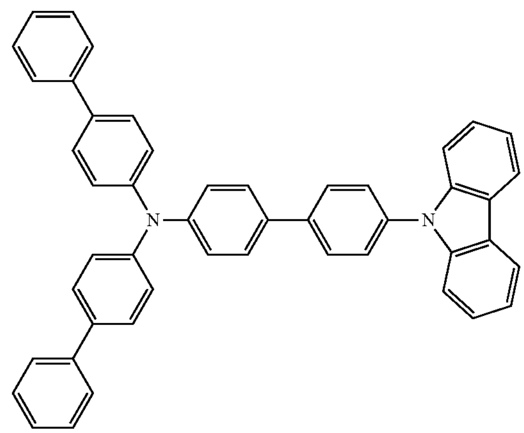
(H10)
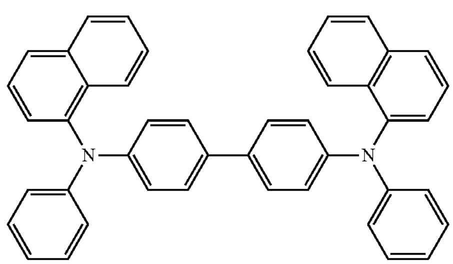
(B1)
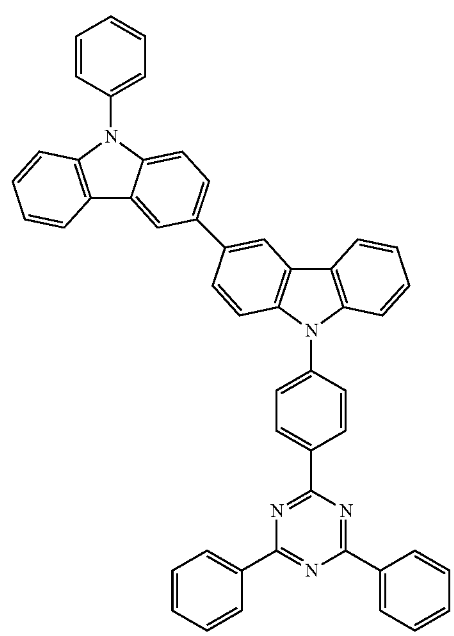

-continued (B2)

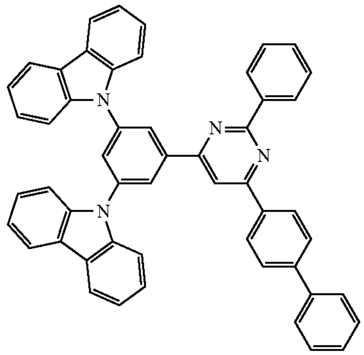

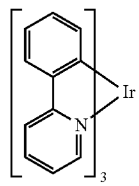

Ir(ppy)3

(C)

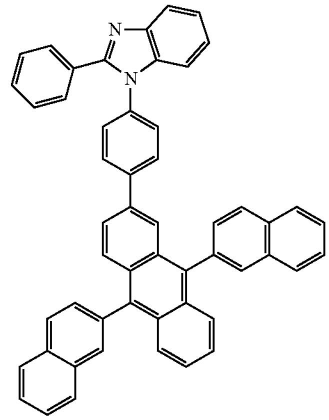

Evaluation of Emission Performance of Organic EL Device

The organic EL device thus produced was measured for the luminance (L) and the current density by allowing the device to emit light under a direct current drive, thereby determining the current efficiency (L/J) and the driving voltage (V) at a current density of 10 mA/cm$^2$.

In addition, the organic EL device was measured for the lifetime at an initial luminance of 5200 cd/m$^2$. The results are shown in Table 1.

Examples 2 to 7

Production of Organic EL Device and Evaluation of Emission Performance

Each organic EL device was produced in the same manner as in Example 1 except for using the material shown in Table 1 as the second hole transporting material in place of the carbazole derivative (H1). The results of the evaluation of emission performance are shown in Table 1.

Comparative Examples 1 to 6

Production of Organic EL Device and Evaluation of Emission Performance

Each organic EL device was produced in the same manner as in Example 1 except for using the hole transporting material shown in Table 1 as the second hole transporting material in place the carbazole derivative (H1) and using the host material shown in Table 1 in place of the phosphorescent host compound (B1). The results of the evaluation of emission performance are shown in Table 1.

TABLE 1

| | | | Measurement results | | |
|---|---|---|---|---|---|
| | Hole transporting material | Host material | Emission efficiency (cd/A) @ 10 mA/cm$^2$ | Driving voltage (V) @ 10 mA/cm$^2$ | 90% Half lifetime (h) |
| Examples | | | | | |
| 1 | H1 | B1 | 62.6 | 3.8 | 466 |
| 2 | H2 | B1 | 66.7 | 4.9 | 634 |
| 3 | H3 | B1 | 66.8 | 4.9 | 623 |
| 4 | H4 | B1 | 62.1 | 4.5 | 458 |
| 5 | H5 | B1 | 61.2 | 4.6 | 433 |
| 6 | H6 | B1 | 67.4 | 5.0 | 565 |
| 7 | H7 | B1 | 65.0 | 4.2 | 445 |
| Comparative Examples | | | | | |
| 1 | H1 | B2 | 65.0 | 3.9 | 111 |
| 2 | H5 | B2 | 64.1 | 5.0 | 231 |
| 3 | H8 | B1 | 60.8 | 4.1 | 213 |
| 4 | H8 | B2 | 64.8 | 4.2 | 98 |
| 5 | H9 | B1 | 57.7 | 4.2 | 10 |
| 6 | H10 | B1 | 35.5 | 4.6 | 118 |

The above hole transporting materials and host materials were measured for the ionization potential (Ip) and the triplet energy. The results are shown in Table 2.

TABLE 2

| | Ip (eV) | Eg (T) (eV) |
|---|---|---|
| Hole transporting material | | |
| H1 | 5.5 | 2.8 |
| H2 | 5.6 | 2.9 |
| H3 | 5.6 | 2.9 |
| H4 | 5.7 | 2.8 |
| H5 | 5.7 | 2.8 |
| H6 | 5.7 | 2.9 |
| H7 | 5.6 | 2.9 |
| H8 | 5.5 | 2.6 |
| H9 | 5.6 | 2.6 |
| H10 | 5.5 | 2.5 |
| Host material | | |
| B1 | 5.7 | 2.8 |
| B2 | 6.1 | 2.7 |

It can be seen from Table 1 that the organic EL devices of the invention produced in Examples 1 to 7 have longer lifetimes as compared with the conventional organic EL devices produced in Comparative Examples 1 to 6.

Upon comparing Example 1 with Comparative Example 1 or Example 5 with Comparative Example 2, it can bee seen that the driving voltage of the organic EL device is lower and the lifetime is longer when using the host B1 than using the host B2. The carbazole derivatives used in examples as the hole transporting materials have low hole transporting ability. However, the host compound B1 has high hole transporting ability. By combinedly using these materials, the carrier balance in the light emitting layer may be improved to reduce the driving voltage and prolong the lifetime. In contrast, since the host compound B2 has high electron transporting ability, the carrier balance in the light emitting layer may be lost to result in the high driving voltage and the short lifetime as can bee seen in Comparative Examples 1 and 2.

In Comparative Examples 3 and 4, the effect of the compound B1 of reducing the driving voltage is low because of high hole transporting ability of the hole transporting material H8, but the lifetime may be prolonged because of high hole transporting ability of the compound B1.

Example 8

Production of Organic EL Device

A glass substrate with an ITO transparent electrode having a size of 25 mm×75 mm×1.1 mm (manufactured by GEOMATEC Co., Ltd.) was ultrasonically cleaned in isopropyl alcohol for 5 min and then UV (ultraviolet)/ozone cleaned for 30 min.

The cleaned glass substrate with the transparent electrode line was mounted on the substrate holder of a vacuum deposition apparatus. First, the following electron-accepting compound (A) was vapor-deposited onto the surface where the transparent electrode line was formed so as to cover the transparent electrode, thereby forming a film A having a thickness of 5 nm. On the film A, the following aromatic amine derivative (X2) as a first hole transporting material was vapor-deposited to form a first hole transporting layer having a thickness of 65 nm. Successively after the formation of the first hole transporting layer, the following carbazole derivative (H1) as a second hole transporting material was vapor-deposited to form a second hole transporting layer having a thickness of 10 nm.

On the hole transporting layer, the compound (B3) (host for phosphorescence) and $Ir(bzq)_3$ (dopant for phosphorescence) were vapor co-deposited into a film having a thickness of 25 nm, to form a phosphorescent light emitting layer. The concentration of $Ir(bzq)_3$ was 10% by mass.

Then, a film of the compound (C2) having a thickness of 35 nm, a film of LiF having a thickness of 1 nm, and a film of metallic Al having a thickness of 80 nm were successively deposited to form a cathode. The LiF film as the electron injecting electrode was formed at a film-forming speed of 1 Å/min.

(A)

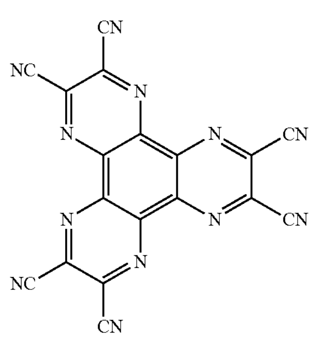

-continued (X2)

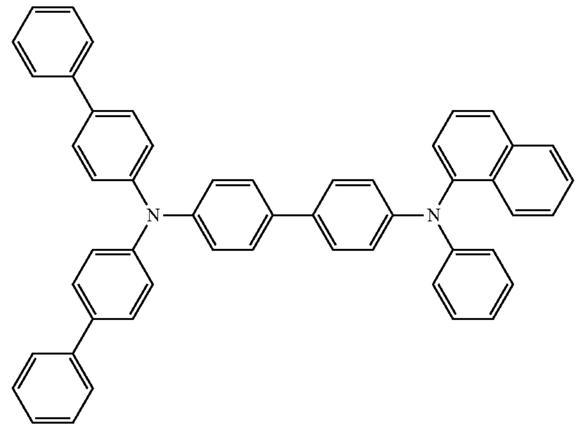

(H1)

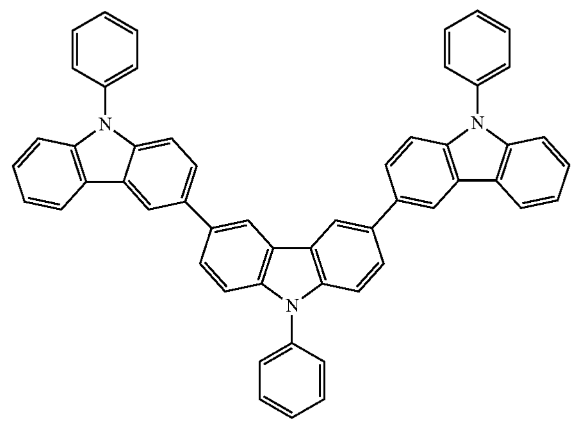

(H2)

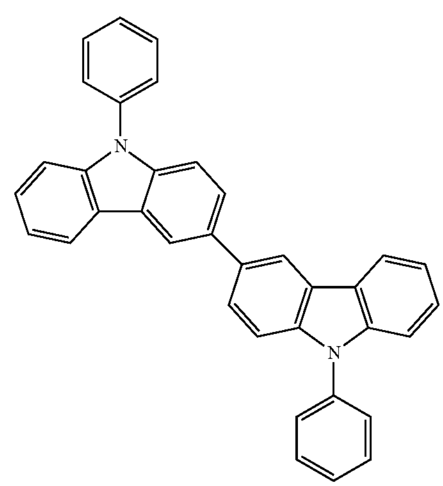

-continued
(H3)
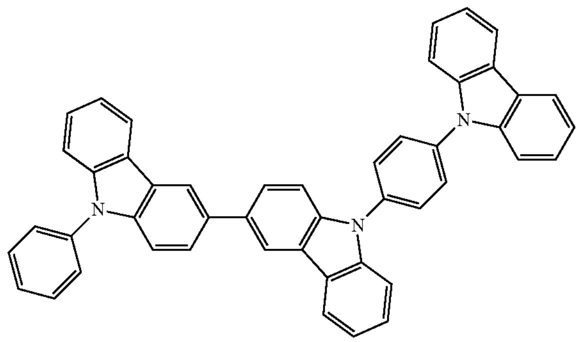
(H4)
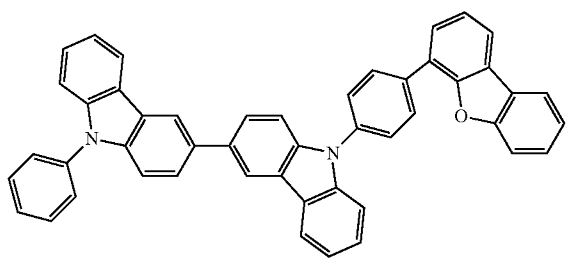
(H5)
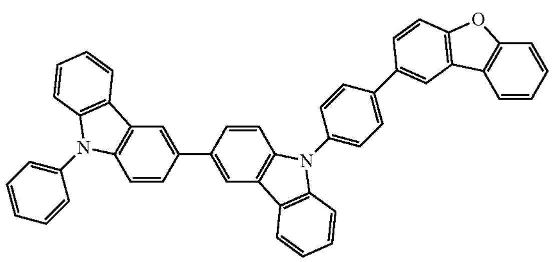
(H6)
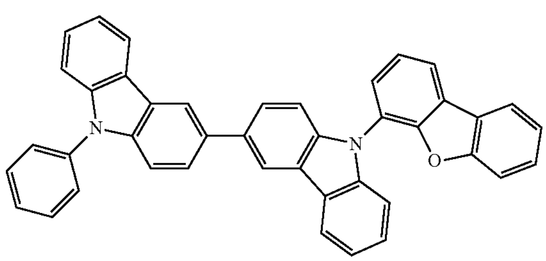
(H7)
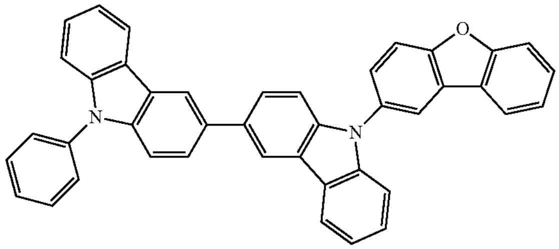
-continued
(H8)
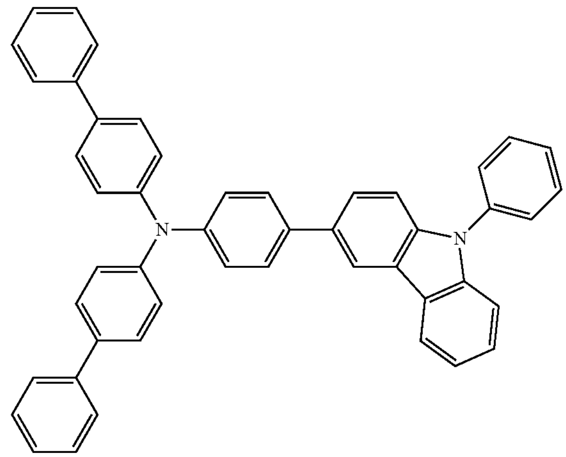
(H9)
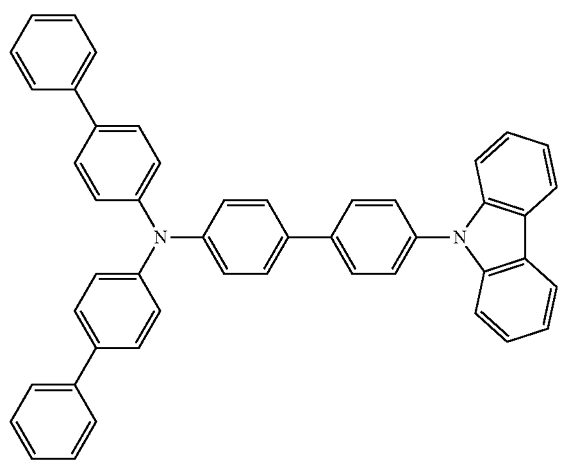
(H10)
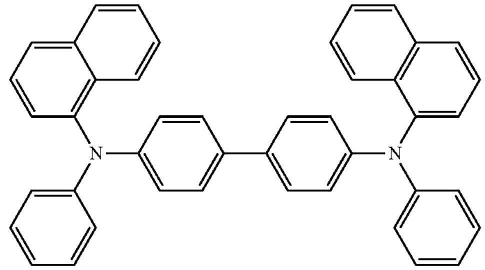

-continued (B3)

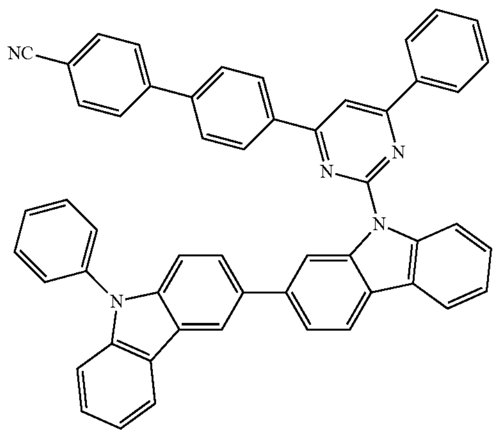

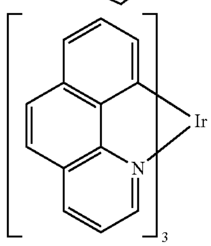

$Ir(bzq)_3$ (C2)

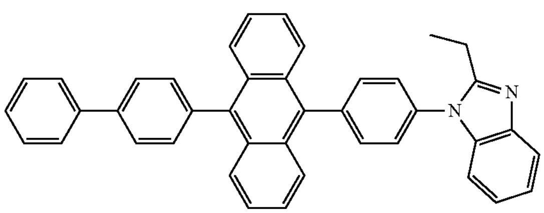

Evaluation of Emission Performance of Organic EL Device

The organic EL device thus produced was measured for the luminance (cd/m$^2$) and the current density by allowing the device to emit light under a direct current drive, thereby determining the emission efficiency (cd/A) and the driving voltage (V) at a current density of 10 mA/cm$^2$. In addition, the lifetime until the luminance was reduced to 80% of the initial luminance was measured at a current density of 50 mA/cm$^2$.

Examples 9 to 14

Production of Organic EL Device and Evaluation of Emission Performance

Each organic EL device was produced in the same manner as in Example 8 except for using the material shown in Table 3 as the second hole transporting material in place of the carbazole derivative (H1). The results of the evaluation of emission performance are shown in Table 3.

Comparative Examples 7 to 9

Production of Organic EL Device and Evaluation of Emission Performance

Each organic EL device was produced in the same manner as in Example 8 except for using the hole transporting material shown in Table 3 as the second hole transporting material in place of the carbazole derivative (H1). The results of the evaluation of emission performance are shown in Table 3.

TABLE 3

| | | | Measurement results | | |
|---|---|---|---|---|---|
| | Hole transporting material | Host material | Emission efficiency (cd/A) @ 10 mA/cm$^2$ | Driving voltage (V) @ 10 mA/cm$^2$ | 80% Half lifetime (h) |
| Examples | | | | | |
| 8 | H1 | B3 | 65.4 | 3.1 | 360 |
| 9 | H2 | B3 | 68.3 | 3.5 | 450 |
| 10 | H3 | B3 | 67.8 | 3.5 | 440 |
| 11 | H4 | B3 | 64.9 | 3.2 | 350 |
| 12 | H5 | B3 | 64.5 | 3.2 | 340 |
| 13 | H6 | B3 | 68.4 | 3.6 | 430 |
| 14 | H7 | B3 | 67.9 | 3.0 | 340 |
| Comparative Examples | | | | | |
| 7 | H8 | B3 | 60.5 | 3.0 | 245 |
| 8 | H9 | B3 | 65.2 | 3.0 | 10 |
| 9 | H10 | B3 | 57.5 | 3.2 | 250 |

It can be seen from Table 3 that the organic EL devices of the invention produced in Examples 8 to 14 have longer lifetimes as compared with the conventional organic EL devices produced in Comparative Examples 7 to 9.

INDUSTRIAL APPLICABILITY

The organic EL device of the invention has a long lifetime and is capable of driving at a low voltage.

REFERENCE NUMERALS

1: Organic electroluminescence device

2: Substrate

3: Anode

4: Cathode

5: Light emitting layer

6: Hole transporting layer

7: Electron transporting layer

10: Emission unit

What is claimed is:

1. An organic electroluminescence device, comprising a first organic thin-film layer and a second organic thin-film layer between an anode and a cathode opposing the anode in this order from the anode side, wherein the first organic thin-film layer comprises an aromatic heterocyclic derivative A represented by formula (1-1), the second organic thin-film layer comprises an aromatic heterocyclic derivative B represented by formula (2-1), and the aromatic heterocyclic derivative A and the aromatic heterocyclic derivative B are different from each other:

(1-1)

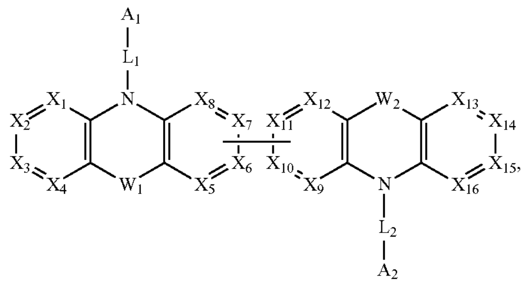

wherein:

each of $W_1$ and $W_2$ independently represents a single bond, $CR_1R_2$ or $SiR_1R_2$;

each of $R_1$ and $R_2$ independently represents a hydrogen atom, a substituted or unsubstituted alkyl group having 1 to 20 carbon atoms, a substituted or unsubstituted cycloalkyl group having 3 to 20 carbon atoms, a substituted or unsubstituted haloalkyl group having 1 to 20 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms;

each of $A_1$ and $A_2$ independently represents a substituted or unsubstituted aryl group having 6 to 30 ring carbon atoms or a substituted or unsubstituted heteroaryl group having 2 to 30 ring carbon atoms;

each of $L_1$ and $L_2$ independently represents a single bond, a substituted or unsubstituted arylene group having 6 to 30 ring carbon atoms, or a substituted or unsubstituted heteroarylene group having 2 to 30 ring carbon atoms;

one of $X_5$ to $X_8$ and one of $X_9$ to $X_{12}$ represent carbon atoms which are bonded to each other and the others of $X_1$ to $X_{16}$ independently represent $CR_3$ or a nitrogen atom; and $R_3$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms or adjacent $R_3$ groups are bonded to each other to form a ring structure;

(2-1)

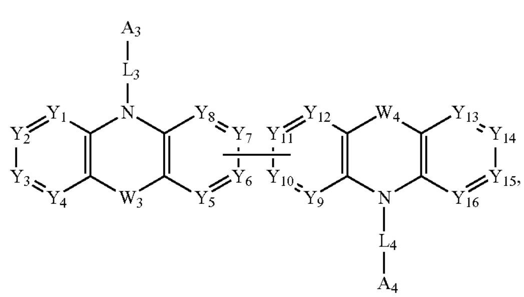

wherein:

each of $W_3$ and $W_4$ independently represents a single bond, $CR_4R_5$ or $SiR_4R_5$;

each of $R_4$ and $R_5$ independently represents a hydrogen atom, a substituted or unsubstituted alkyl group having 1 to 20 carbon atoms, a substituted or unsubstituted cycloalkyl group having 3 to 20 carbon atoms, a substituted or unsubstituted haloalkyl group having 1 to 20 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms;

each of $L_3$ and $L_4$ independently represents a single bond, a substituted or unsubstituted arylene group having 6 to 30 ring carbon atoms, or a substituted or unsubstituted heteroarylene group having 2 to 30 ring carbon atoms;

one of $Y_5$ to $Y_8$ and one of $Y_9$ to $Y_{12}$ represent carbon atoms which are bonded to each other and the others of $Y_1$ to $Y_{16}$ independently represent $CR_6$ or a nitrogen atom;

$R_6$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, or adjacent $R_6$ groups are bonded to each other to form a ring structure; and each of $A_3$ and $A_4$ independently represents a substituted or unsubstituted aryl group having 6 to 30 ring carbon atoms or a substituted or unsubstituted heteroaryl group having 2 to 30 ring carbon atoms, with the proviso that at least one of $A_3$ and $A_4$ is represented by formula (2-a):

(2-a)

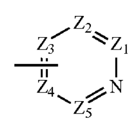

wherein:

each of $Z_1$ to $Z_5$ independently represents $CR_7$ or a nitrogen atom; and $R_7$ independently represents a hydrogen atom, a fluorine atom, a cyano group, a substituted or unsubstituted alkyl group having 1 to 20 carbon atoms, a substituted or unsubstituted cycloalkyl group having 3 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aralkyl group having 7 to 30 carbon atoms, a substituted or unsubstituted aryl group having 6 to 30 ring carbon atoms, or a substituted or unsubstituted heteroaryl group having 2 to 30 ring carbon atoms, or adjacent $R_7$ groups are bonded to each other to form a ring structure.

2. The organic electroluminescence device according to claim 1, wherein the aromatic heterocyclic derivative A is represented by formula (1-2) and the aromatic heterocyclic derivative B is represented by formula (2-2):

(1-2)

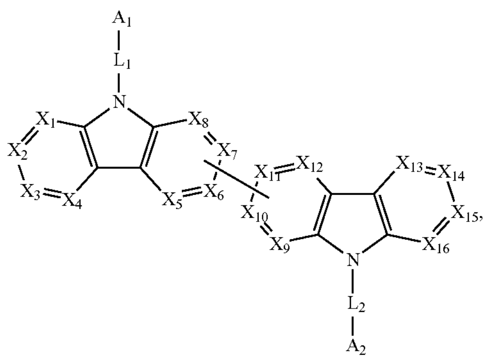

wherein $A_1$, $A_2$, $L_1$, $L_2$, and $X_1$ to $X_{16}$ are as defined in formula (1-1); and (2-2)

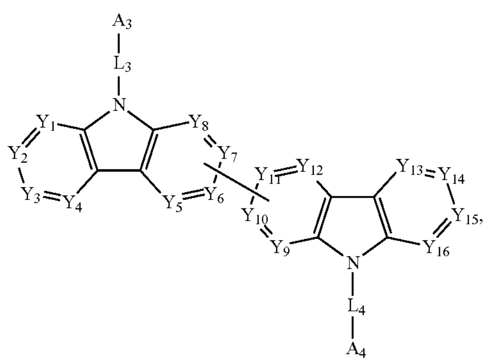

wherein $A_3$, $A_4$, $L_3$, $L_4$, and $Y_1$ to $Y_{16}$ are as defined in formula (2-1).

3. The organic electroluminescence device according to claim 1, wherein the aromatic heterocyclic derivative A is represented by formula (1-3):

(1-3)

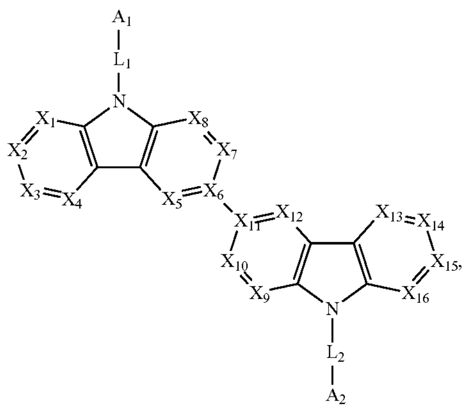

wherein $A_1$, $A_2$, $L_1$, $L_2$, and $X_1$ to $X_{16}$ are as defined in formula (1-1).

4. The organic electroluminescence device according to claim 1, wherein the aromatic heterocyclic derivative A is represented by formula (1-4) or (1-5):

(1-4)

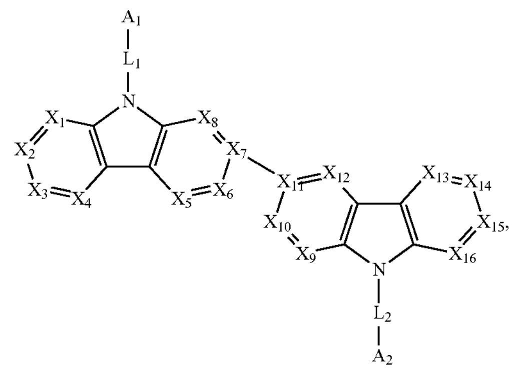

(1-5)

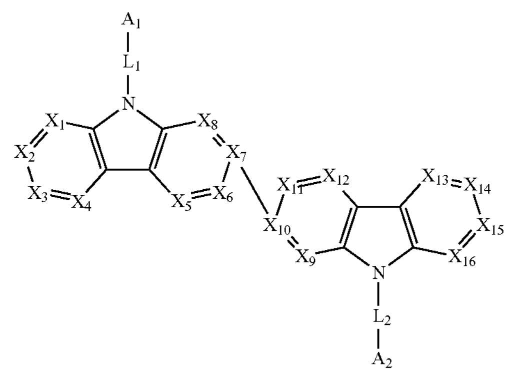

wherein $A_1$, $A_2$, $L_1$, $L_2$, and $X_1$ to $X_{16}$ are as defined in formula (1-1).

5. The organic electroluminescence device according to claim 1, wherein the aromatic heterocyclic derivative B is represented by formula (2-3):

(2-3)

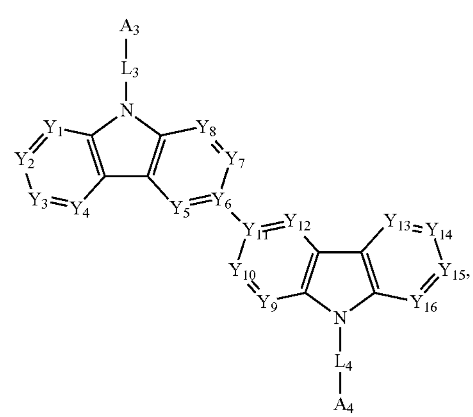

wherein $A_3$, $A_4$, $L_3$, $L_4$, and $Y_1$ to $Y_{16}$ are as defined in formula (2-1).

6. The organic electroluminescence device according to claim 1, wherein the aromatic heterocyclic derivative B is represented by formula (2-4) or (2-5):

(2-4)

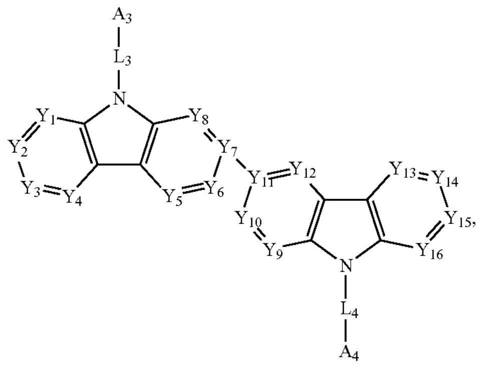

(2-5)

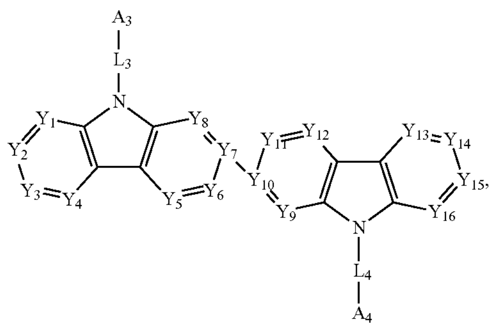

wherein $A_3$, $A_4$, $L_3$, $L_4$, and $Y_1$ to $Y_{16}$ are as defined in formula (2-1).

7. The organic electroluminescence device according to claim 5, wherein the aromatic heterocyclic derivative A is represented by formula (1-3):

(1-3)

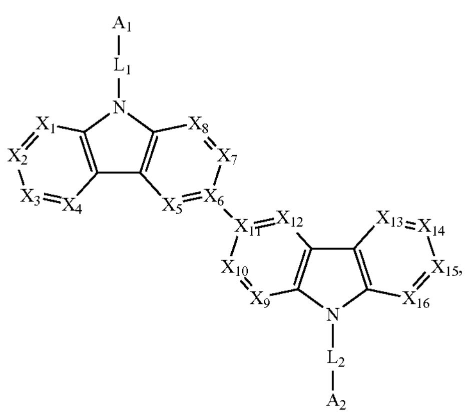

wherein $A_1$, $A_2$, $L_1$, $L_2$, and $X_1$ to $X_{16}$ are as defined in formula (1-1).

8. The organic electroluminescence device according to claim 6, wherein the aromatic heterocyclic derivative A is represented by formula (1-3):

(1-3)

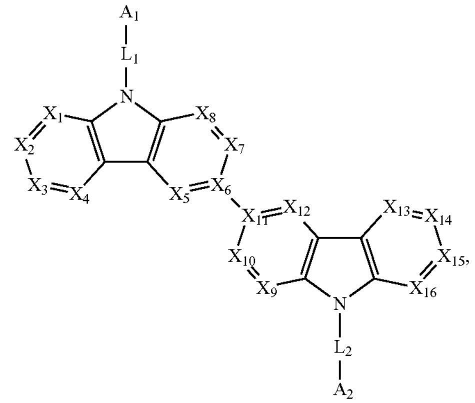

wherein $A_1$, $A_2$, $L_1$, $L_2$, and $X_1$ to $X_{16}$ are as defined in formula (1-1).

9. The organic electroluminescence device according to claim 1, wherein at least one of $A_1$ and $A_2$ represents a substituted or unsubstituted dibenzofuranyl group, a substituted or unsubstituted carbazolyl group, or a substituted or unsubstituted dibenzothiophenyl group.

10. The organic electroluminescence device according to claim 1, wherein a layer comprising a compound represented by formula (10) is bonded to the first organic thin-film layer:

(10)

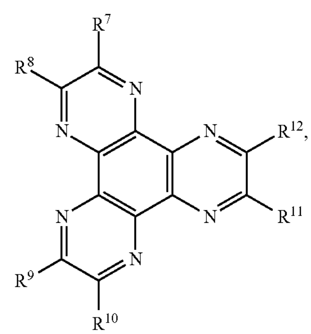

wherein each of $R^7$ to $R^{12}$ independently represents a cyano group, —$CONH_2$, a carboxyl group, or —$COOR^{13}$, wherein $R^{13}$ represents an alkyl group having 1 to 20 carbon atoms, or $R^7$ and $R^8$, $R^9$ and $R^{10}$, or $R^{11}$ and $R^{12}$ are bonded to each other to form —CO—O—CO—.

11. The organic electroluminescence device according to claim 1, wherein the second organic thin-film layer further comprises a phosphorescent emitting material.

12. The organic electroluminescence device according to claim 11, wherein the phosphorescent emitting material is an ortho metallated complex comprising a metal selected from the group consisting of iridium (Ir), osmium (Os), and platinum (Pt).

13. The organic electroluminescence device according to claim 1, wherein the aromatic heterocyclic derivative A is represented by formula (1-2) and the aromatic heterocyclic derivative B is represented by formula (2-2):

(1-2)

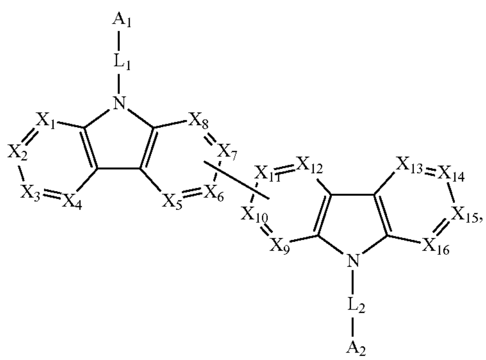

wherein $A_1$, $A_2$, $L_1$, $L_2$, and $X_1$ to $X_{16}$ are as defined in formula (1-1); and (2-2)

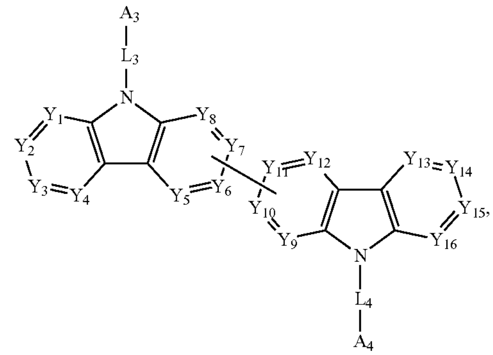

wherein $A_3$, $A_4$, $L_3$, $L_4$, and $Y_1$ to $Y_{16}$ are as defined in formula (2-1).

14. The organic electroluminescence device according to claim 1, wherein the second organic thin film layer is an emitting layer.

15. The organic electroluminescence device according to claim 1, wherein the first organic thin film layer is a hole transporting layer or a space layer.

* * * * *